US008426036B2

(12) United States Patent
Nishimura et al.

(10) Patent No.: US 8,426,036 B2
(45) Date of Patent: Apr. 23, 2013

(54) ORGANIC EL DEVICE AND ANTHRACENE DERIVATIVE

(75) Inventors: Kazuki Nishimura, Sodegaura (JP); Toshihiro Iwakuma, Sodegaura (JP); Masahiro Kawamura, Sodegaura (JP); Chishio Hosokawa, Sodegaura (JP); Kenichi Fukuoka, Sodegaura (JP); Yukitoshi Jinde, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 577 days.

(21) Appl. No.: 12/668,111

(22) PCT Filed: Jul. 4, 2008

(86) PCT No.: PCT/JP2008/062146
§ 371 (c)(1),
(2), (4) Date: Jan. 7, 2010

(87) PCT Pub. No.: WO2009/008357

PCT Pub. Date: Jan. 15, 2009

(65) Prior Publication Data

US 2010/0207110 A1 Aug. 19, 2010

(30) Foreign Application Priority Data

Jul. 7, 2007 (JP) ................................ 2007-179123

(51) Int. Cl.
*H01L 51/54* (2006.01)

(52) U.S. Cl.
USPC ........... 428/690; 428/917; 313/504; 313/506; 252/301.16; 257/40; 257/E51.049; 585/26

(58) Field of Classification Search ........................ None
See application file for complete search history.

(56) References Cited

U.S. PATENT DOCUMENTS

| | | | | |
|---|---|---|---|---|
| 2002/0182441 | A1 | 12/2002 | Lamansky et al. | |
| 2003/0201415 | A1 | 10/2003 | Hoag et al. | |
| 2004/0161633 | A1* | 8/2004 | Seo et al. | 428/690 |
| 2004/0185300 | A1 | 9/2004 | Hatwar et al. | |
| 2005/0064233 | A1 | 3/2005 | Matsuura et al. | |
| 2005/0077817 | A1 | 4/2005 | Yamazaki et al. | |
| 2005/0089714 | A1 | 4/2005 | Hatwar et al. | |
| 2005/0089715 | A1 | 4/2005 | Cosimbescu et al. | |
| 2005/0089717 | A1 | 4/2005 | Cosimbescu et al. | |
| 2005/0214576 | A1 | 9/2005 | Lamansky et al. | |
| 2006/0043859 | A1 | 3/2006 | Fukuoka et al. | |
| 2006/0127698 | A1 | 6/2006 | Tokailin et al. | |
| 2006/0134456 | A1 | 6/2006 | Ikeda et al. | |
| 2006/0222888 | A1* | 10/2006 | Lee et al. | 428/690 |
| 2007/0063638 | A1 | 3/2007 | Tokairin et al. | |
| 2007/0134511 | A1 | 6/2007 | Kawamura et al. | |
| 2007/0194701 | A1 | 8/2007 | Ito et al. | |
| 2010/0141129 | A1 | 6/2010 | Fukuoka et al. | |

FOREIGN PATENT DOCUMENTS

| | | | |
|---|---|---|---|
| EP | 1 565 041 | A1 | 8/2005 |
| EP | 1 718 124 | A1 | 11/2006 |
| EP | 1 727 396 | A1 | 11/2006 |
| JP | 9 241629 | | 9/1997 |
| JP | 2001 250690 | | 9/2001 |
| JP | 2003 257670 | | 9/2003 |
| JP | 2003 317946 | | 11/2003 |
| JP | 2004 506305 | | 2/2004 |

(Continued)

OTHER PUBLICATIONS

Sun, Yiru et al. "Management of singlet and triplet excitons for efficient white organic light-emitting devices", Nature, Letters, vol. 440, pp. 908-912, (Apr. 13, 2006).
U.S. Appl. No. 12/667,939, filed Jan. 6, 2010, Nishimura, et al.
U.S. Appl. No. 12/668,035, filed Jan. 7, 2010, Nishimura, et al.
U.S. Appl. No. 12/667,893, filed Jan. 6, 2010, Nishimura, et al.
U.S. Appl. No. 12/668,110, filed Jan. 7, 2010, Nishimura, et al.
Extended Search Report issued Mar. 19, 2012 in European Patent Application No. 08790877.8—1235/2166592.

*Primary Examiner* — Michael H Wilson
(74) *Attorney, Agent, or Firm* — Oblon, Spivak, McClelland, Maier & Neustadt, L.L.P.

(57) ABSTRACT

An organic EL device includes: an anode for injecting holes; a phosphorescent-emitting layer; a fluorescent-emitting layer; and a cathode for injecting electrons. The phosphorescent-emitting layer contains a phosphorescent host and a phosphorescent dopant for phosphorescent emission. The fluorescent-emitting layer contains a fluorescent host and a fluorescent dopant for fluorescent emission. The fluorescent host is at least one of an asymmetric anthracene derivative represented by a formula (1) below and a pyrene derivative represented by a formula (2) below.

(1)

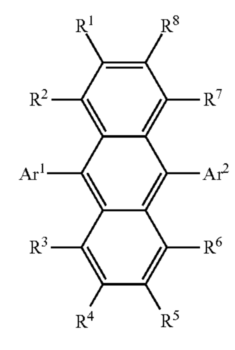

(2)

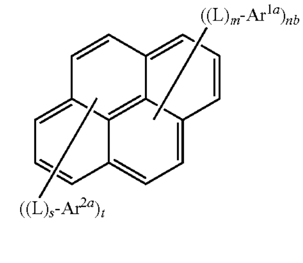

6 Claims, 1 Drawing Sheet

FOREIGN PATENT DOCUMENTS

| | | |
|---|---|---|
| JP | 2004 221045 | 8/2004 |
| JP | 2005 19413 | 1/2005 |
| JP | 2007 19070 | 1/2005 |
| JP | 2005 123205 | 5/2005 |
| JP | 2005 235787 | 9/2005 |
| JP | 2006 120689 | 5/2006 |
| JP | 2006 120821 | 5/2006 |
| JP | 2006 172762 | 6/2006 |
| JP | 2006 190759 | 7/2006 |
| JP | 2007 27620 | 2/2007 |
| JP | 2007 59310 | 3/2007 |
| JP | 2007 73814 | 3/2007 |
| JP | 2007 509502 | 4/2007 |
| JP | 2007 173827 | 7/2007 |
| WO | 2004 016575 | 2/2004 |
| WO | 2004 018588 | 3/2004 |
| WO | 2004 060026 | 7/2004 |
| WO | 2005 079118 | 8/2005 |
| WO | 2005 117500 | 12/2005 |
| WO | 2006 038020 | 4/2006 |
| WO | 2006 062078 | 6/2006 |
| WO | 2007 029426 | 3/2007 |
| WO | 2007 029806 | 3/2007 |
| WO | 2007 032162 | 3/2007 |

* cited by examiner

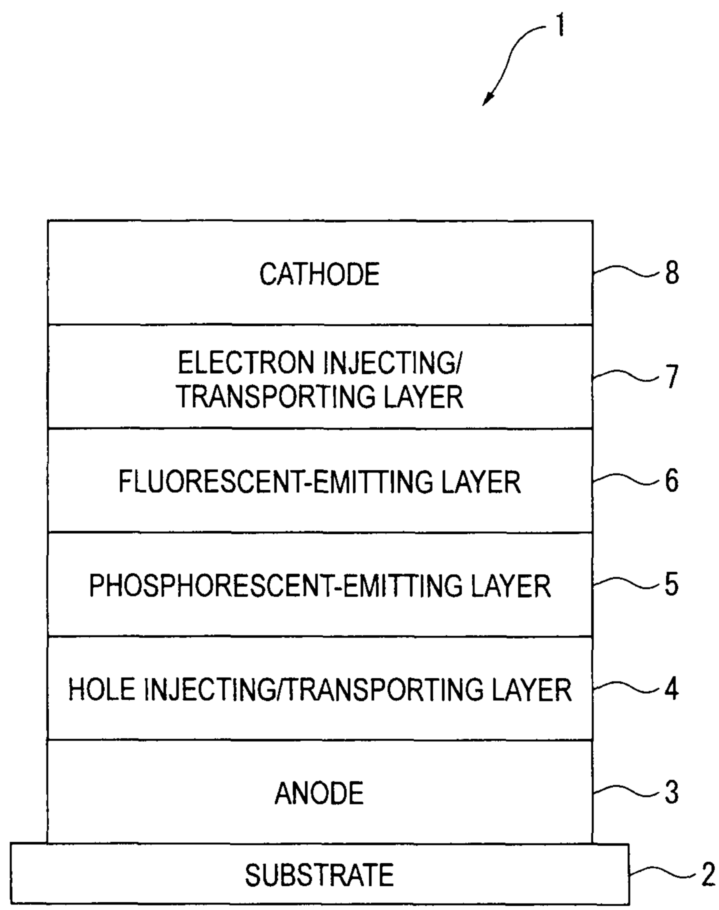
1
CATHODE
8
ELECTRON INJECTING/
TRANSPORTING LAYER
7
FLUORESCENT-EMITTING LAYER
6
PHOSPHORESCENT-EMITTING LAYER
5
HOLE INJECTING/TRANSPORTING LAYER
4
ANODE
3
SUBSTRATE
2

ORGANIC EL DEVICE AND ANTHRACENE DERIVATIVE

TECHNICAL FIELD

The present invention relates to an organic EL device. In particular, the invention relates to an organic EL device including a fluorescent-emitting layer and a phosphorescent-emitting layer.

BACKGROUND ART

To date, organic EL devices including a plurality of emitting layers each of which emits light of a different wavelength are known. Such organic EL devices are also known to provide mixed-color light in which the lights emitted by the emitting layers are mixed together. One of such organic EL devices includes a layered red-emitting layer, green-emitting layer and blue-emitting layer, and provides white light in which emissions from the emitting layers are mixed together.

In recent years, a further progress has been made in the development of phosphorescent materials utilizing the emission from triplet exciton energy, and devices of high luminous efficiency have been realized (e.g., Patent Document 1).

Hence, some expect that devices for mixed-color emission will be obtainable by using phosphorescent materials that provide emission at different wavelengths, in particular, white-emitting devices.

However, a phosphorescent material capable of providing long-wavelength emission of green to red color has been known so far, but no phosphorescent material capable of providing short-wavelength emission (blue emission) at a practical level has been known.

Thus, one possible solution is to obtain short-wavelength emission (blue emission) from fluorescent emission while using a phosphorescent material for long-wavelength emission (green to red emission).

However, while the quantum efficiency of the phosphorescent emission can be enhanced up to be 75% or more or approximated to 100%, the luminous efficiency of fluorescent blue emission is typically low. Thus, balancing of the mixed color (e.g., white balance) is difficult.

One possible approach would be to increase the exciton generation in the fluorescent-emitting layer for enhancing the luminance of the blue emission up to the luminance of the phosphorescent emission. However, such an approach would invite increase in the load applied on the fluorescent-emitting layer, so that the degradation of the materials of the fluorescent-emitting layer would be accelerated. Thus, the device lifetime would be considerably shortened.

In view of such problems, there has been a demand for a mixed-color-emitting device (e.g., white-emitting device) having practically-applicable luminous efficiency and lifetime.

Patent Document 1: US2002/182441

DISCLOSURE OF THE INVENTION

Problems to Be Solved by the Invention

An object of the invention is to solve the above problems and to provide a mixed-color-emitting organic EL device having high luminous efficiency and long lifetime.

Means for Solving the Problems

An organic EL device according to an aspect of the invention includes: an anode for injecting holes; a phosphorescent-emitting layer; a fluorescent-emitting layer; and a cathode for injecting electrons, the phosphorescent-emitting layer containing a phosphorescent host and a phosphorescent dopant for phosphorescent emission, the fluorescent-emitting layer containing a fluorescent host and a fluorescent dopant for fluorescent emission, the fluorescent host being at least one of an asymmetric anthracene derivative represented by a formula (1) below and a pyrene derivative represented by a formula (2) below.

[Chemical Formula 1]

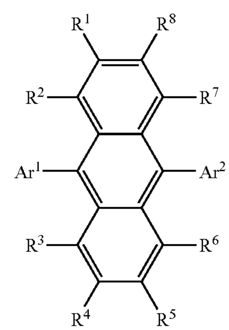

(1)

In the formula, $Ar^1$ and $Ar^2$ are different groups, each independently representing a group derived from a substituted or unsubstituted aromatic ring having 6 to 20 ring carbon atoms. The aromatic ring may be substituted by one or more substituent(s) or unsubstituted. The substituent(s) is selected from the group consisting of a substituted or unsubstituted aryl group having 6 to 50 ring carbon atoms, substituted or unsubstituted alkyl group having 1 to 50 carbon atoms, substituted or unsubstituted cycloalkyl group having 3 to 50 carbon atoms, substituted or unsubstituted alkoxy group having 1 to 50 carbon atoms, substituted or unsubstituted aralkyl group having 6 to 50 ring carbon atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, substituted or unsubstituted silyl group, carboxyl group, halogen atom, cyano group, nitro group and hydroxy group. When the aromatic ring is substituted by two or more substituents, the substituents may be the same or different. An adjacent set of the substituents may be bonded together to form a saturated or unsaturated cyclic structure.

$R^1$ to $R^8$ each are selected from the group consisting of a hydrogen atom, substituted or unsubstituted aryl group having 6 to 50 ring carbon atoms, substituted or unsubstituted heteroaryl group having 5 to 50 ring atoms, substituted or unsubstituted alkyl group having 1 to 50 carbon atoms, substituted or unsubstituted cycloalkyl group having 3 to 50 carbon atoms, substituted or unsubstituted alkoxy group having 1 to 50 carbon atoms, substituted or unsubstituted aralkyl group having 6 to 50 ring carbon atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, substituted or unsubstituted silyl group, carboxyl group, halogen atom, cyano group, nitro group and hydroxy group. An adjacent set of substituents may be bonded together to form a saturated or unsaturated cyclic structure,

[Chemical Formula 2]

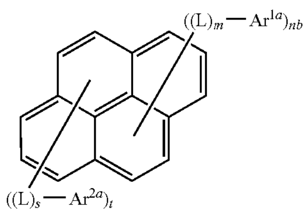

(2)

In the formula, $Ar^{1a}$ and $Ar^{2a}$ each represent a substituted or unsubstituted aromatic ring group having 6 to 50 ring carbon atoms.

L each represent a substituted or unsubstituted phenylene group, substituted or unsubstituted naphthalenylene, substituted or unsubstituted fluorenylene or substituted or unsubstituted dibenzo-sylolylene group.

m is an integer of 0 to 2, nb is an integer of 1 to 4, s is an integer of 0 to 2 and t is an integer of 0 to 4.

L or $Ar^{1a}$ is bonded to pyrene in any one of 1st to 5th positions, and L or $Ar^{2a}$ is bonded to pyrene in any one of 6th to 10th positions.

However, when nb+t is even, $Ar^{1a}$, $Ar^{2a}$ and L satisfy the following (1) or (2), (1) $Ar^{1a} \neq Ar^{2a}$, wherein ≠ means that $Ar^{1a}$ and $Ar^{2a}$ are group of different structures, (2) when $Ar^{1a}=Ar^{2a}$, (2-1) m≠s and/or nb≠t or (2-2) when m=s and nb=t and, (2-2-1) L or the pyrene is bonded in a different bonding position on $Ar^{1a}$ and $Ar^{2a}$, or (2-2-2) L or the pyrene is bonded in the same bonding position on $Ar^{1a}$ and $Ar^{2a}$, substituting positions of L or $Ar^{1a}$ and $Ar^{2a}$ in the pyrene are not 1st and 6th positions or 2nd and 7th positions.

According to the above structure, asymmetric anthracene derivatives and pyrene derivatives are hosts having favorable performance and long lifetime. Thus, by the application to the emitting device according to the aspect of the invention, the obtained device can exhibit high emitting performance and long lifetime.

Examples of the anthracene derivative are those represented by the following formulae.

[Chemical Formula 3]

2a'-52

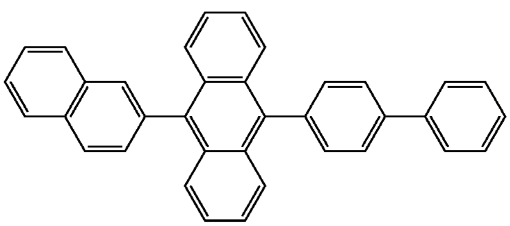

2a'-53

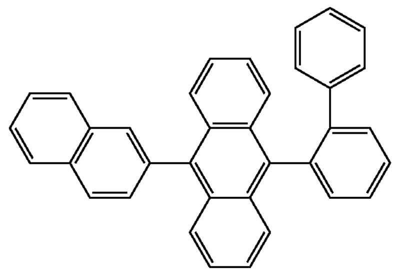

2a'-54

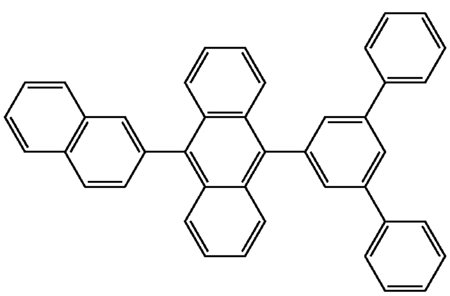

2a'-55

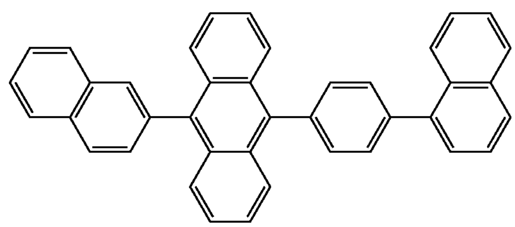

2a'-56

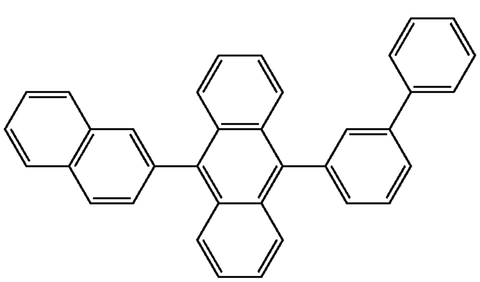

2a'-57

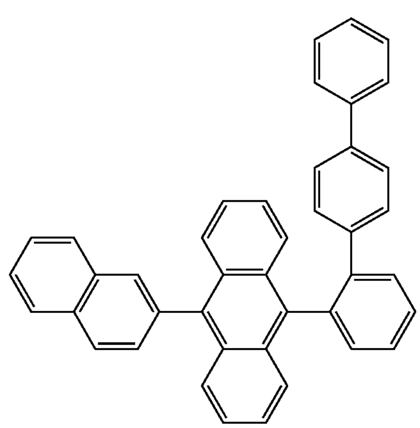

-continued
2a′-58
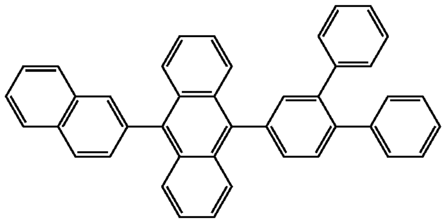
2a′-59
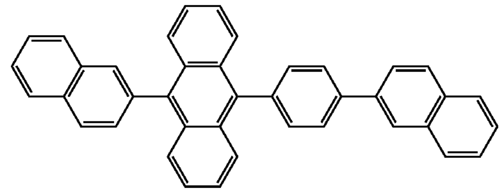
2a′-60
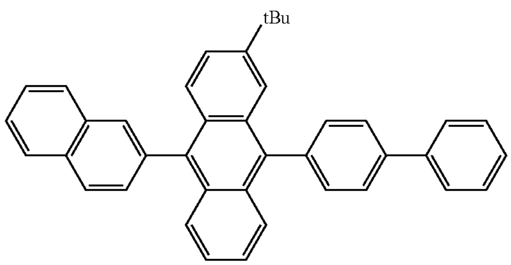
2a′-61
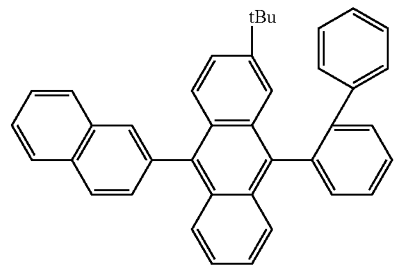
2a′-62
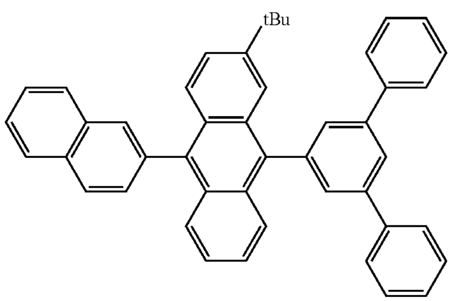
2a′-63
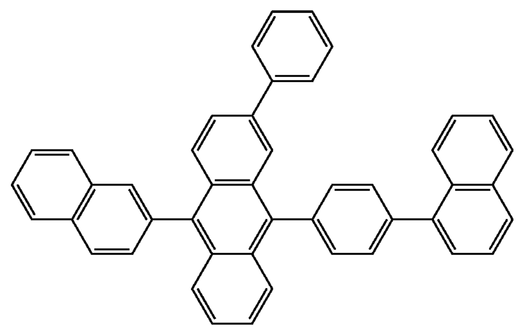
2a′-64
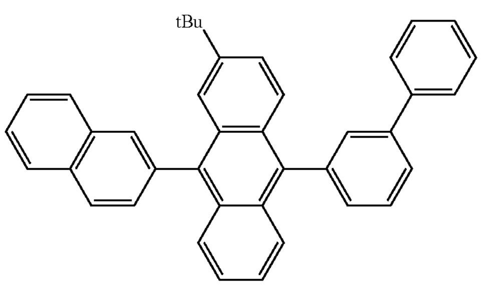
2a′-65
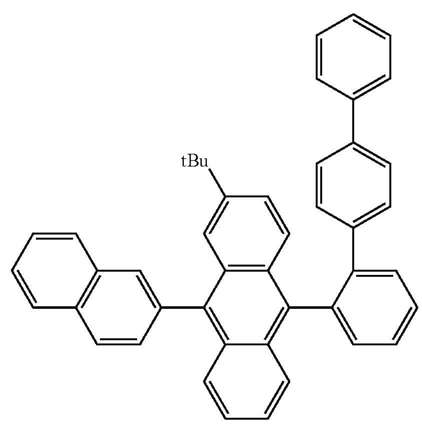
2a′-66
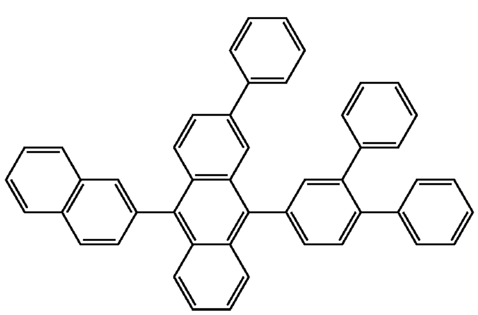
2a′-67
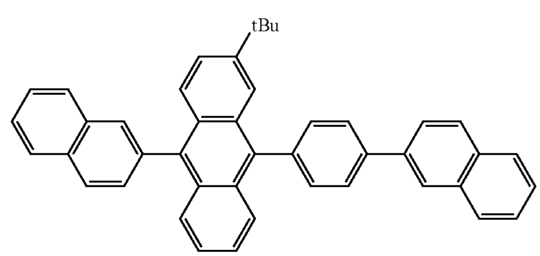

-continued
[Chemical Formula 4]
2a′-68
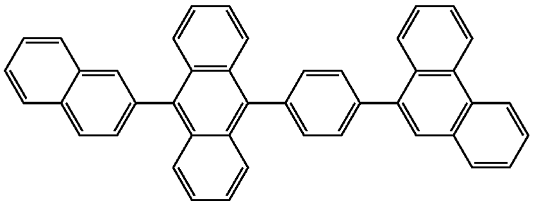
2a′-69
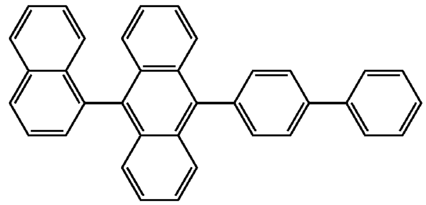
2a′-70
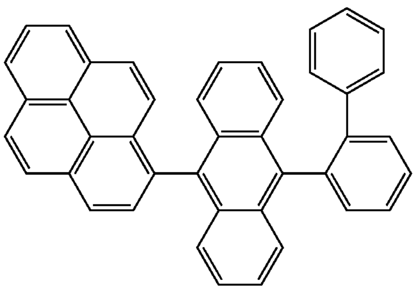
2a′-71
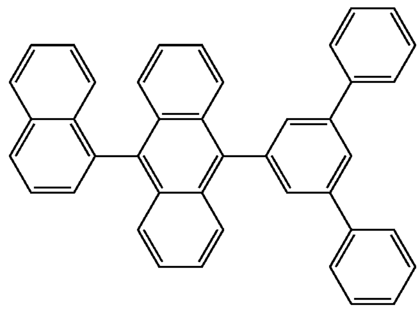
2a′-72
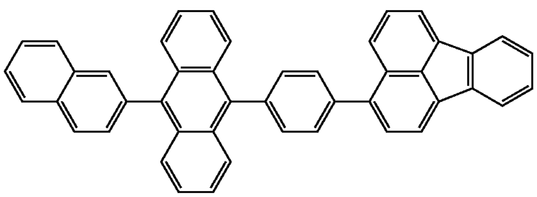
2a′-73
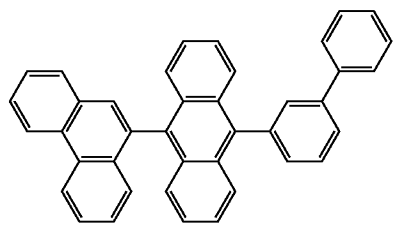
2a′-74
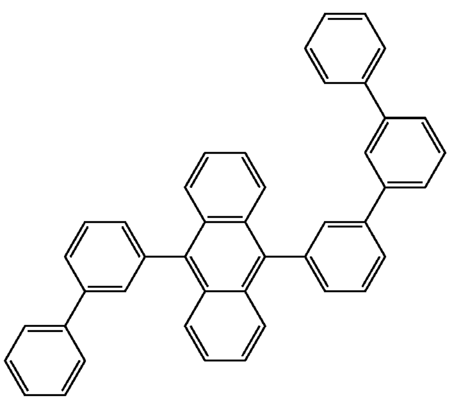
2a′-75
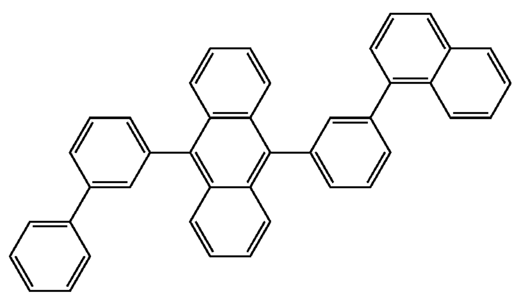
2a′-76
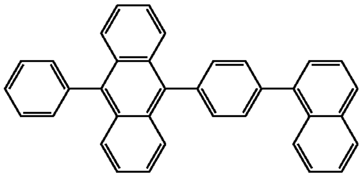
2a′-77
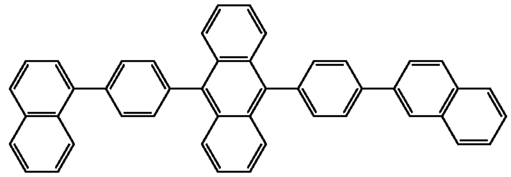

-continued
2a'-78
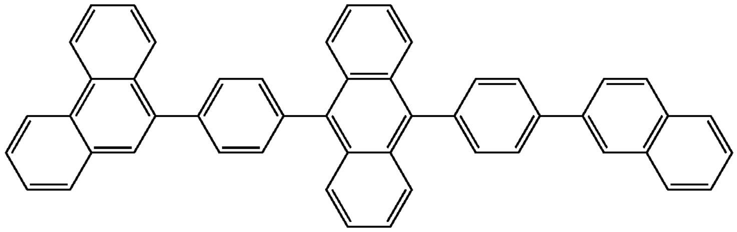
2a'-79
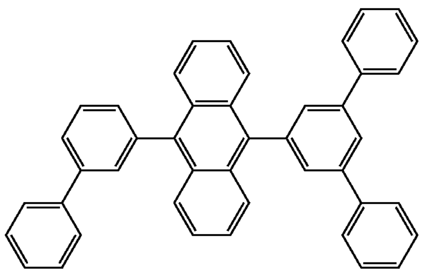
2a'-80
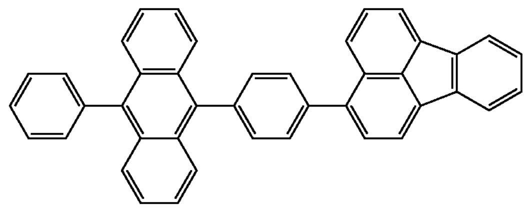
2a'-81
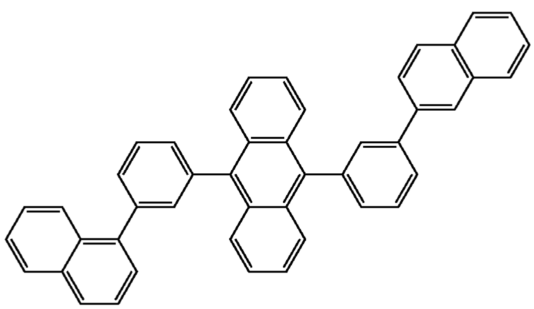
2a'-82
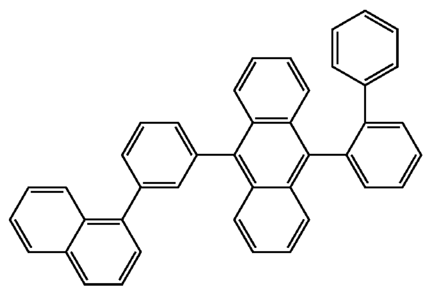
2a'-83
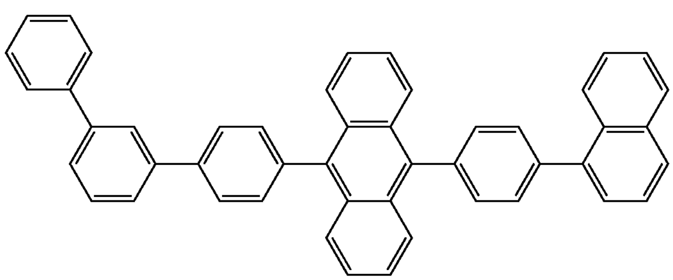
[Chemical Formula 5]
2a'-84
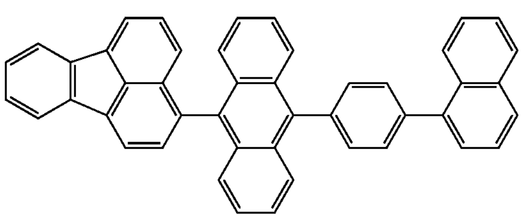
2a'-85
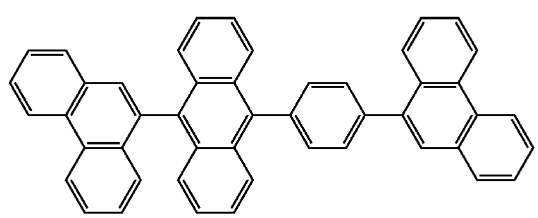

-continued
2a'-86
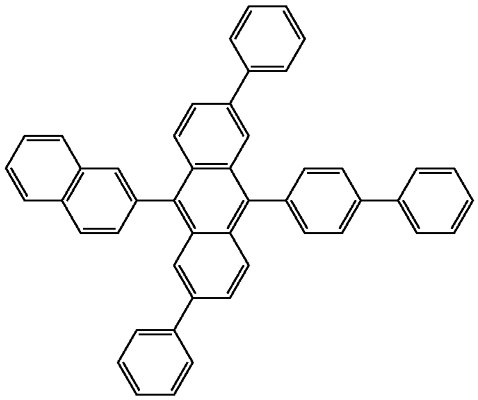
2a'-87
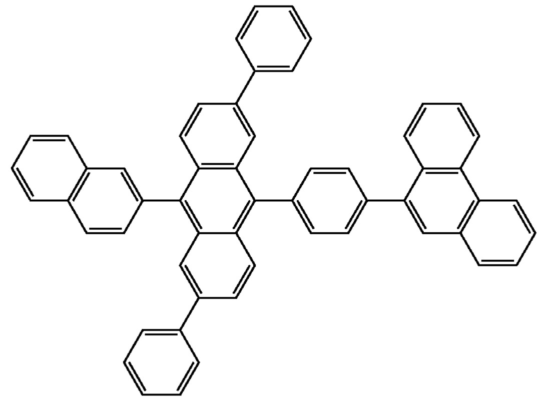
2a'-88
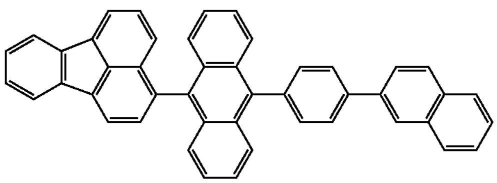
2a'-89
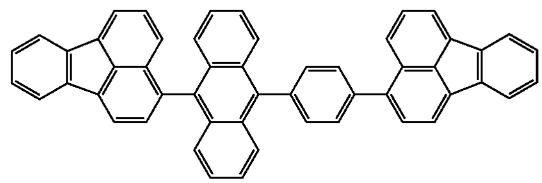
2a'-90
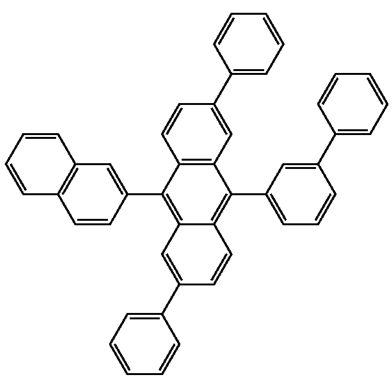
2a'-91
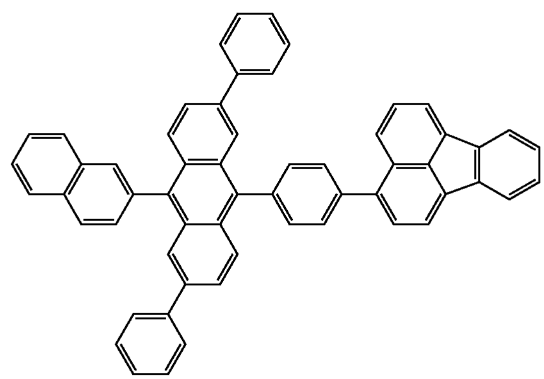
2a'-92
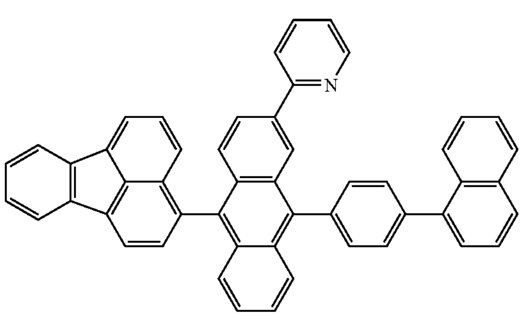
2a'-93
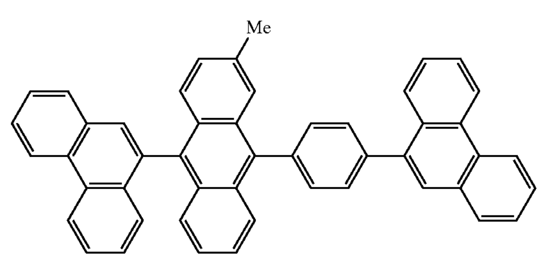

-continued
2a′-94
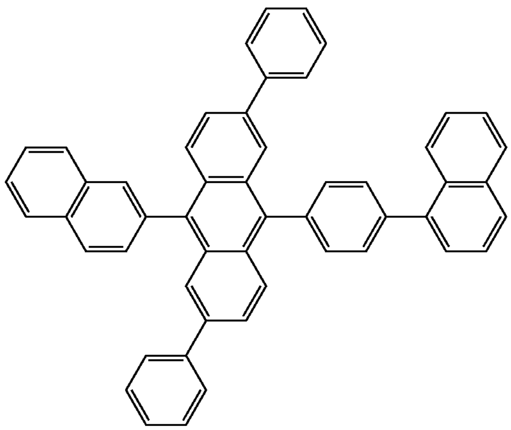
2a′-95
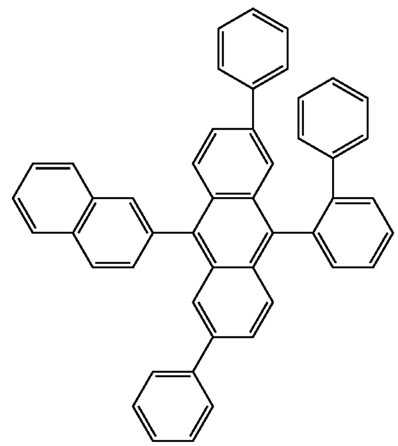
2a′-96
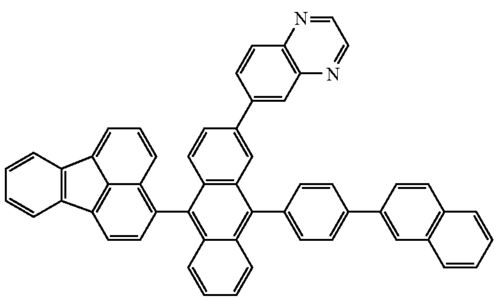
2a′-97
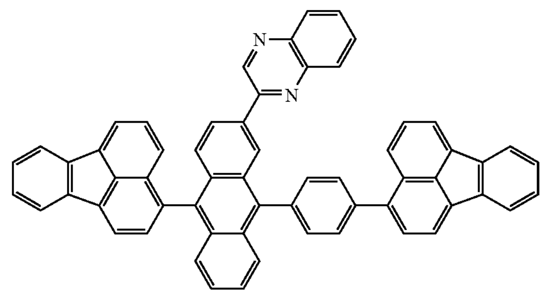
2a′-98
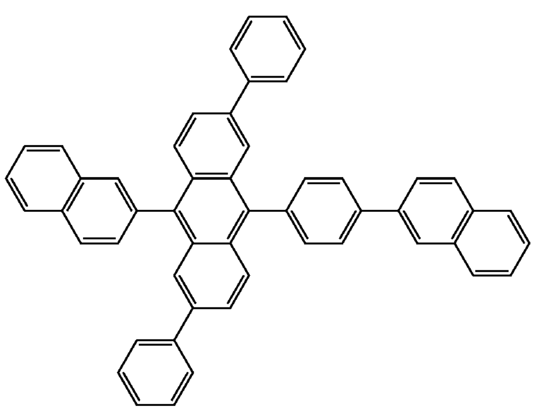
2a′-99
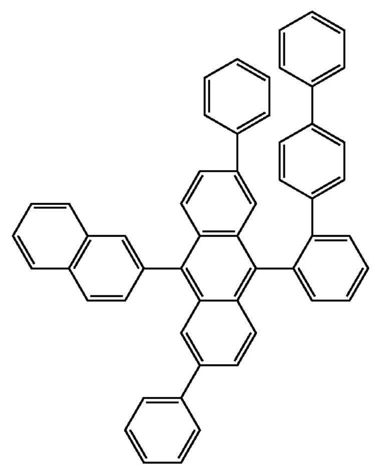
[Chemical Formula 6]
2a′-100
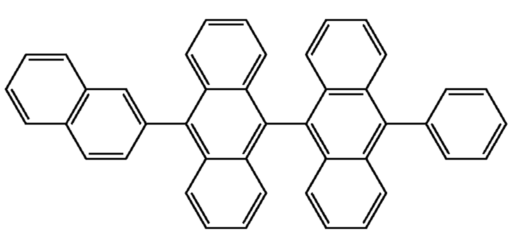
2a′-101
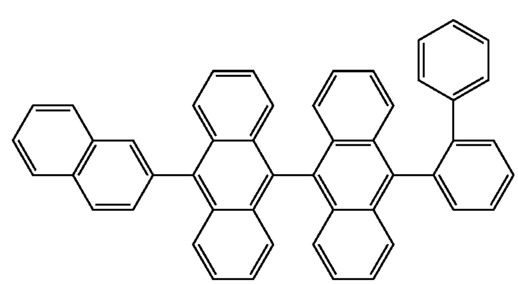

-continued
2a'-102
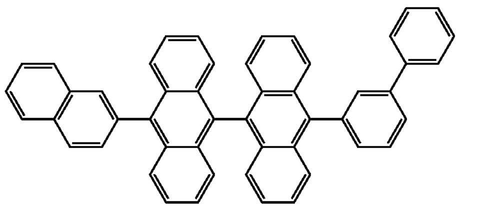
2a'-103
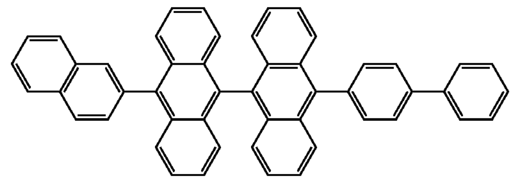
2a'-104
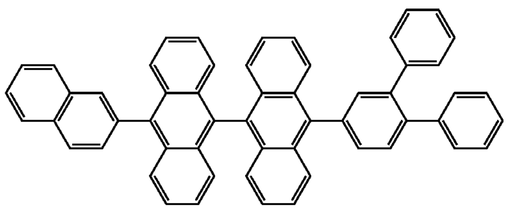
2a'-105
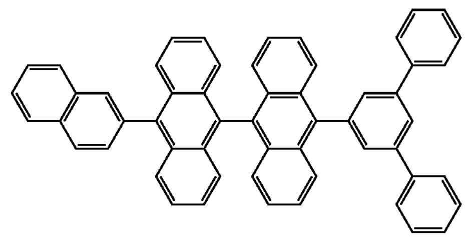
2a'-106
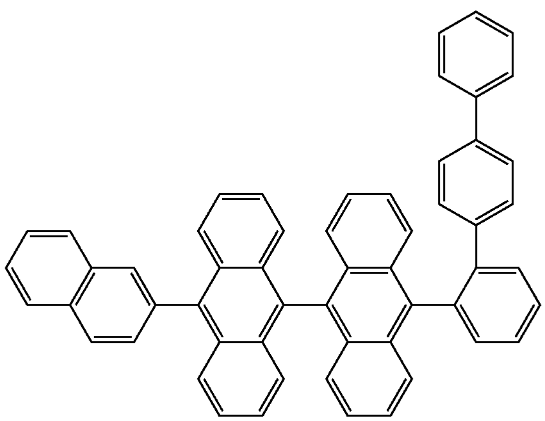
2a'-107
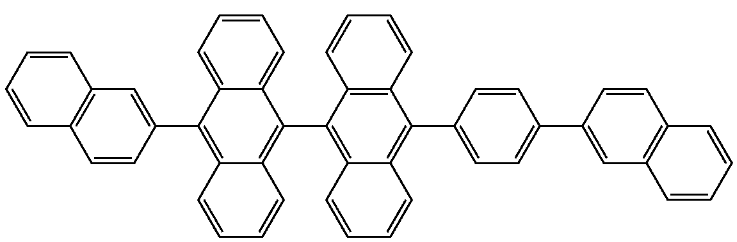
2a'-108
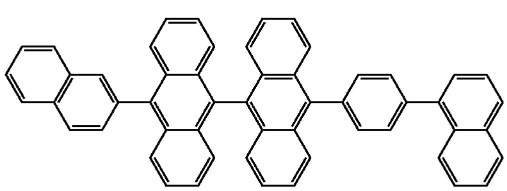
2a'-109
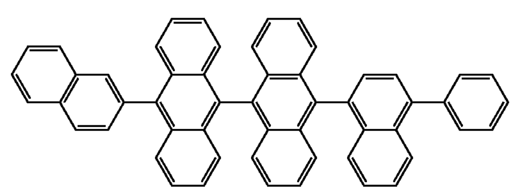
2a'-110
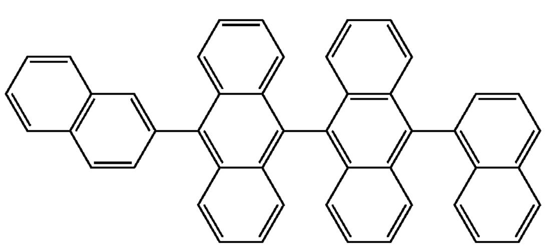

-continued
2a′-111
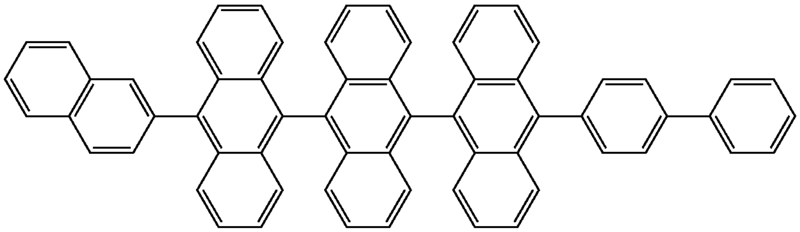
[Chemical Formula 7]
2a′-112
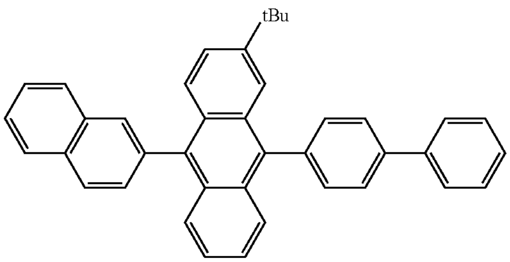
2a′-113
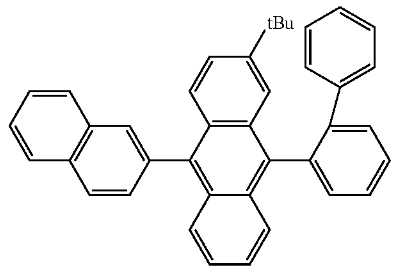
2a′-114
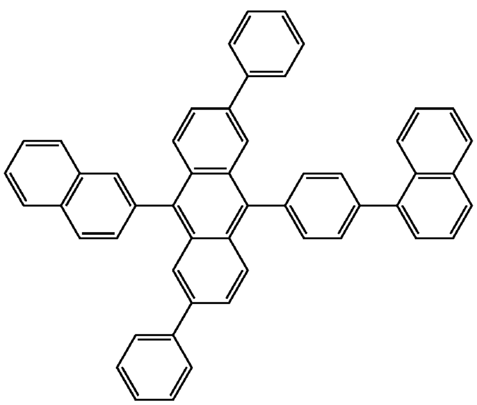
2a′-115
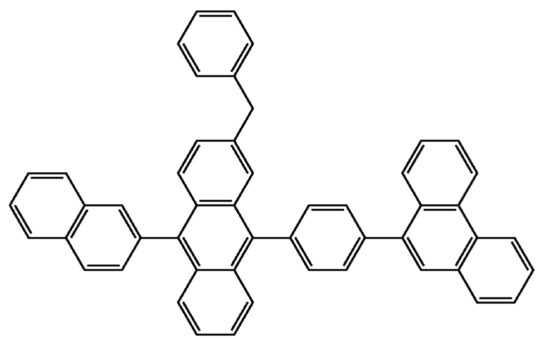
2a′-116
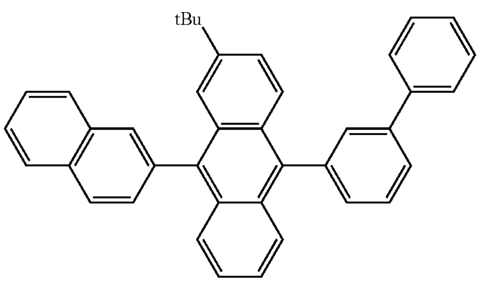
2a′-117
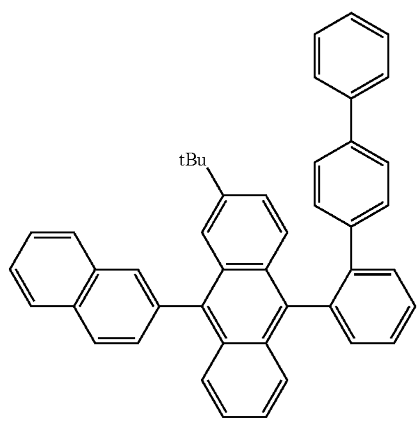
2a′-118
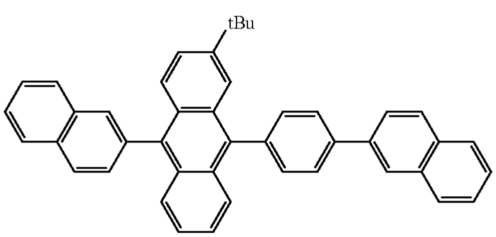
2a′-119
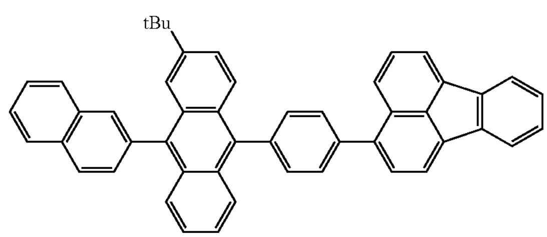

-continued
2a'-120
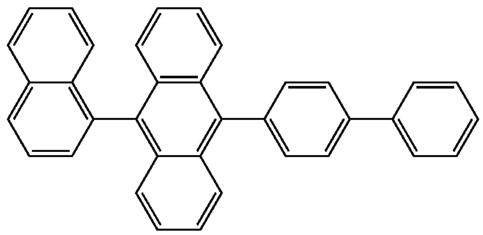
2a'-121
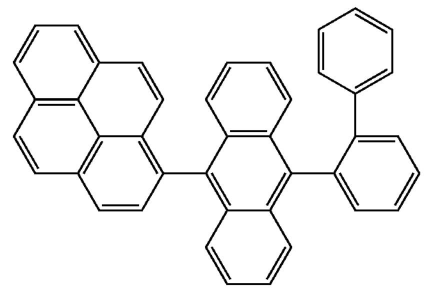
2a'-122
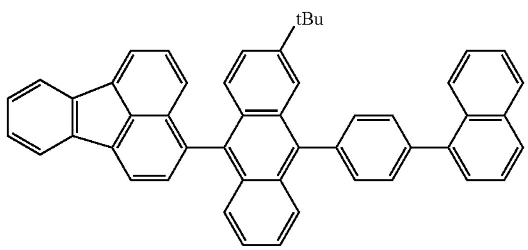
2a'-123
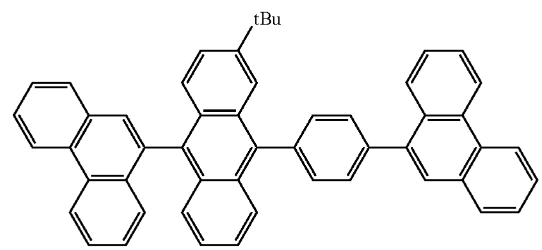
2a'-124
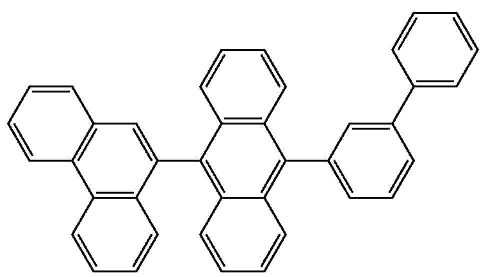
2a'-125
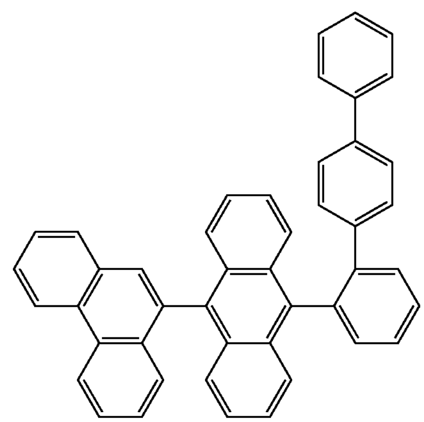
2a'-126
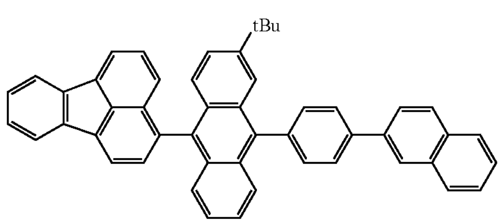
2a'-127
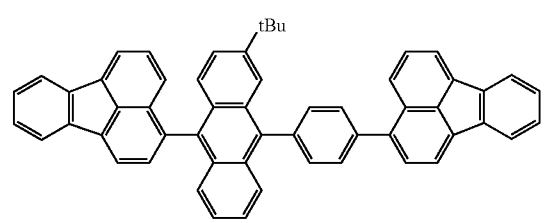
[Chemical Formula 8]
2a'-128
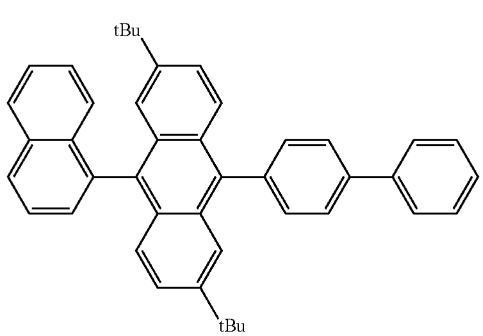
2a'-129
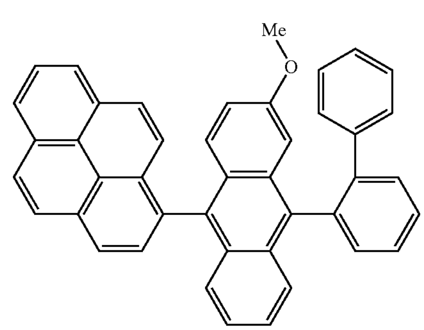

-continued
2a'-130
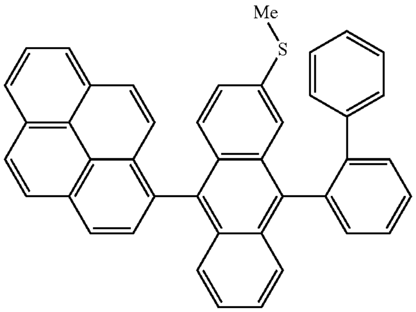
2a'-131
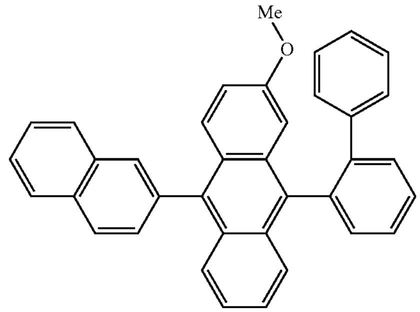
2a'-132
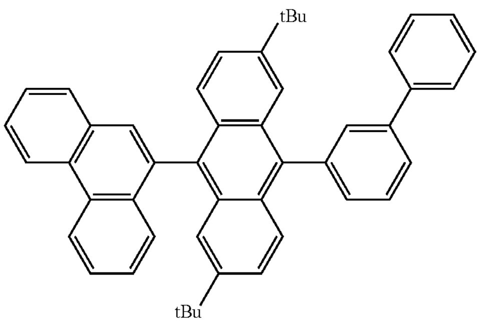
2a'-133
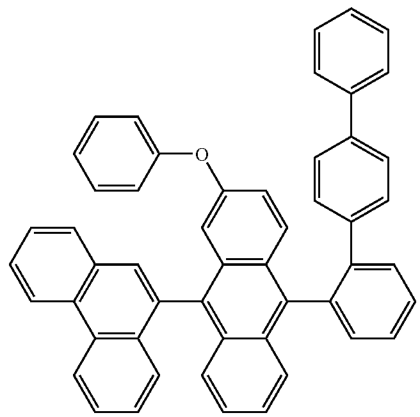
2a'-134
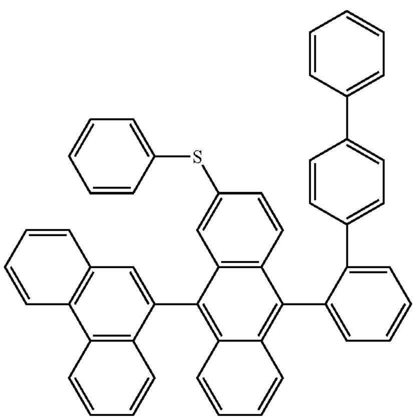
2a'-135
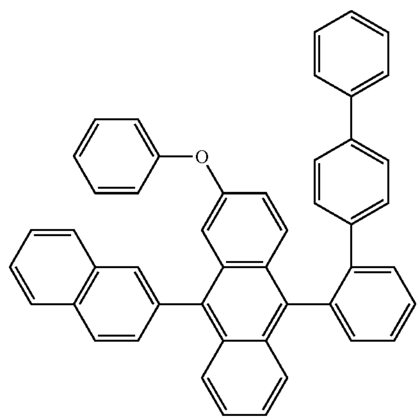
2a'-136
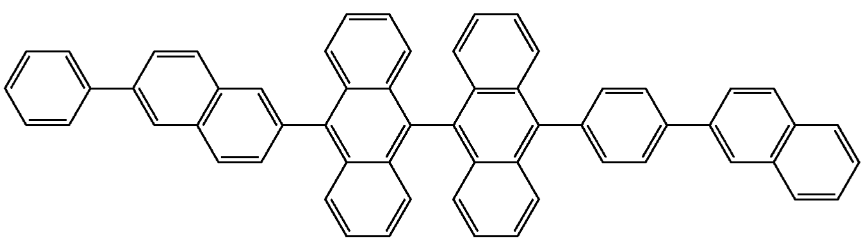
2a'-137
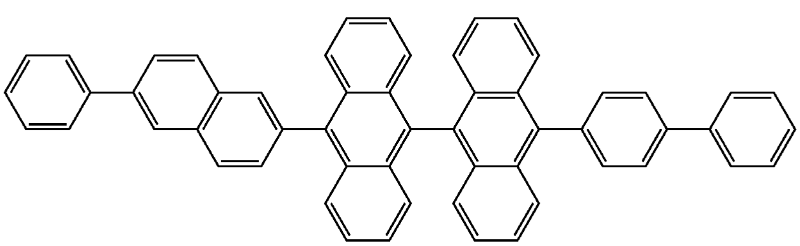

-continued
2a′-138
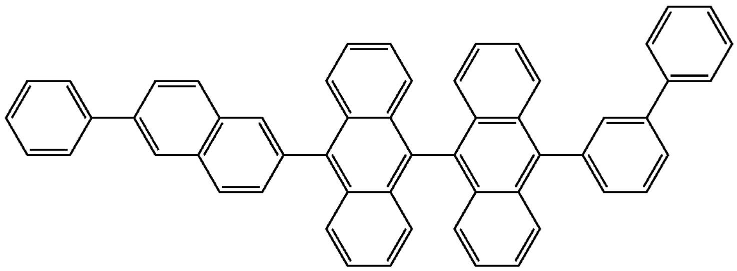
2a′-139
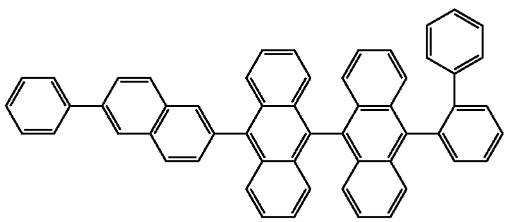
2a′-140
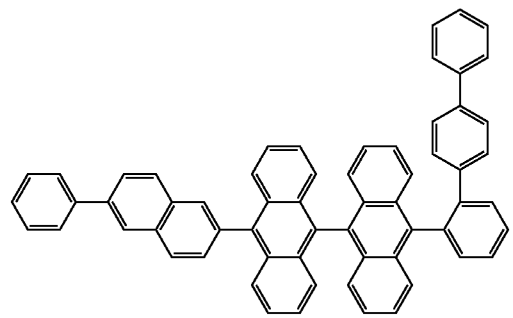
2a′-141
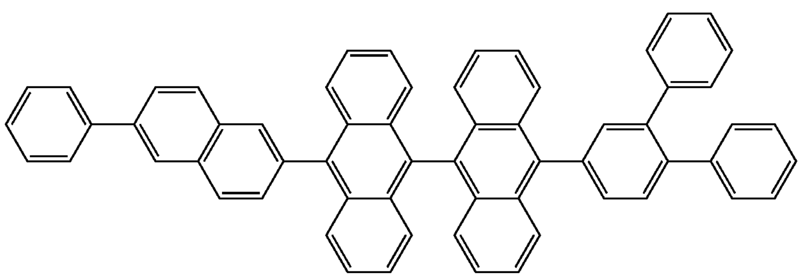
2a′-142
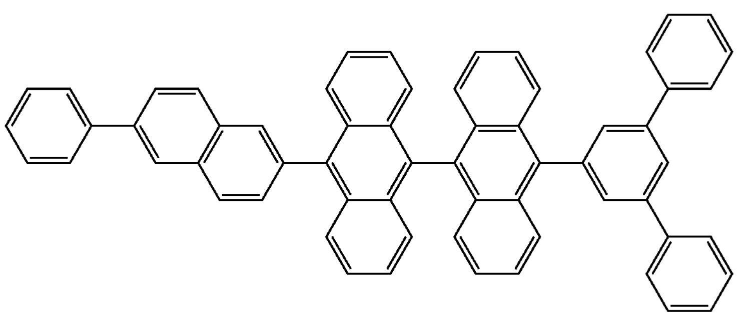
2a′-143
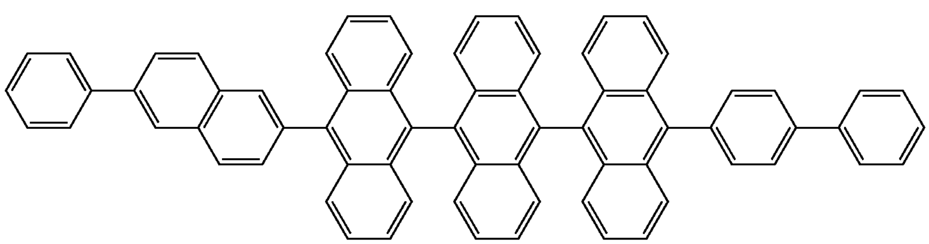
Examples of the pyrene derivative are those represented by the following formulae.

[Chemical Formula 9]
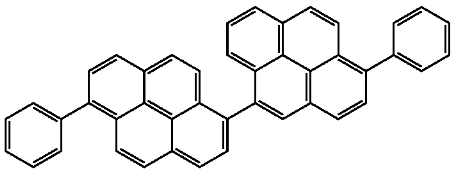
2b-1
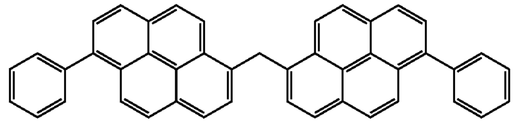
2b-2
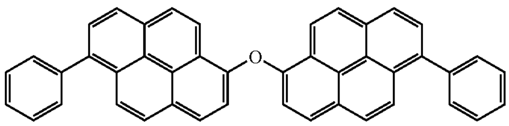
2b-3
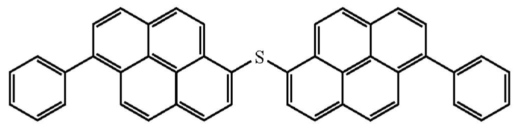
2b-4
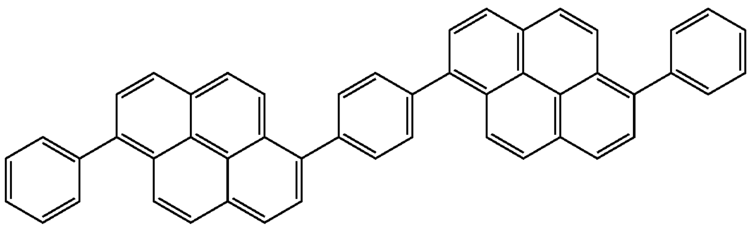
2b-5
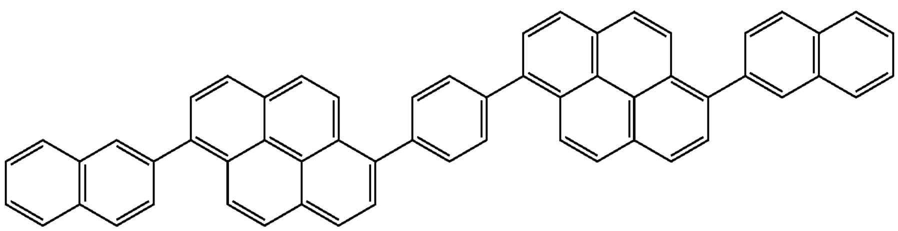
2b-6
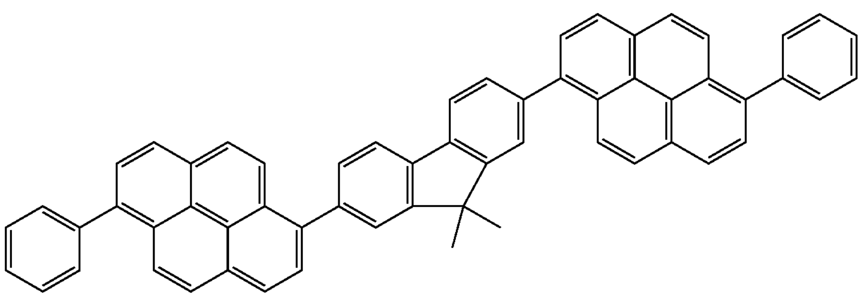
2b-7
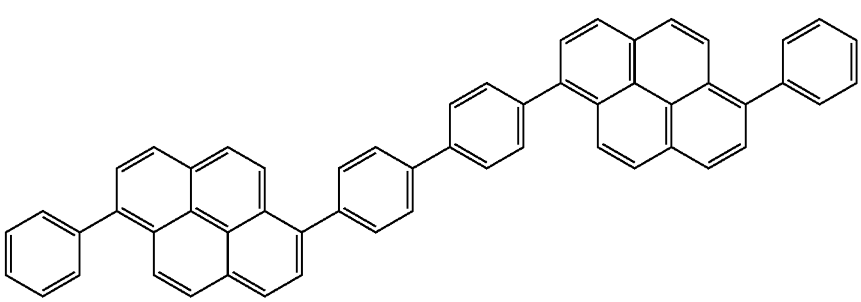
2b-8

-continued
2b-9
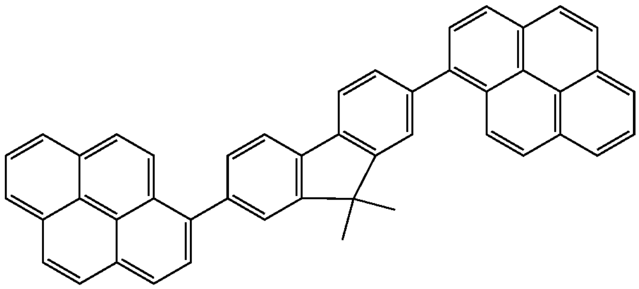
2b-10
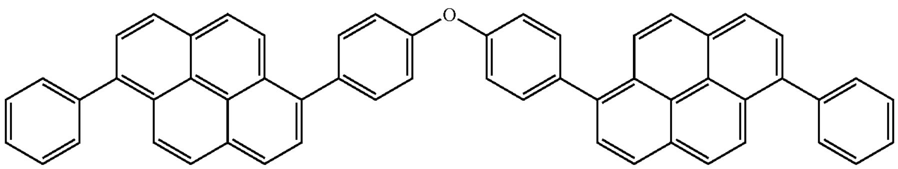
2b-11
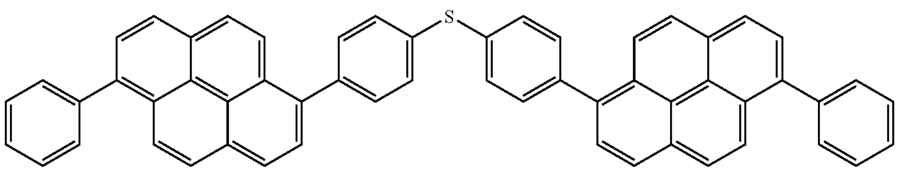
2b-12
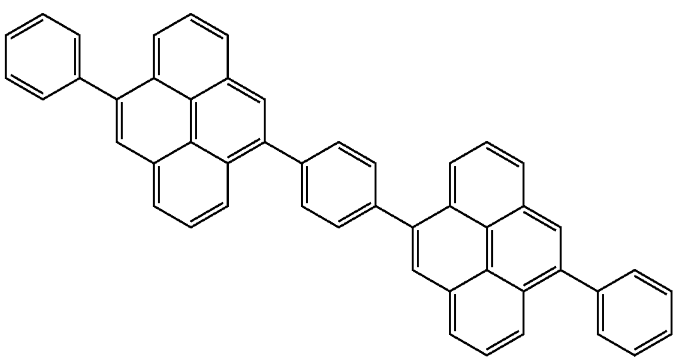
[Chemical Formula 10]
2b-13
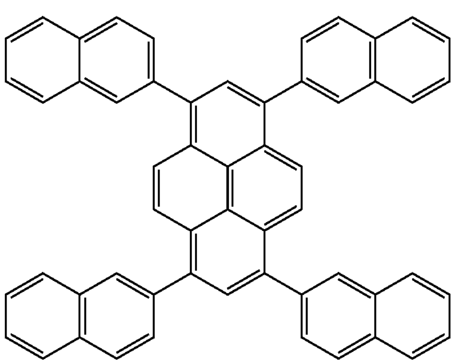
2b-14
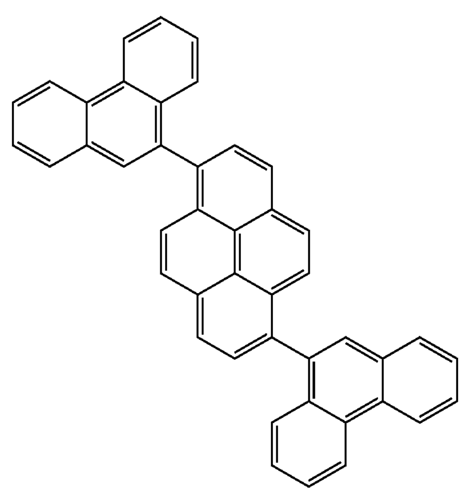

-continued
2b-15
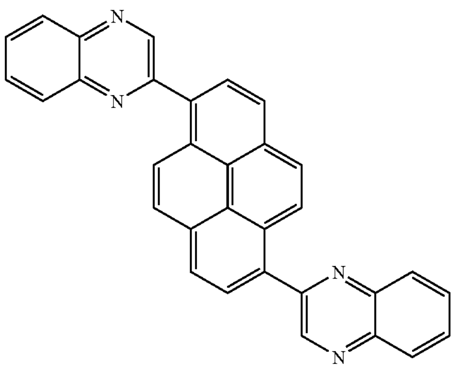
2b-16
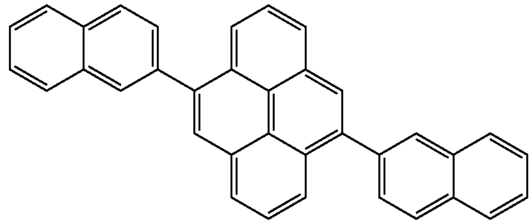
2b-17
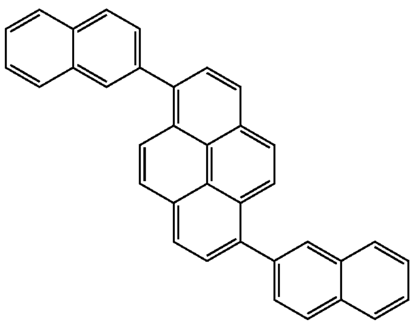
2b-18
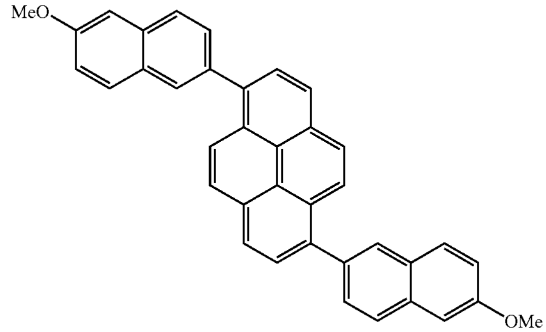
2b-19
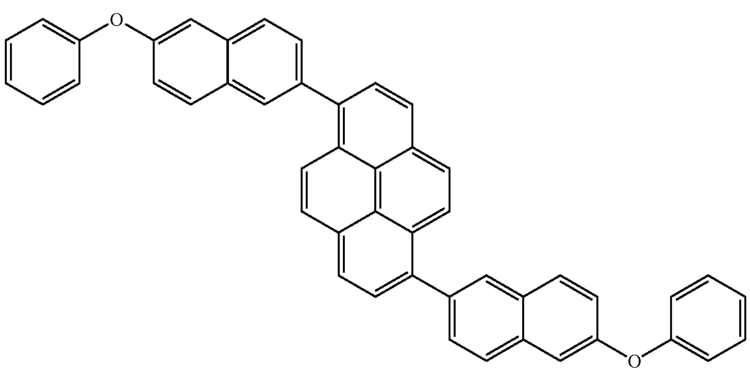
2b-20
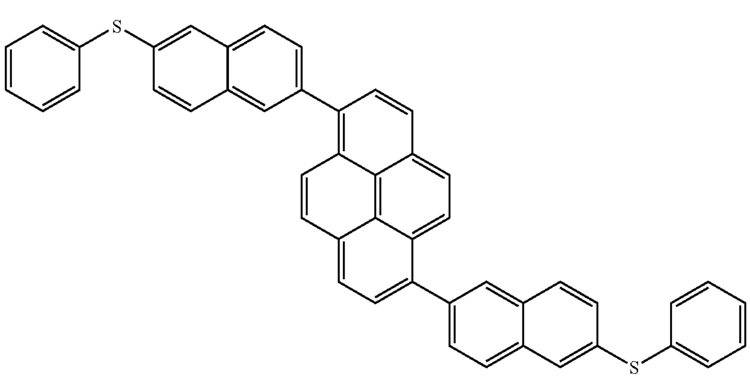

-continued
[Chemical Formula 11]
2b-21
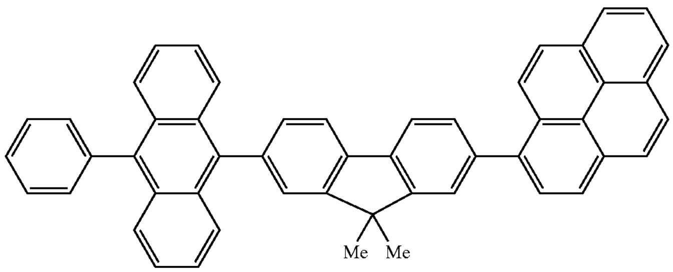
2b-22
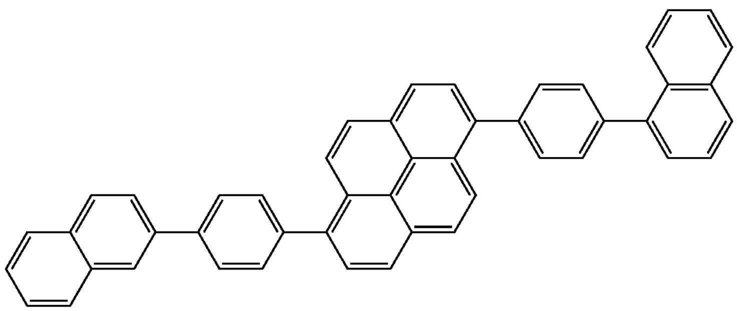
2b-23
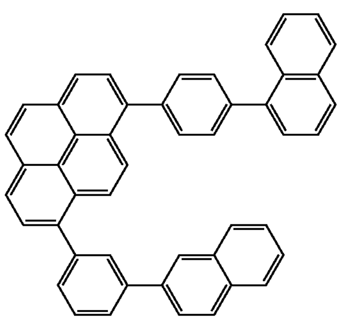
2b-24
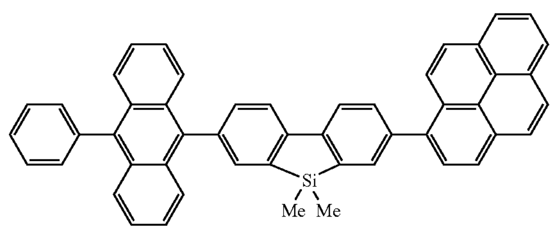
2b-25
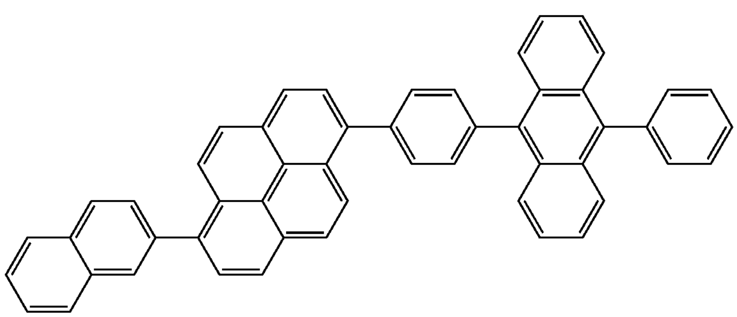

-continued
2b-26
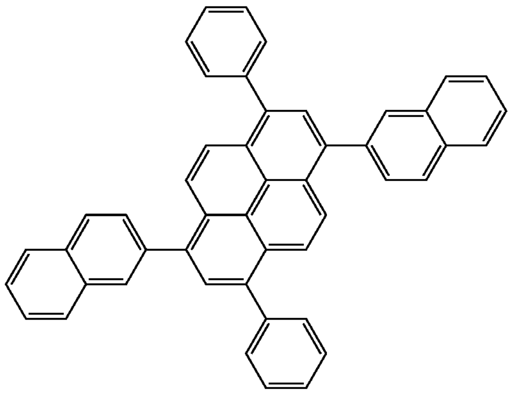
2b-27
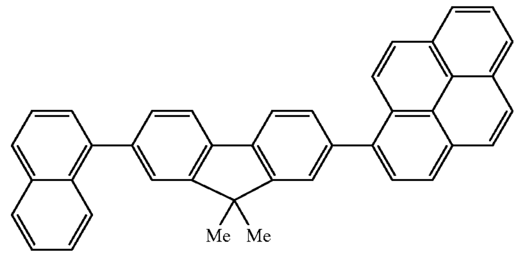
2b-28
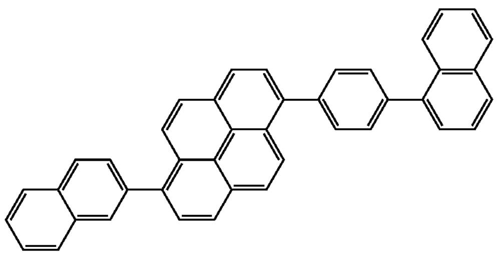
2b-29
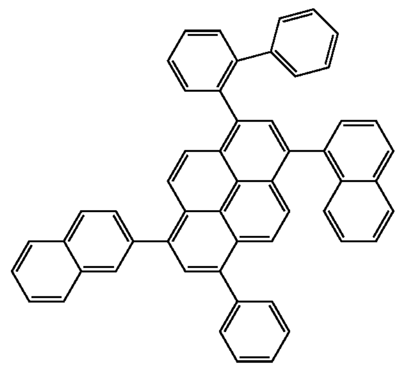
[Chemical Formula 12]
2b-30
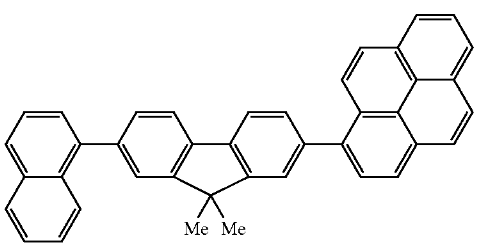
2b-31
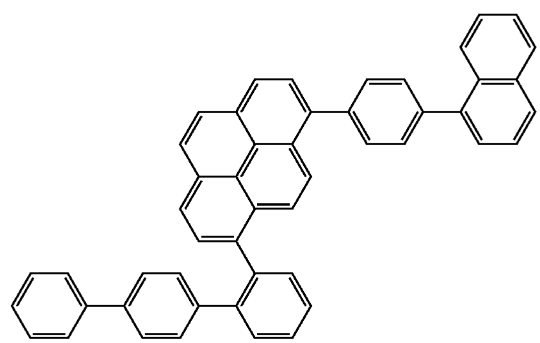
2b-32
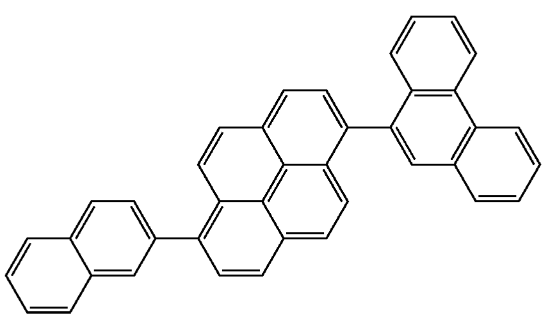
2b-33
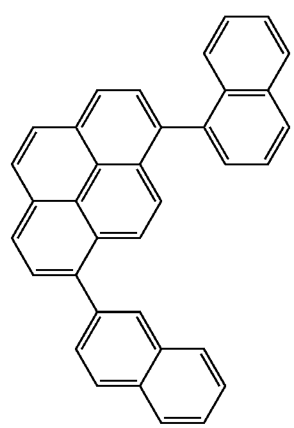

-continued
2b-34
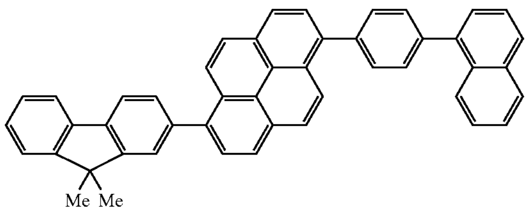
2b-35
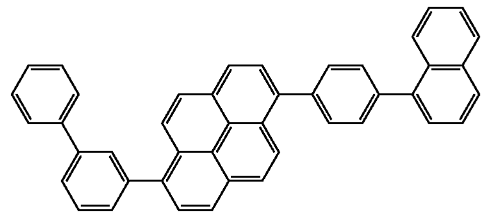
2b-36
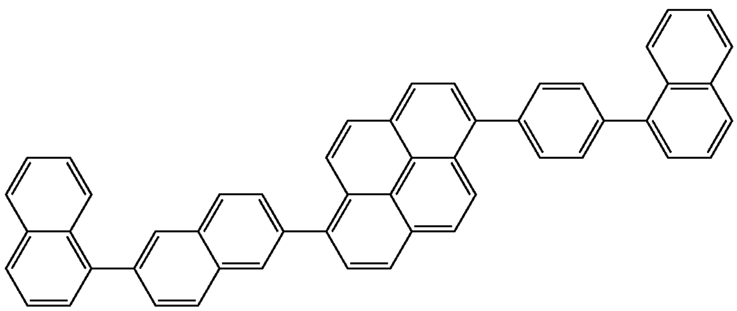
2b-37
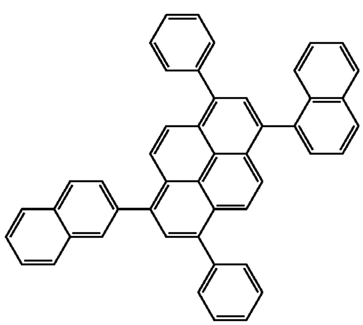
2b-38
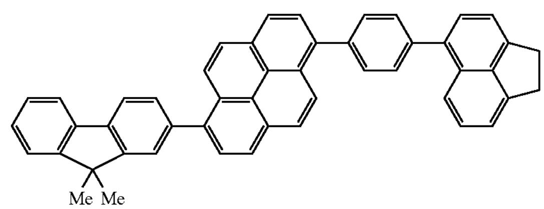
2b-39
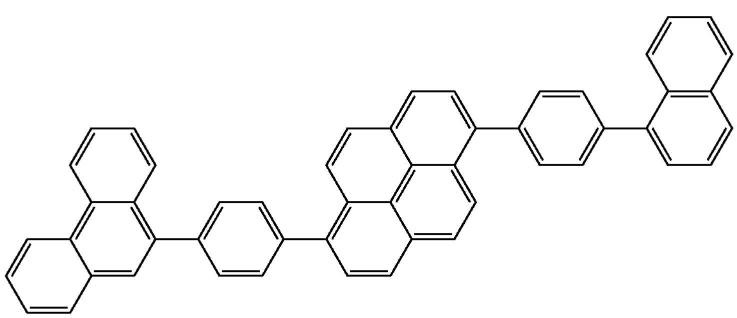
2b-40
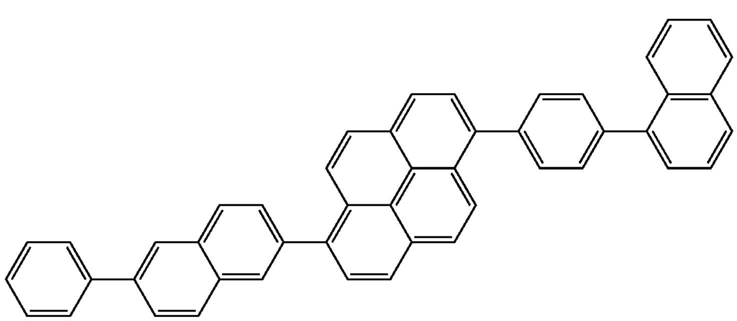

-continued 2b-41

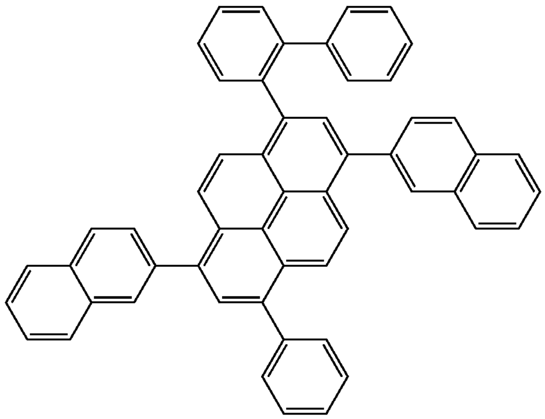

2b-42

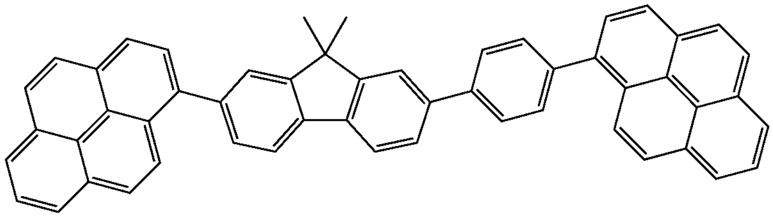

Preferably in the aspect of the invention, in place of the asymmetric anthracene derivative, a benzanthracene derivative represented by the following formula (3) is used as the fluorescent host.

[Chemical Formula 13]

(3)

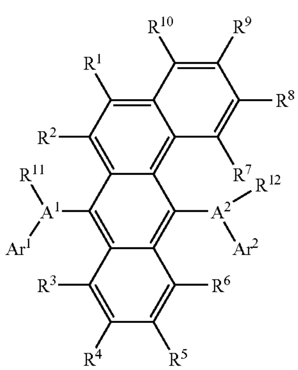

In the formula (3), $Ar^1$ and $Ar^2$ each independently represent a substituted or unsubstituted aromatic ring group having 6 to 50 ring carbon atoms.

$R^1$ to $R^{12}$ each are independently selected from the group consisting of a hydrogen atom, substituted or unsubstituted aromatic ring group having 6 to 50 ring carbon atoms, substituted or unsubstituted aromatic heterocyclic group having 5 to 50 ring carbon atoms, substituted or unsubstituted alkyl group having 1 to 50 carbon atoms, substituted or unsubstituted cycloalkyl group, substituted or unsubstituted alkoxy group having 1 to 50 carbon atoms, substituted or unsubstituted aralkyl group having 6 to 50 ring atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, substituted or unsubstituted silyl group, carboxyl group, halogen atom, cyano group, nitro group and hydroxyl group.

$Ar^1$, $Ar^2$, $R^{11}$ and $R^{12}$ each may be plural. An adjacent set thereof may form a saturated or unsaturated cyclic structure.

According to the above structure, the benzanthracene derivative is capable of further enhancing the external quantum efficiency and further prolonging half lifetime (time until the initial luminance is reduced to half).

The organic EL device according to the aspect of the invention may adopt any known host as the phosphorescent host. Examples are CBP (4,4'-bis(N-carbazolyl)biphenyl), NPD (4,4'-bis[N-(1-naphthyl)-N-phenylamino]biphenyl) and Balq.

The examples are specifically shown below, but the invention is not limited thereto.

One of the examples is a carbazole derivative represented by any one of the following formulae (101) to (105).

[Chemical Formula 14]

(101)

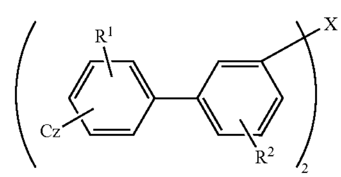

(102)

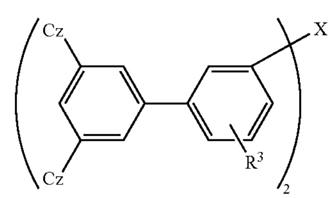

-continued (103)

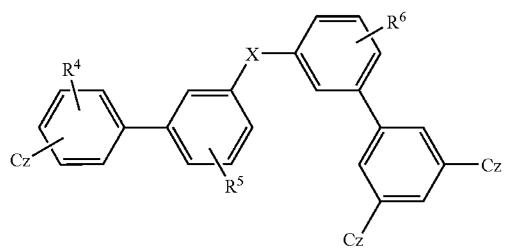

(104)

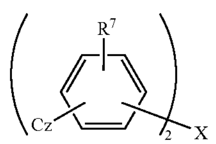

(105)

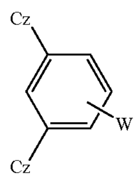

In particular, the compounds represented by the formula (101) or (103) are favorably usable as the phosphorescent host.

The structure of the formula (101) is any one of the following structures.

[Chemical Formula 15]

(101′)

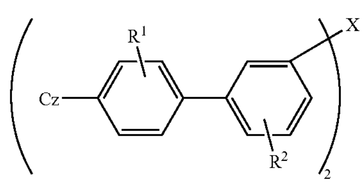

(101″)

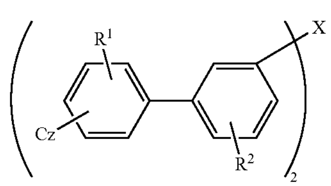

(101‴)

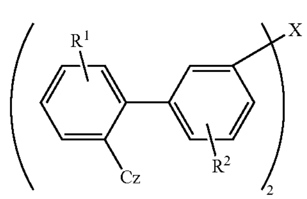

The structure of the formula (103) is any one of the following structures.

[Chemical Formula 16]

(103′)

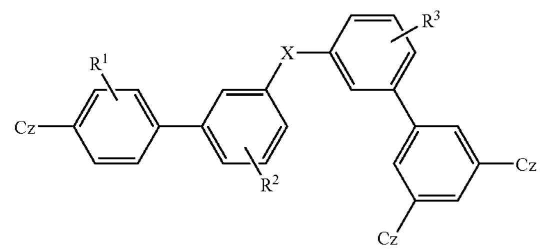

(103″)

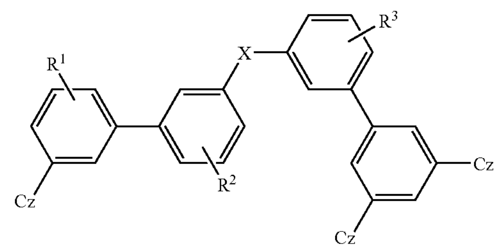

(103‴)

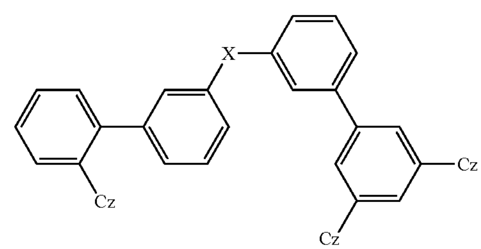

Among the above, materials containing the compounds represented by the general formula (101') or (103') are preferable.

In the formulae (101) to (104), $R^1$ to $R^7$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^1$ to $R^7$ each may be plural. An adjacent set thereof may form a saturated or unsaturated cyclic structure.

Examples of the halogen atom represented by $R^1$ to $R^7$ are fluorine, chlorine, bromine and iodine.

Examples of the substituted or unsubstituted alkyl group represented by $R^1$ to $R^7$ are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butyl-pentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethylhexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group and 3,5-tetramethylcyclohexyl group.

Examples of the substituted or unsubstituted heterocyclic group having 3 to 30 carbon atoms represented by $R^1$ to $R^7$ are 1-pyrrolyl group, 2-pyrrolyl group, 3-pyrrolyl group, pyrazinyl group, 2-pyridinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl, 4-pyridinyl, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl, 5-quinoxalinyl, 6-quinoxalinyl, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-6-yl, β-carboline-7-yl, β-carboline-6-yl, β-carboline-9-yl, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl, 5-oxadiazolyl, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Among the above, the preferable examples are 2-pyridinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group and 9-carbazolyl group.

The substituted or unsubstituted alkoxy group having 1 to 40 carbon atoms represented by $R^1$ to $R^7$ is a group represented by —OY. Examples of Y are the same as those described with respect to the alkyl group. Preferable examples are also the same.

Examples of the substituted or unsubstituted aryl group having 6 to 40 carbon atoms represented by $R^1$ to $R^7$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among the above, the preferably examples are a phenyl group, 1-naphthyl group, 2-naphthyl group, 9-phenanthryl group, 2-biphenylyl group, 3-biphenylyl group, 4-biphenylyl group, p-tolyl group and 3,4-xylyl group.

The substituted or unsubstituted aryloxy group having 6 to 40 carbon atoms represented by $R^1$ to $R^7$ is a group represented by —OAr. Examples of Ar are the same as those described with respect to the aryl group. Preferable examples are also the same.

Examples of the substituted or unsubstituted aralkyl group having 7 to 40 carbon atoms represented by $R^1$ to $R^7$ are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

Among the above, the preferable examples are a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group.

Examples of the substituted or unsubstituted alkenyl group having 2 to 40 carbon atoms represented by $R^1$ to $R^7$ are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-phenylvinyl group and 1,2-diphenylvinyl group are preferable.

The substituted or unsubstituted alkylamino group having 1 to 80 carbon atoms, the substituted or unsubstituted arylamino group having 6 to 80 carbon atoms and the substituted or unsubstituted aralkylamino group having 7 to 80 carbon atoms, which are represented by $R^1$ to $R^7$, are represented by $—NQ^1Q^2$. Examples of $Q^1$ and $Q^2$ each are independently the same as those described with respect to the alkyl group, aryl group and aralkyl group. The preferable examples are also the same.

The substituted or unsubstituted alkylsilyl group having 3 to 10 carbon atoms represented by $R^1$ to $R^7$ are a trimethylsilyl group, triethylsilyl group, t-butyldimethylsilyl group, vinyldimethylsilyl group and propyldimethylsilyl group.

The substituted or unsubstituted arylsilyl group having 6 to 30 carbon atoms represented by $R^1$ to $R^7$ are a triphenylsilyl group, phenyldimethylsilyl group and t-butyldiphenylsilyl group.

Examples of the cyclic structure formed when $R^1$ to $R^7$ are plural are a unsaturated six-membered ring such as benzene ring, saturated or unsaturated five-membered ring and seven-membered ring.

In the formulae (101) to (104), X is a group represented by any one of the following general formulae (111) to (116).

[Chemical Formula 17]

(111)

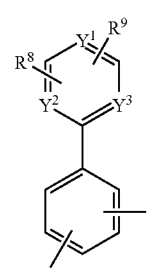

(112)

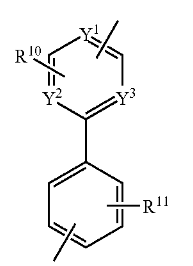

-continued (113)

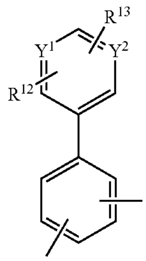

(114)

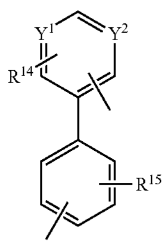

(115)

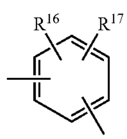

(116)

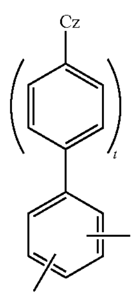

In the formulae (111) to (116), $R^8$ to $R^{17}$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^8$ to $R^{17}$ each may be plural. An adjacent set thereof may form a saturated or unsaturated cyclic structure.

Examples of the groups represented by $R^8$ to $R^{17}$ are the same as the examples described in relation to $R^1$ to $R^7$. The preferable examples are also the same.

In the formulae (111) to (114), $Y^1$ to $Y^3$ each independently represent —CR(R represents a hydrogen atom, group bonded to X in the general formulae (101) to (104) or any one of $R^8$, $R^9$, $R^{10}$, $R^{12}$, $R^{13}$ and $R^{14}$) or a nitrogen atom. When $Y^1$ to $Y^3$ represent a nitrogen atom, the number thereof is at least 2 within the same ring. Cz is the same as the following.

In the general formula (116), t is an integer of 0 to 1.

The group represented by the general formula (111) preferably has any one of the following structures.

[Chemical Formula 18]

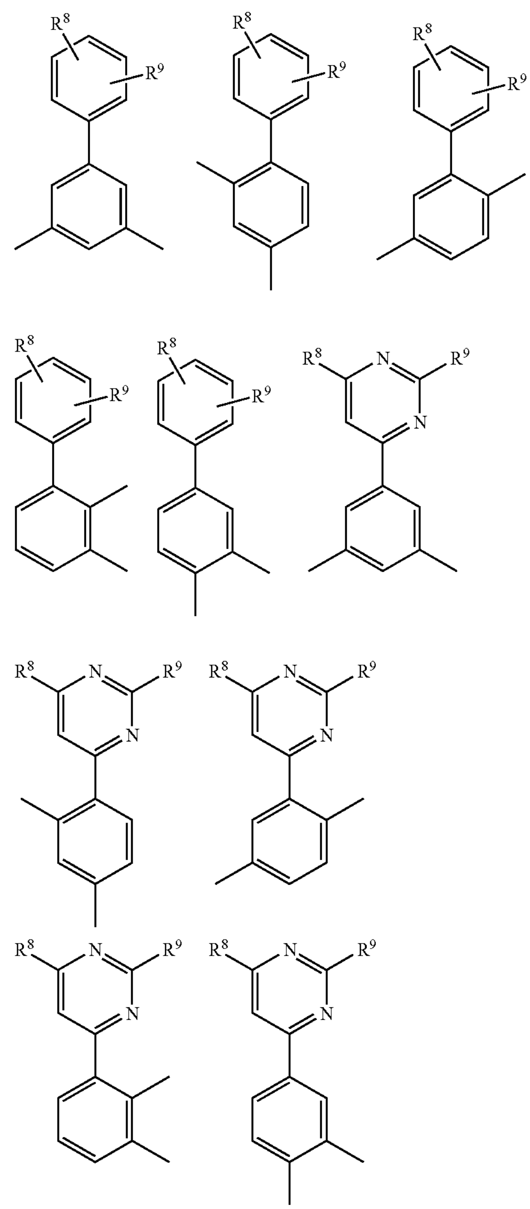

-continued
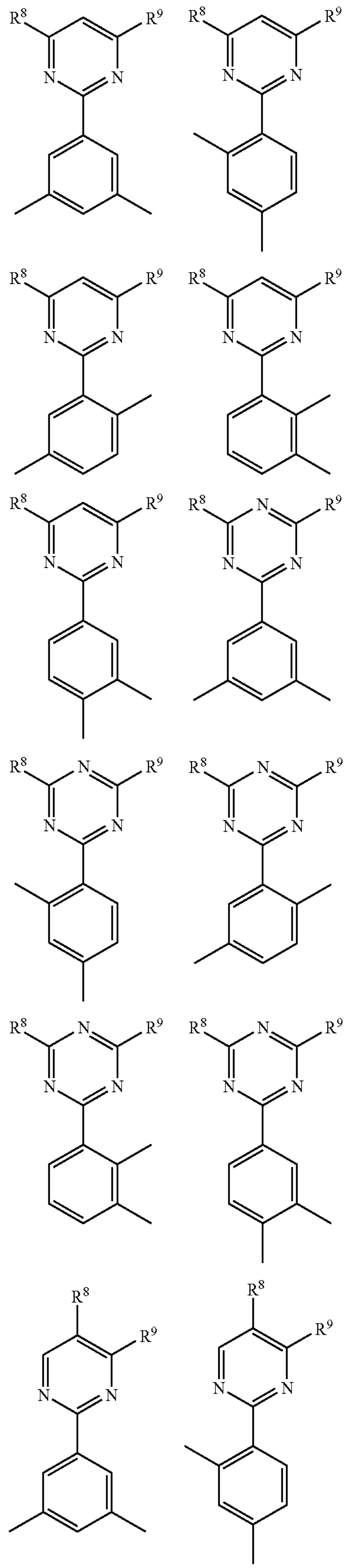
-continued
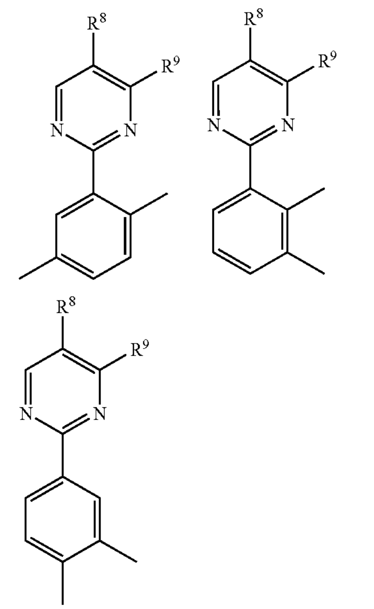
The group represented by the general formula (112) preferably has any one of the following structures.
[Chemical Formula 19]
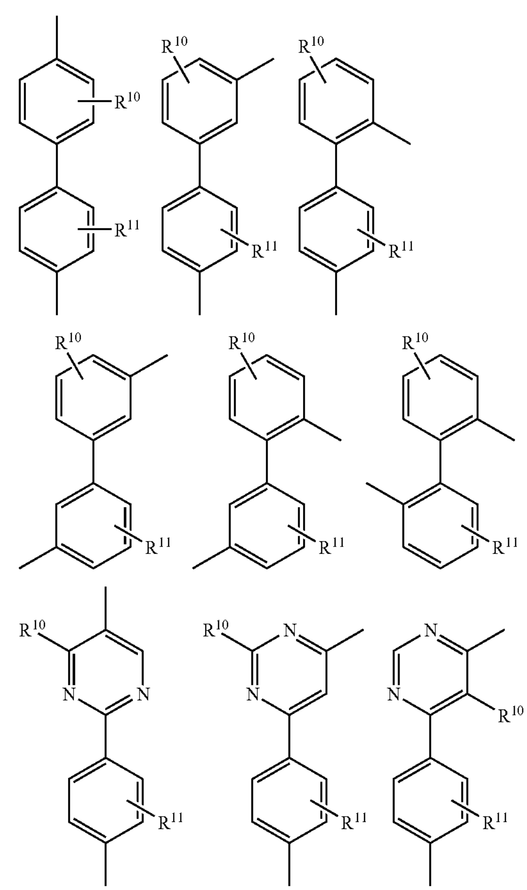

-continued
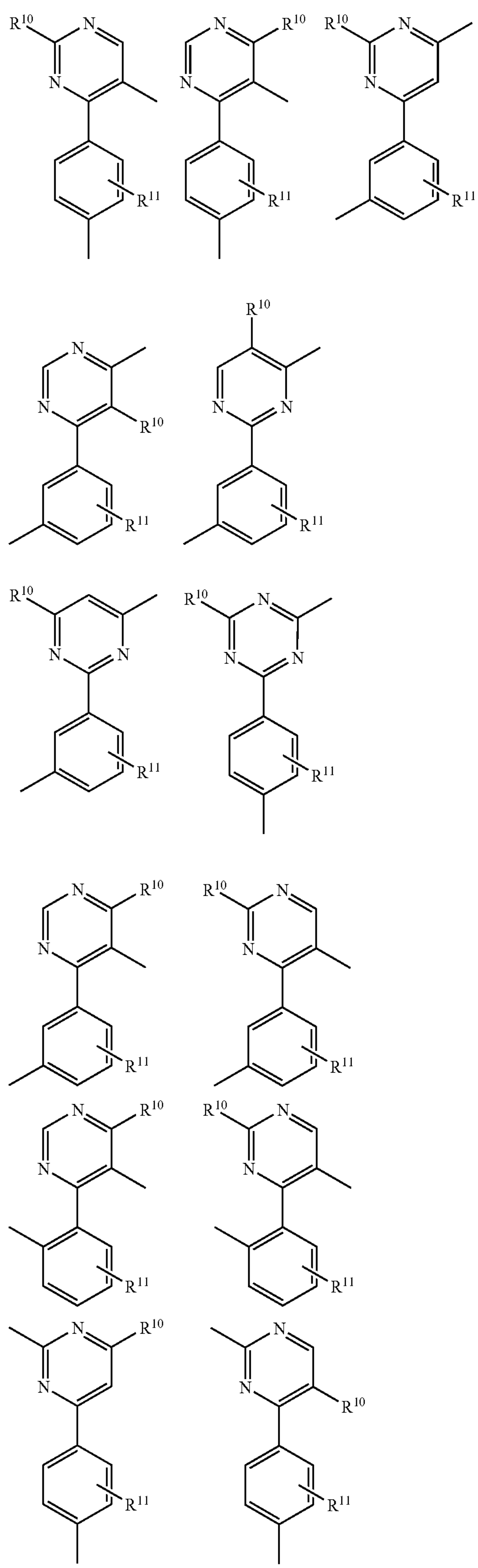
-continued
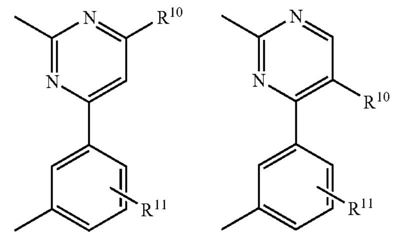
The group represented by the general formula (113) preferably has any one of the following structures.
[Chemical Formula 20]
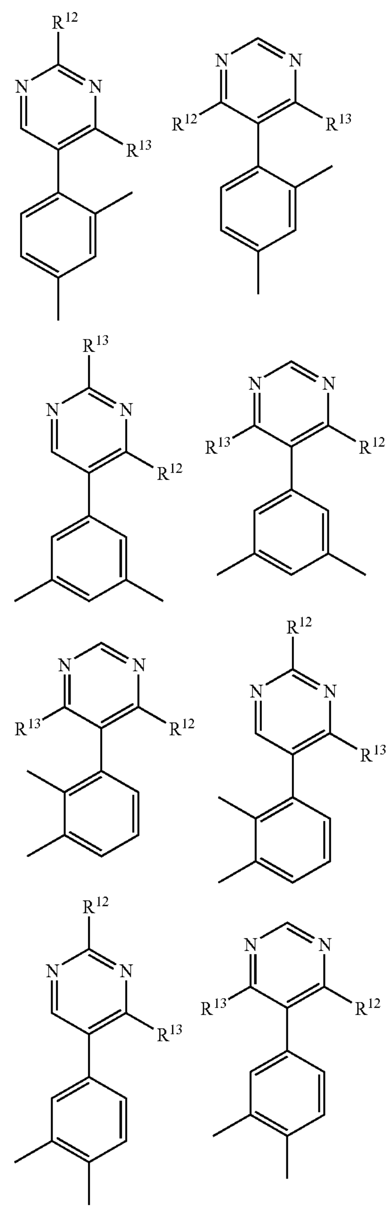
The group represented by the general formula (114) preferably has any one of the following structures.

[Chemical Formula 21]
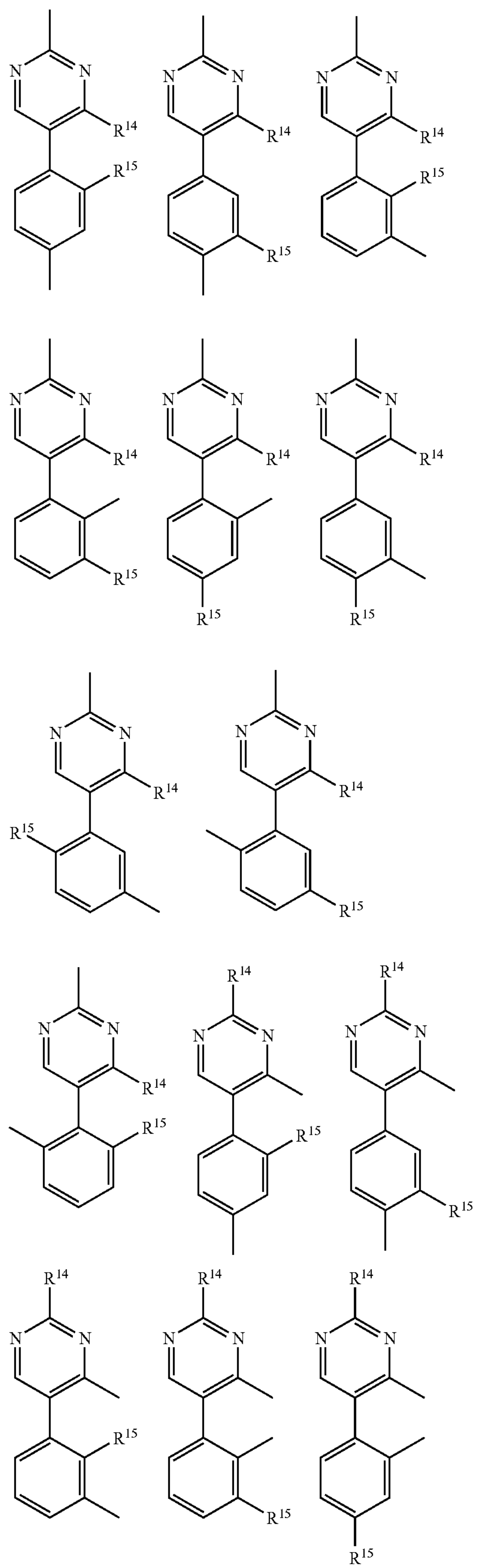
-continued
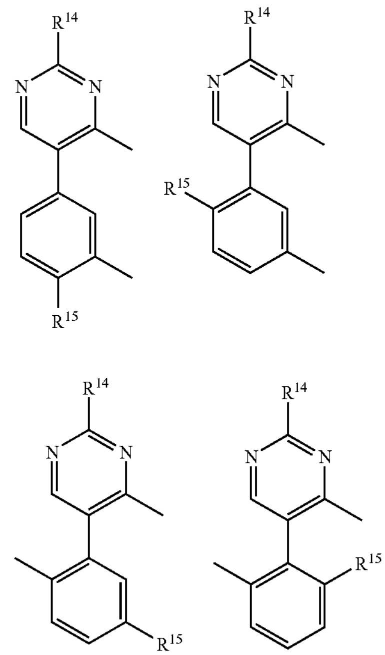
The group represented by the general formula (115) preferably has any one of the following structures.
[Chemical Formula 22]
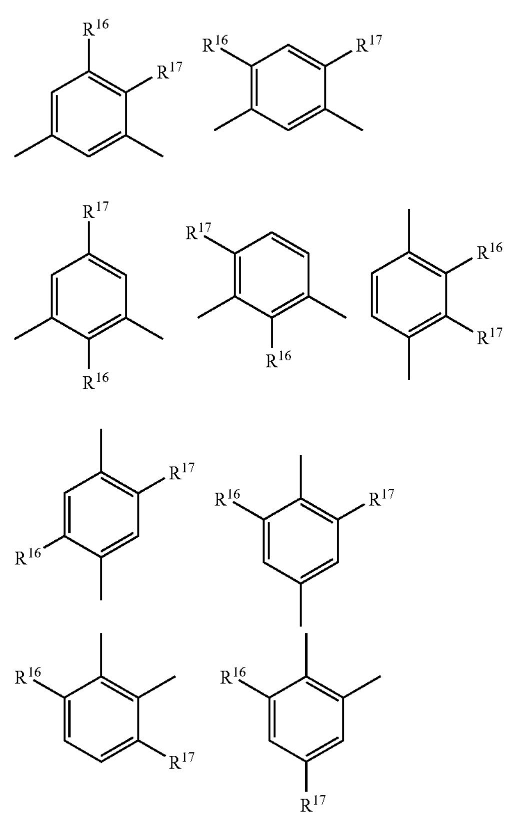

-continued

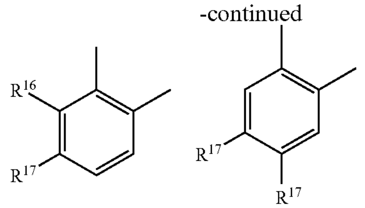

The group represented by the general formula (116) preferably has any one of the following structures.

[Chemical Formula 23]

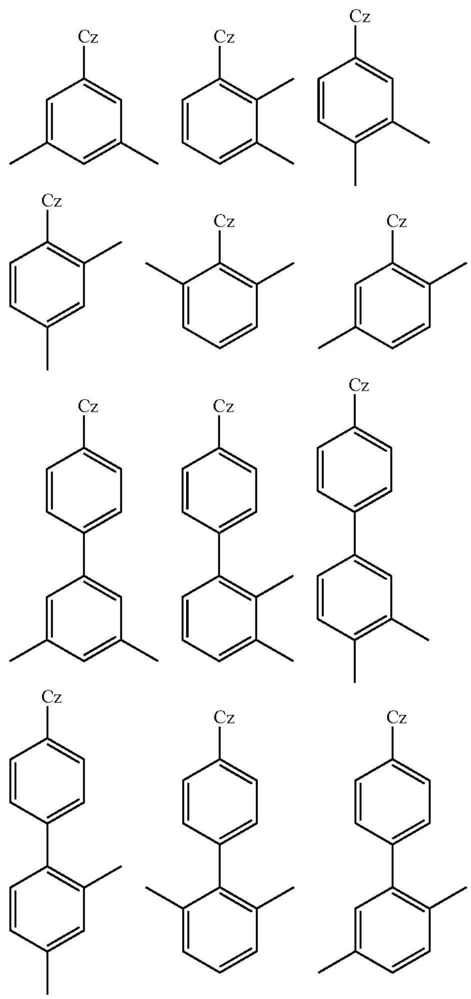

In the formula (105), W is a group represented by any one of the following formulae (121) to (125).

[Chemical Formula 24]

(121)

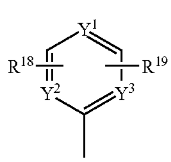

-continued (122)

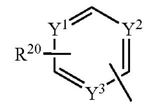

(123)

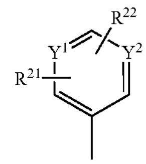

(124)

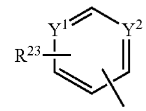

(125)

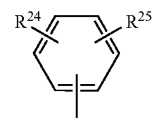

In the formulae (121) to (125), $R^{18}$ to $R^{25}$ represent the same as those represented by $R^8$ to $R^{17}$. $Y^1$ to $Y^3$ are the same as $Y^1$ to $Y^3$ in the formulae (111) to (114).

Examples of the groups represented by $R^{18}$ to $R^{25}$ are the same as the examples described in relation to $R^1$ to $R^7$. The preferable examples are also the same.

In the formulae (101) to (105), Cz is a group represented by either one of the following formulae (131) and (132).

[Chemical Formula 25]

(131)

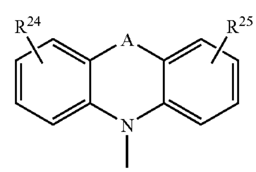

(132)

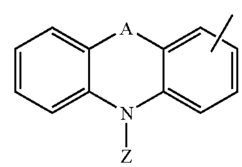

In the formulae (131) and (132), A represents a single bond, —$(CR^{26}R^{27})_n$— (n is an integer of 1 to 3), —$SiR^{28}R^{29}$—, —$NR^{30}$—, —O— or —S—. $R^{26}$ and $R^{27}$, and $R^{28}$ and $R^{29}$ may be bonded together to form a saturated or unsaturated cyclic structure. $R^{24}$ to $R^{30}$ each independently represent a hydrogen atom, halogen atom, substituted or unsubstituted alkyl group having 1 to 40 carbon atoms, substituted or unsubstituted heterocyclic group having 3 to 30 carbon atoms, substituted or unsubstituted alkoxy group having 1 to 40 carbon atoms, substituted or unsubstituted aryl group having 6 to 40 carbon atoms, substituted or unsubstituted aryloxy group having 6 to 40 carbon atoms, substituted or unsubstituted aralkyl group having 7 to 40 carbon atoms, substituted or unsubstituted alkenyl group having 2 to 40 carbon atoms, substituted or unsubstituted alkylamino group having 1 to 80 carbon atoms, substituted or unsubstituted arylamino group having 6 to 80 carbon atoms, substituted or unsubstituted aralkylamino group having 7 to 80 carbon atoms, substituted or unsubstituted alkylsilyl group having 3 to 10 carbon atoms, substituted or unsubstituted arylsilyl group having 6 to 30 carbon atoms or cyano group. $R^{24}$ to $R^{25}$ each may be plural. An adjacent set thereof may form a saturated or unsaturated cyclic structure.

In the formula (132), Z represents a substituted or unsubstituted alkyl group having 1 to 20 carbon atoms, a substituted or unsubstituted aryl group having 6 to 18 carbon atoms, or a substituted or unsubstituted aralkyl group having 7 to 40 carbon atoms.

Examples of the alkyl group having 1 to 20 carbon atoms represented by 7 are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group. The preferable examples are a methyl group, ethyl group, propyl group, n-hexyl group and n-heptyl group.

Examples of the aryl group represented by 7 are a phenyl group, naphthyl group, tolyl group, biphenyl group and terphenyl group. The preferable examples are a phenyl group, biphenyl group and tolyl group.

Examples of the aralkyl group represented by Z are an α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, benzyl group, p-cyanobenzyl group, m-cyanobenzyl group, o-cyanobenzyl group, 1-phenylethyl group, 2-phenylethyl group, 1-phenylisopropyl group and 2-phenylisopropyl group. Preferable examples are a benzyl group and p-cyanobenzyl group.

Cz preferably has any one of the following structures.

[Chemical Formula 26]

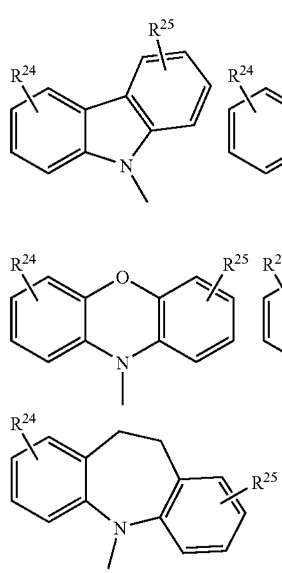

-continued

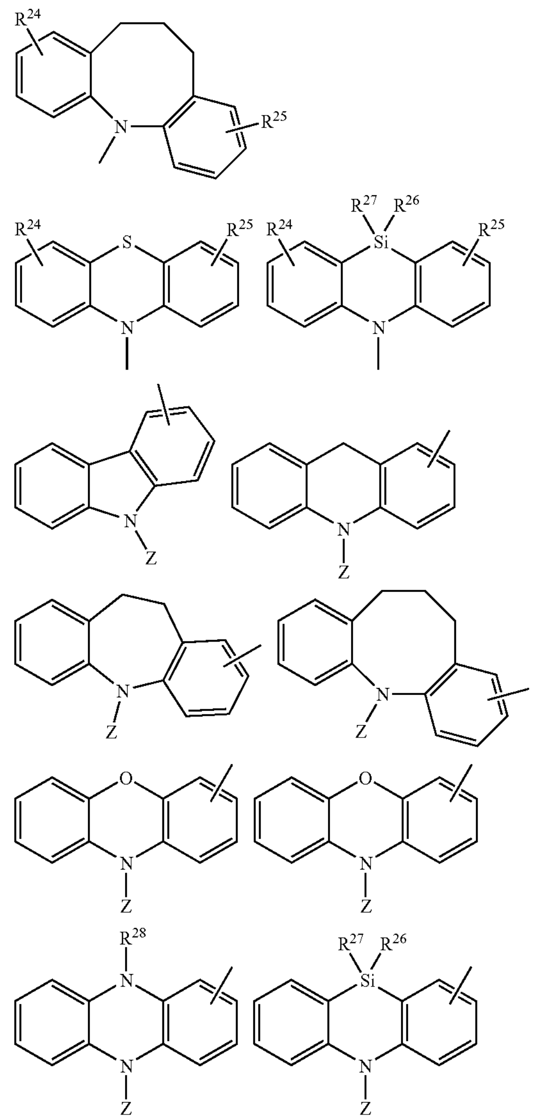

Cz more preferably has any one of the following structures.

[Chemical Formula 27]

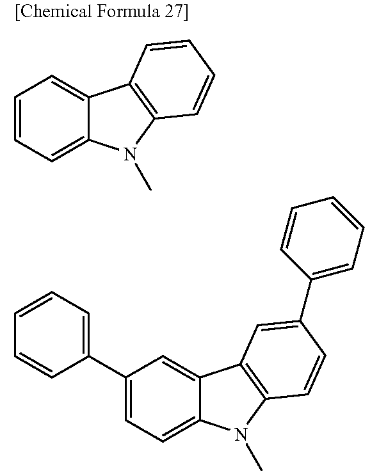

-continued

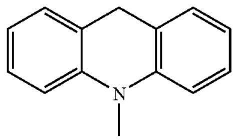

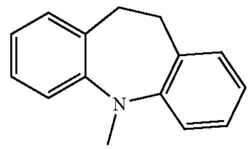

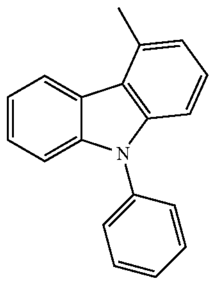

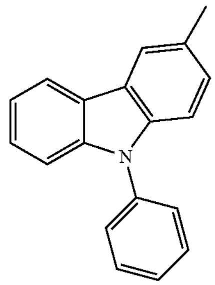

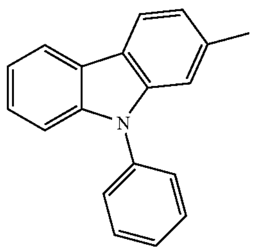

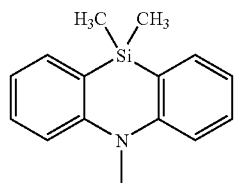

-continued

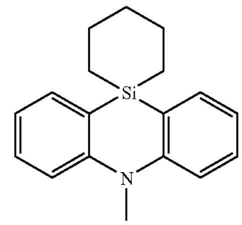

In addition, Cz particularly preferably represents a substituted or unsubstituted carbazolyl group or substituted or unsubstituted arylcarbazolyl group.

Examples of the substituents for the groups exemplified in the general formulae (101) to (105) are a halogen atom, hydroxyl group, amino group, nitro group, cyano group, alkyl group, alkenyl group, cycloalkyl group, alkoxy group, aromatic hydrocarbon group, aromatic heterocyclic group, aralkyl group, aryloxy group and alkoxycarbonyl group.

Examples of the organic-EL-device material containing the compound represented by any one of the formulae (101) to (105) according to the aspect of the invention will be shown below. However, the invention is not limited to the exemplary compounds shown below.

[Chemical Formula 28]

(C1)

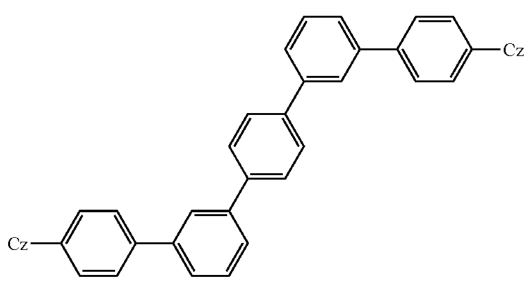

(C2)

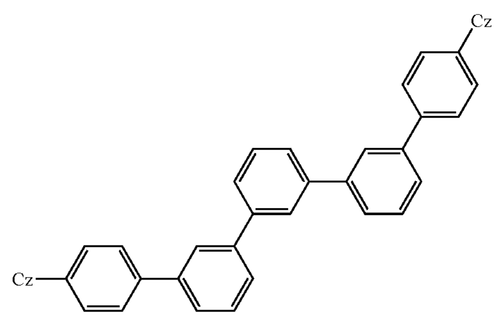

(C3)

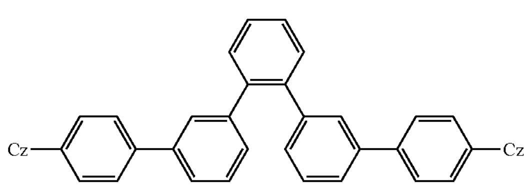

(C4)

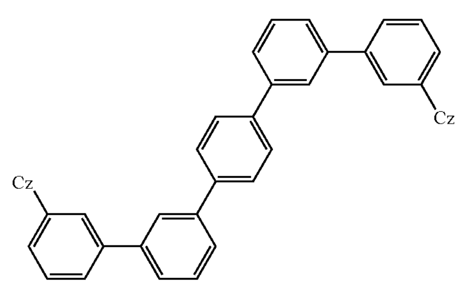

-continued
(C5)
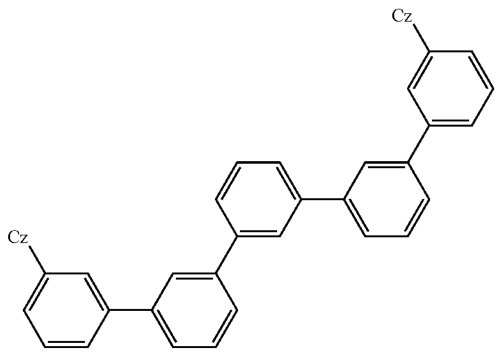
(C6)
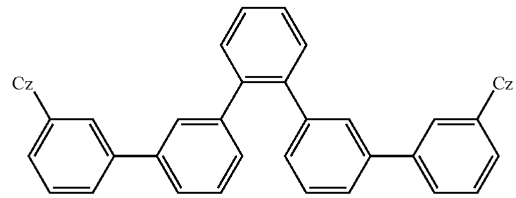
(C7)
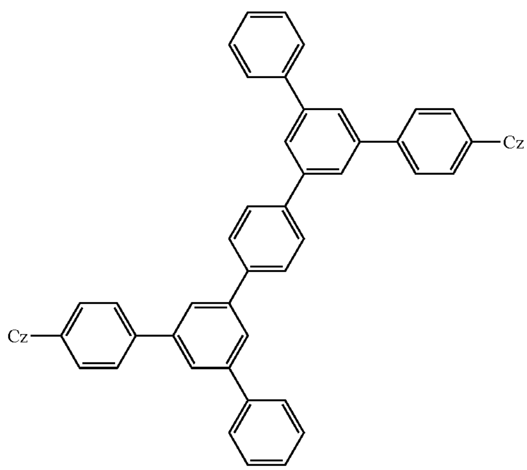
(C8)
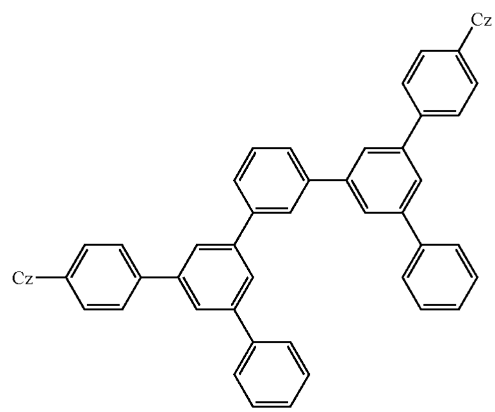
(C9)
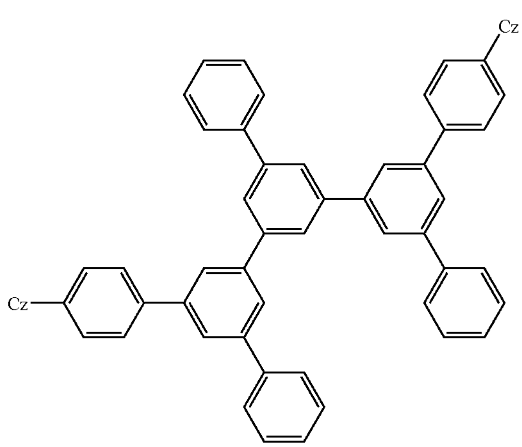
(C10)
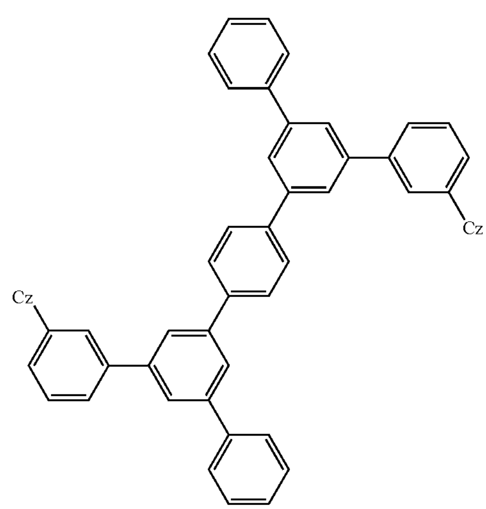

-continued
(C11)
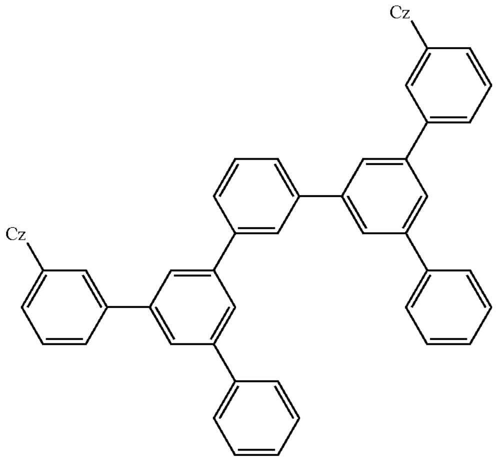
(C12)
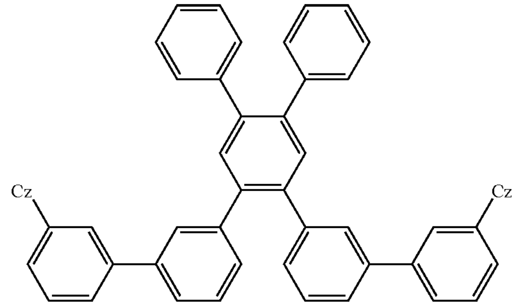
(C13)
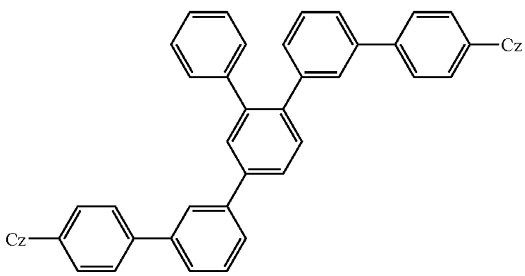
(C14)
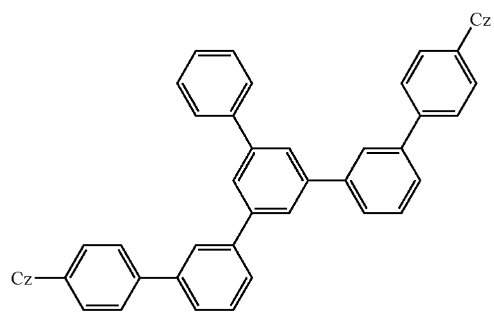
(C15)
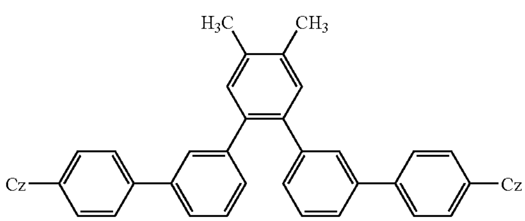
(C16)
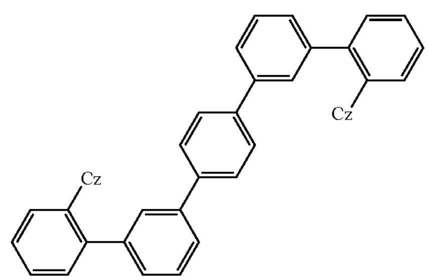
(C17)
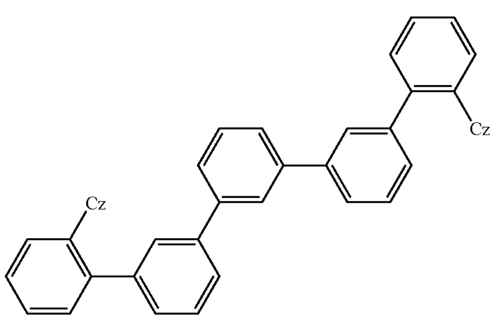
(C18)
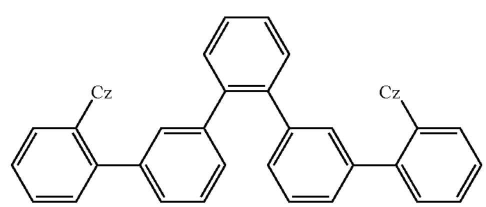

-continued
(C19)
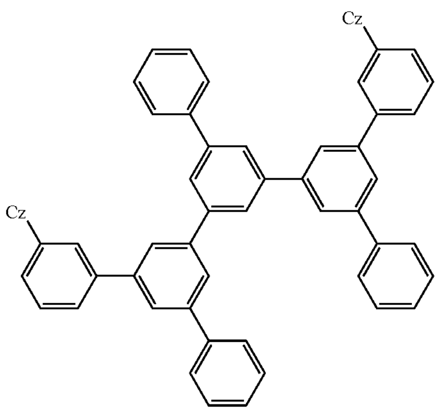
(C20)
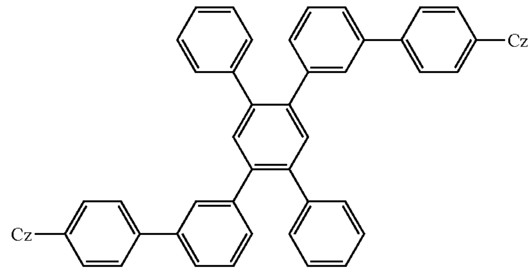
(C21)
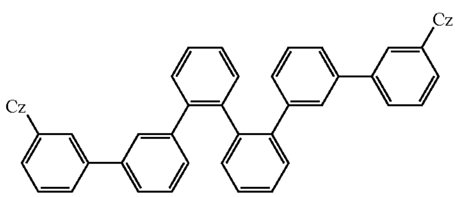
(C22)
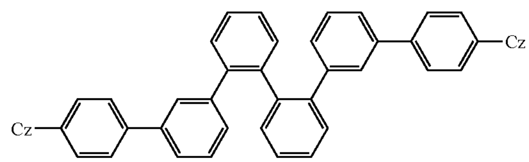
(C23)
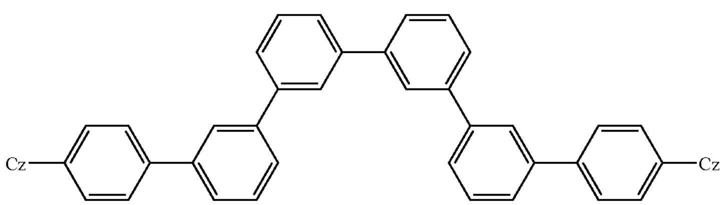
(C24)
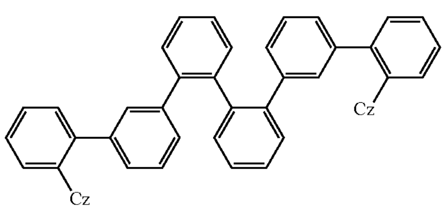
(C25)
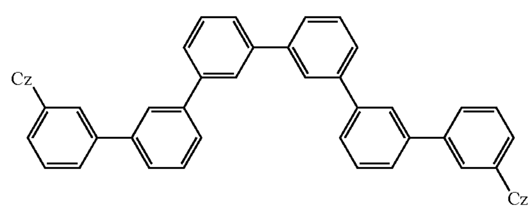
[Chemical Formula 29]
(C26)
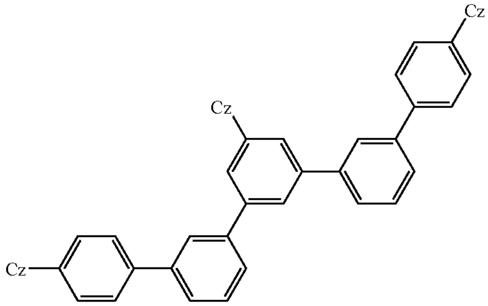
(C27)
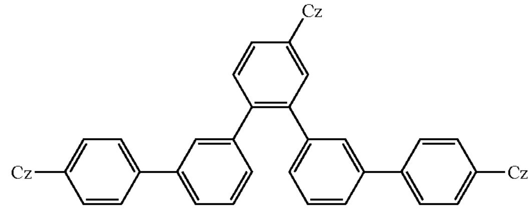

-continued
(C28)
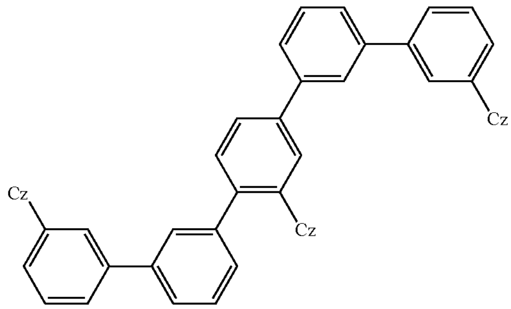
(C29)
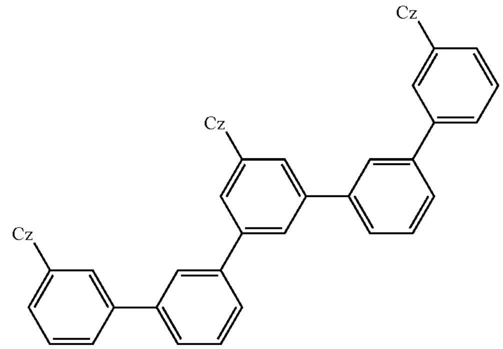
(C30)
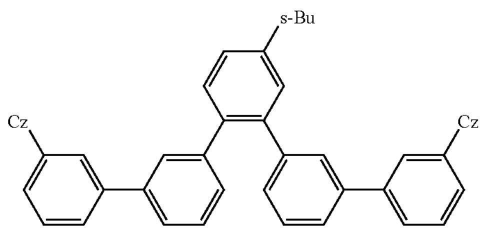
(C31)
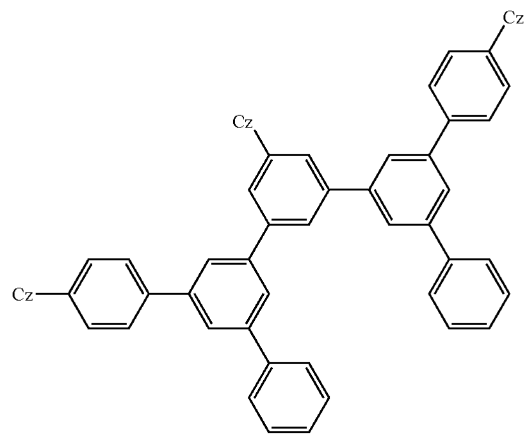
(C32)
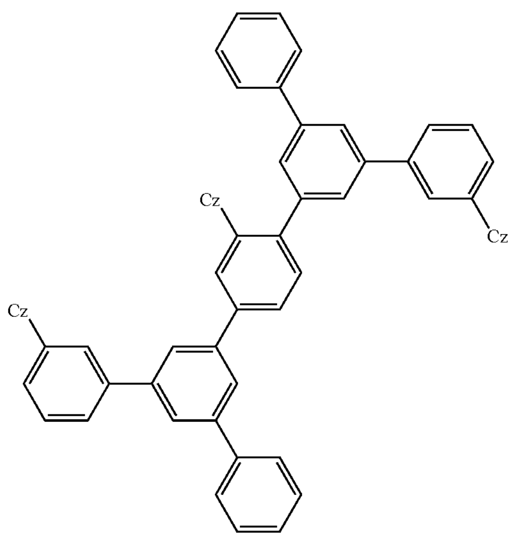
(C33)
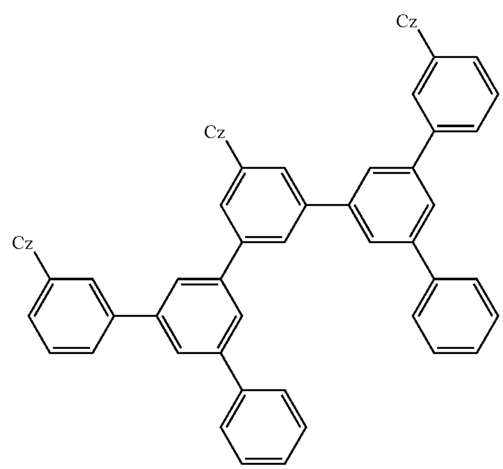
(C34)
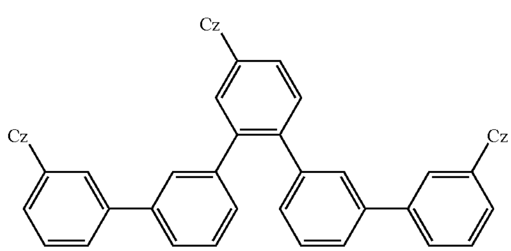
(C35)
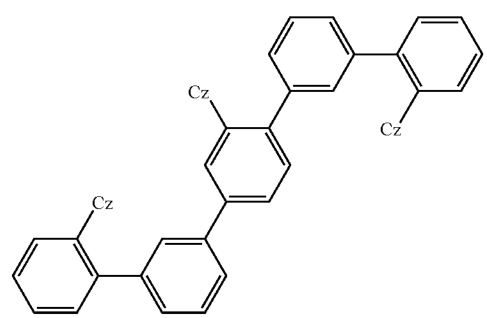

-continued
(C36)
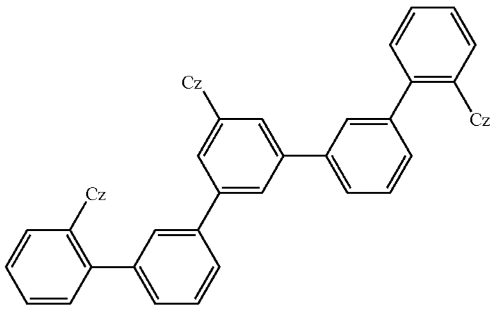
(C37)
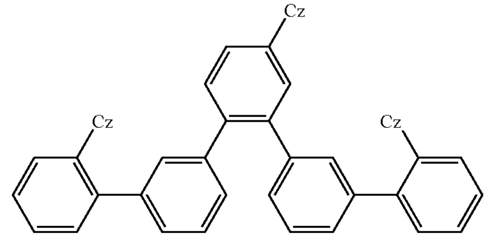
(C38)
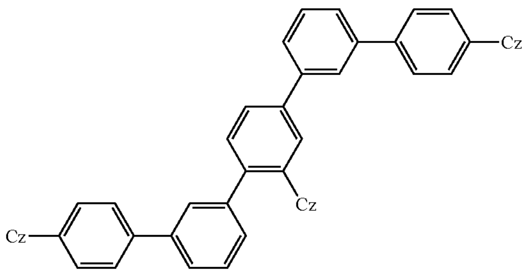
(C39)
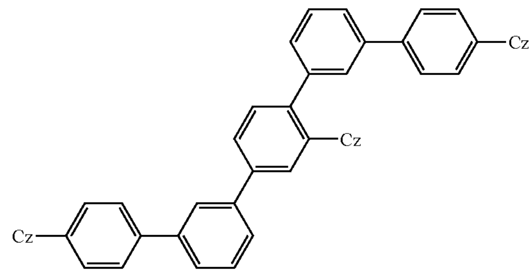
[Chemical Formula 30]
(C40)
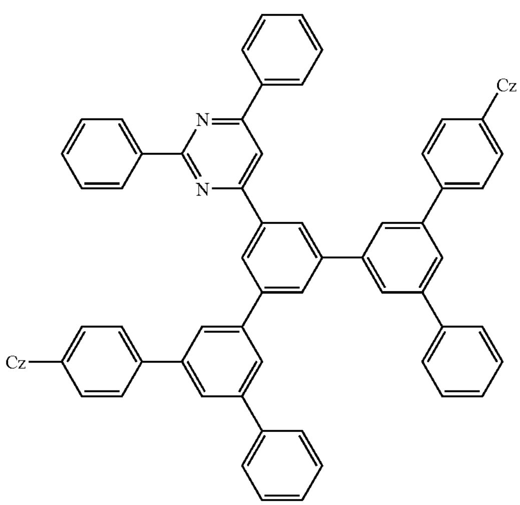
(C41)
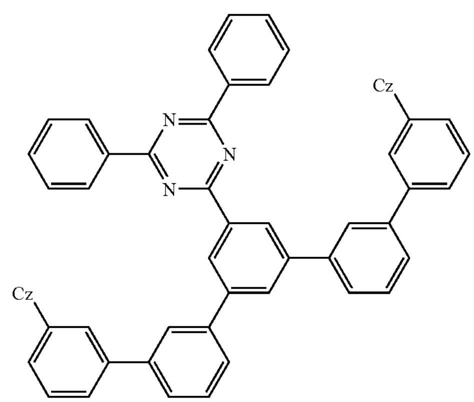
(C42)
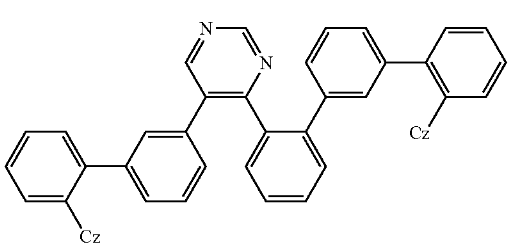
(C43)
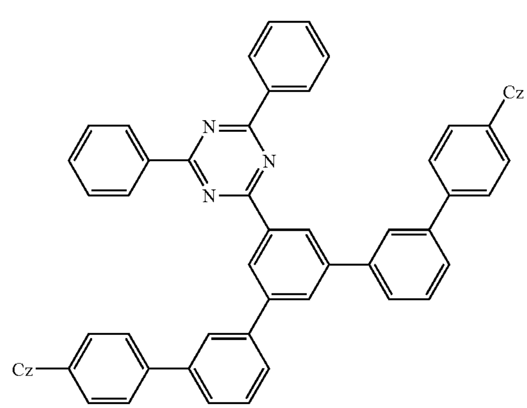

-continued
(C44)
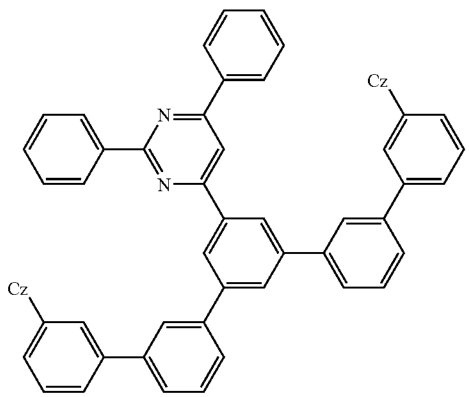
(C45)
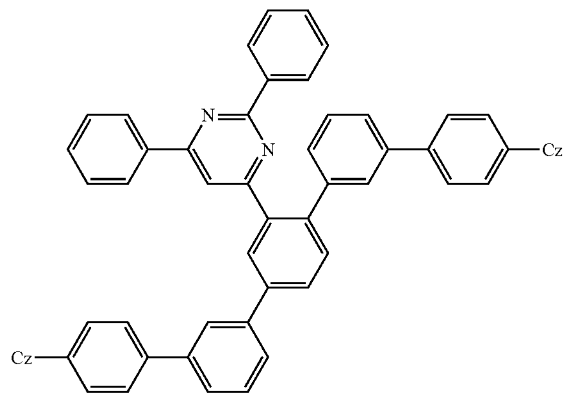
(C46)
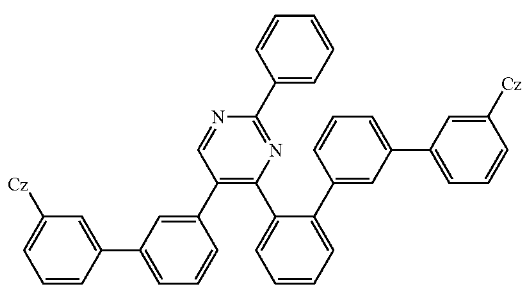
(C47)
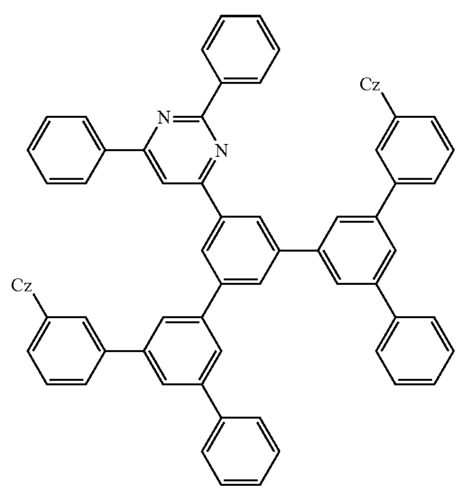
(C48)
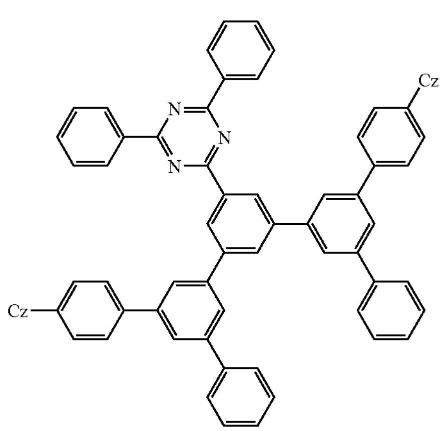
(C49)
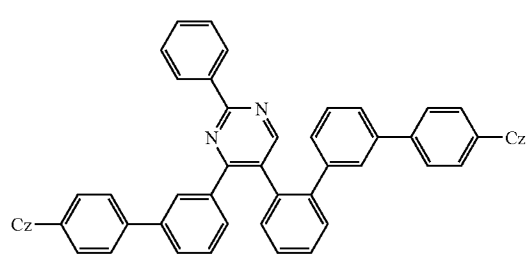

-continued
(C50)
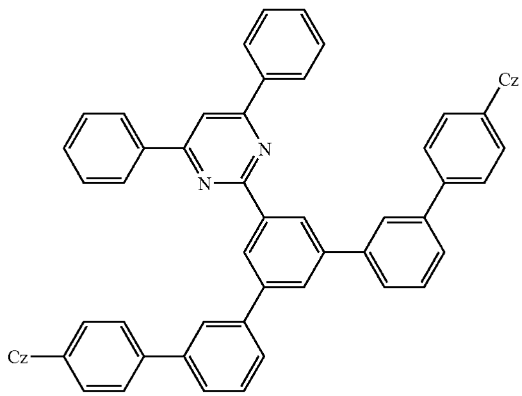
(C51)
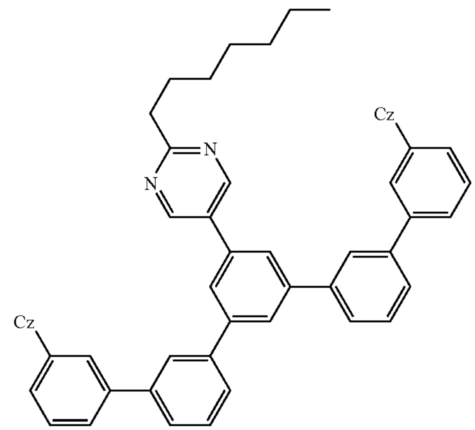
(C52)
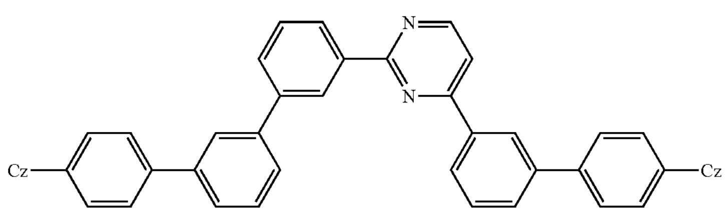
(C53)
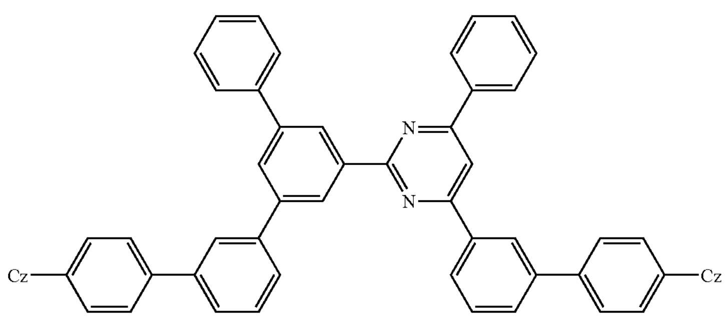
(C54)
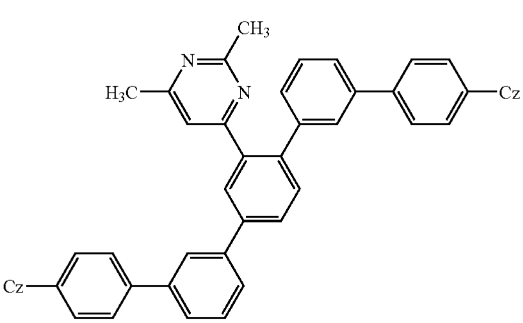
(C55)
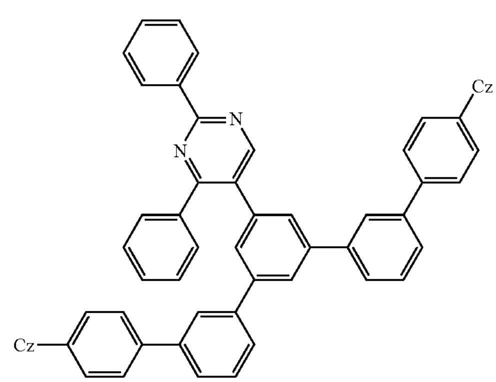

-continued
(C56)
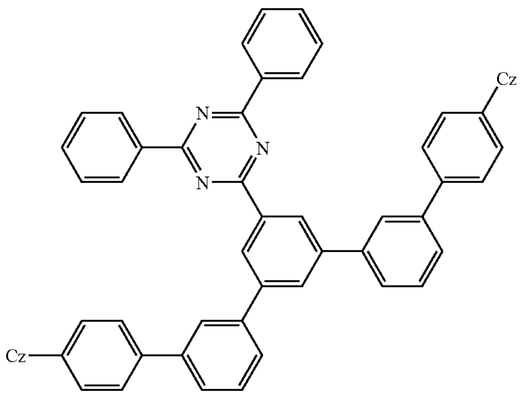
(C57)
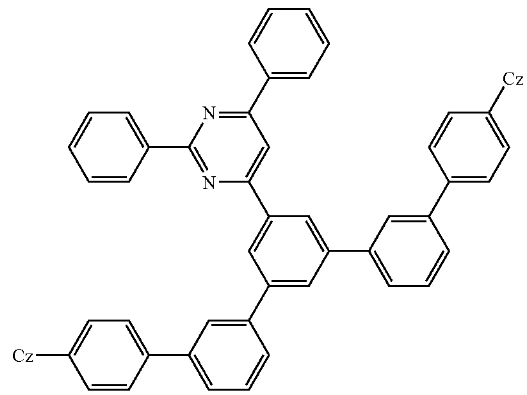
(C58)
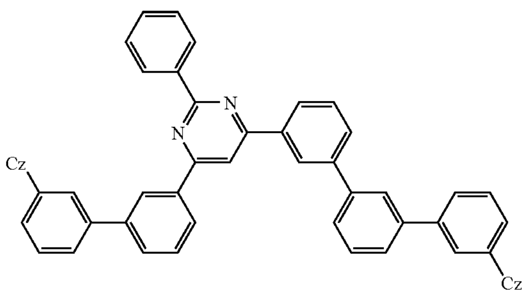
(C59)
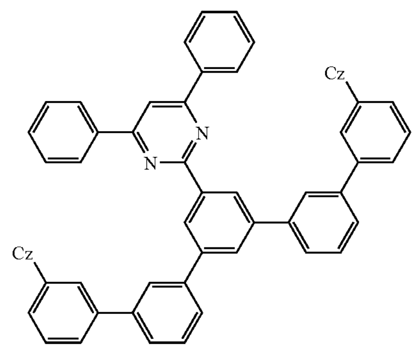
(C60)
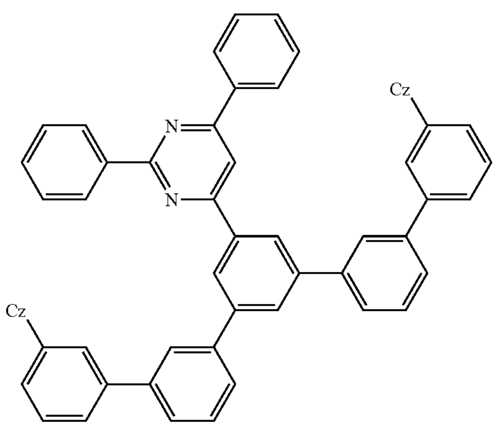
(C61)
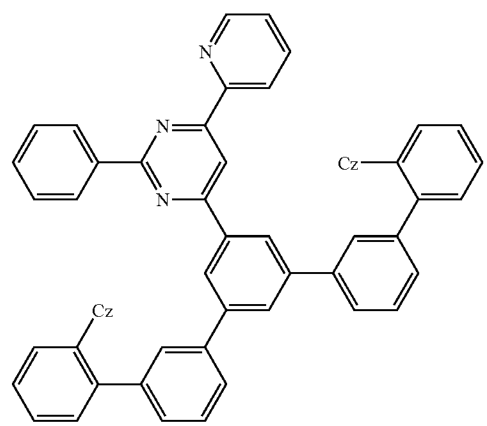
(C62)
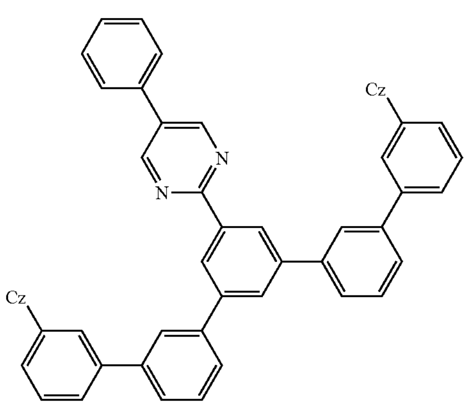
(C63)
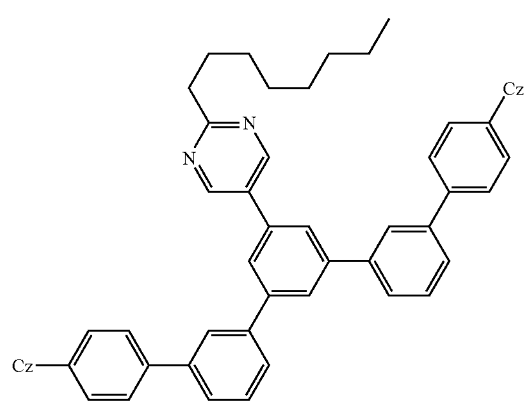

-continued
(C64)
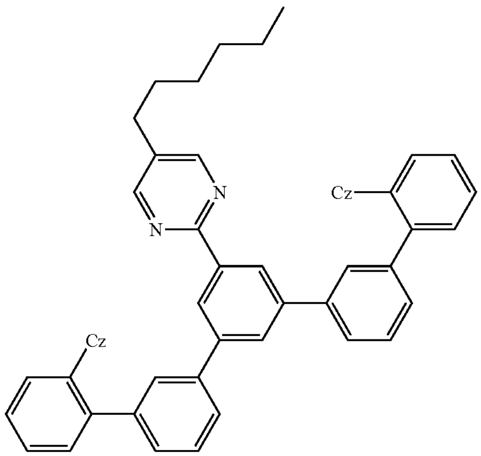
[Chemical Formula 31]
(C65)
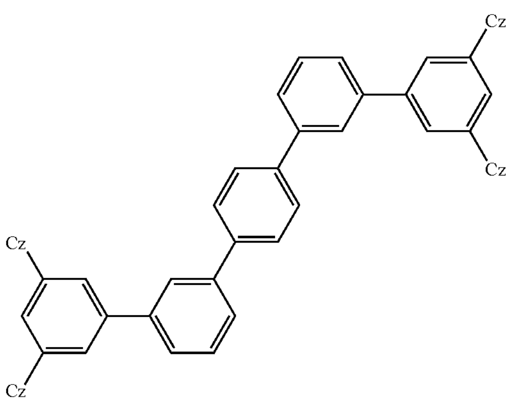
(C66)
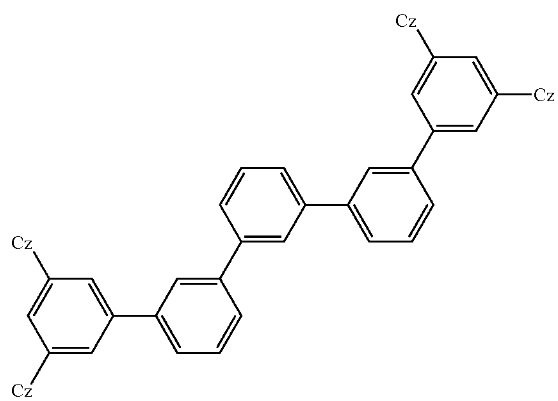
(C67)
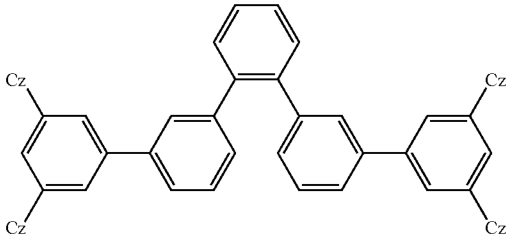
(C68)
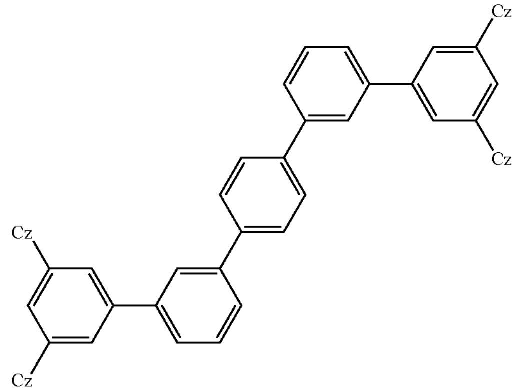

-continued
(C69)
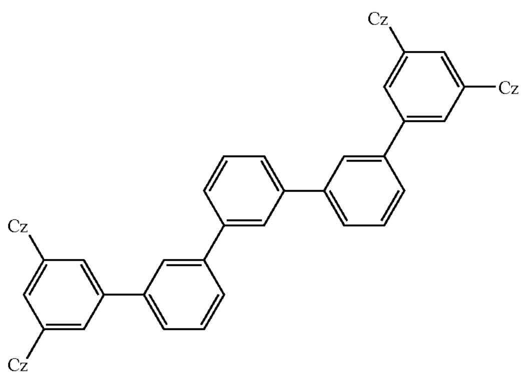
(C70)
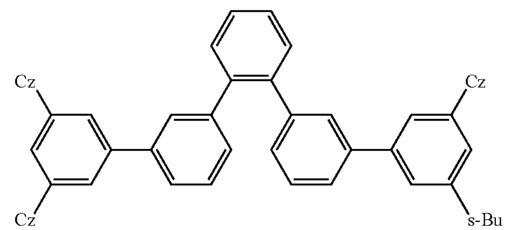
(C71)
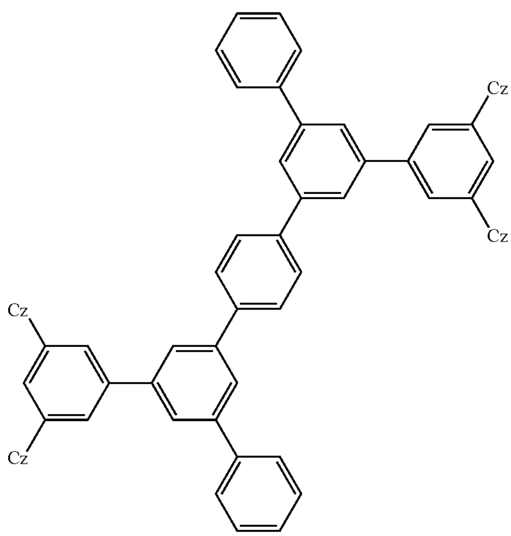
(C72)
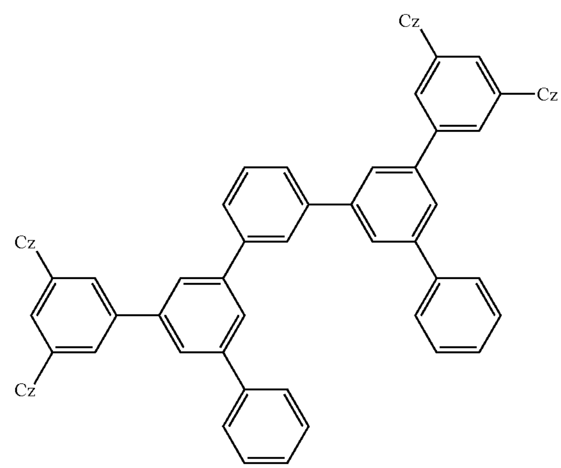
(C73)
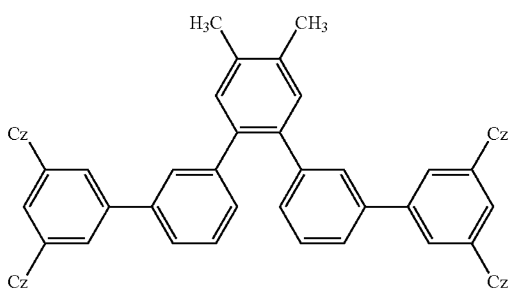
(C74)
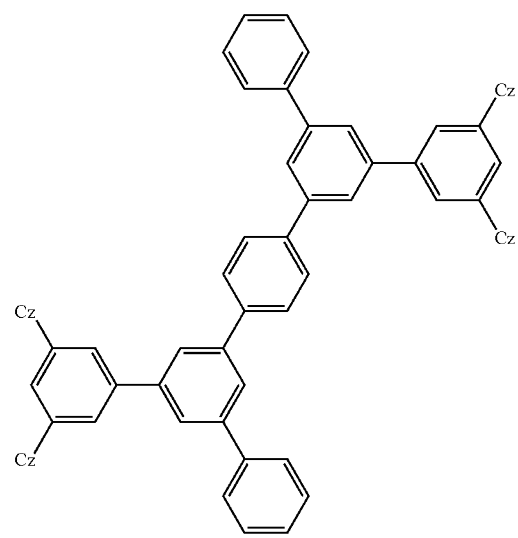

-continued
(C75)
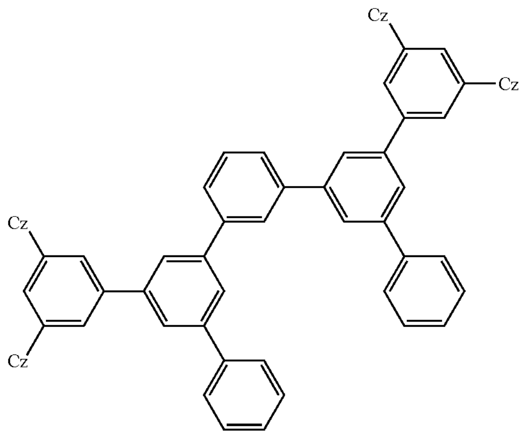
(C76)
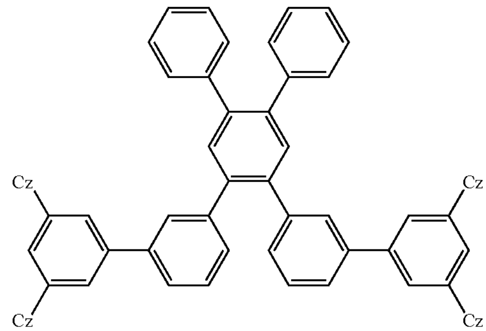
(C77)
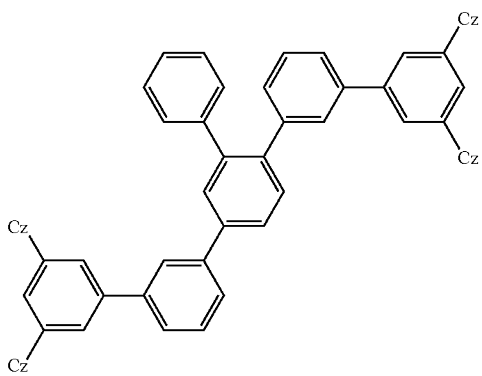
(C78)
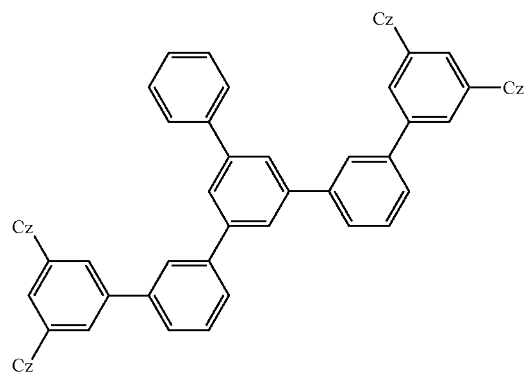
(C79)
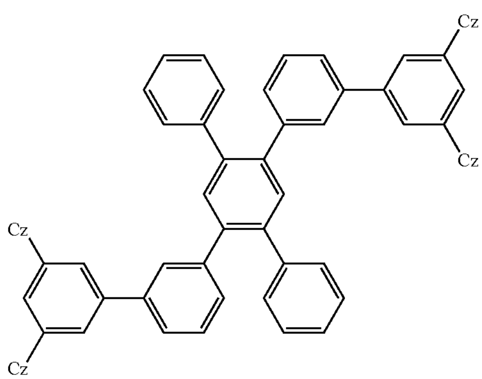
(C80)
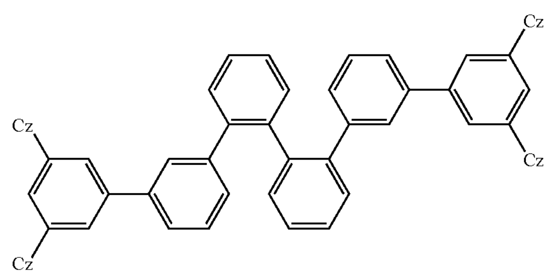
(C81)
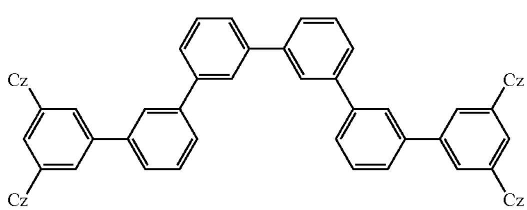
(C82)
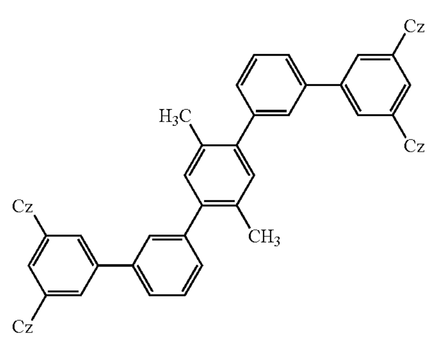

-continued
(C83)
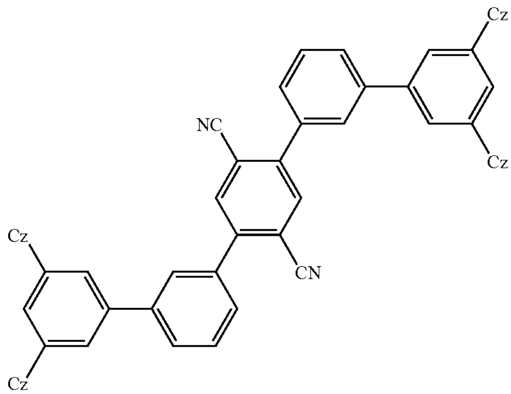
(C84)
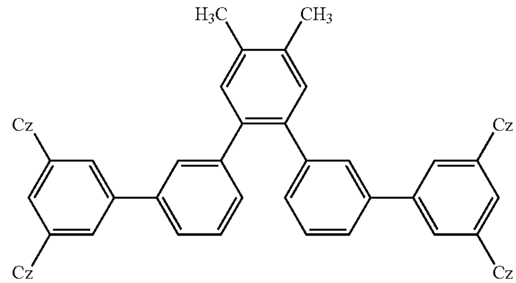
[Chemical Formula 32]
(C85)
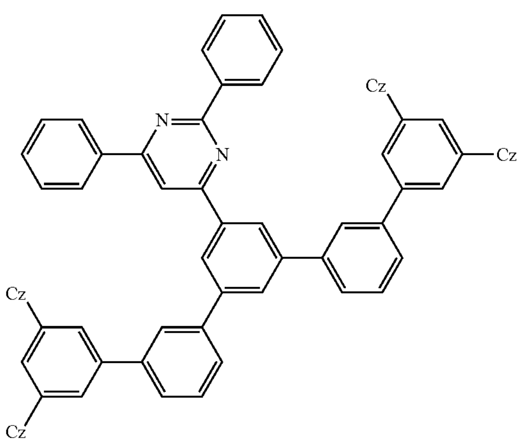
(C86)
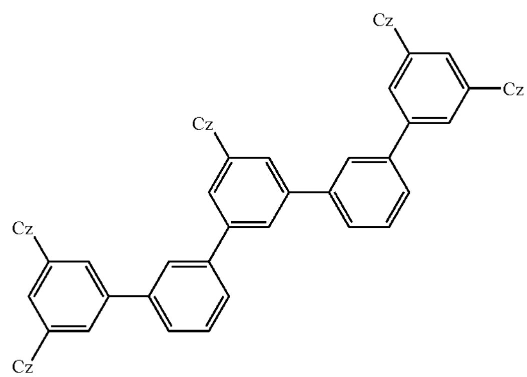
(C87)
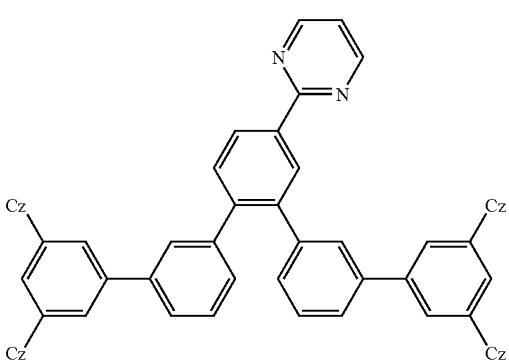
(C88)
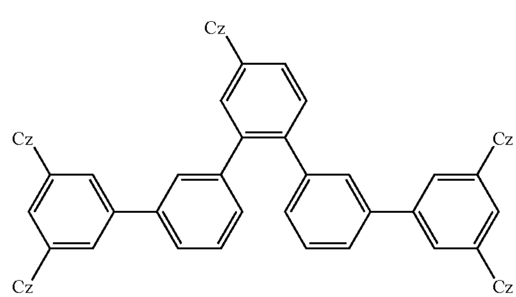

-continued
(C89)
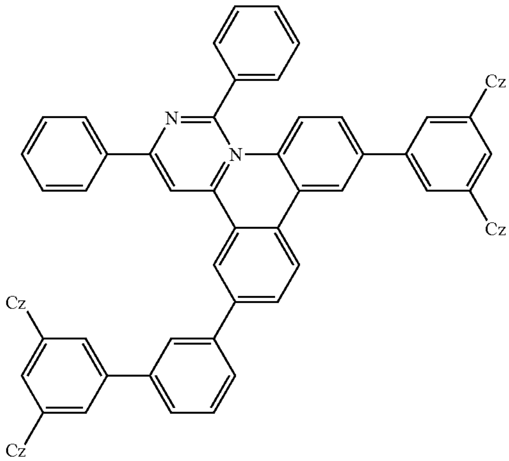
(C90)
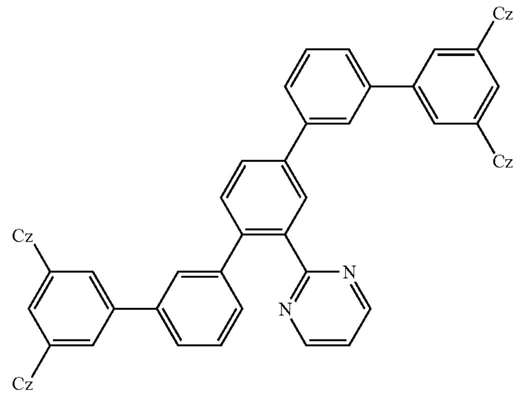
(C91)
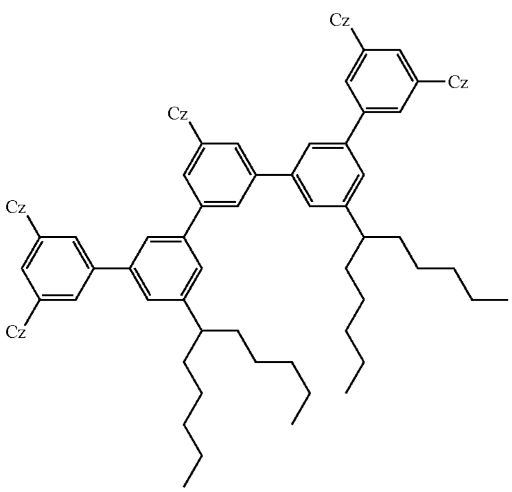
(C92)
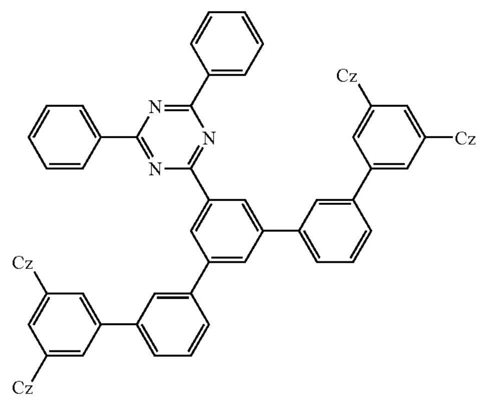
(C93)
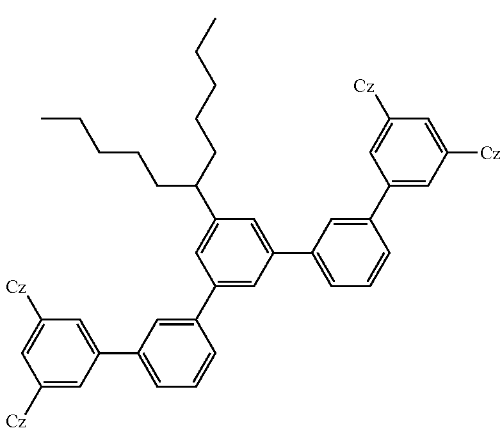
(C94)
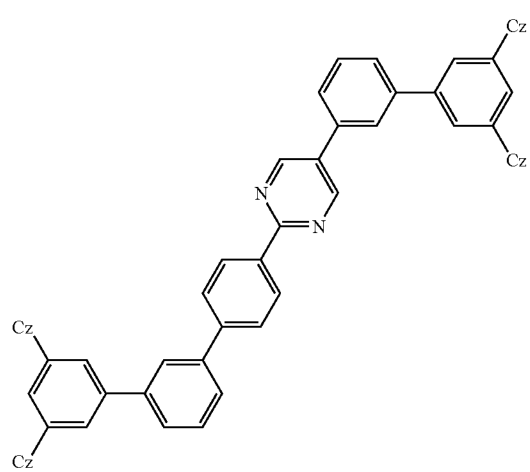

-continued
(C-95)
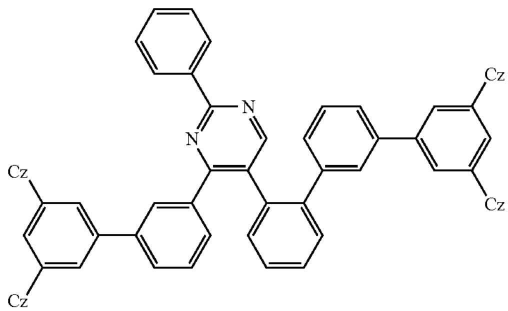
(C96)
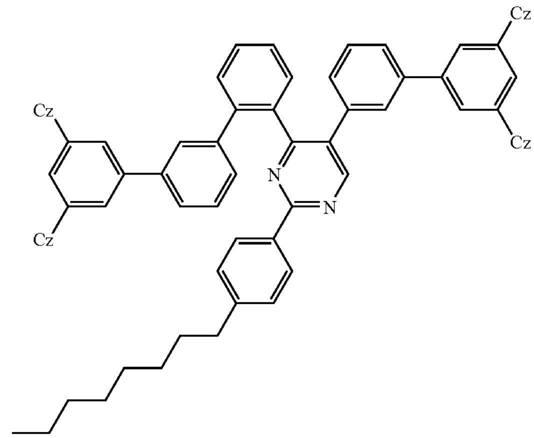
(C97)
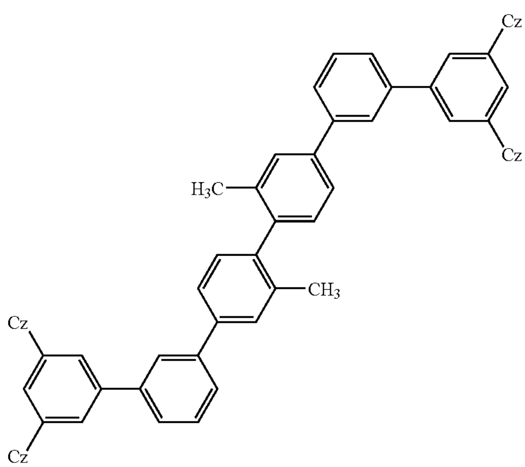
(C98)
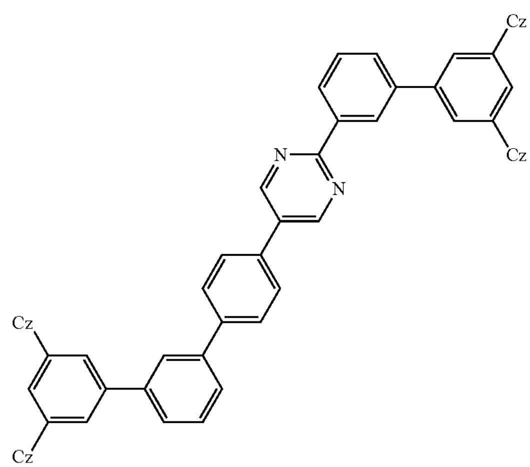
(C99)
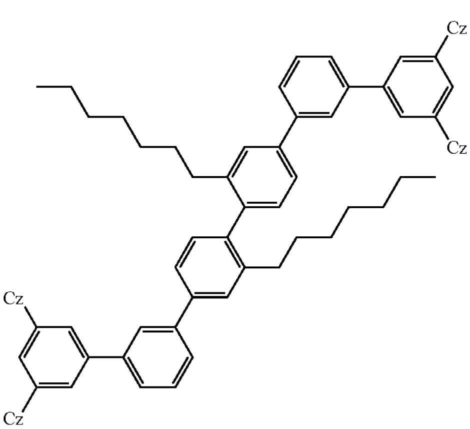
(C100)
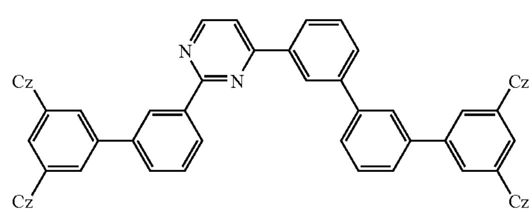

-continued
(C101)
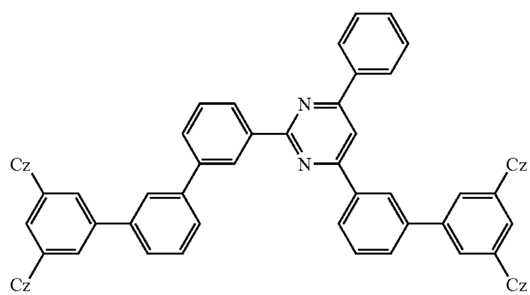
(C102)
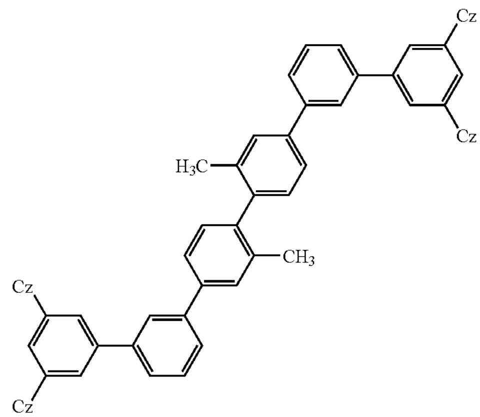
(C103)
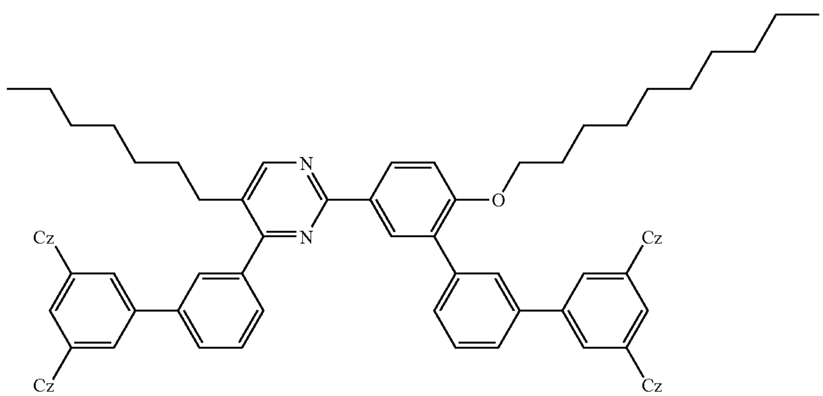
(C104)
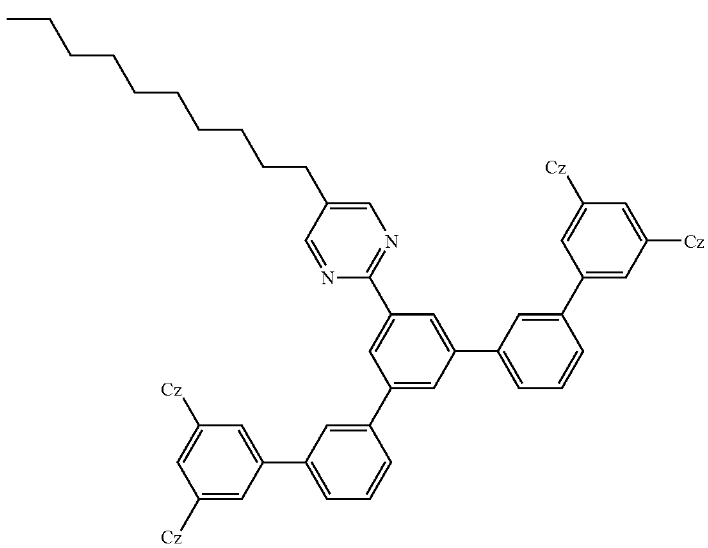

-continued
[Chemical Formula 33]
(C105)
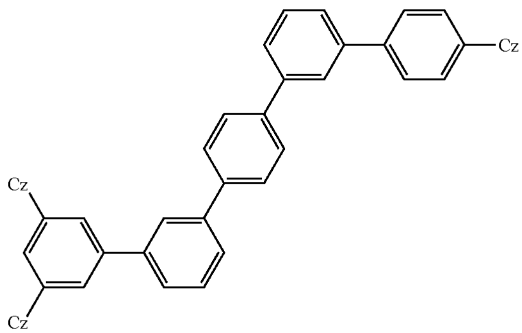
(C106)
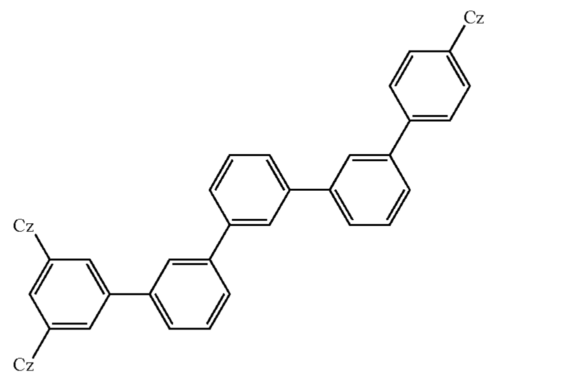
(C107)
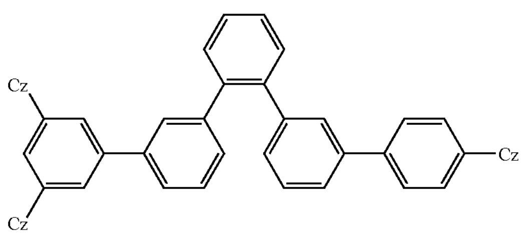
(C108)
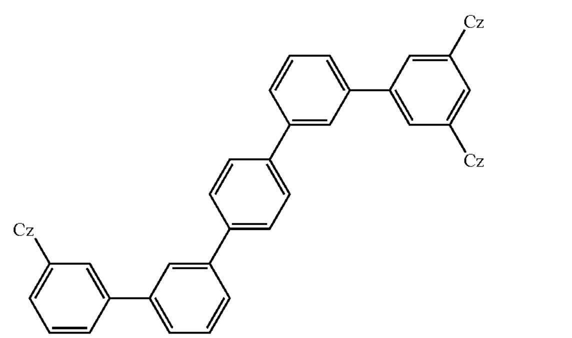
(C109)
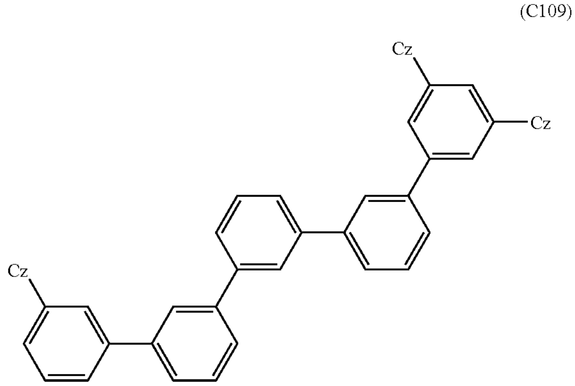
(C110)
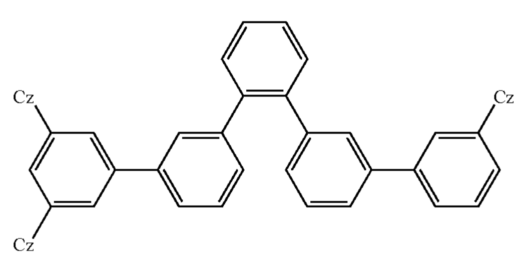

-continued
(C111)
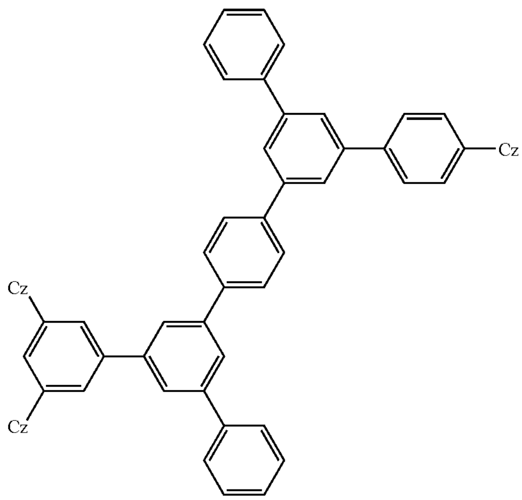
(C112)
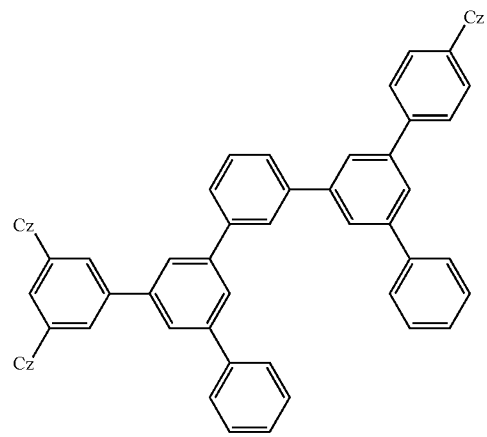
(C113)
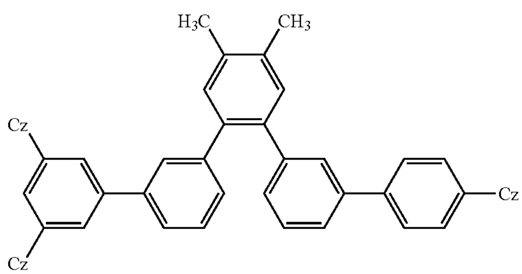
(C114)
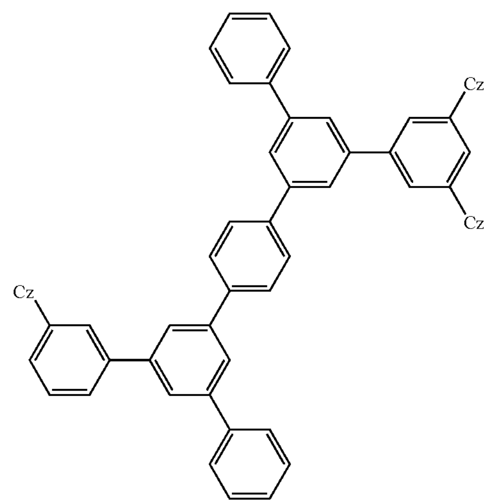
(C115)
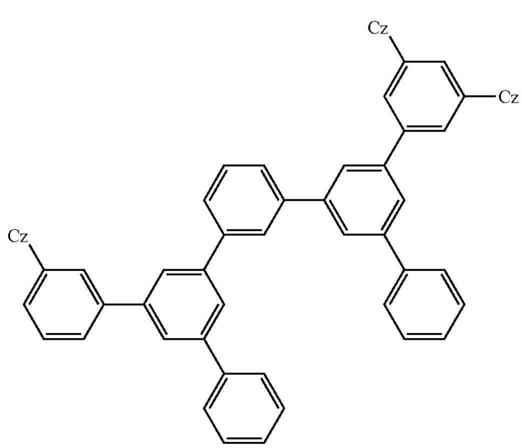
(C116)
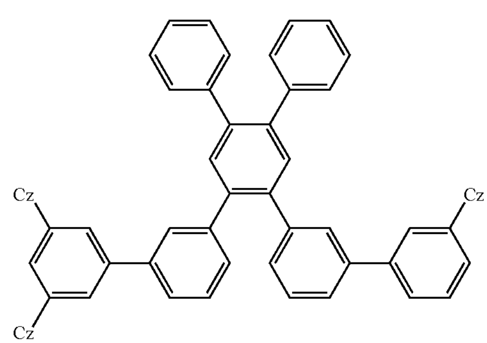

-continued
(C117)
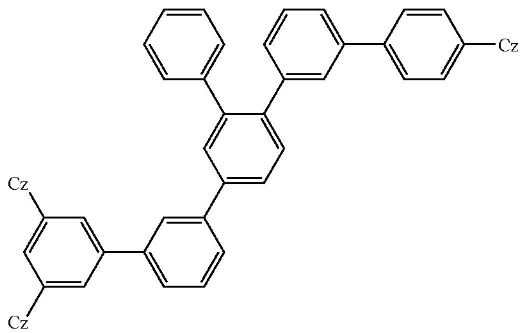
(C118)
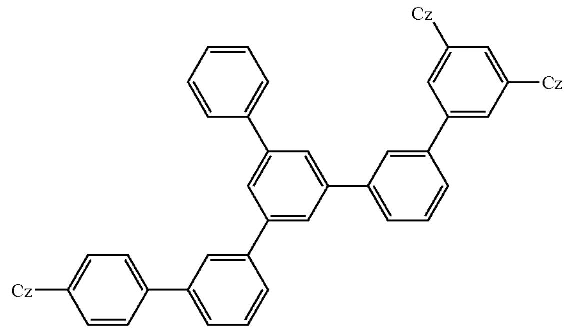
(C119)
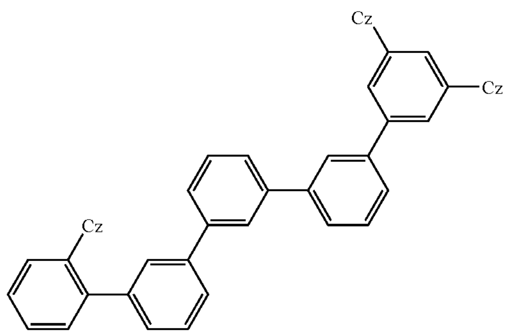
(C120)
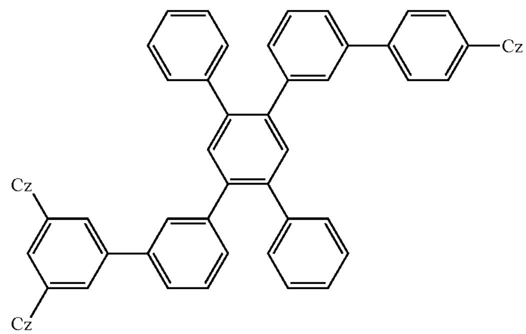
(C121)
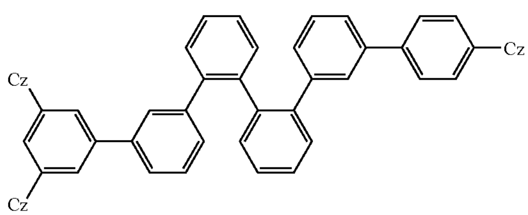
(C122)
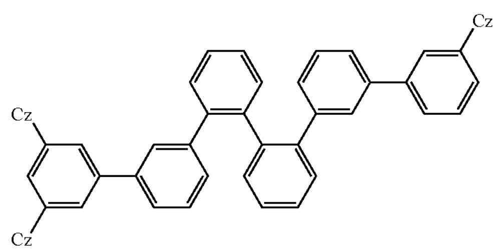
(C123)
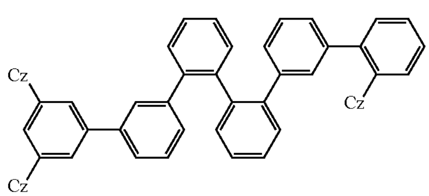
(C124)
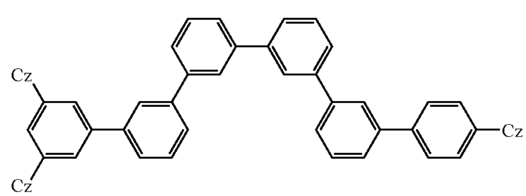
(C125)
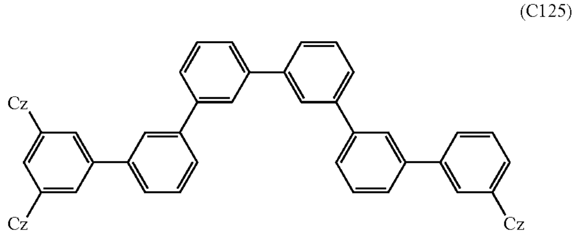
(C126)
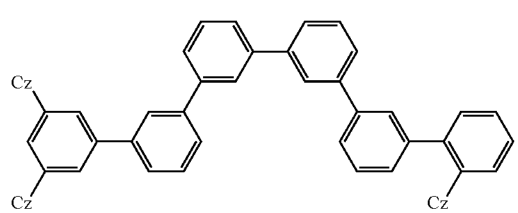

-continued
[Chemical Formula 34]
(C127)
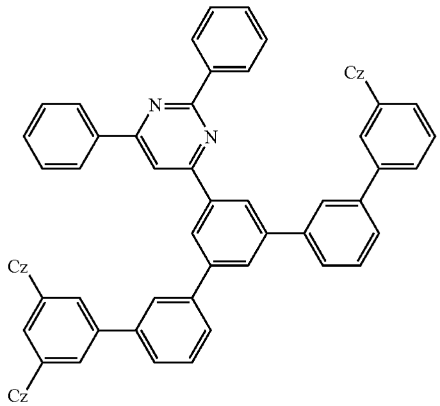
(C128)
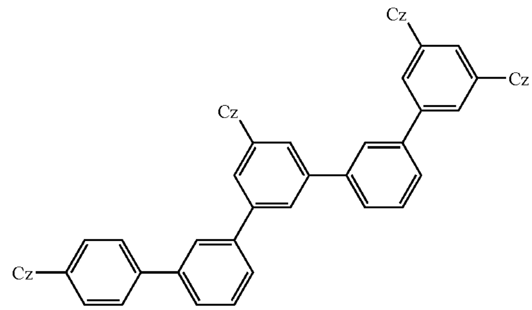
(C129)
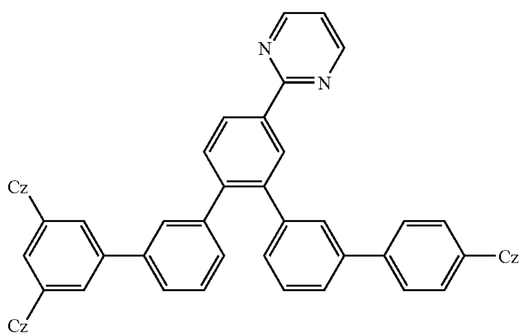
(C130)
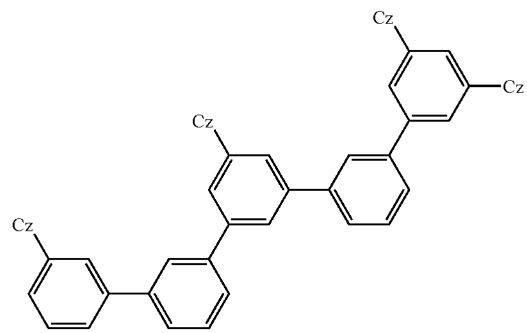
(C131)
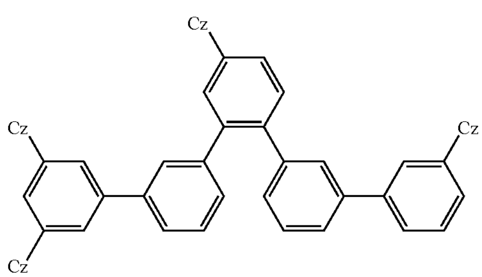
(C132)
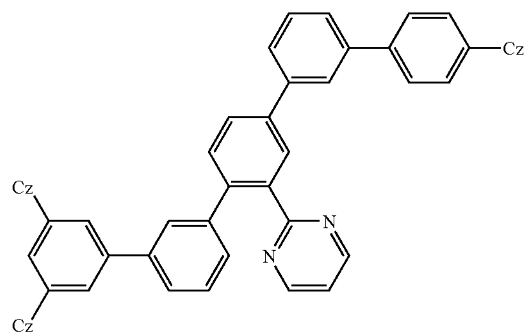
(C133)
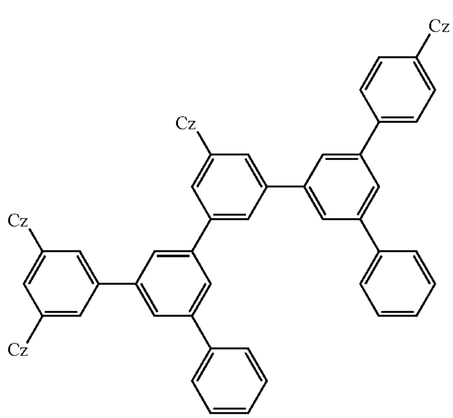
(C134)
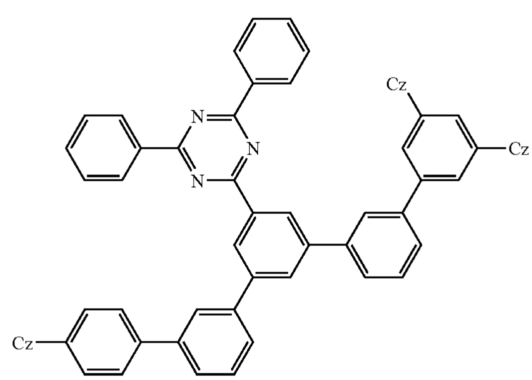

-continued
(C135)
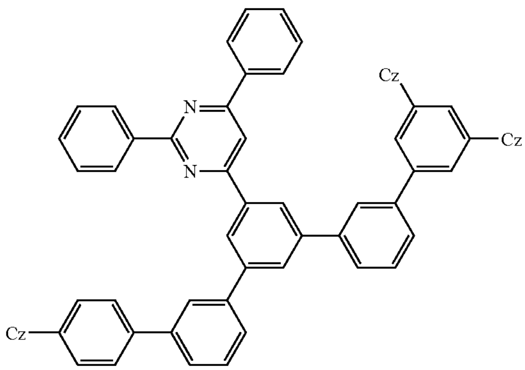
(C136)
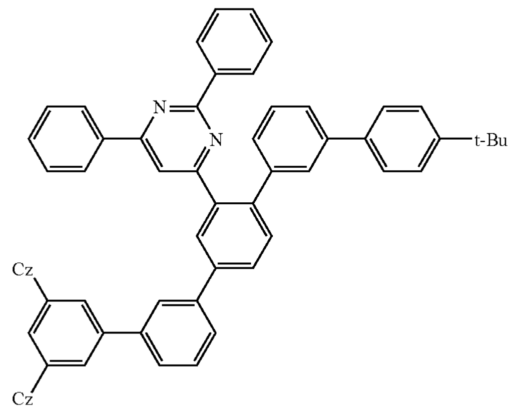
(C137)
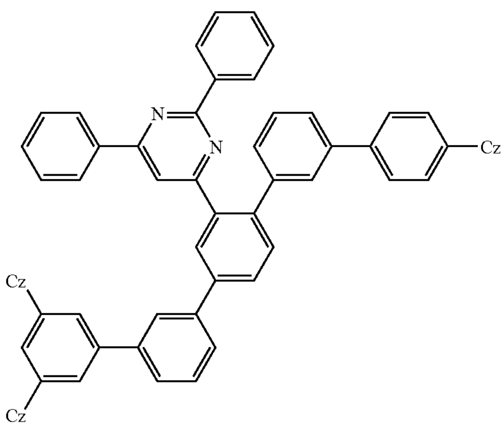
(C138)
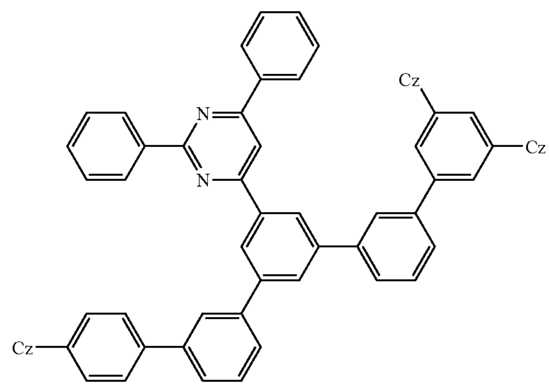
(C139)
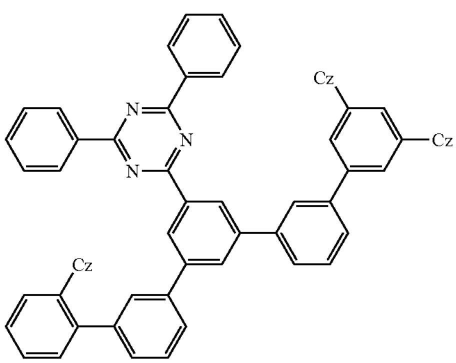
(C140)
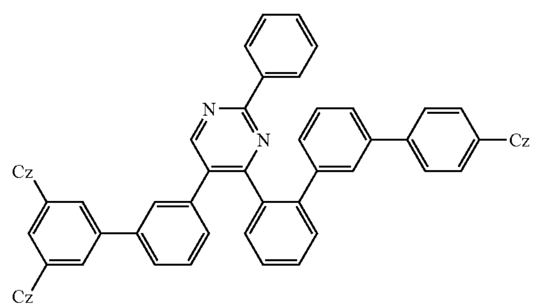
(C141)
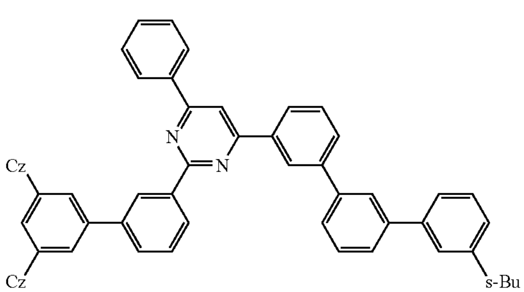
(C142)
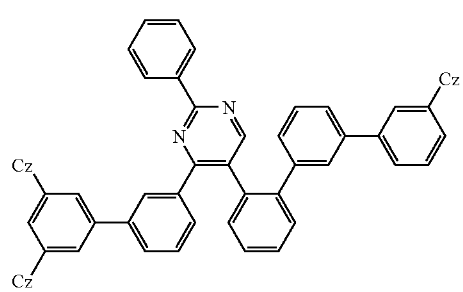

-continued
(C143)
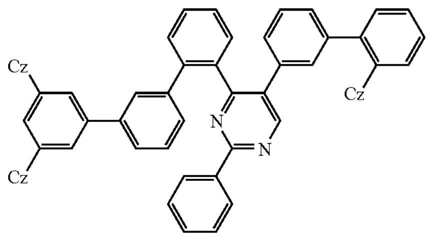
(C144)
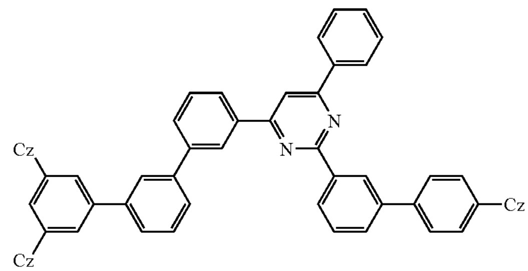
(C145)
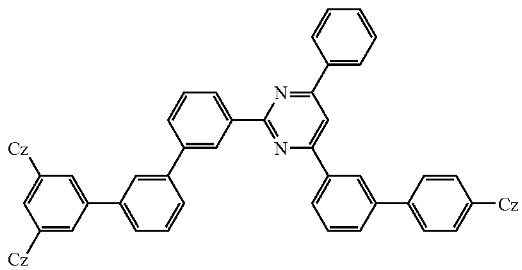
(C146)
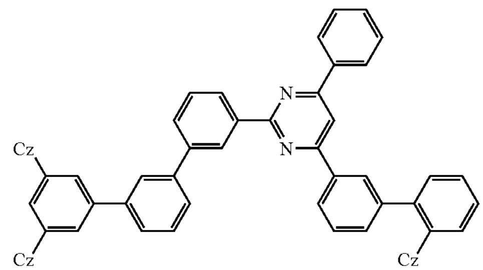
(C147)
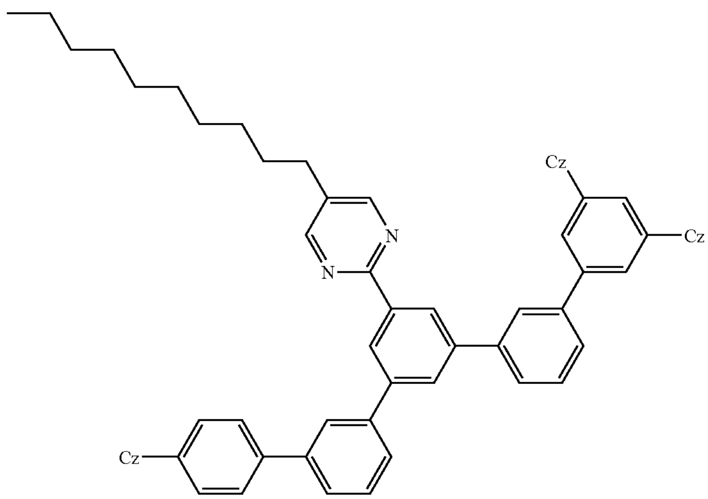
[Chemical Formula 35]
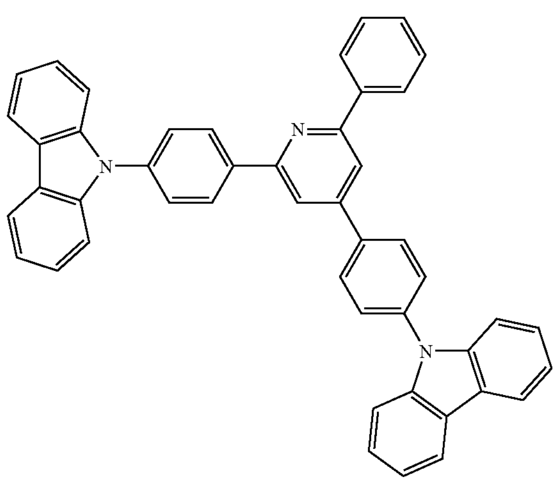

-continued
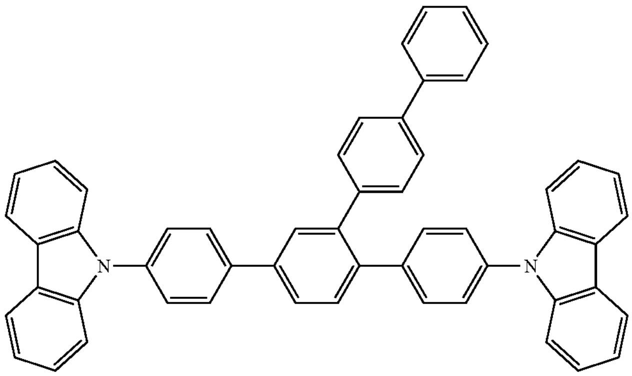
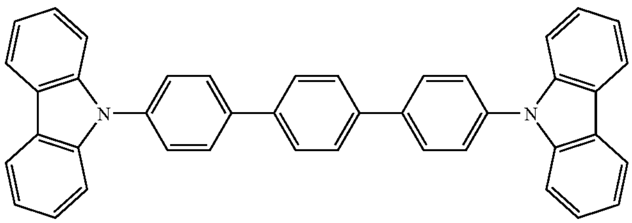
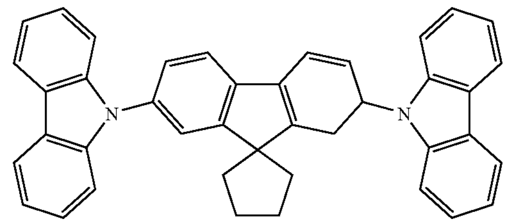
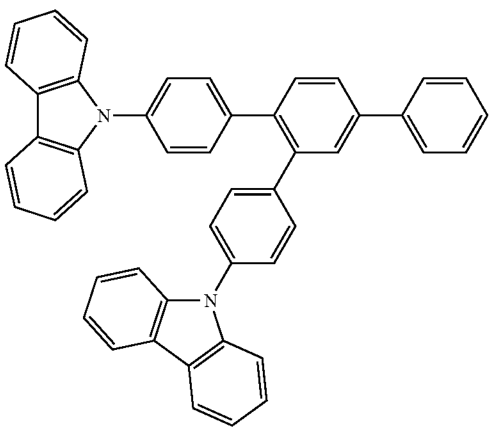
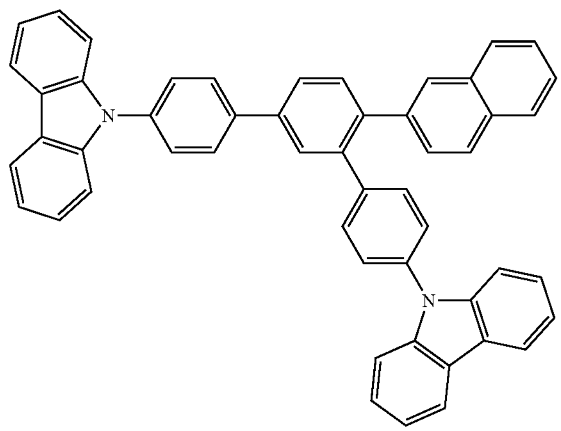
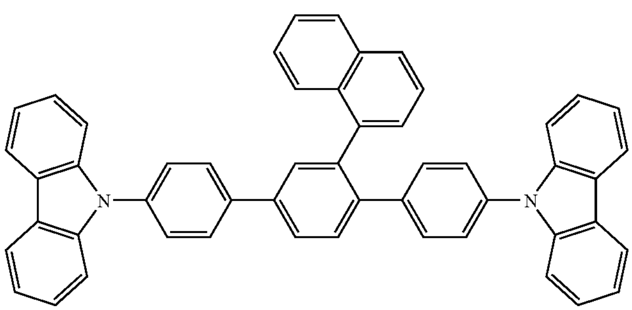
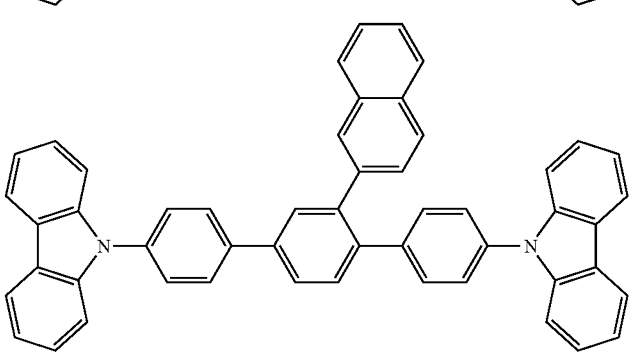

-continued
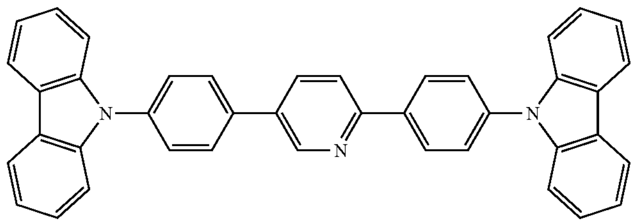
[Chemical Formula 36]
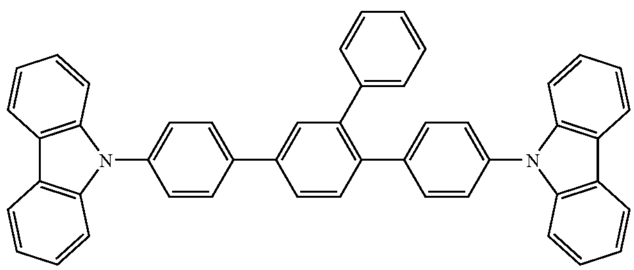
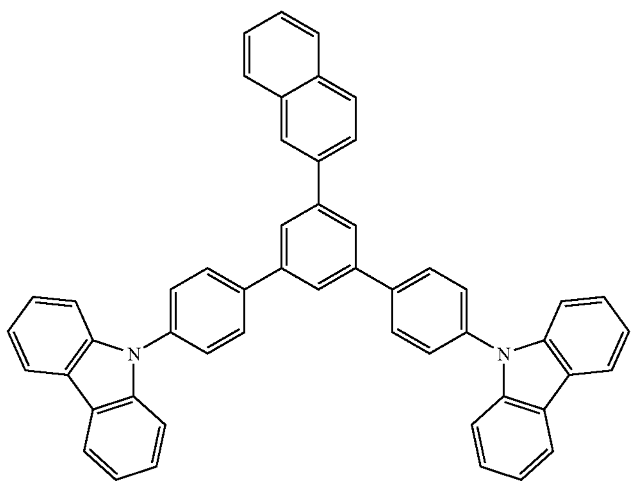
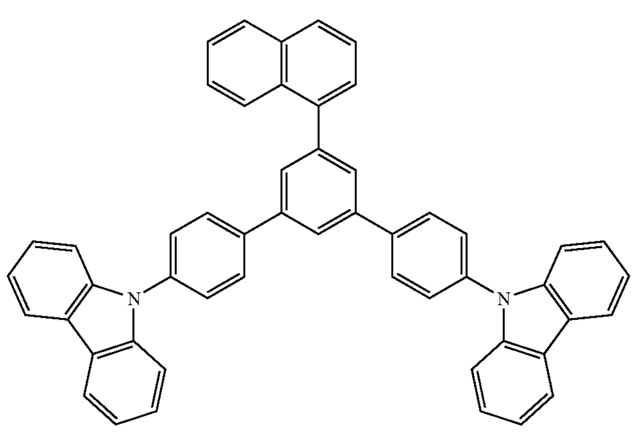

-continued
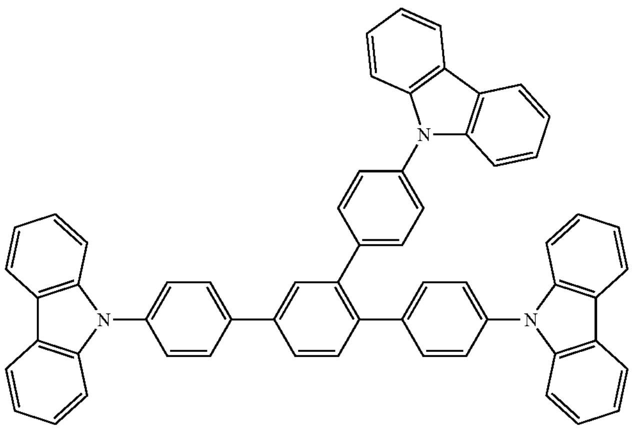
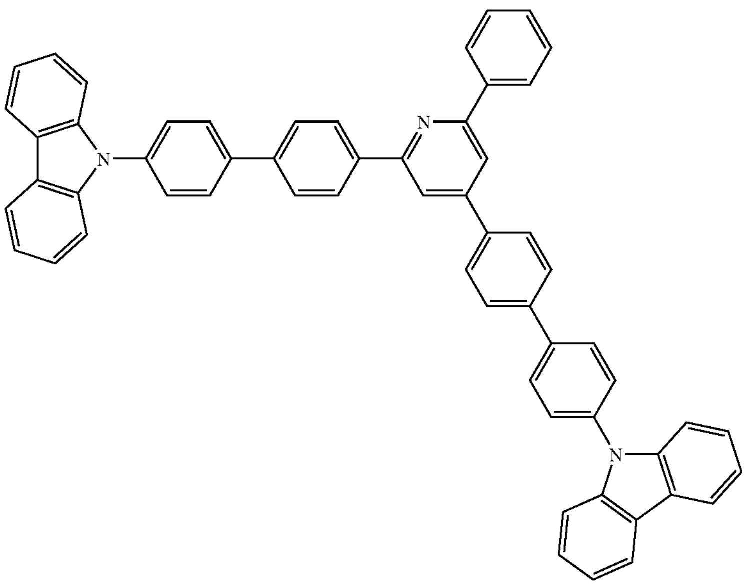
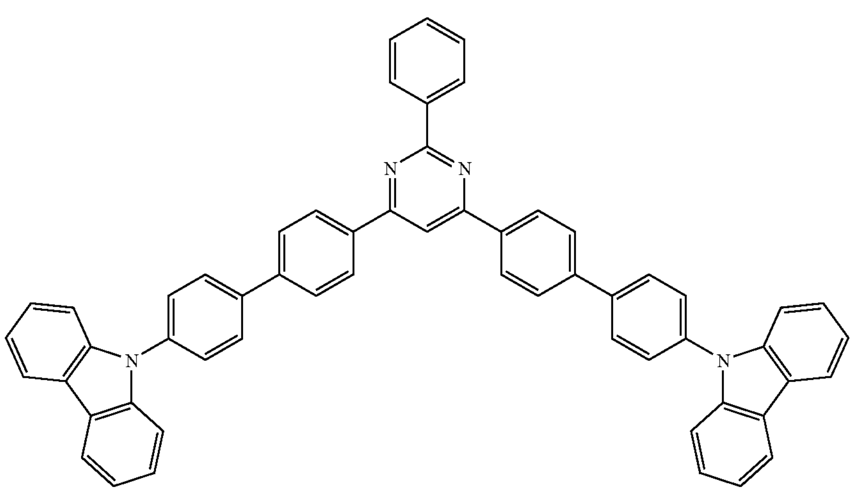

-continued
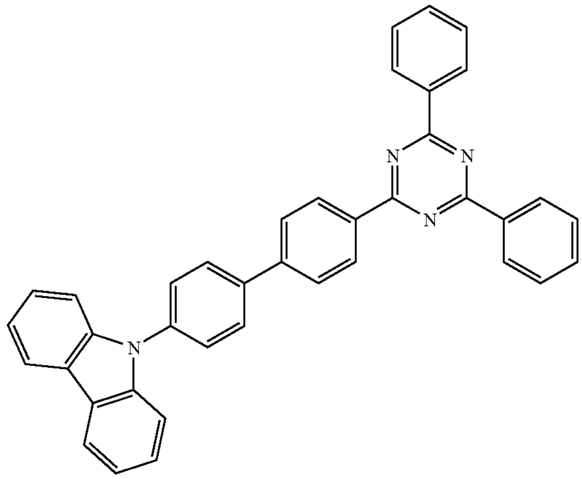
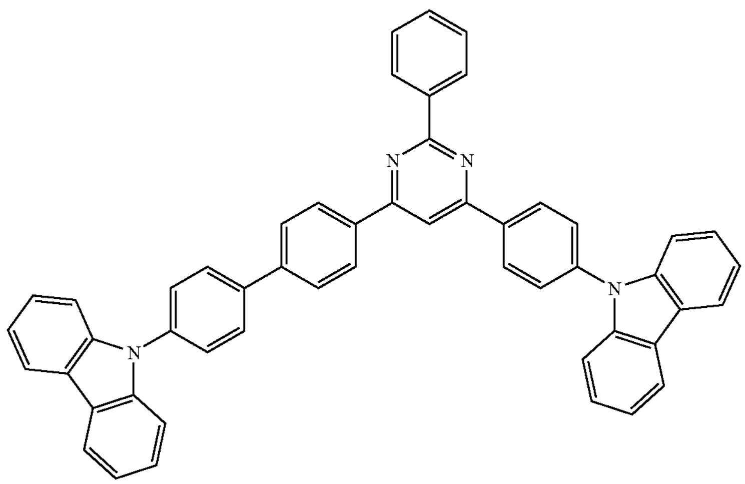
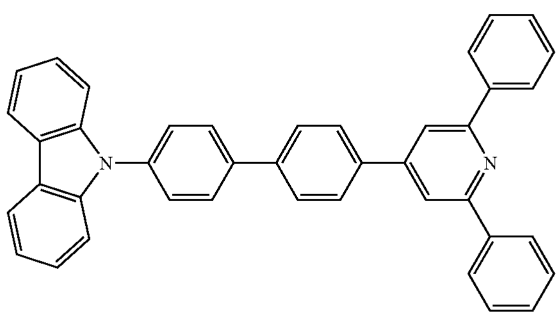
[Chemical Formula 37]
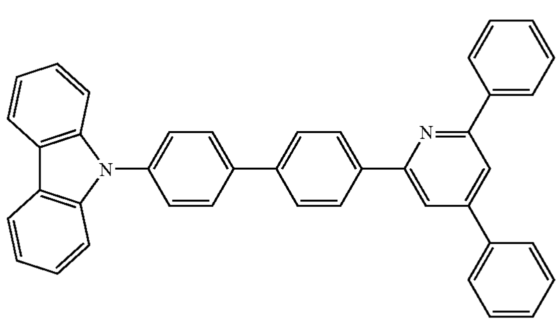

-continued
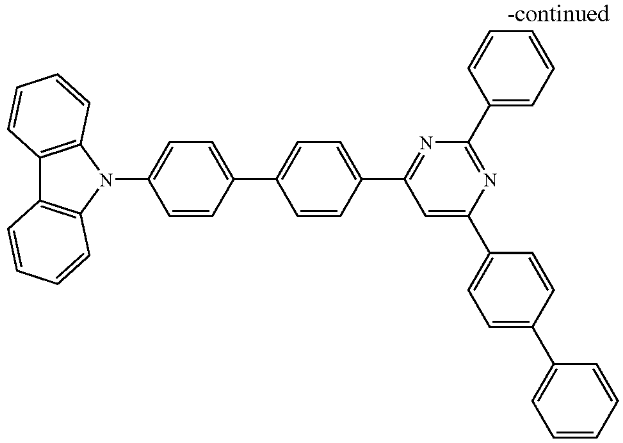
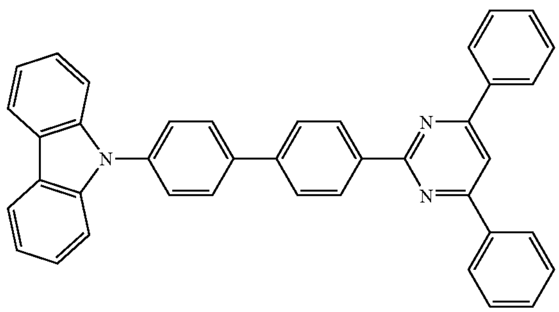
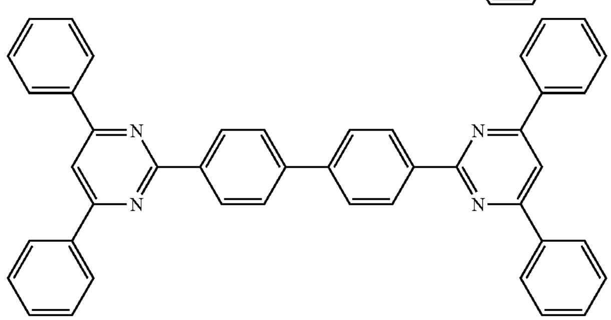
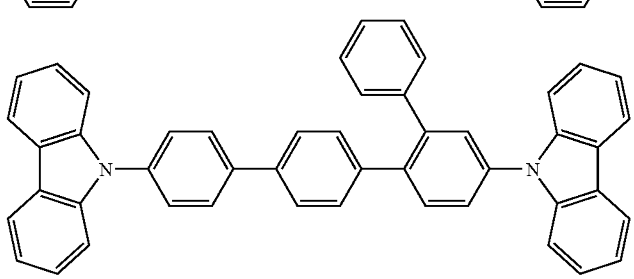
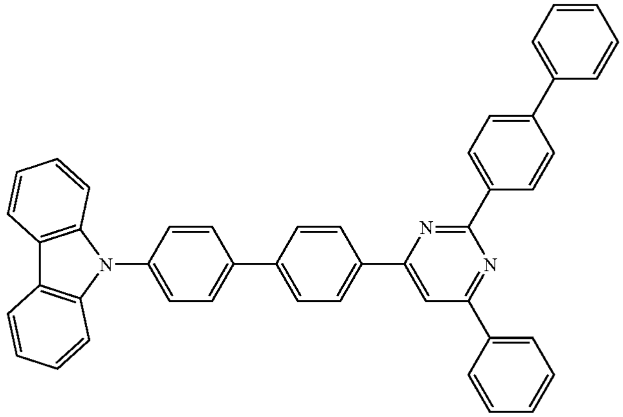 [SMILES: c1ccc(-c2ccc(-c3nc(-c4ccccc4)cc(-c4ccc(-c5ccc(-n6c7ccccc7c7ccccc76)cc5)cc4)n3)cc2)cc1]

-continued
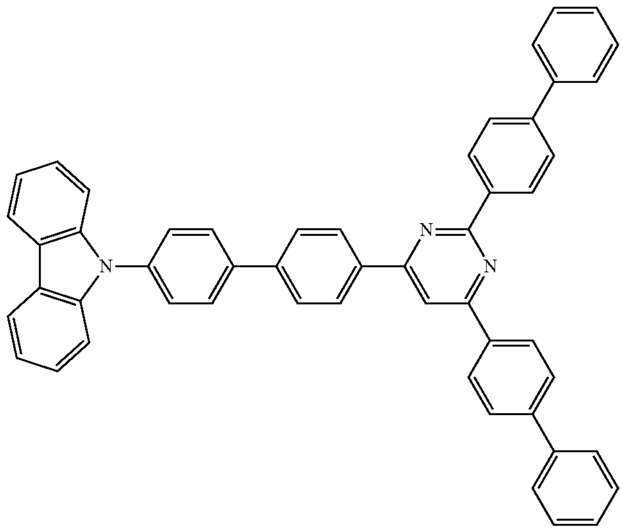
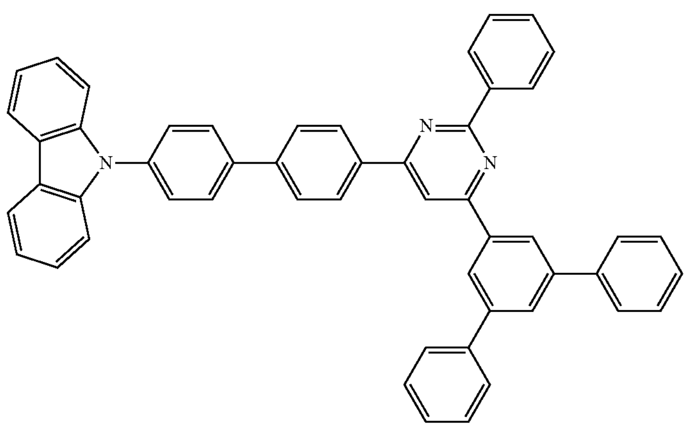
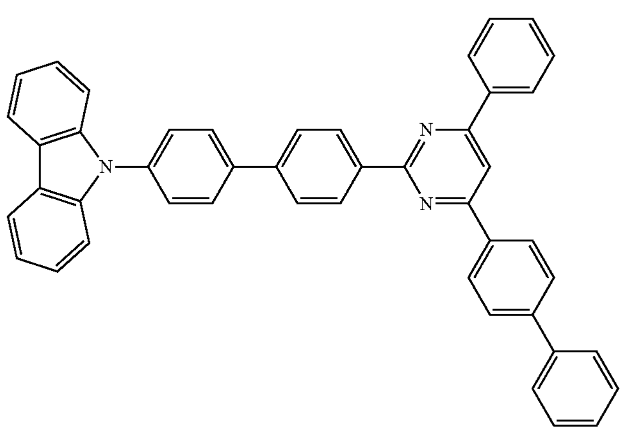

-continued
[Chemical Formula 38]
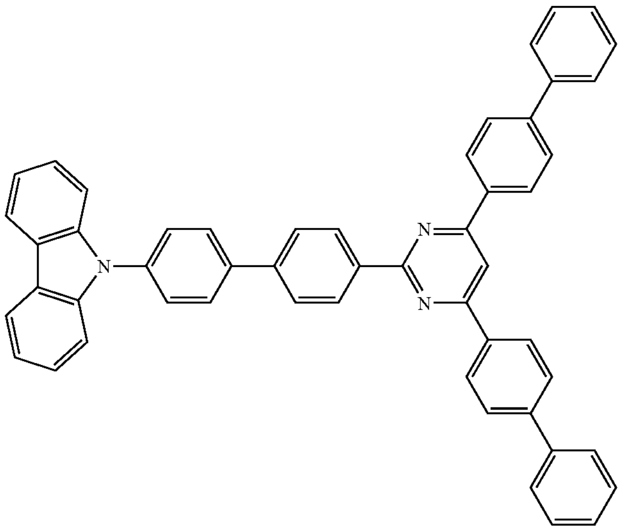
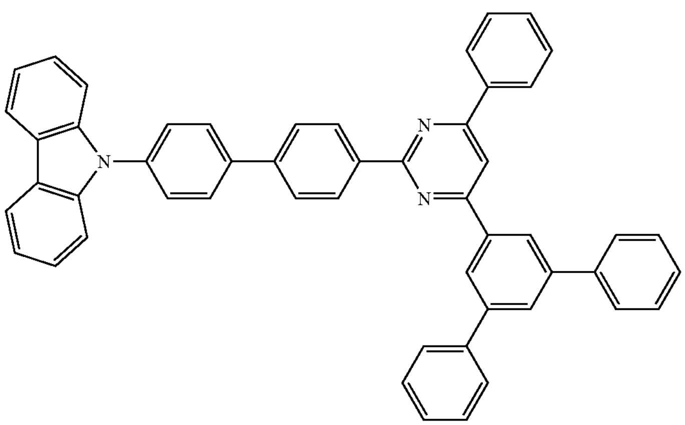
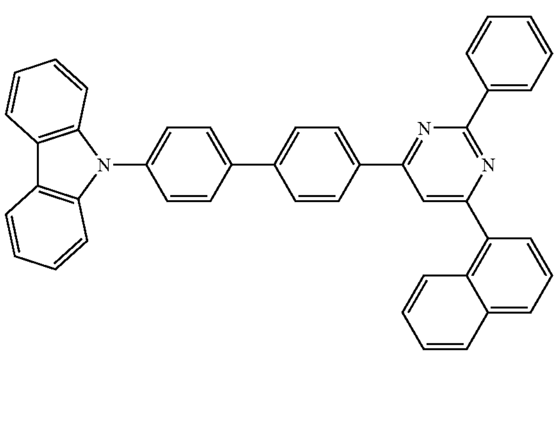
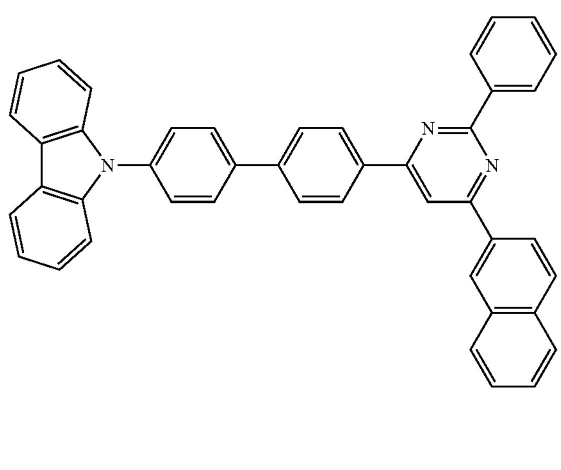

-continued
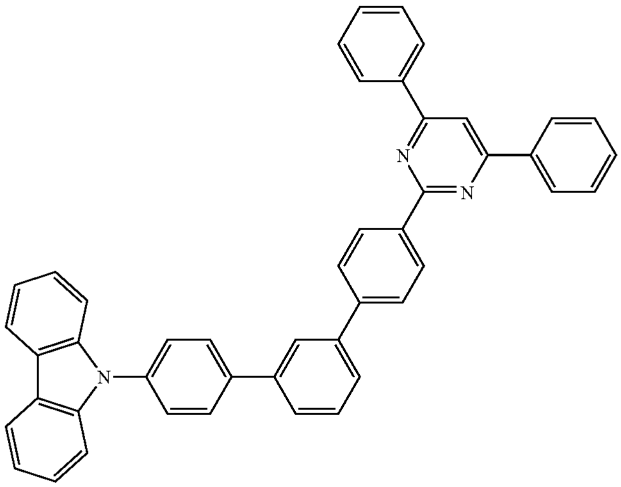
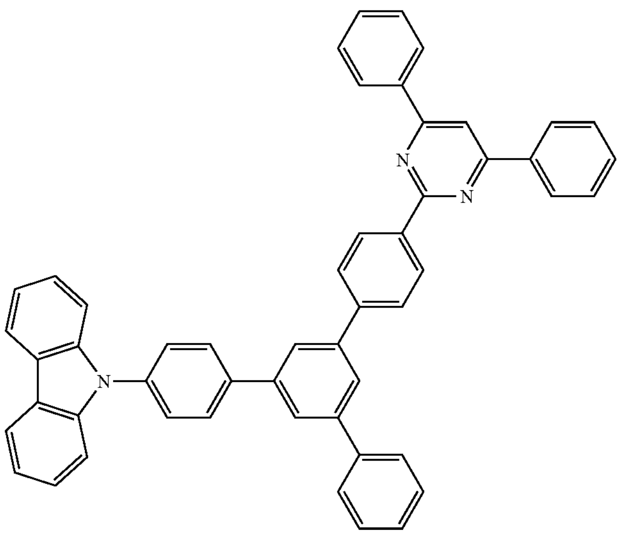
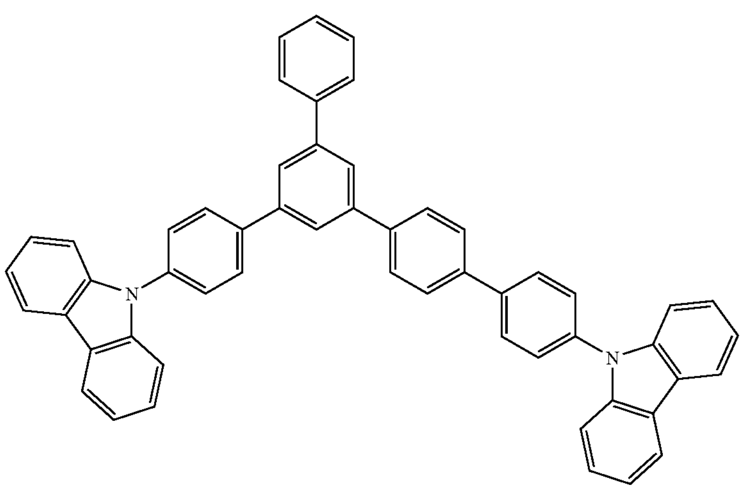

-continued
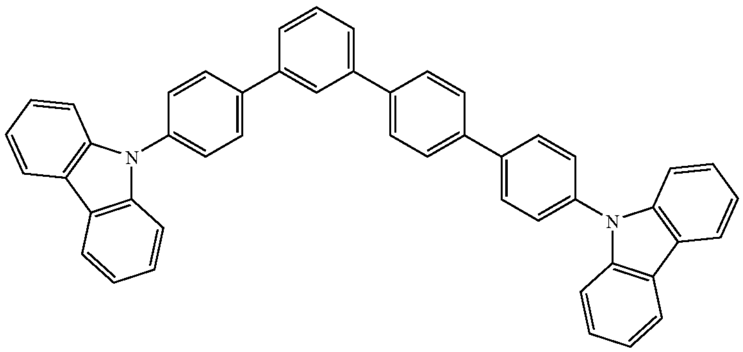
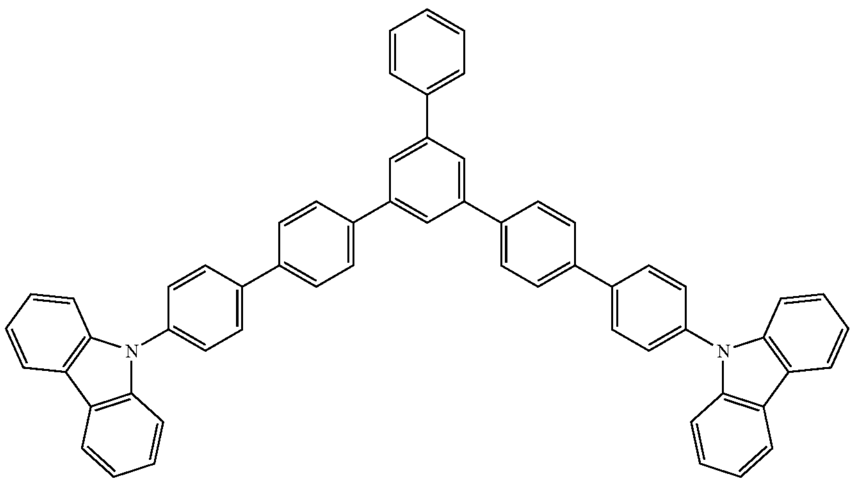
[Chemical Formula 39]
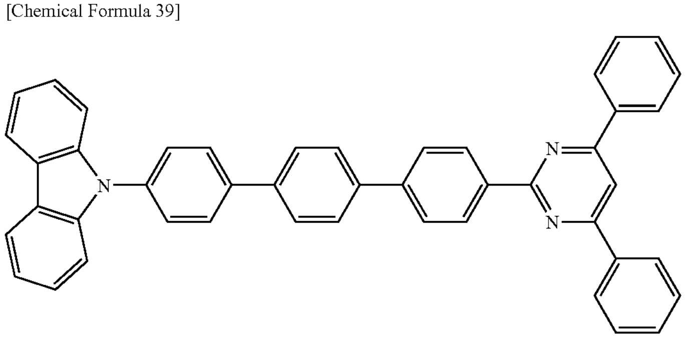
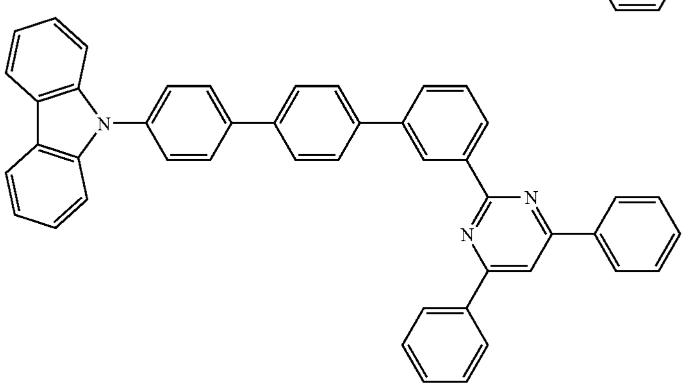

-continued
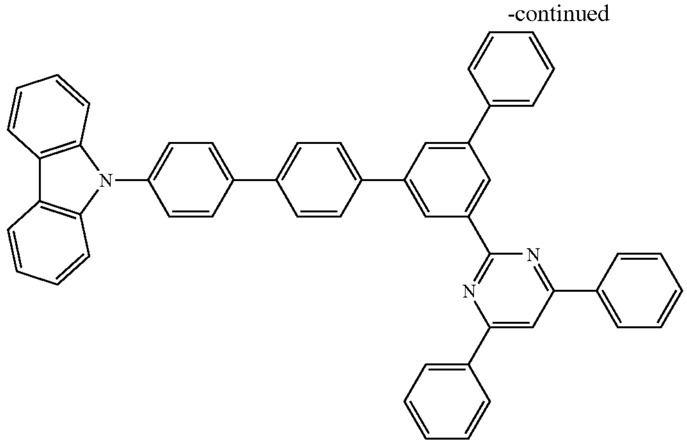
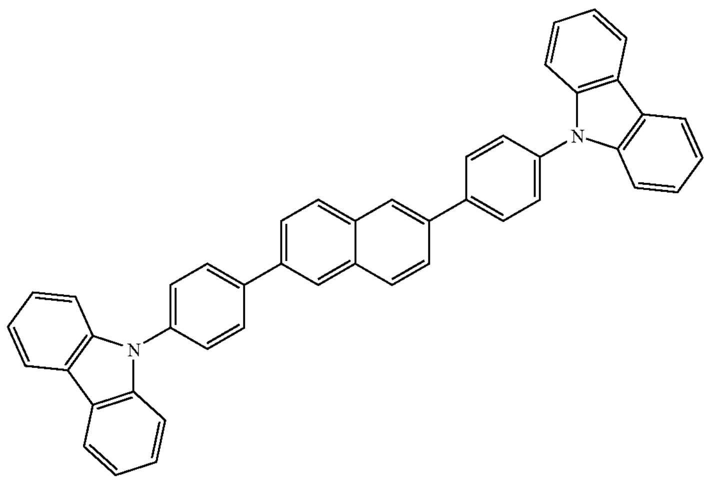
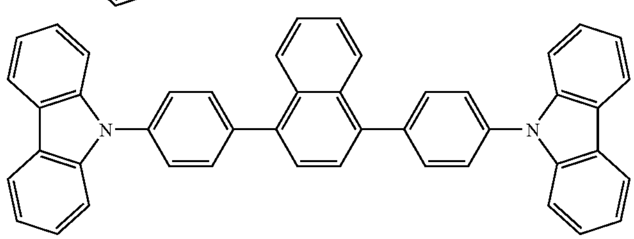
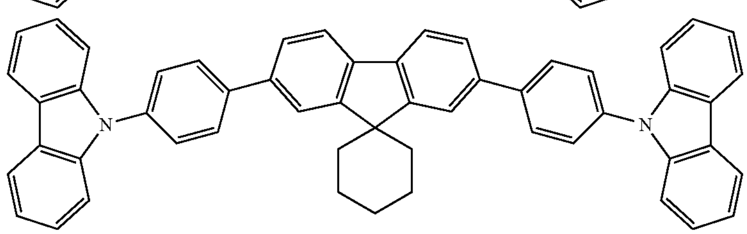
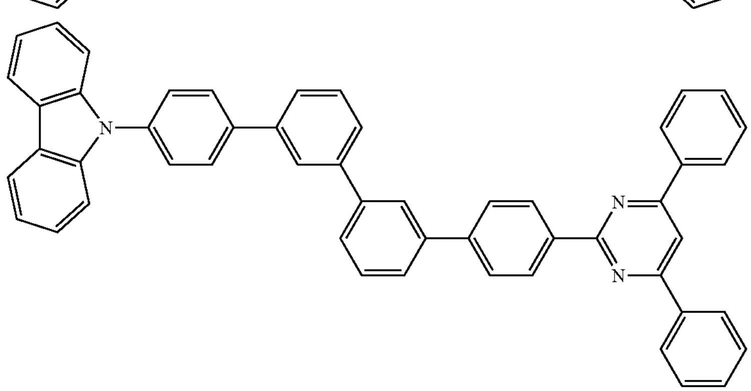

-continued
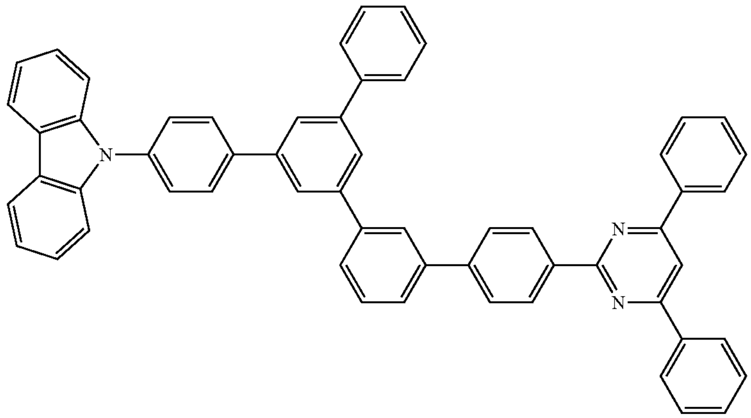
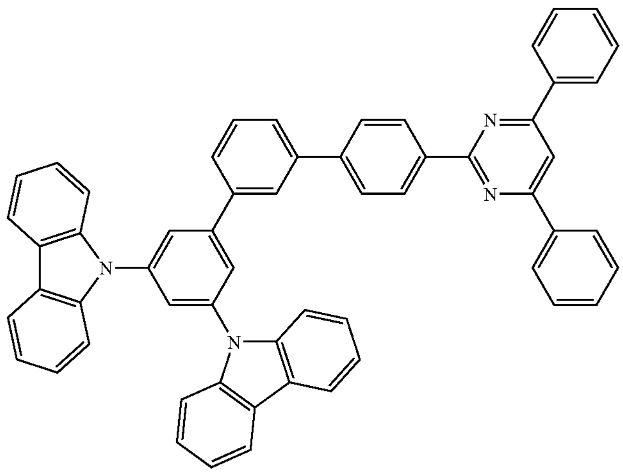
[Chemical Formula 40]
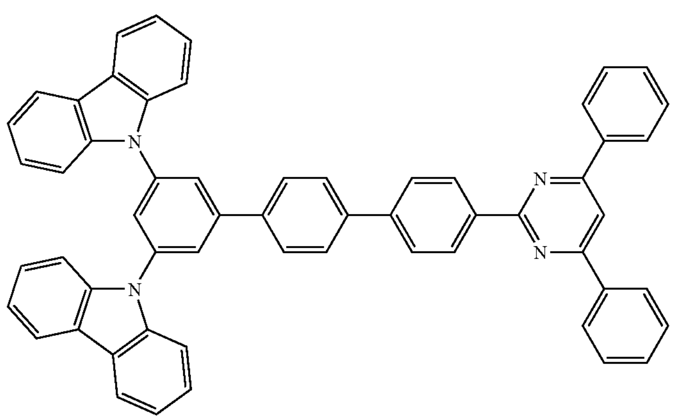
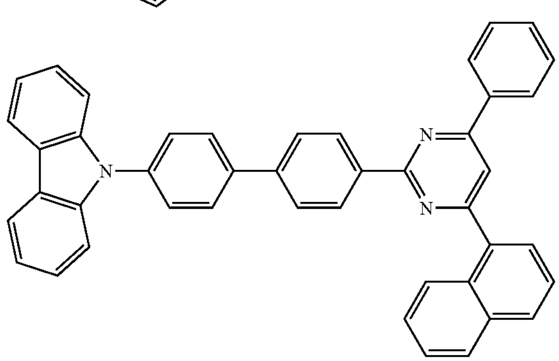
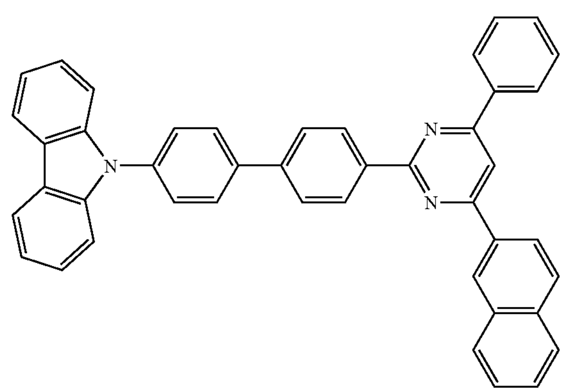

-continued
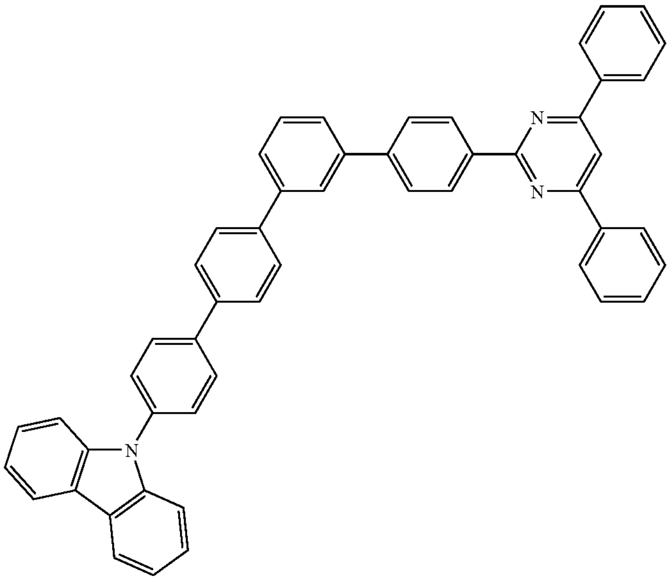
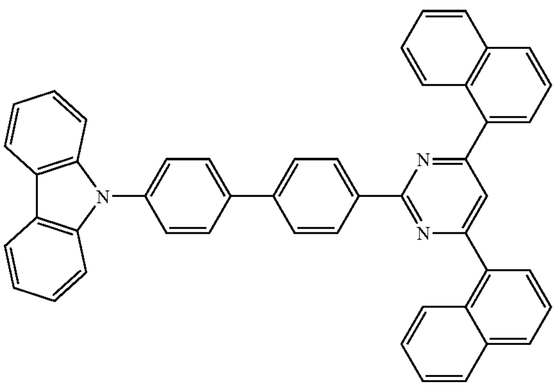
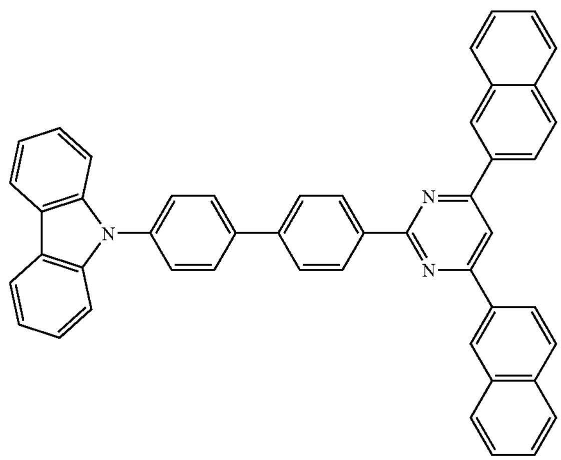
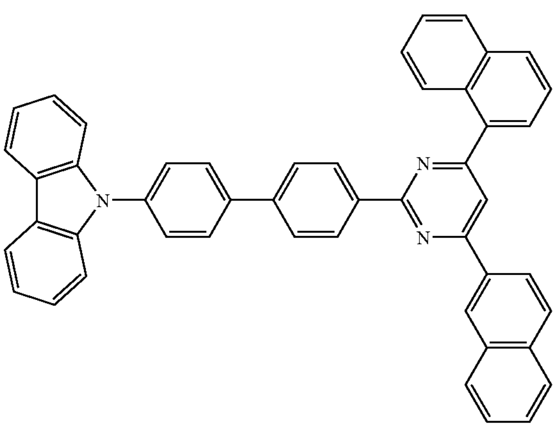
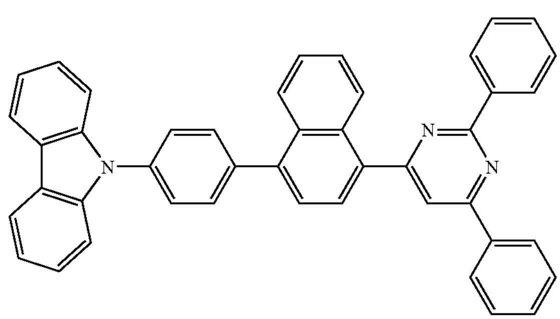
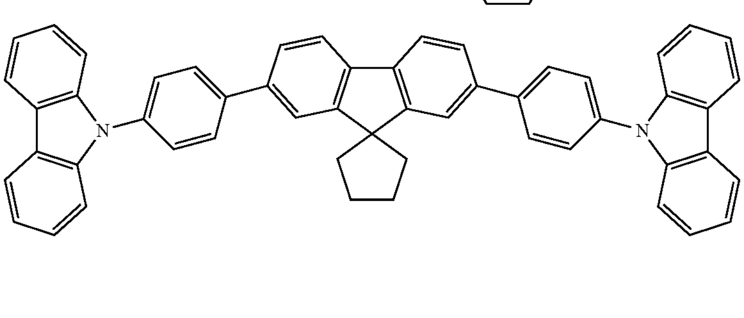

-continued
[Chemical Formula 41]
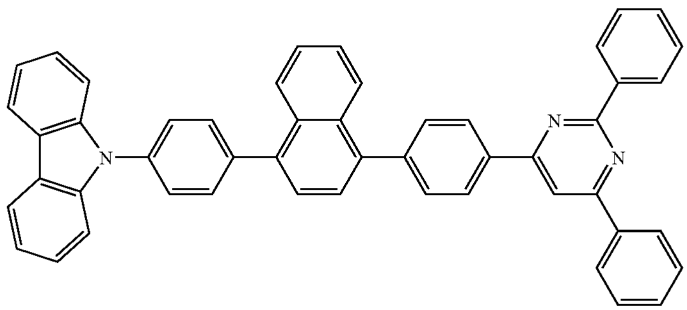
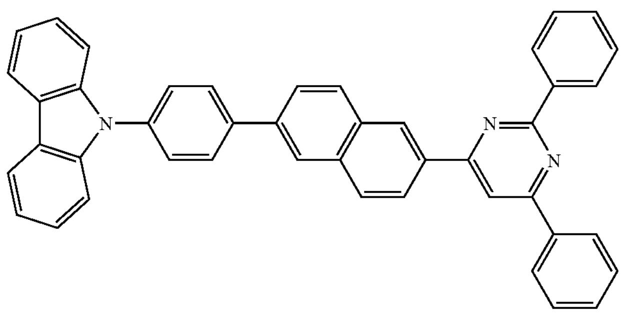
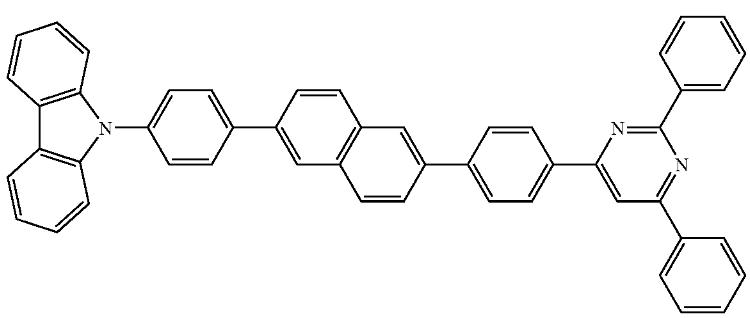
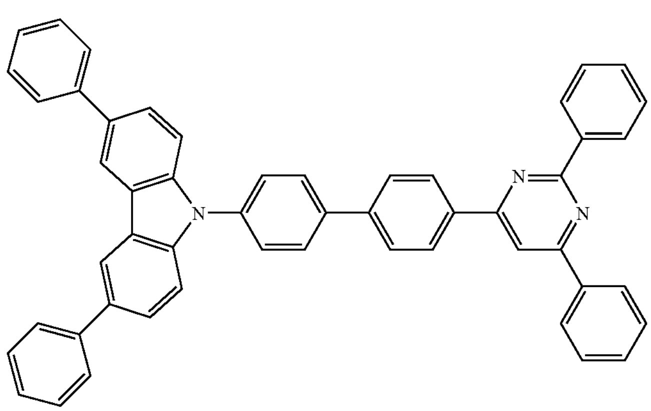

-continued
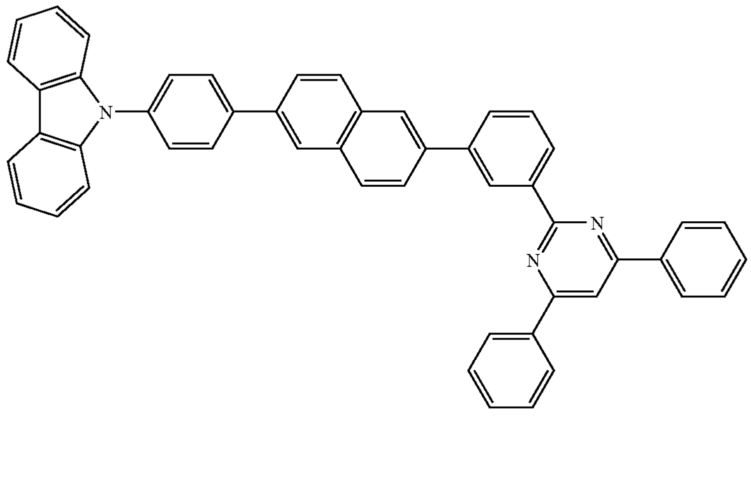
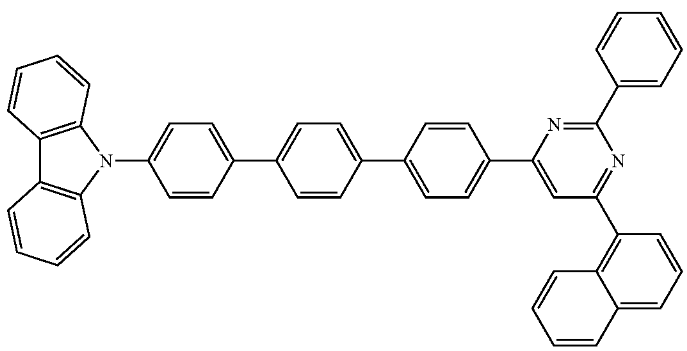
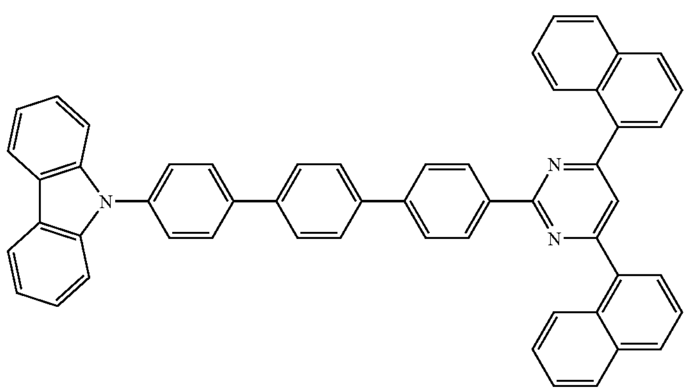
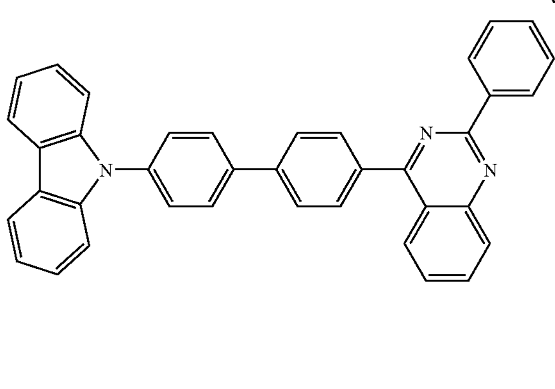
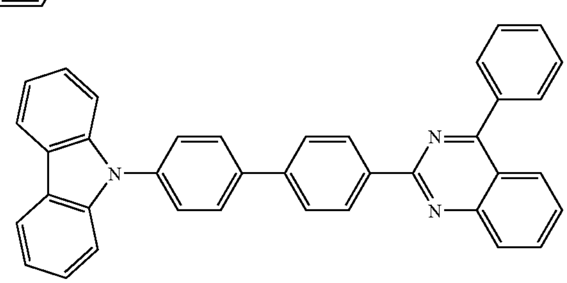

-continued
[Chemical Formula 42]
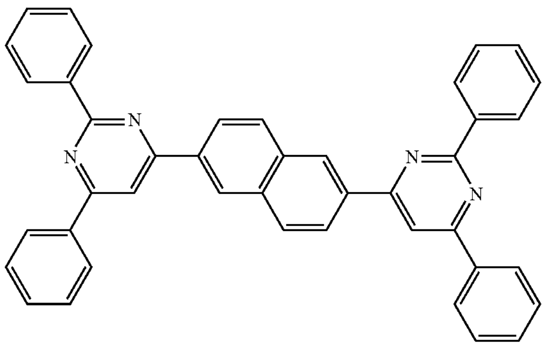
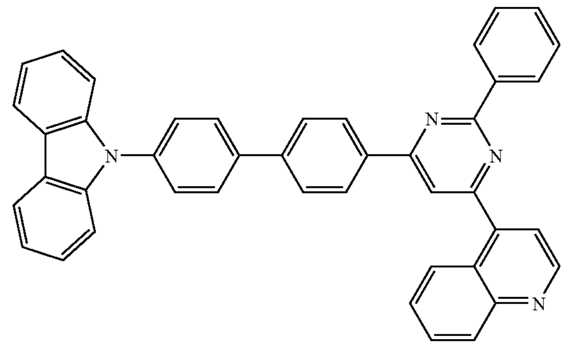
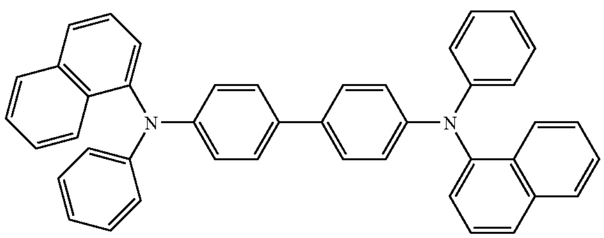
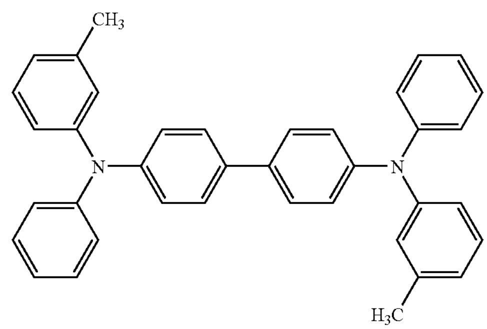
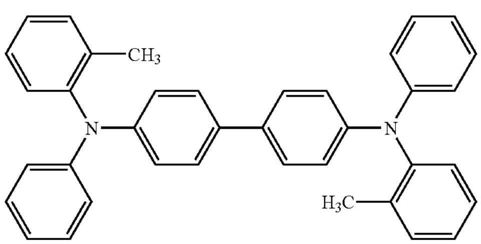
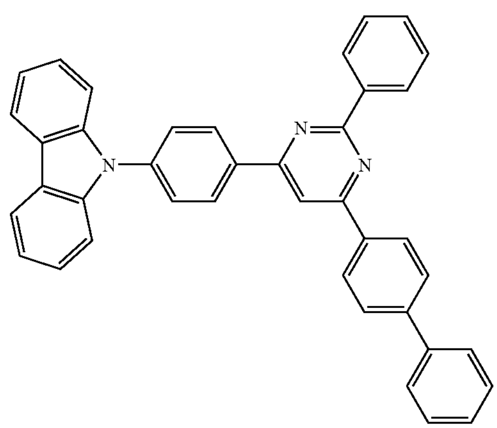
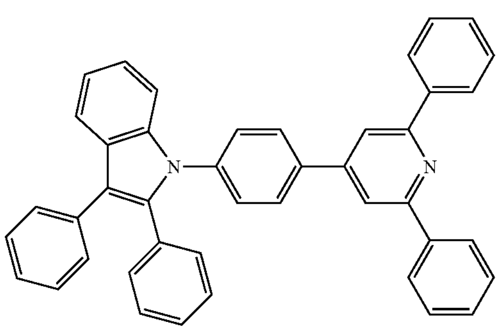
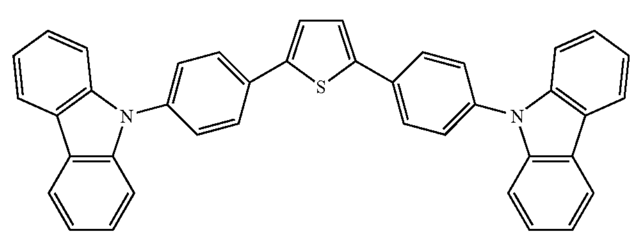

-continued
[Chemical Formula 43]
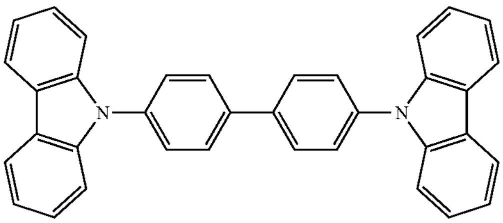
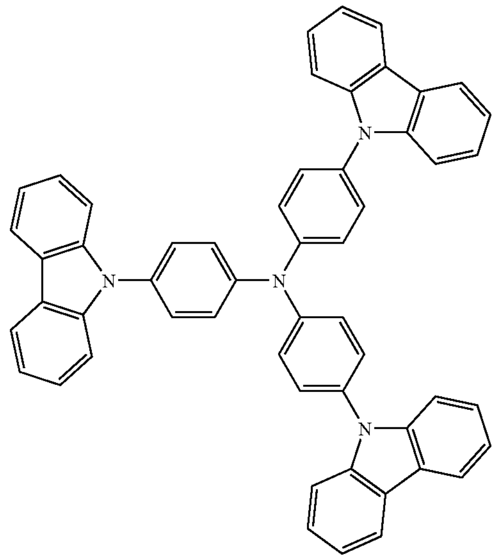
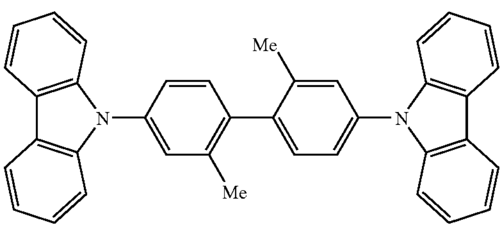
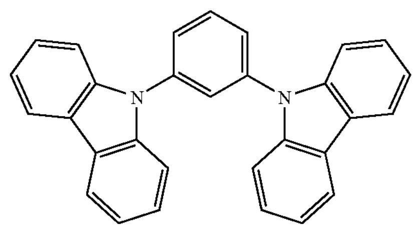
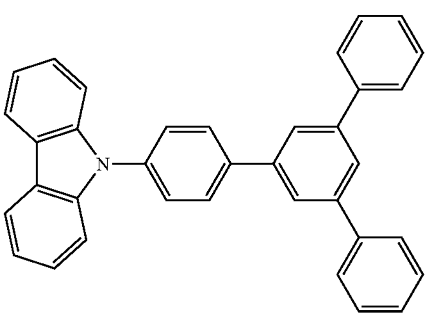
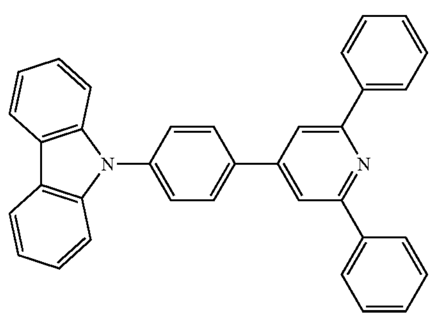
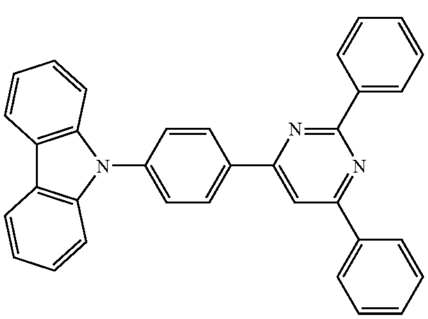
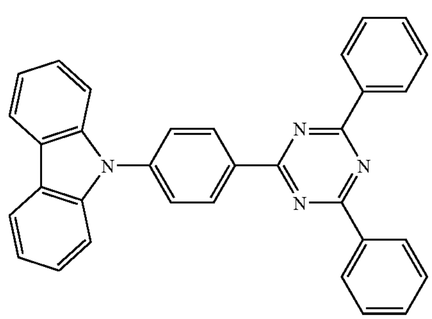

-continued
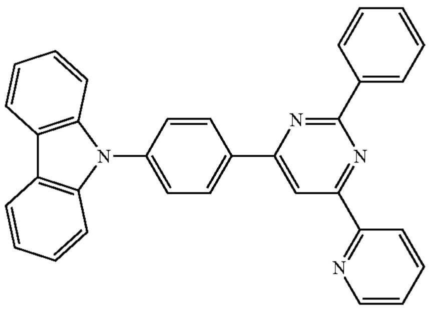
[Chemical Formula 44]
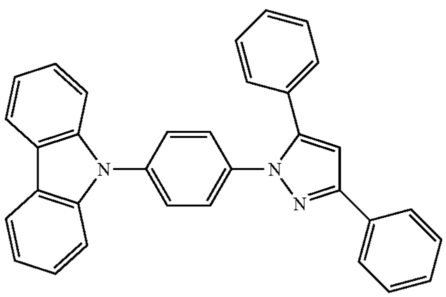
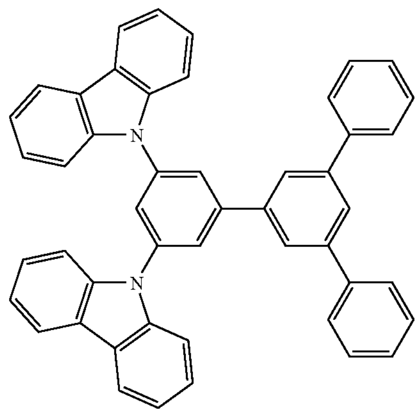
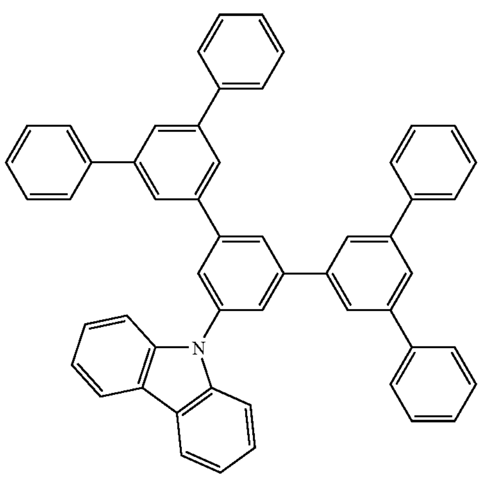
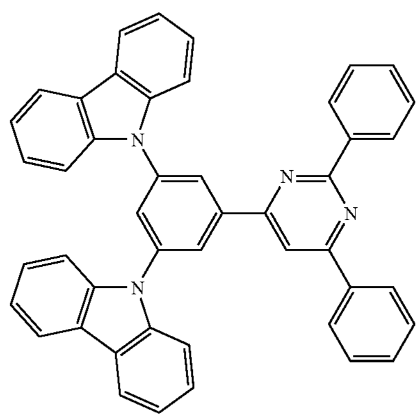
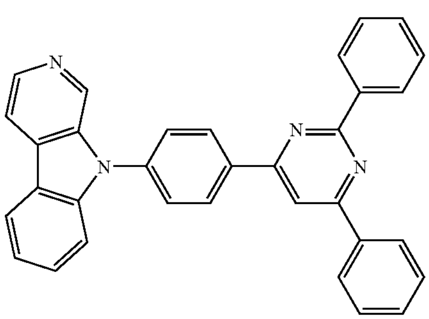
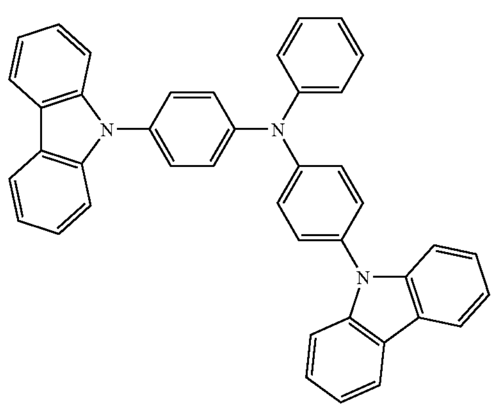

-continued
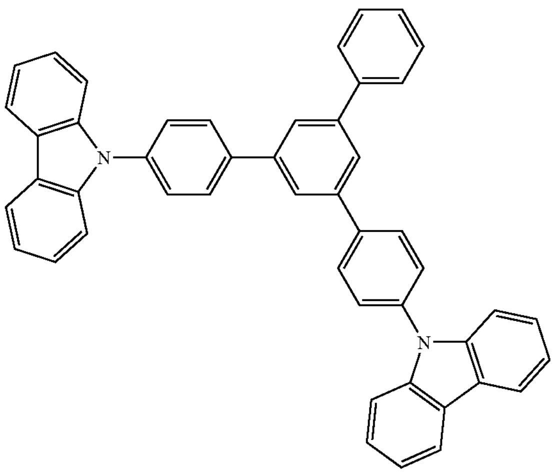
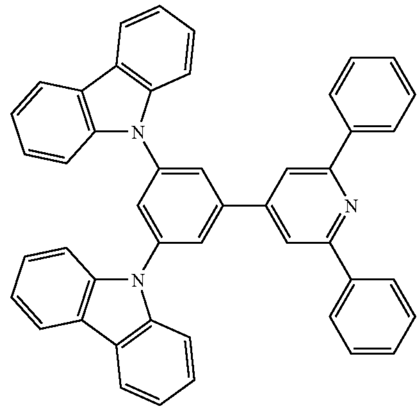
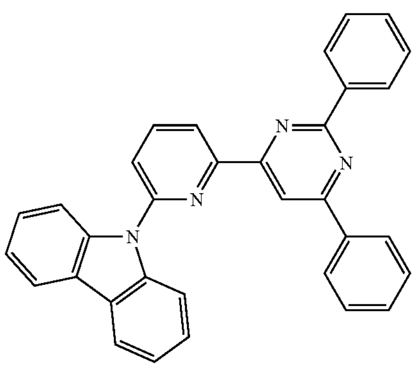
[Chemical Formula 45]
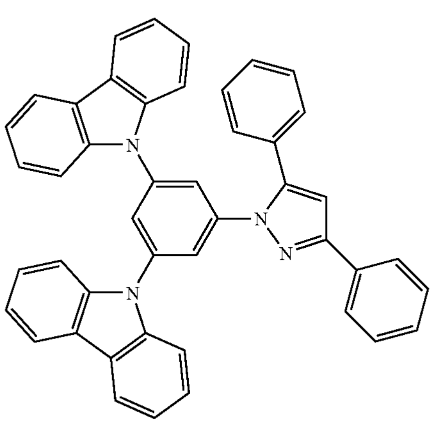
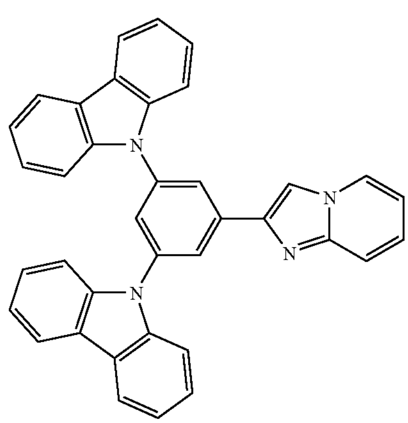

-continued
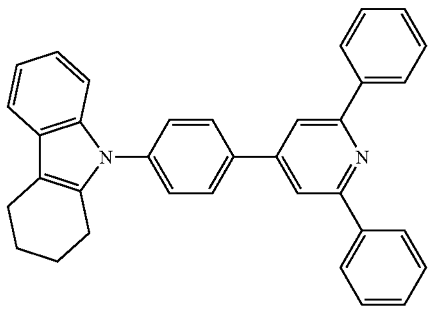
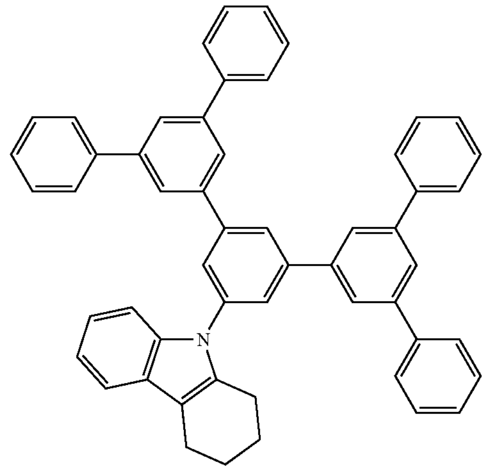
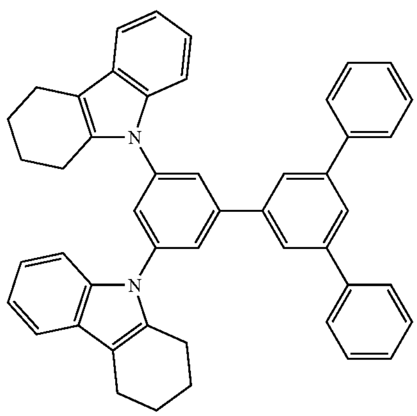
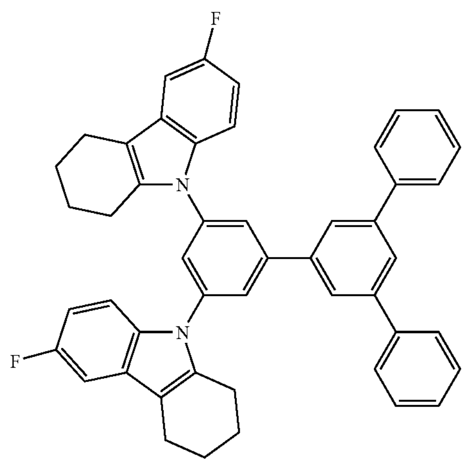
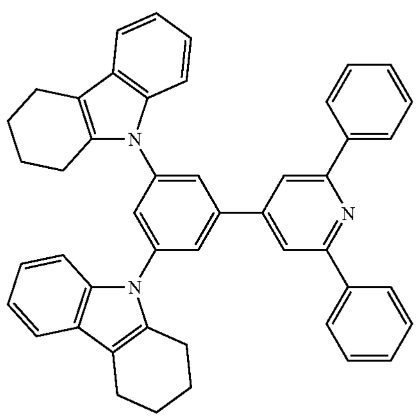
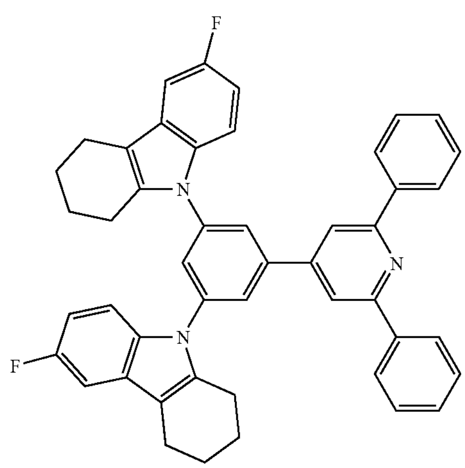
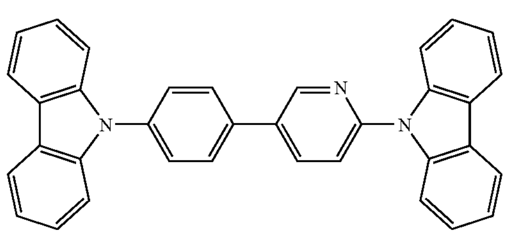

-continued
[Chemical Formula 46]
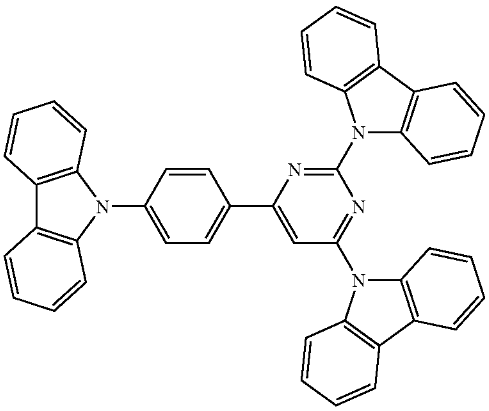
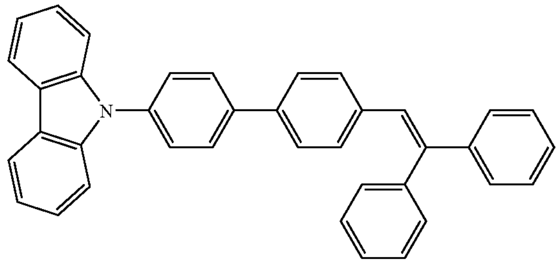
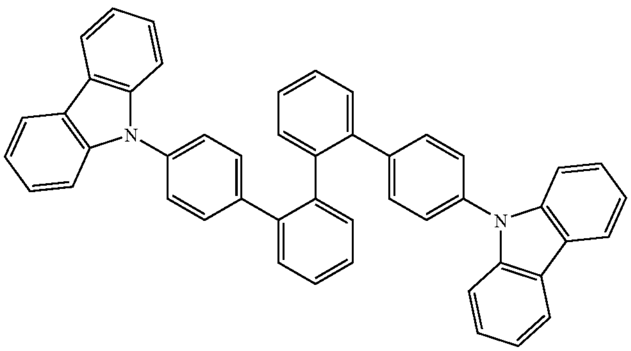
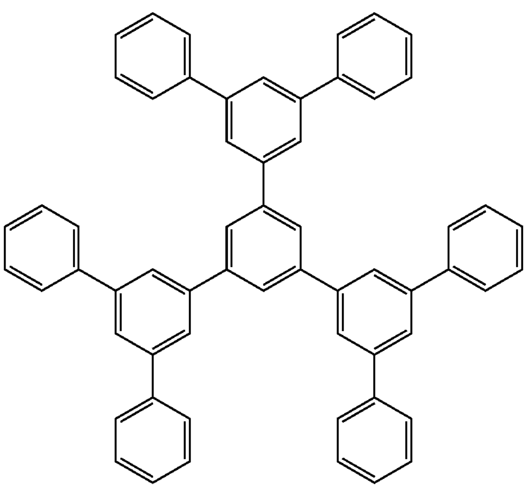
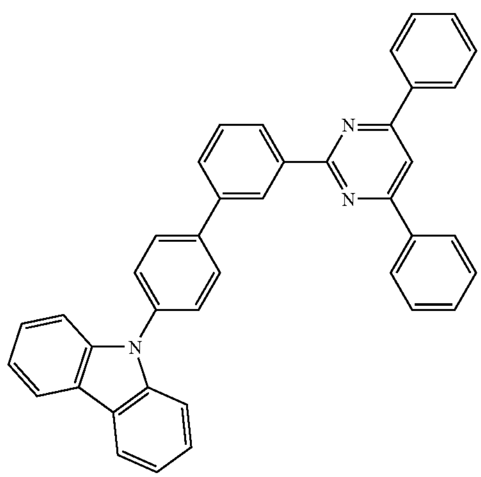
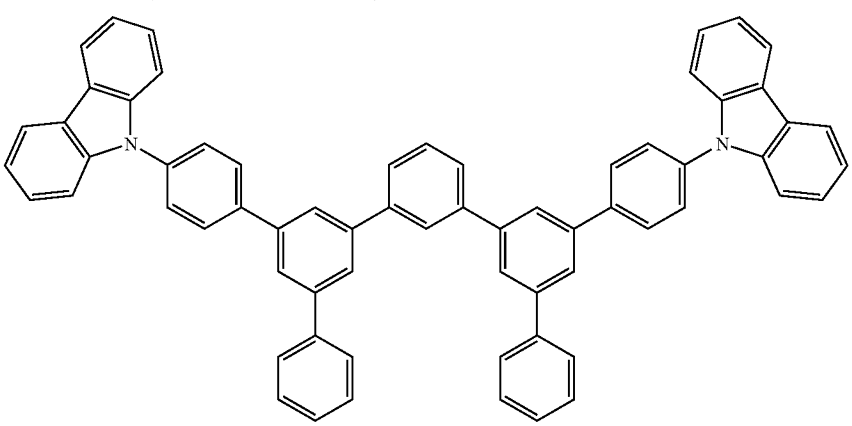

-continued
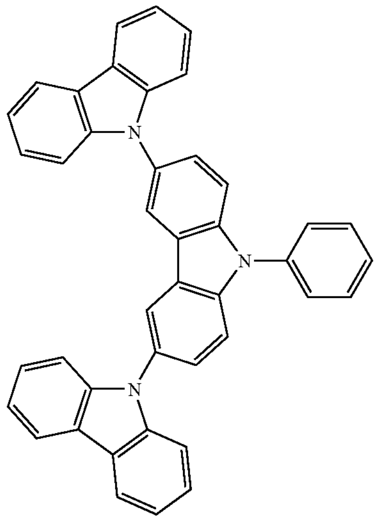
By using the compound represented by the above formula (101) to (105) as the phosphorescent host, the obtained organic EL device can be free from pixel defects and have high luminous efficiency, excellent heat resistance and long lifetime.
Further examples are fluorene compounds shown below.
[Chemical Formula 47]
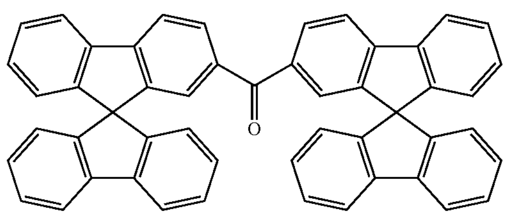
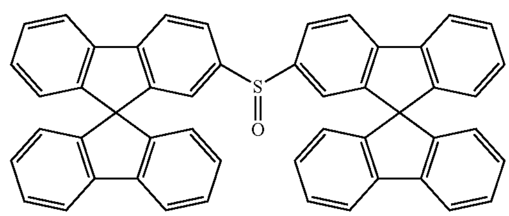
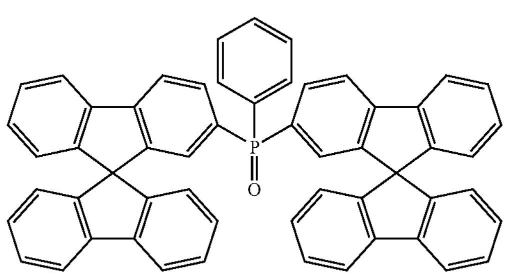
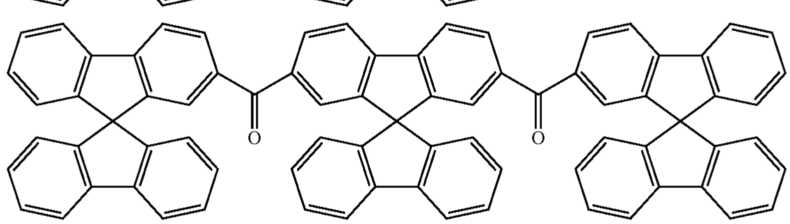

Preferably in the aspect of the invention, the phosphorescent dopant contains a metal complex formed of: a metal selected from Ir, Pt, Os, Au, Cu, Re and Ru; and a ligand.

Examples of the phosphorescent dopant are PQIr (iridium (III)bis(2-phenyl quinolyl-N,C$^{2'}$) acetylacetonate) and Ir(ppy)$_3$ (fac-tris(2-phenylpyridine) iridium). Further examples are compounds shown below.

[Chemical Formula 48]

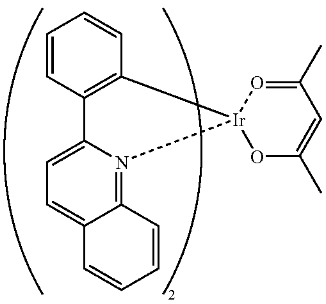

PQIr

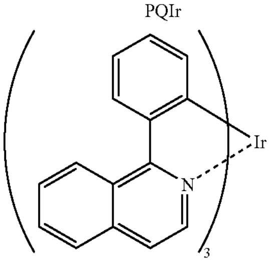

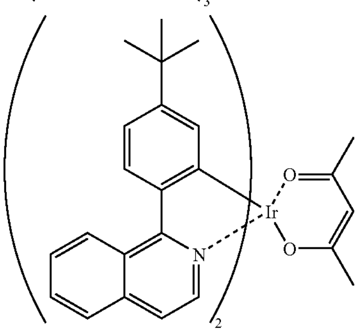

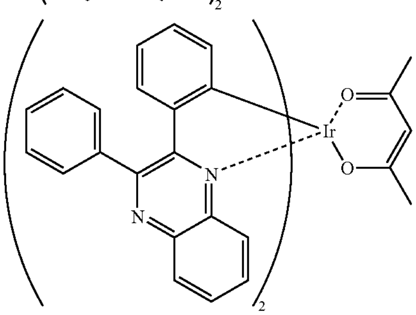

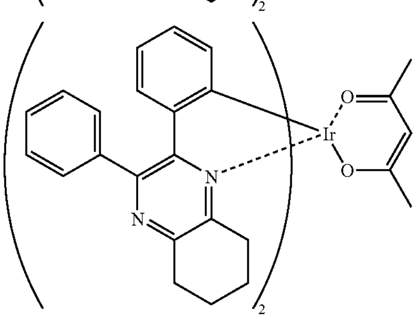

-continued

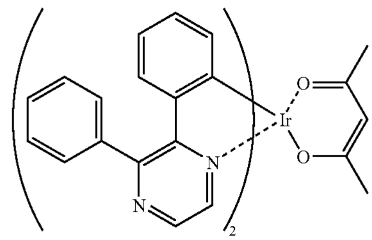

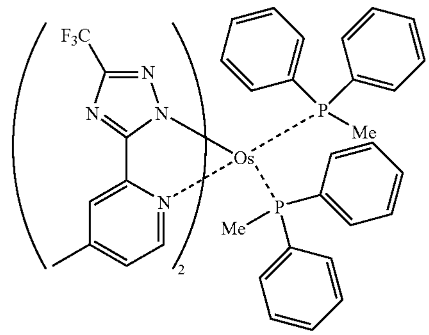

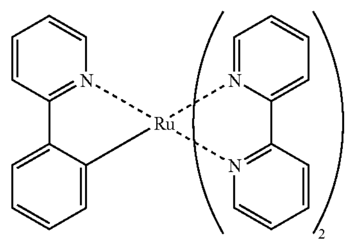

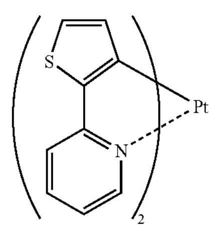

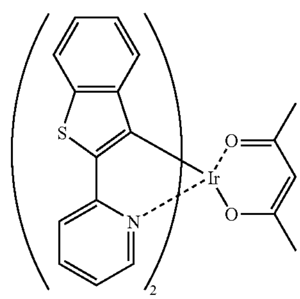

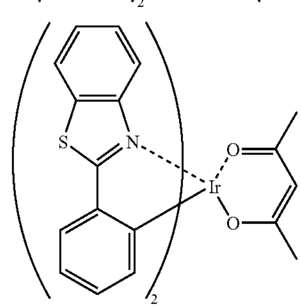

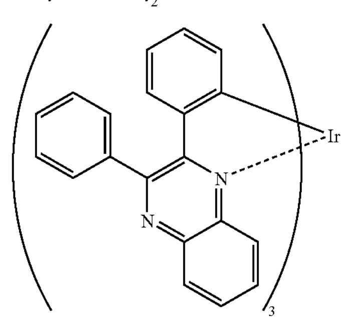

-continued
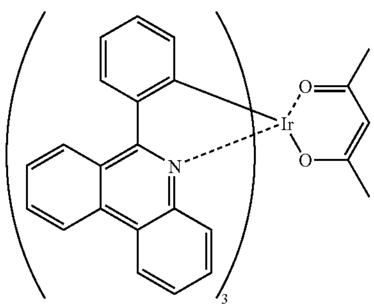
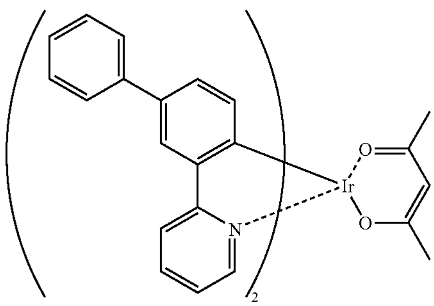
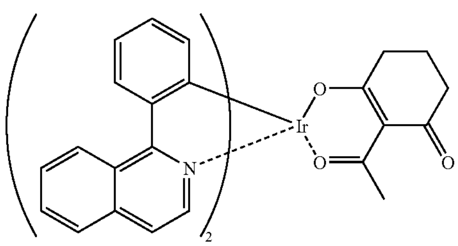
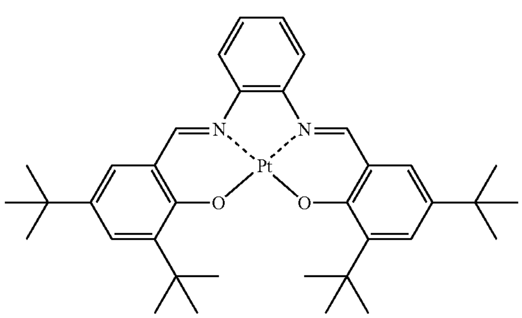
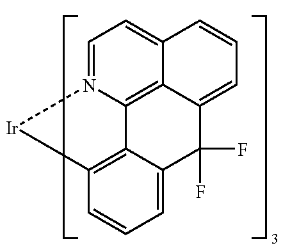
-continued
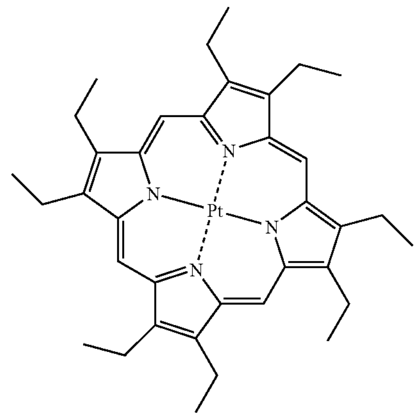
[Chemical Formula 49]
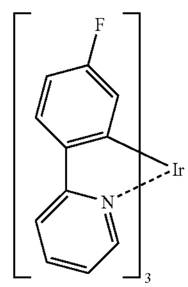
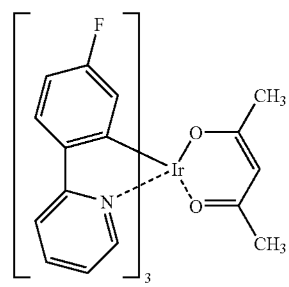
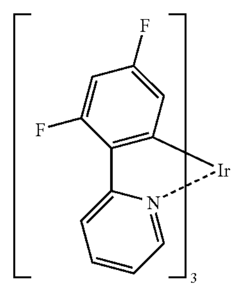
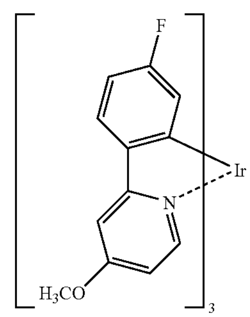
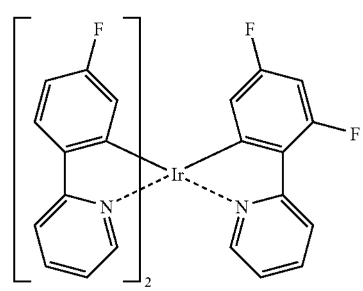
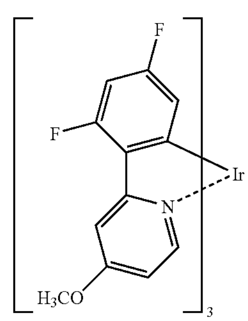

-continued
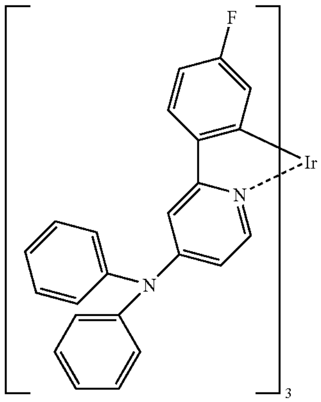
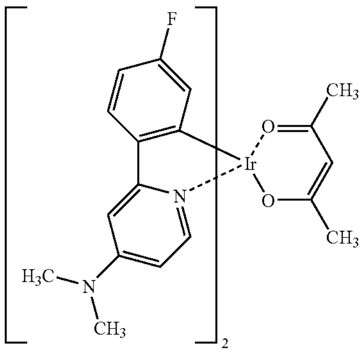
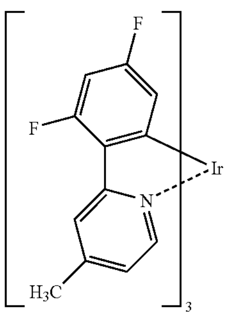
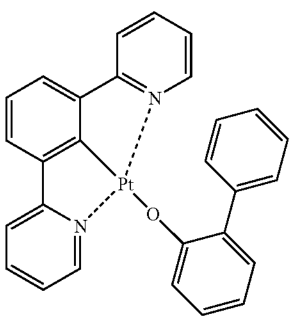
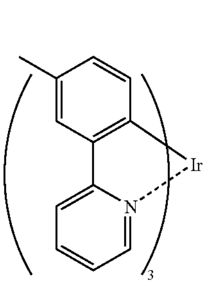
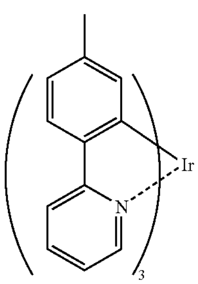
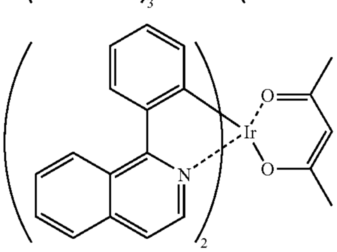
-continued
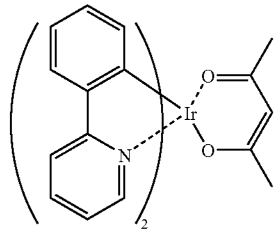
[Chemical Formula 50]
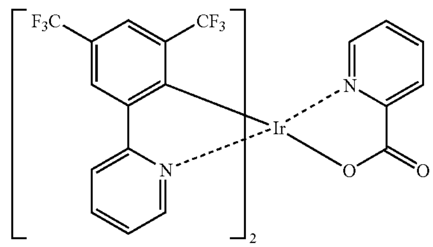
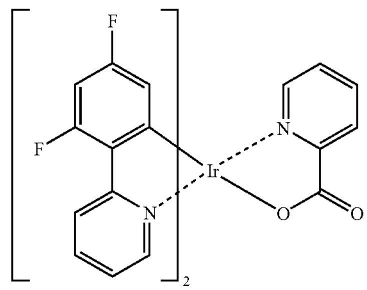
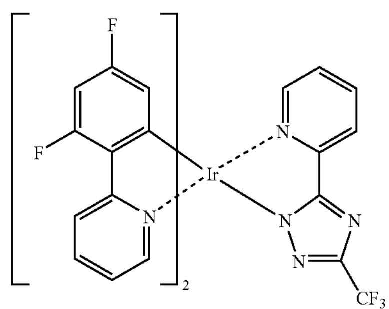
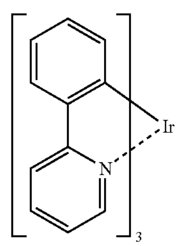
Ir(ppy)$_3$
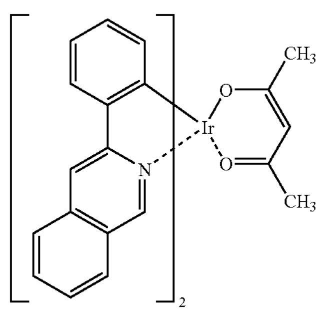
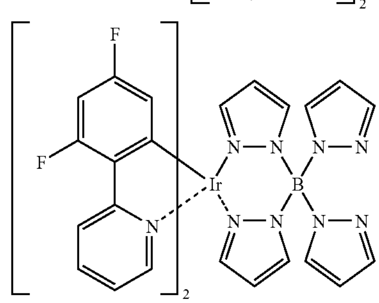

-continued
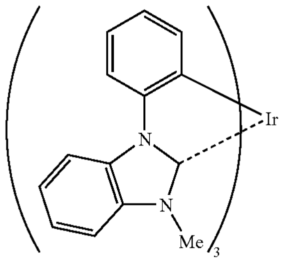
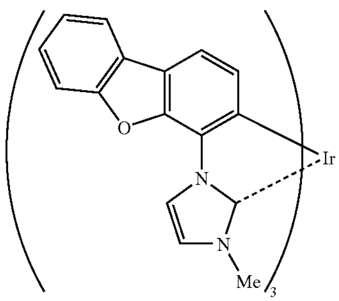
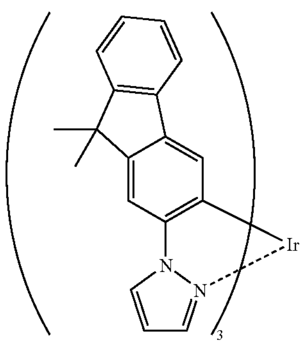
[Chemical Formula 51]
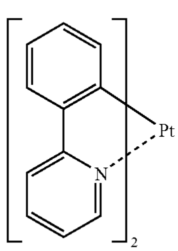
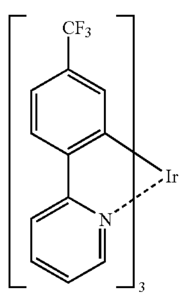
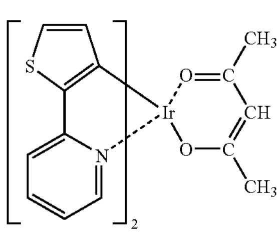
-continued
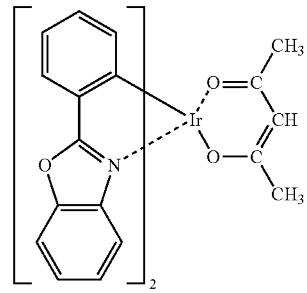
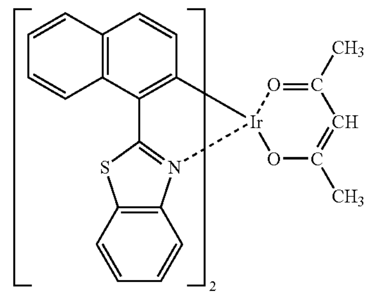
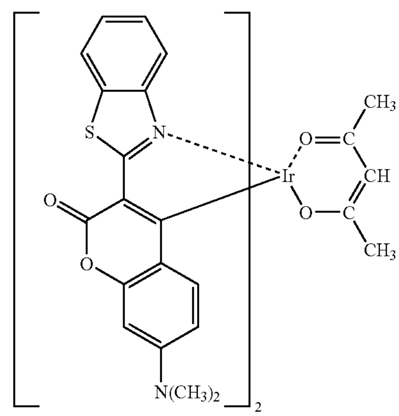
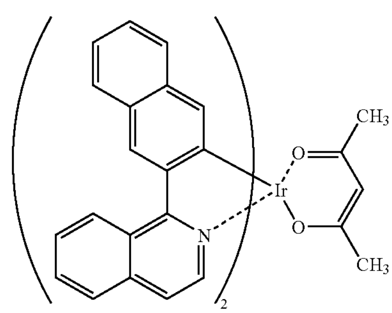
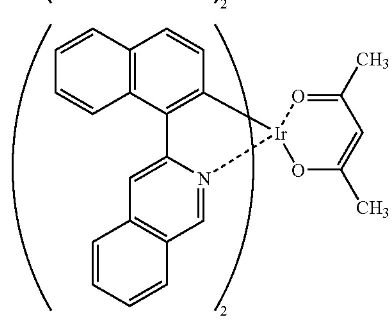

-continued

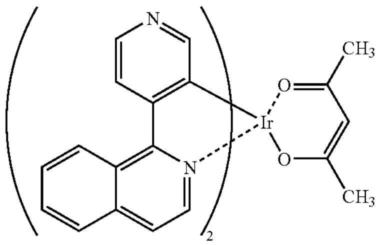

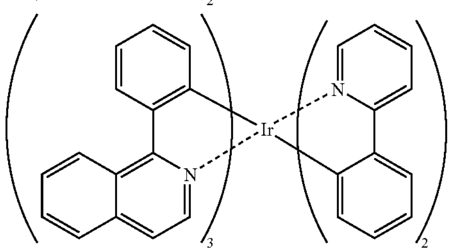

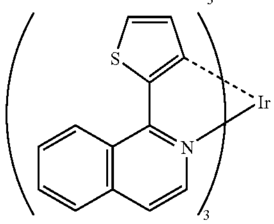

In the organic EL device according to the aspect of the invention, the fluorescent dopant is preferably an amine compound represented by the following formula (4).

[Chemical Formula 52]

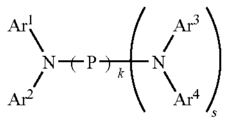

(4)

In the formula, P represents a substituted or unsubstituted aromatic hydrocarbon group having 6 to 40 ring carbon atoms, a substituted or unsubstituted heterocyclic group having 3 to 40 ring atoms, or a substituted or unsubstituted styryl group. k is an integer of 1 to 3.

$Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms. s is an integer of 0 to 4.

An adjacent set of substituents for suitably-selected two of $Ar^1$, $Ar^2$ and P may be bonded together to form a ring. When k is 2 or more, P may be mutually the same or different.

With such a structure, the organic EL device has excellent heat resistance and long lifetime, and blue fluorescent emission is obtainable at high luminous efficiency.

Examples of the aromatic hydrocarbon group and the heterocyclic group represented by P are respectively a substituted or unsubstituted aromatic hydrocarbon group having 6 to 40 ring carbon atoms and a substituted or unsubstituted heterocyclic group having 3 to 40 ring atoms, such as residues of benzene, biphenyl, terphenyl, naphthalene, phenanthrene, fluoranthene, anthracene, pyrene, perylene, coronene, chrysene, picene, dinaphthyl, trinaphthyl, phenylanthracene, diphenylanthracene, florene, triphenylene, rubicene, benzanthracene, dibenzanthracene, acenaphthofluoranthene, tribenzopentaphene, fluoranthenofluoranthene, benzodifluoranthene, benzofluoranthene and diindenoperylene. In particular, residues of naphthalene, phenanthrene, fluoranthene, anthracene, pyrene, perylene, chrysene, phenylanthracene and diphenylanthracene, and residues of combination of two or more thereof are preferable.

In the formula (4), $Ar^1$ to $Ar^4$ each independently represents a substituted or unsubstituted aromatic hydrocarbon group having 6 to 40 ring carbon atoms or a substituted or unsubstituted heterocyclic group having 3 to 40 ring atoms. s is an integer of 0 to 4.

Examples of the aromatic hydrocarbon group represented by $Ar^1$ to $Ar^4$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the heterocyclic group represented by $Ar^1$ to $Ar^4$ are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-9-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

As examples of the amine compound represented by the formula (4), fused aromatic amine, styryl amine, benzidine and the like are shown below, but the invention is not limited thereto. Me represents a methyl group.

[Chemical Formula 53]

(A)-1

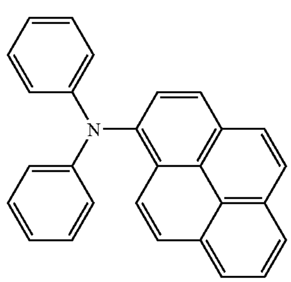

(A)-2

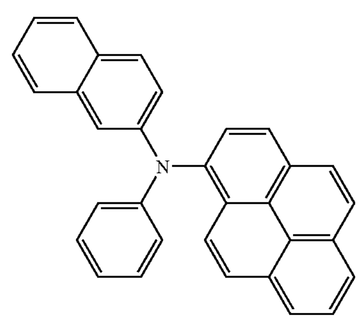

(A)-3

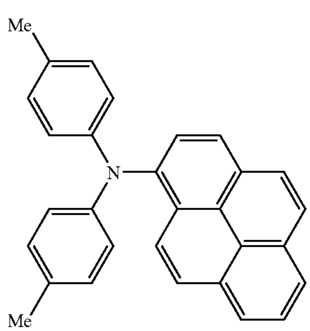

(A)-4

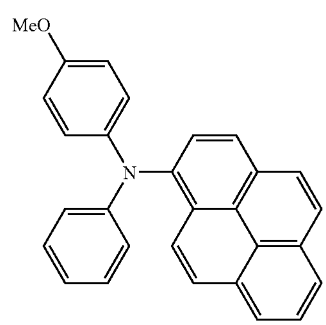

(A)-5

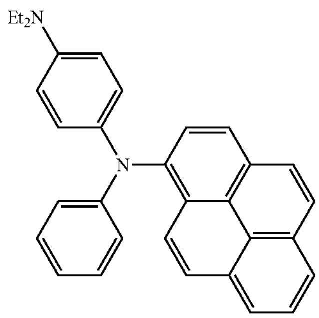

(A)-6

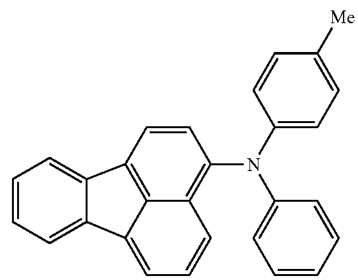

-continued
(A)-7
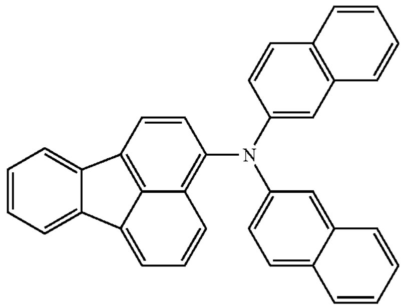
(A)-8
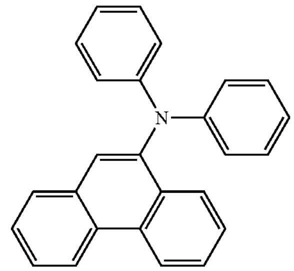
(A)-9
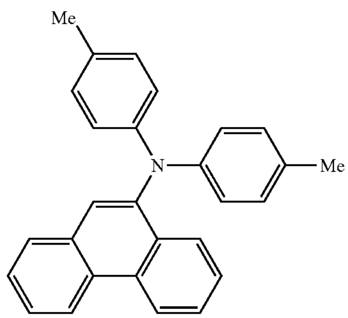
(A)-10
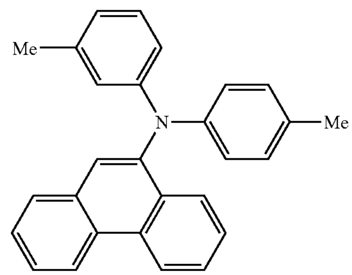
(A)-11
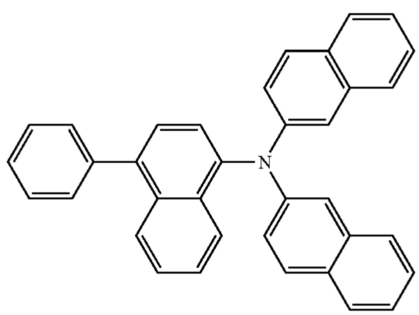
(A)-12
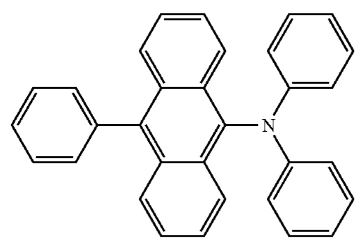
(A)-13
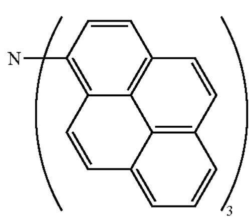
(A)-14
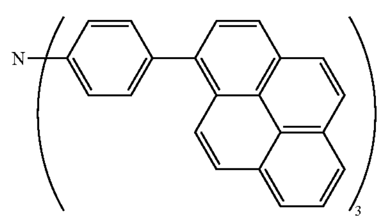
(A)-15
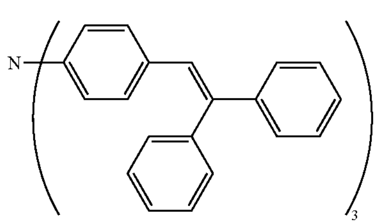

-continued
[Chemical Formula 54]
(A)-16
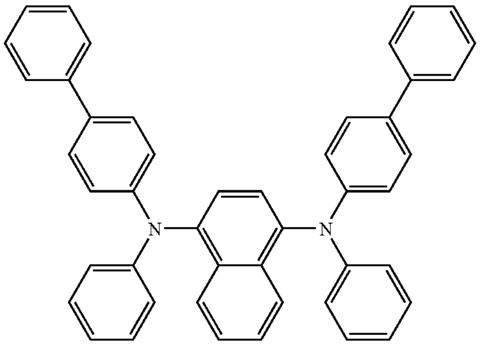
(A)-17
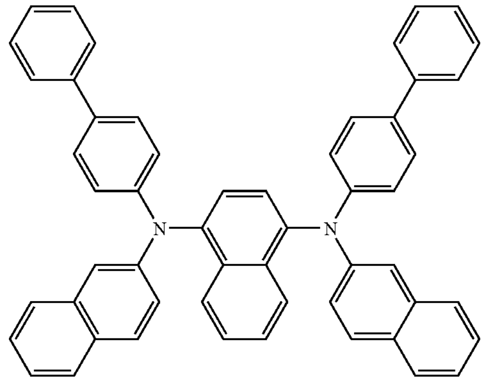
(A)-18
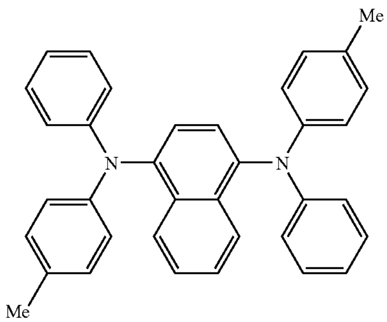
(A)-19
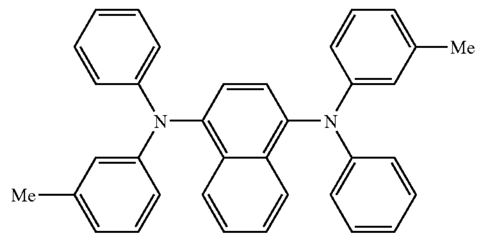
(A)-20
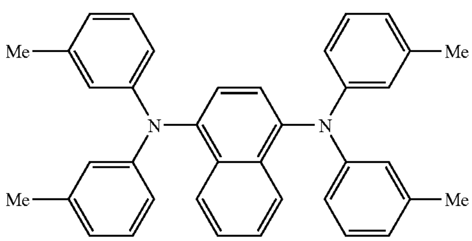
(A)-21
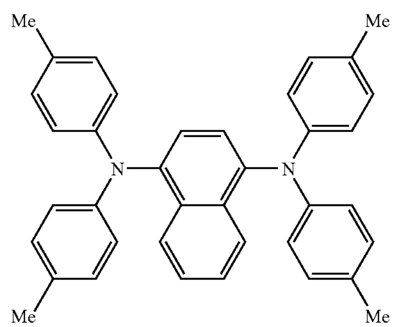
(A)-22
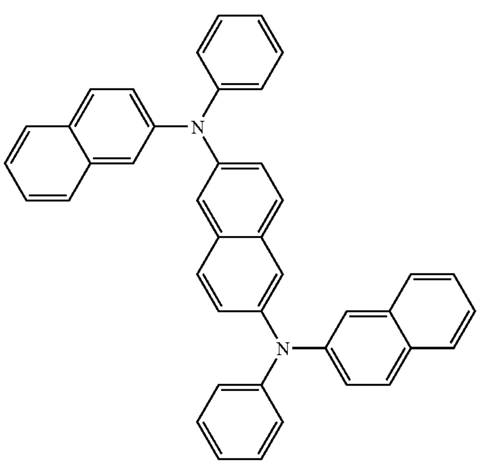
(A)-23
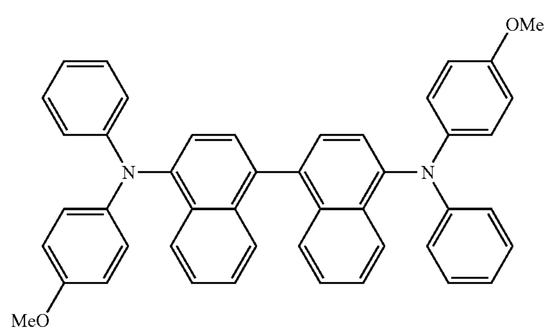

-continued
(A)-24
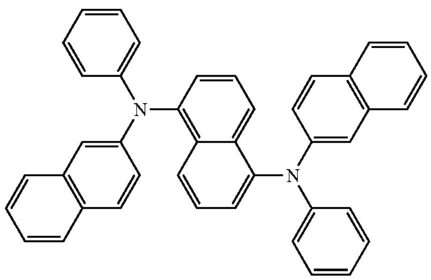
(A)-25
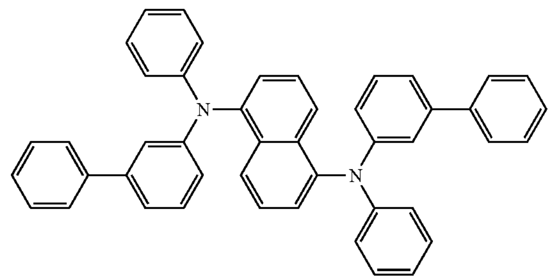
(A)-26
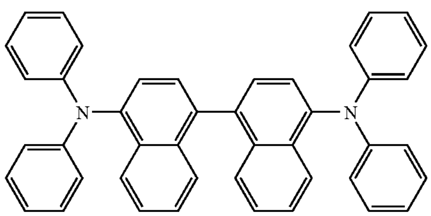
(A)-27
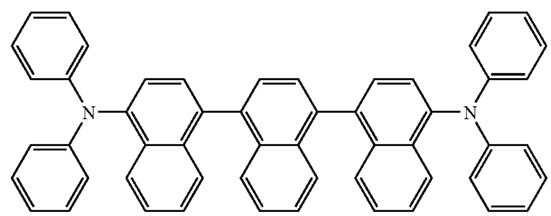
[Chemical Formula 55]
(A)-28
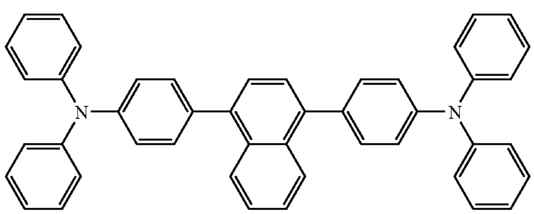
(A)-29
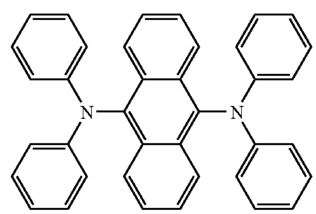
(A)-30
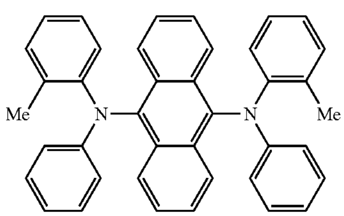
(A)-31
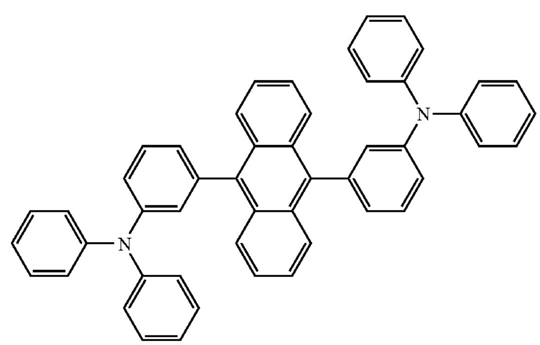
(A)-32
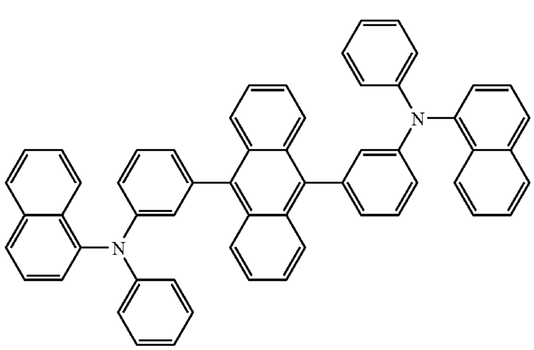
(A)-33
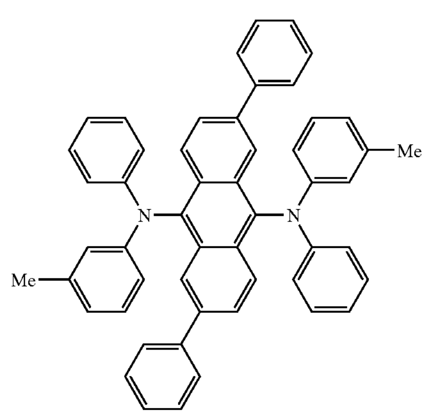

-continued
(A)-34
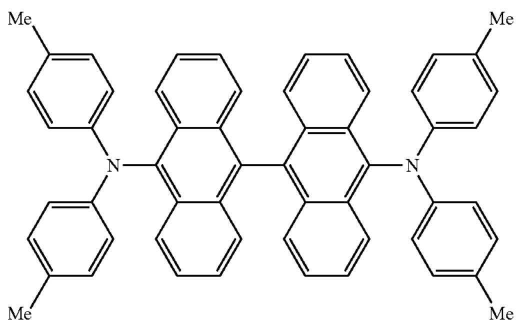
(A)-35
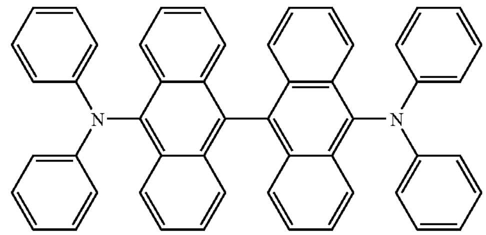
(A)-36
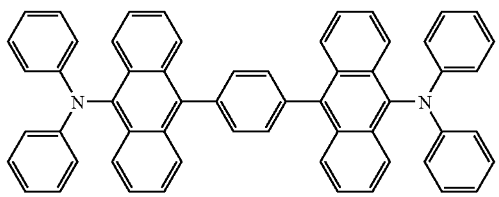
(A)-37
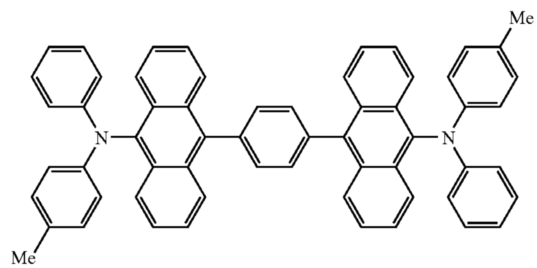
(A)-38
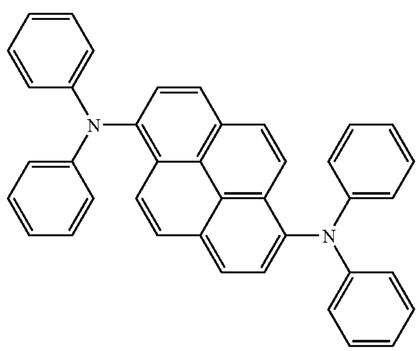
(A)-39
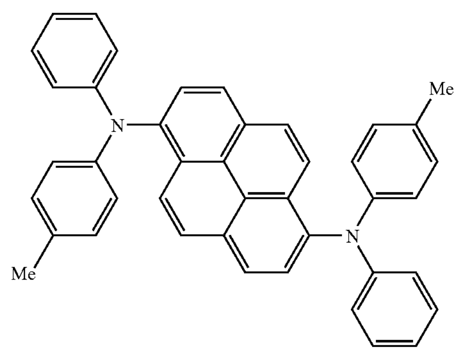
[Chemical Formula 56]
(A)-40
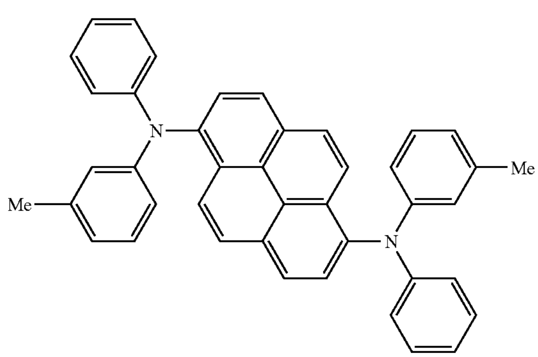
(A)-41
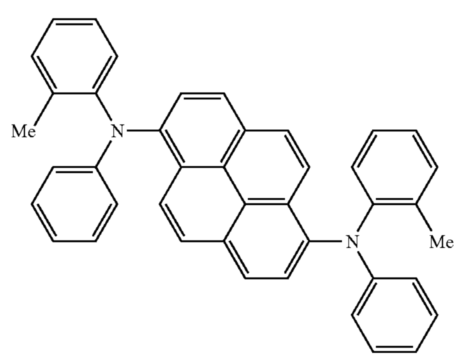

-continued
(A)-42
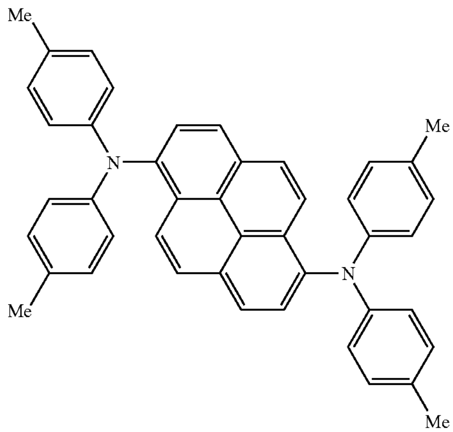
(A)-43
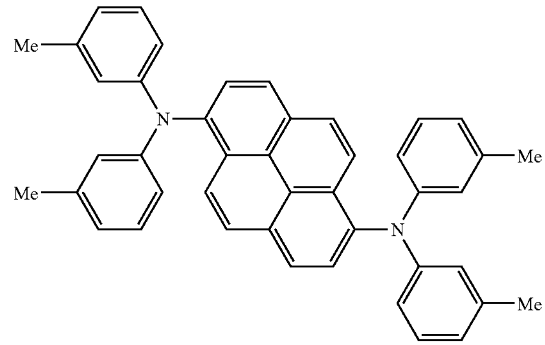
(A)-44
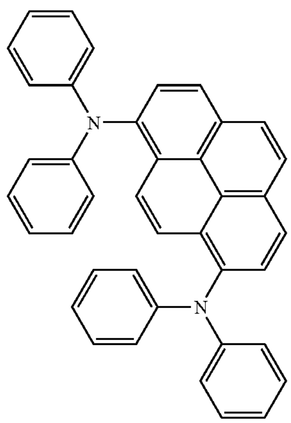
(A)-45
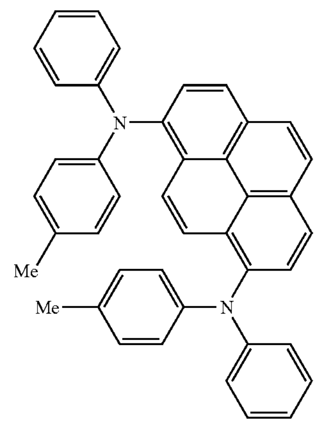
(A)-46
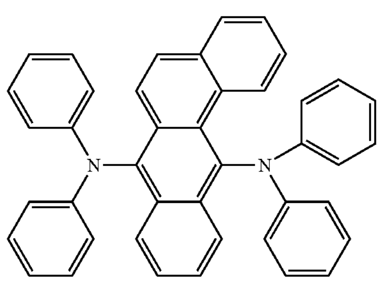
(A)-47
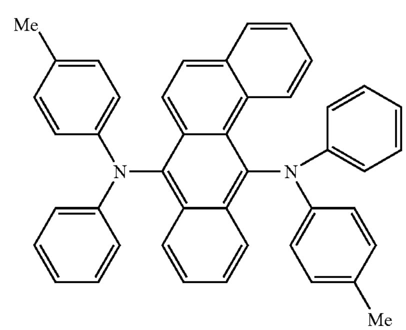
(A)-48
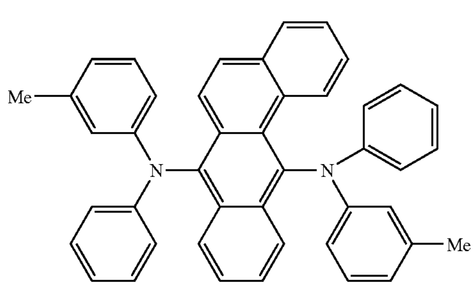
(A)-49
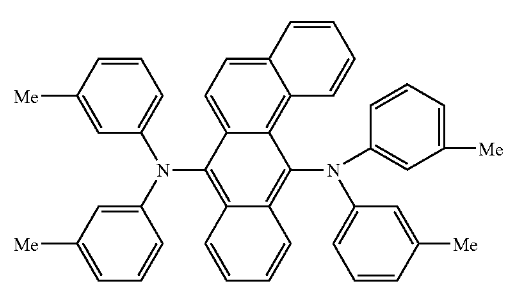

-continued
(A)-50
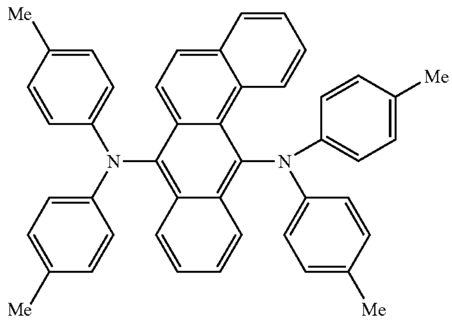
(A)-51
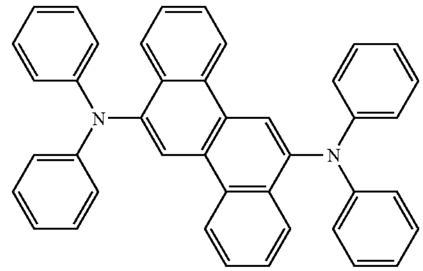
(A)-52
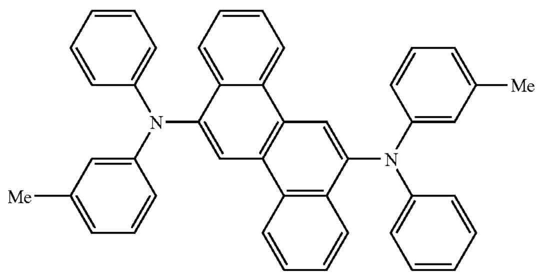
[Chemical Formula 57]
(A)-53
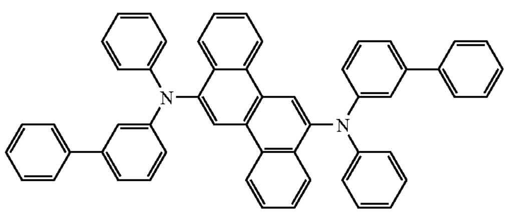
(A)-54
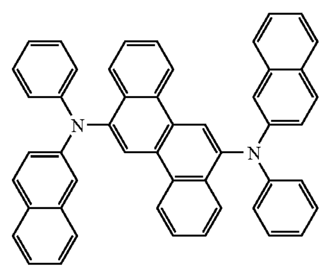
(A)-55
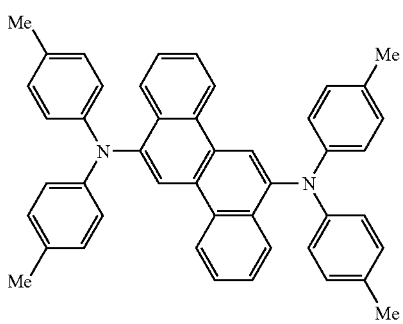
(A)-56
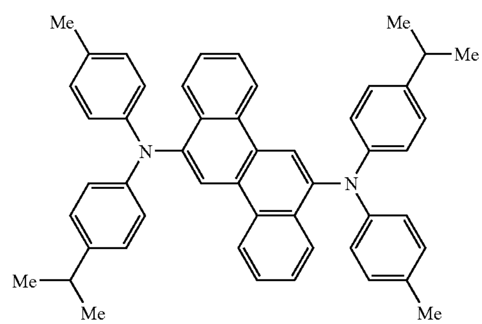
(A)-57
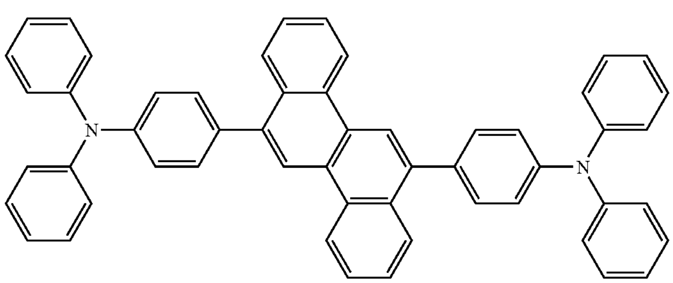

-continued
(A)-58
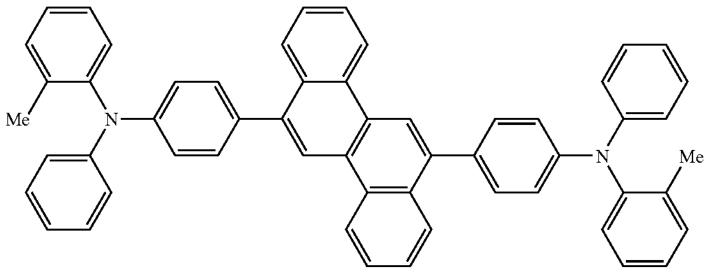
(A)-59
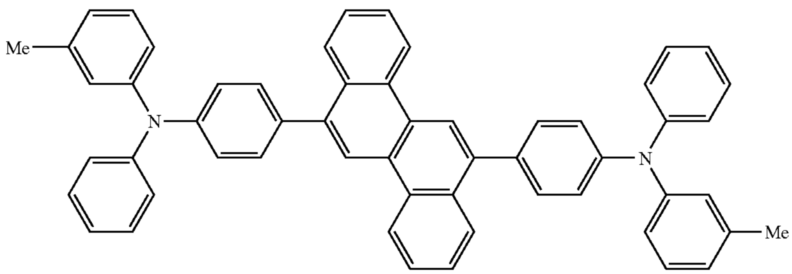
(A)-60
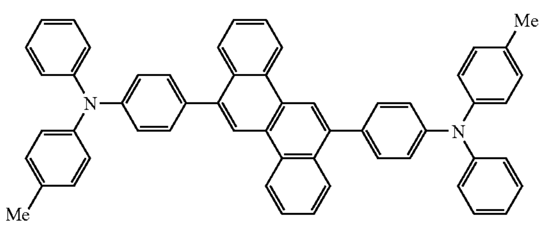
(A)-61
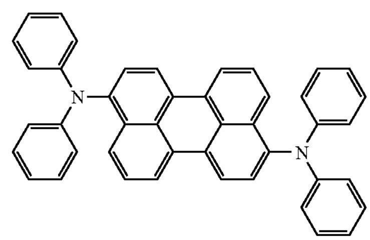
(A)-62
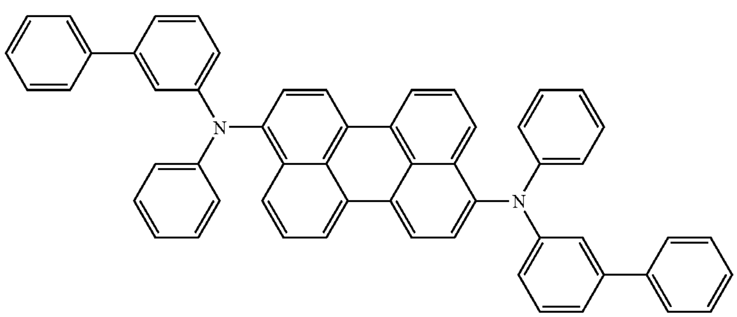
(A)-63
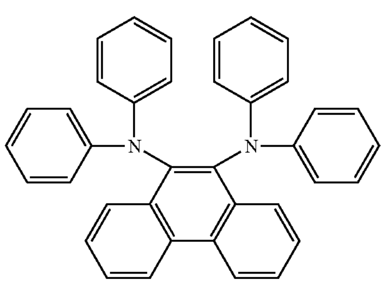
(A)-64
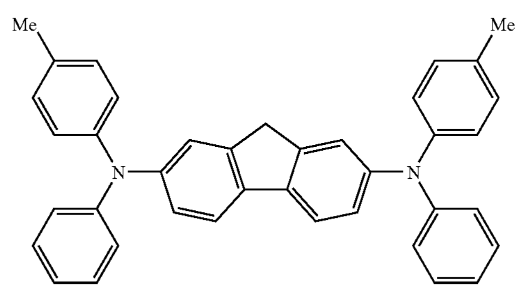

-continued
(A)-65
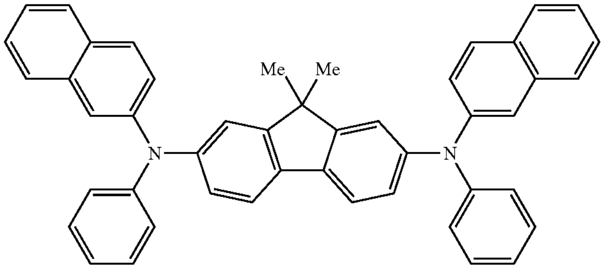
[Chemical Formula 58]
(A)-66
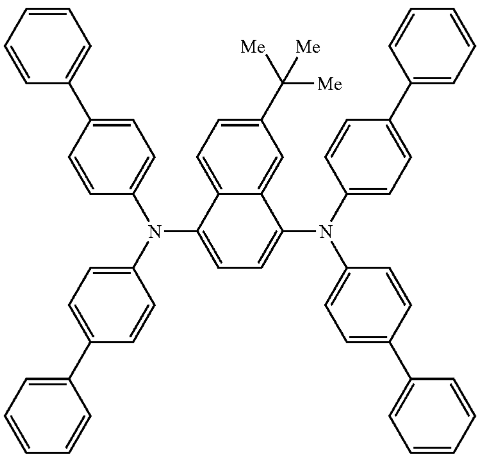
(A)-67
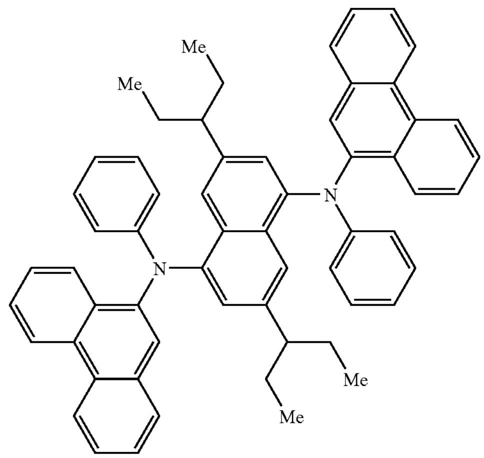
(A)-68
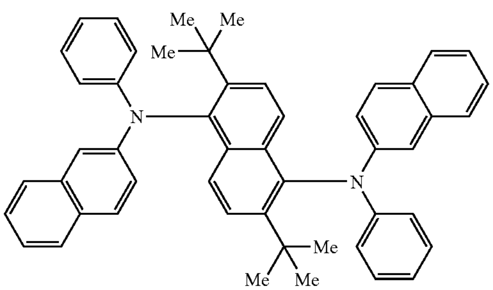
(A)-69
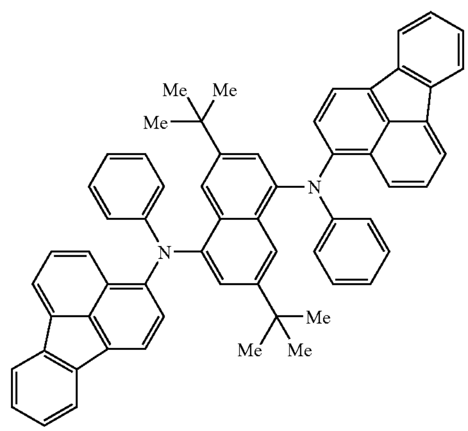
(A)-70
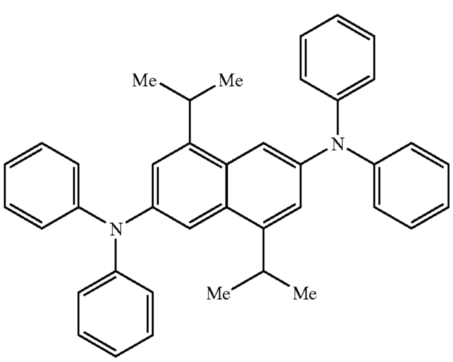
(A)-71
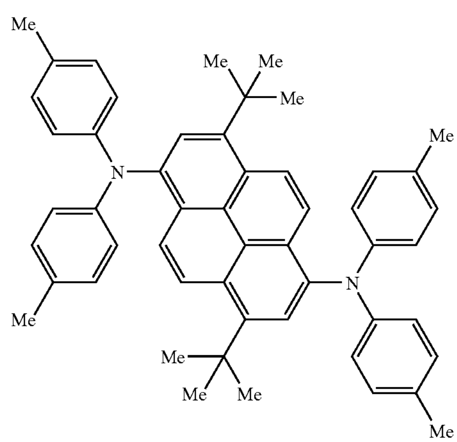

-continued
(A)-72
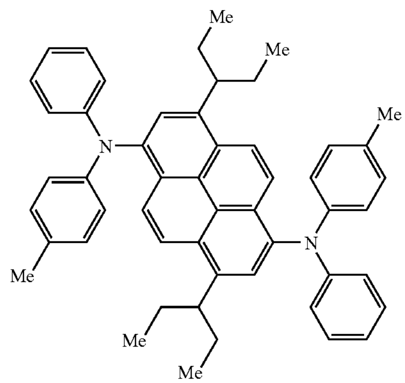
(A)-73
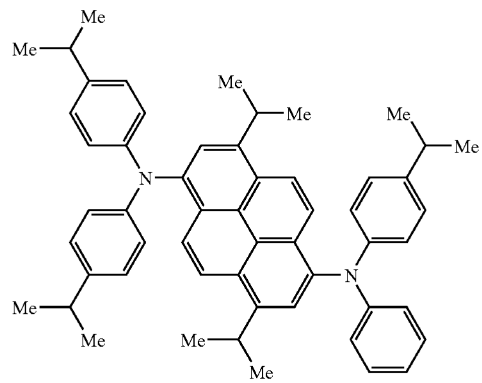
(A)-74
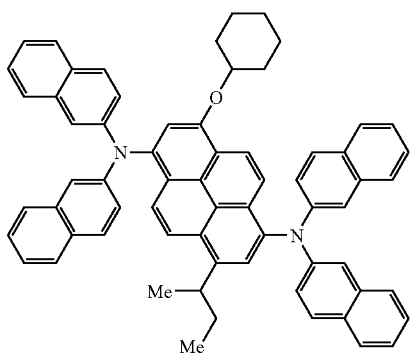
(A)-75
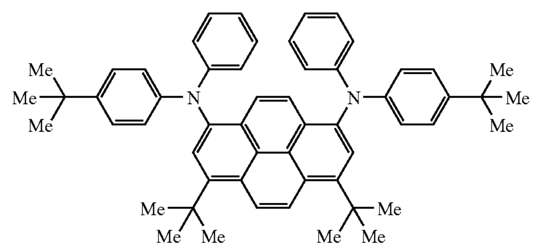
(A)-76
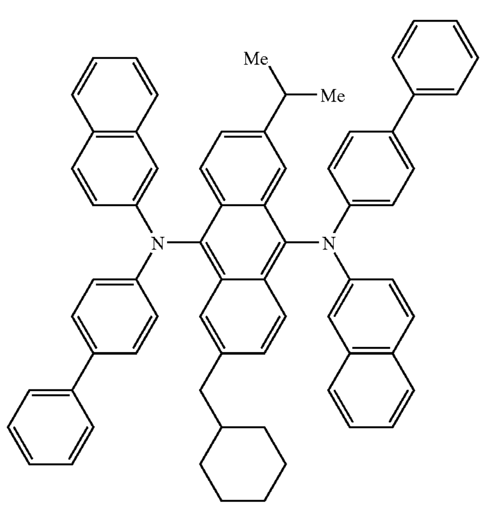
(A)-77
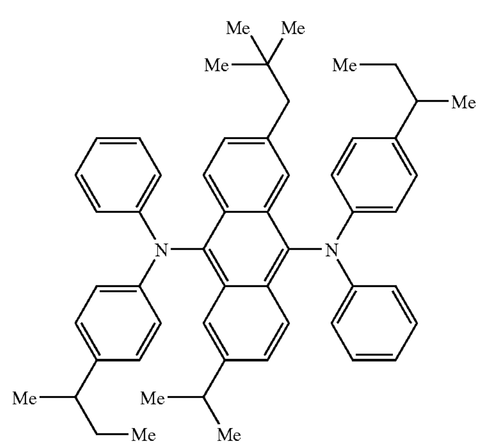

-continued
[Chemical Formula 59]
(A)-78
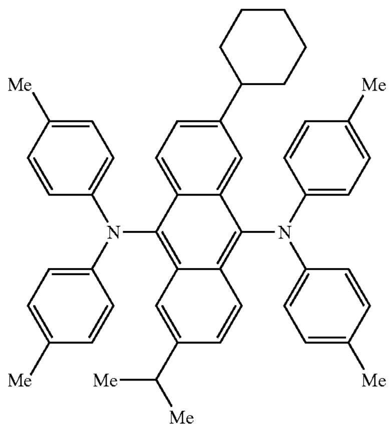
(A)-79
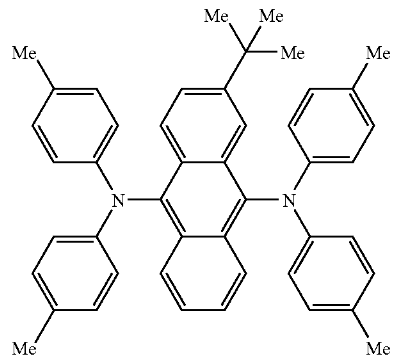
(A)-80
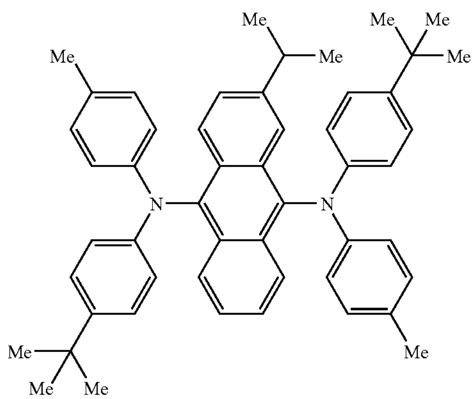
(A)-81
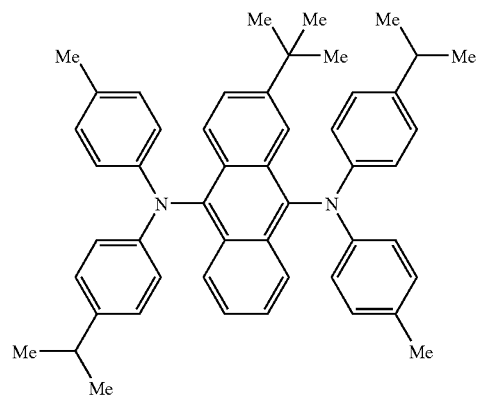
(A)-82
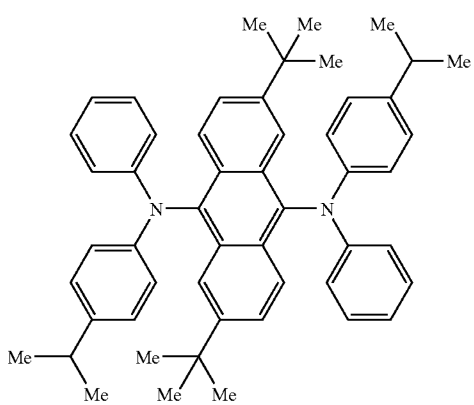
(A)-83
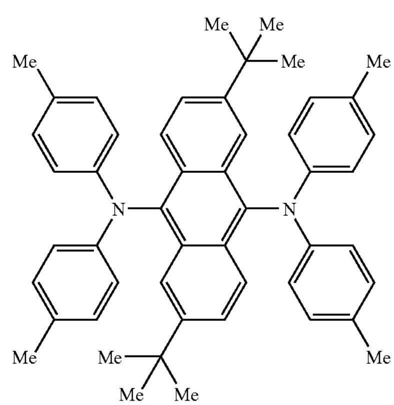

-continued
(A)-84
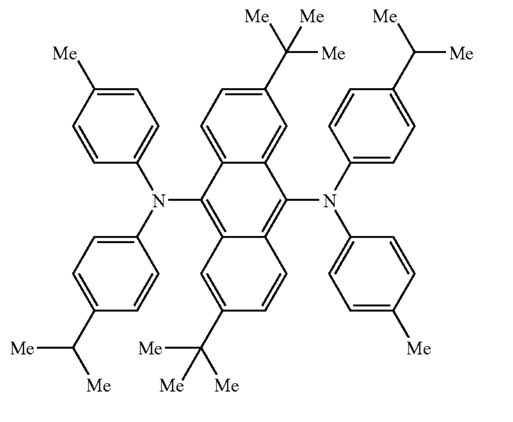
(A)-85
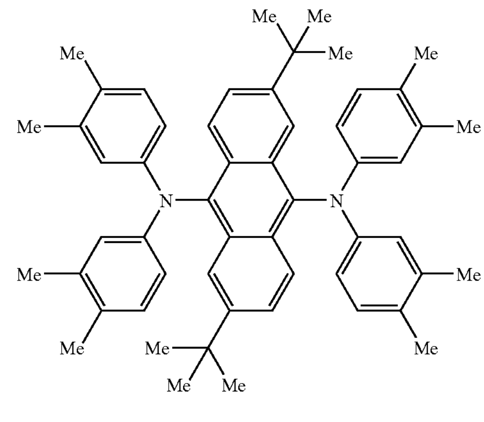
(A)-86
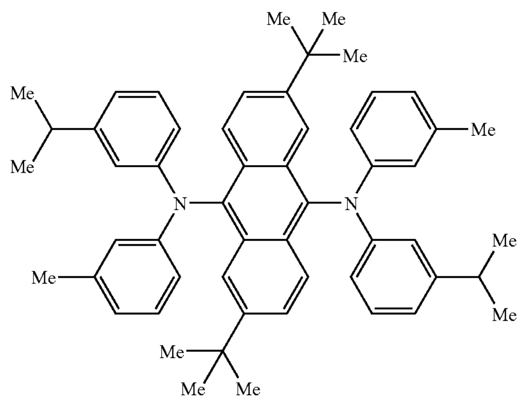
(A)-87
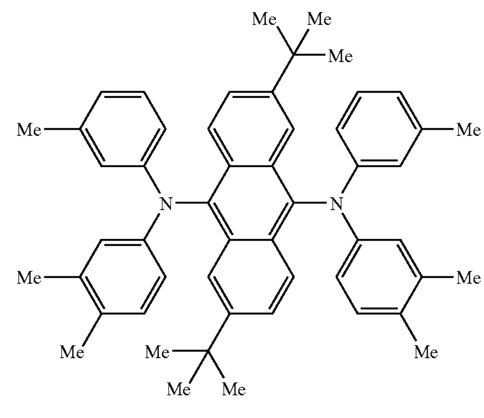
(A)-88
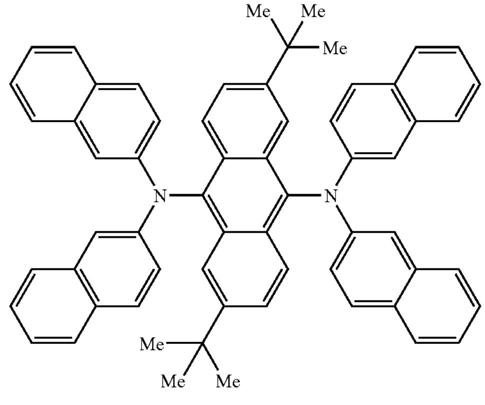
(A)-89
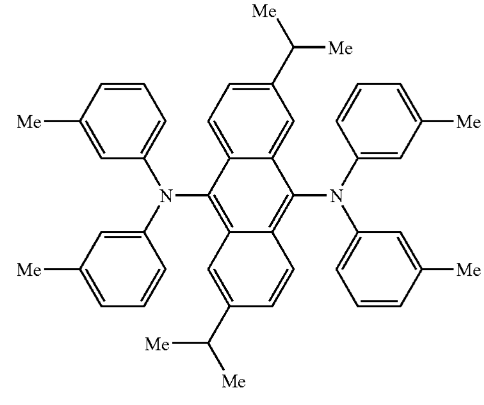

-continued
[Chemical Formula 60]
(A)-90
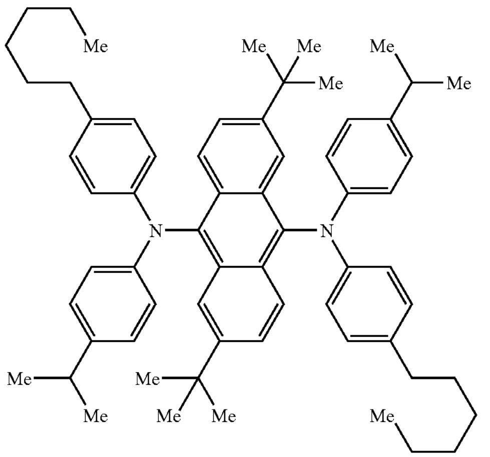
(A)-91
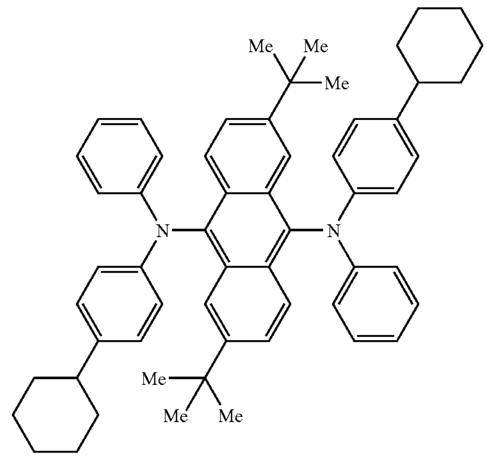
(A)-92
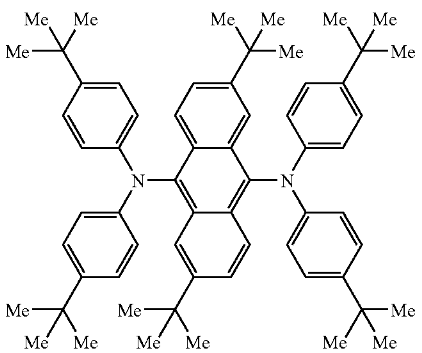
(A)-93
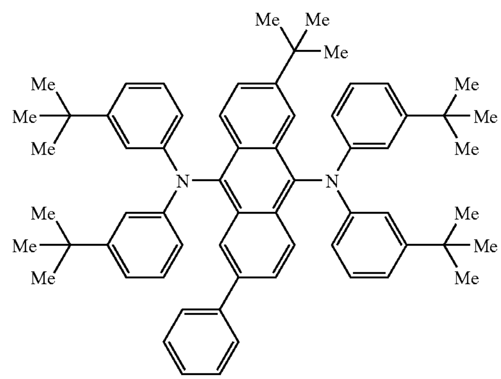
(A)-94
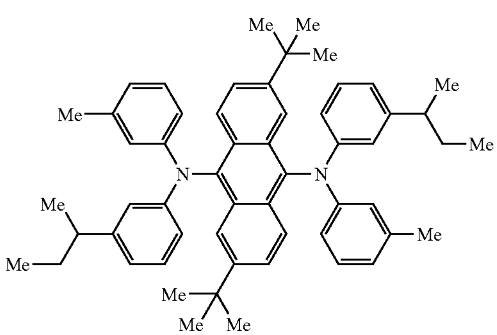
(A)-95
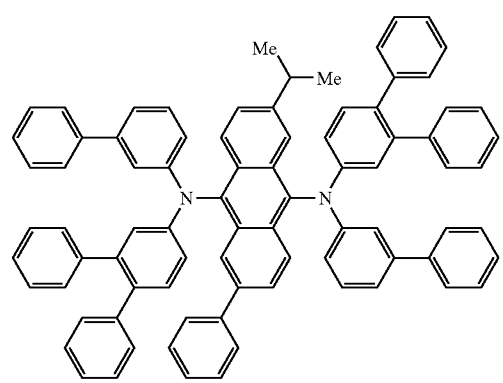
(A)-96
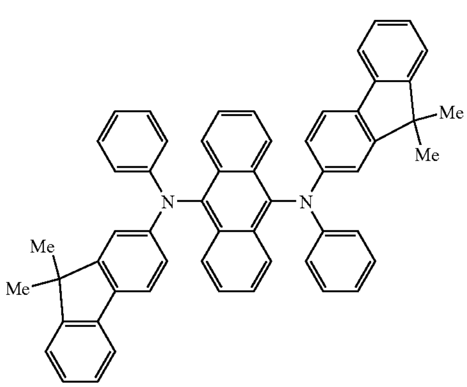
(A)-97
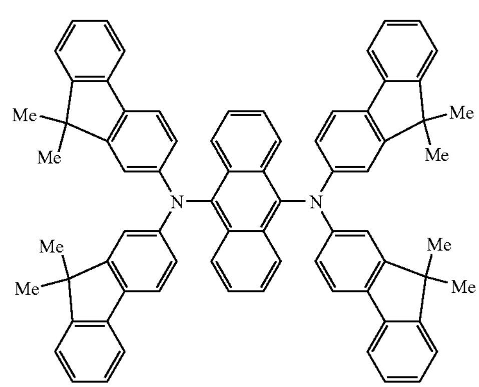

-continued
(A)-98
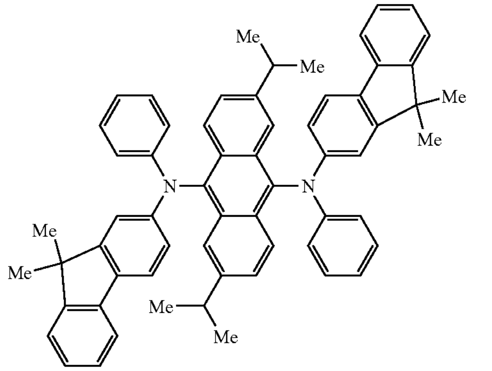
(A)-99
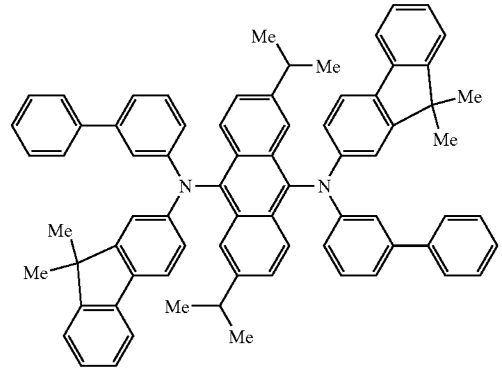
(A)-100
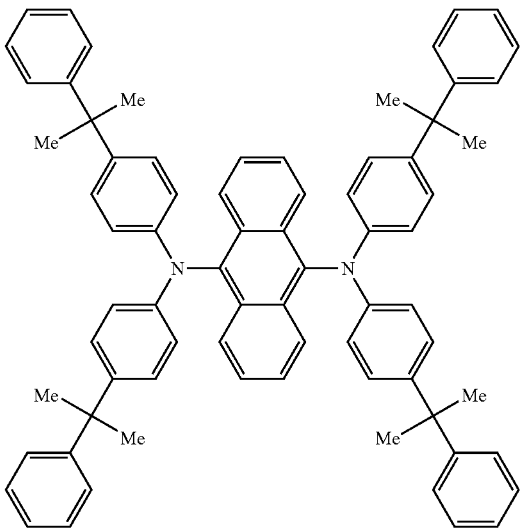
[Chemical Formula 61]
(A)-101
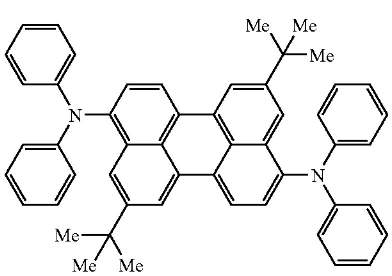
(A)-102
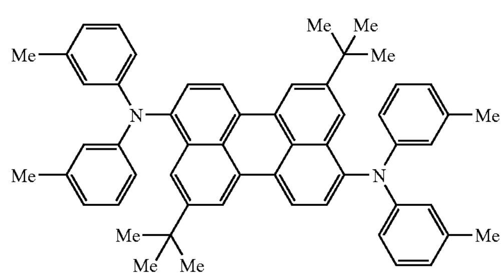
(A)-103
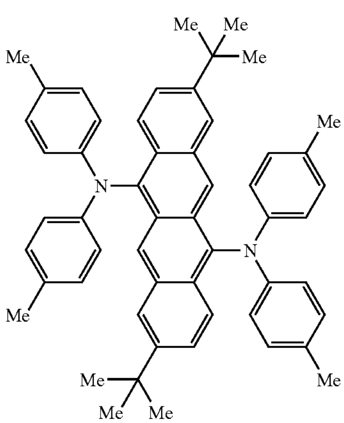
(A)-104
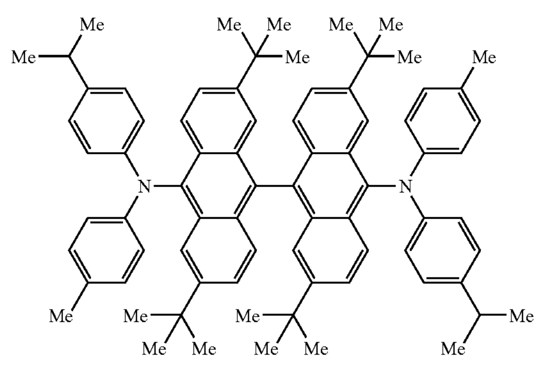

-continued
(A)-105
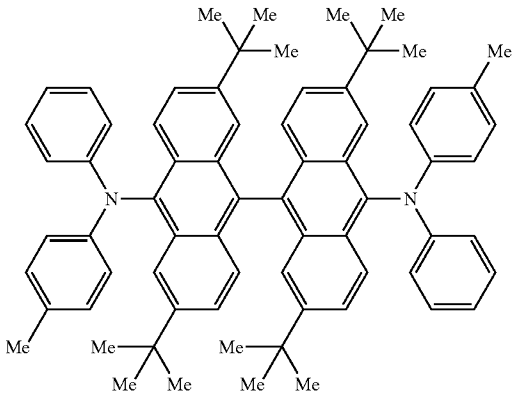
(A)-106
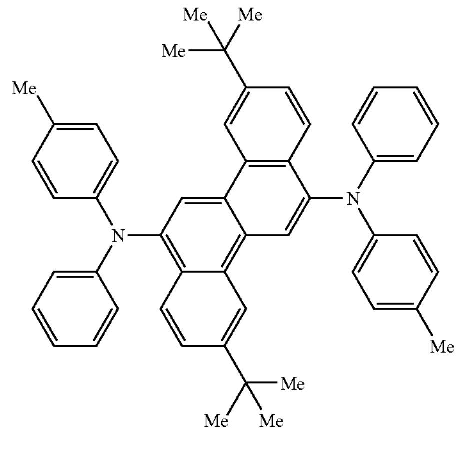
(A)-107
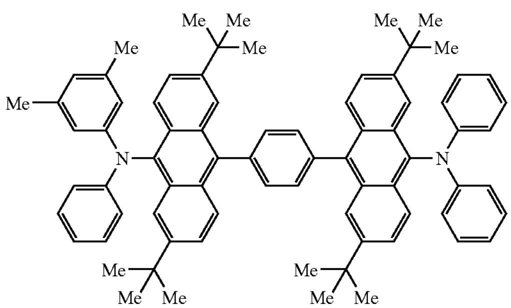
(A)-108
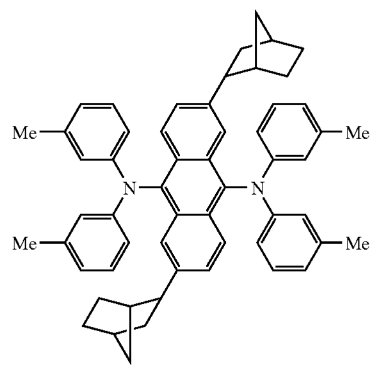
[Chemical Formula 62]
(A)-109
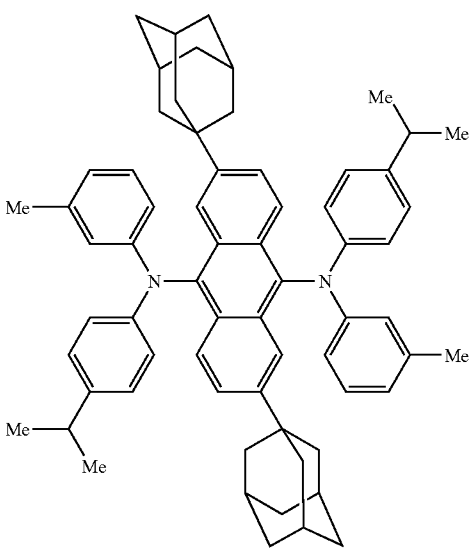
(A)-110
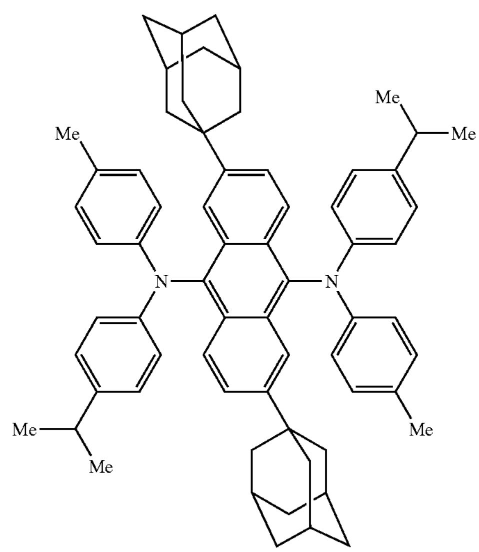

-continued
(A)-111
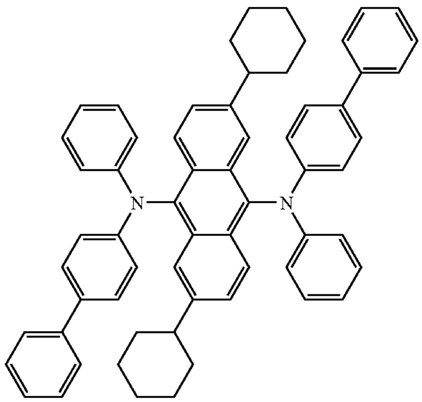
(A)-112
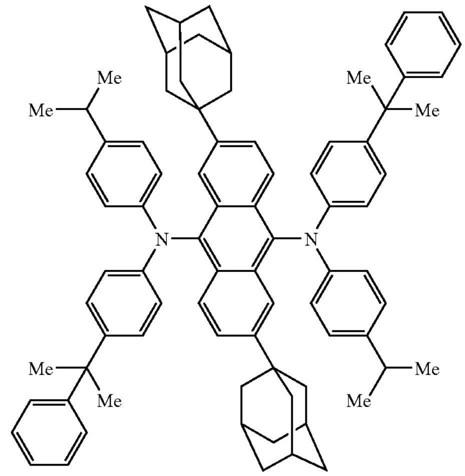
(A)-113
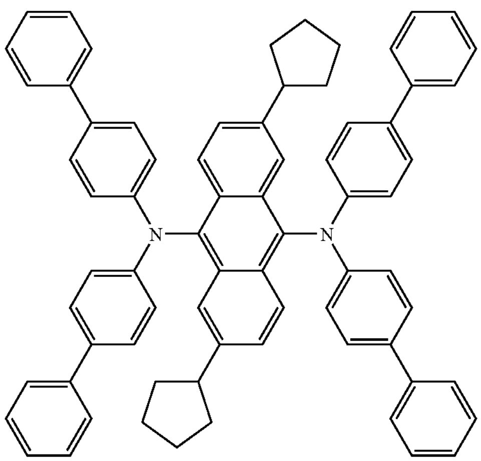
(A)-114
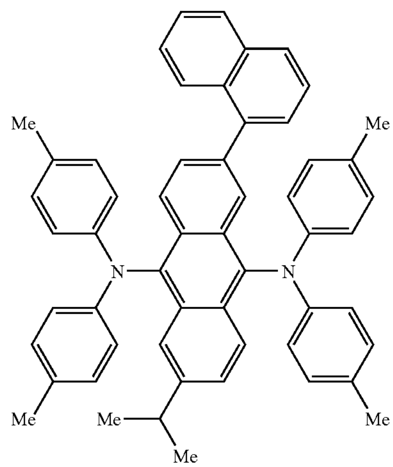
(A)-115
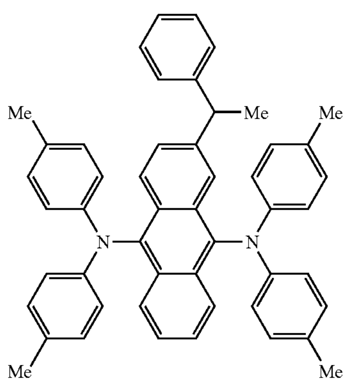
(A)-116
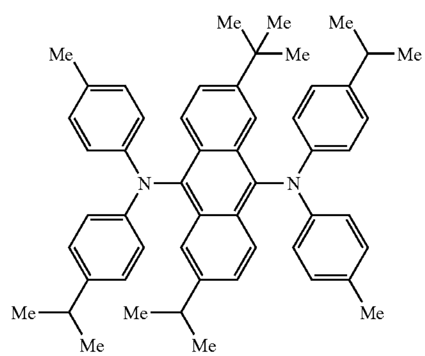
(A)-117
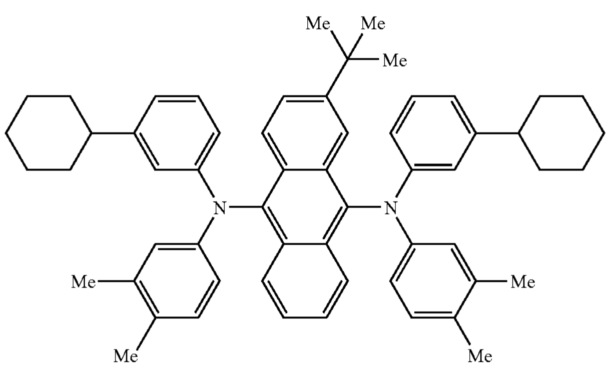

-continued
[Chemical Formula 63]
(A)-118
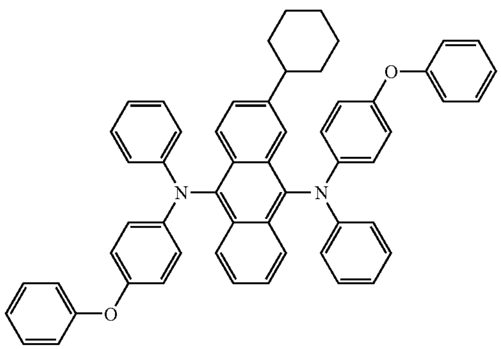
(A)-119
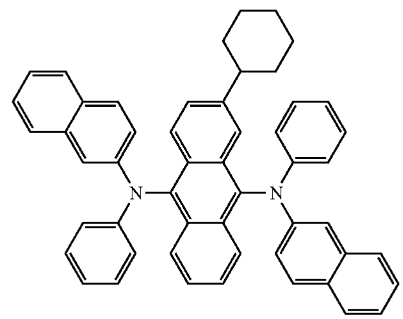
(A)-120
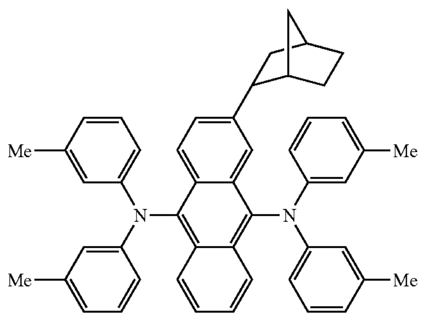
(A)-121
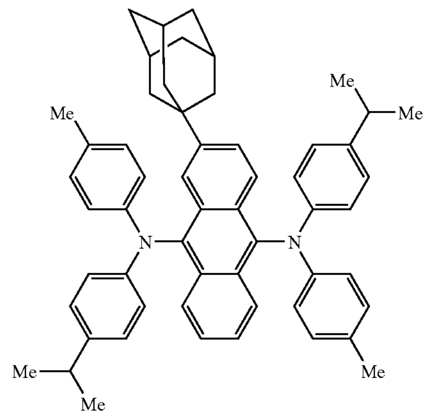
(A)-122
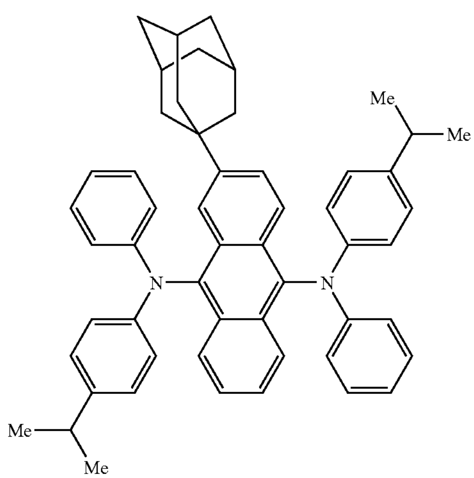
(A)-123
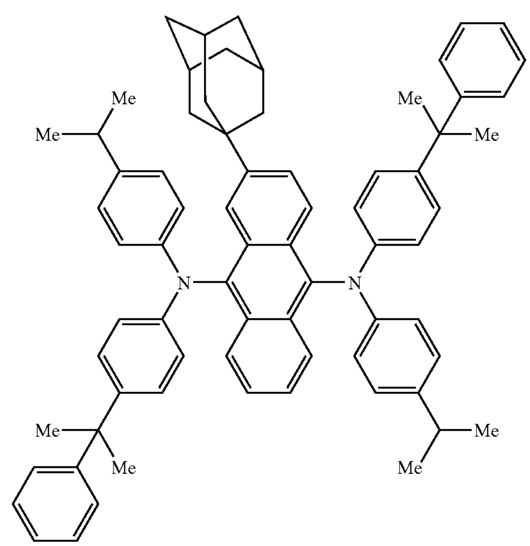

-continued
(A)-124
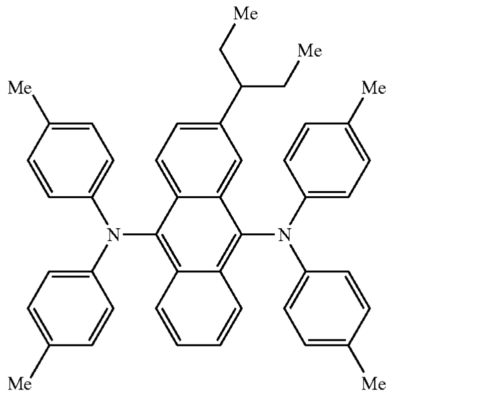
(A)-125
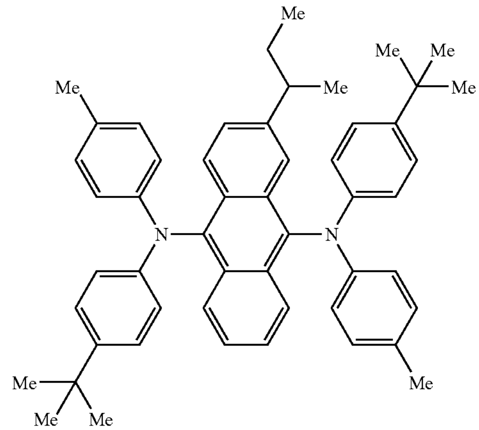
(A)-126
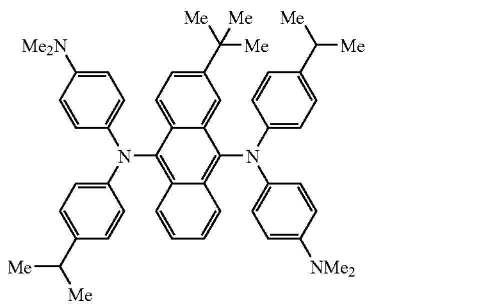
(A)-127
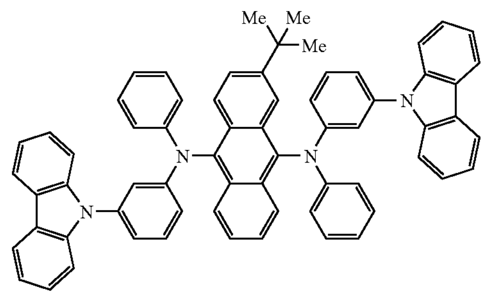
(A)-128
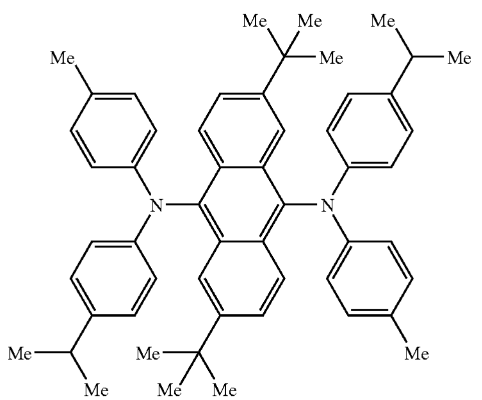
(A)-129
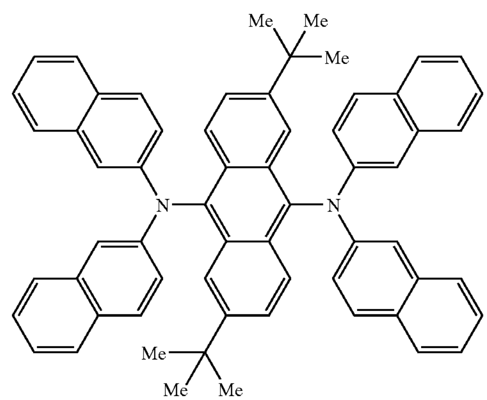
[Chemical Formula 64]
(A)-130
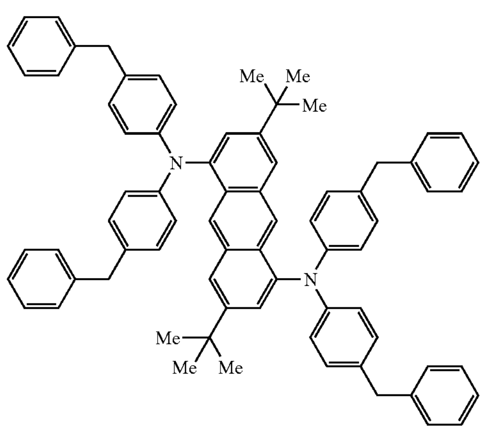
(A)-131
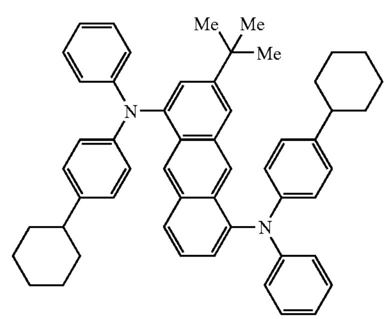

-continued
(A)-132
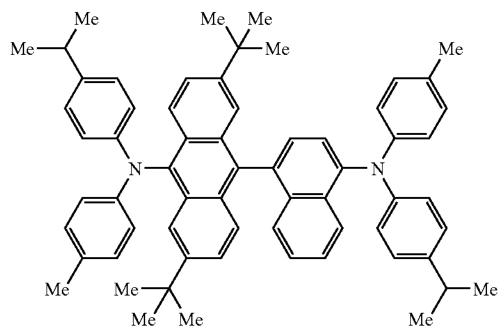
(A)-133
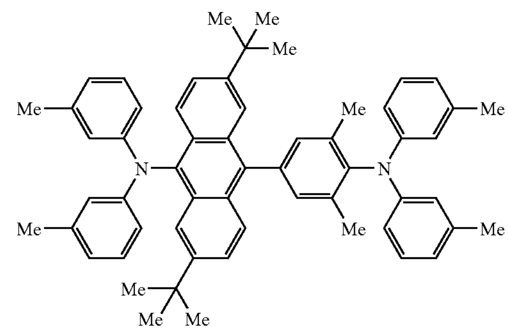
(A)-134
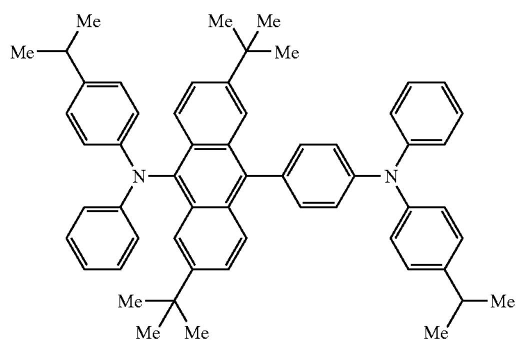
(A)-135
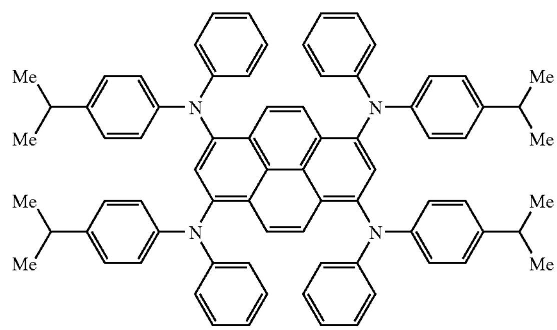
(A)-136
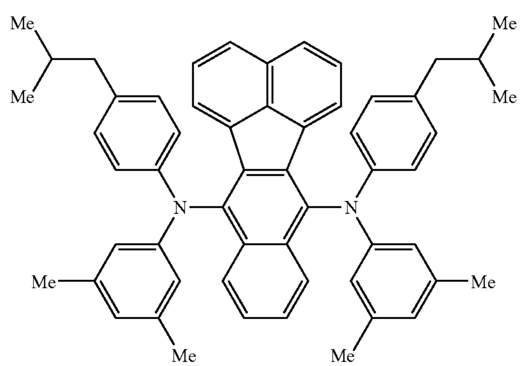
(A)-137
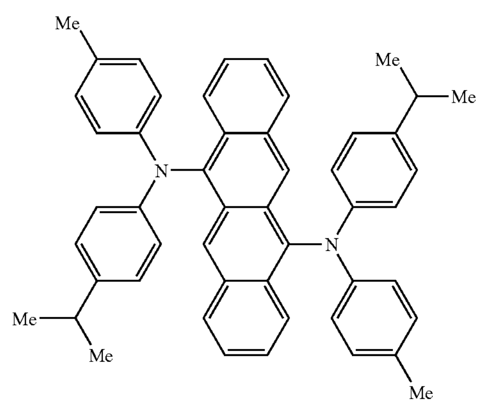
(A)-138
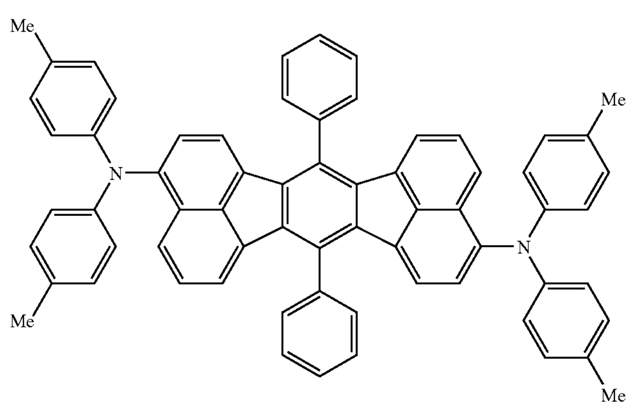

-continued
(A)-139
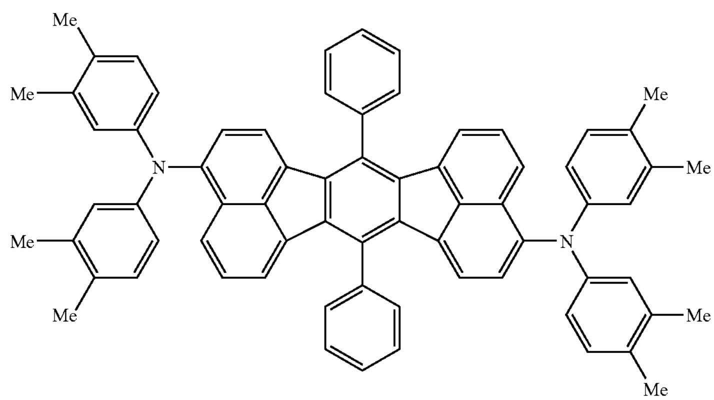
[Chemical Formula 65]
(A)-140
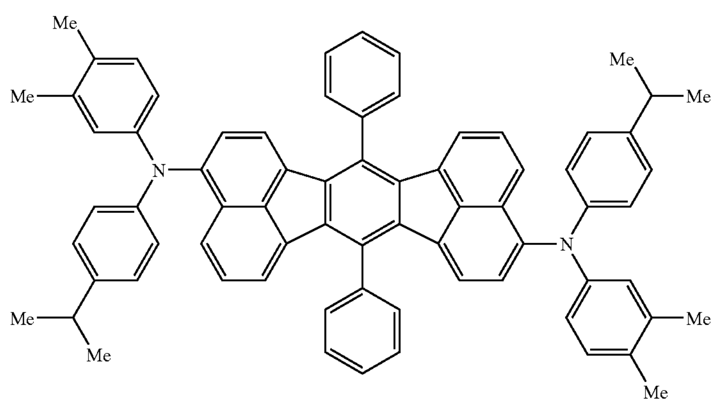
(A)-141
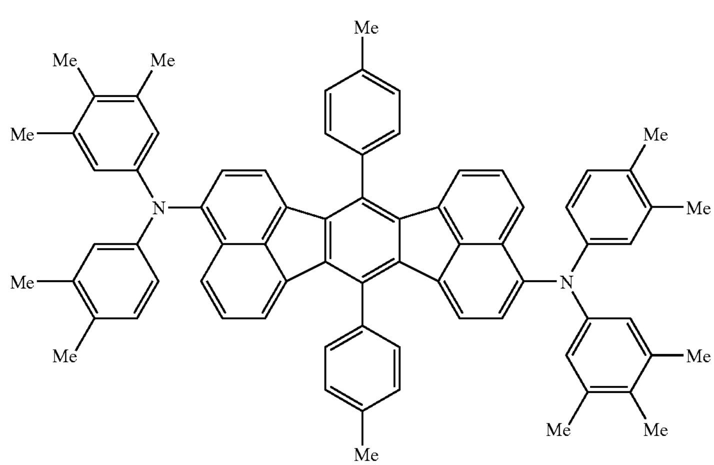

-continued
(A)-142
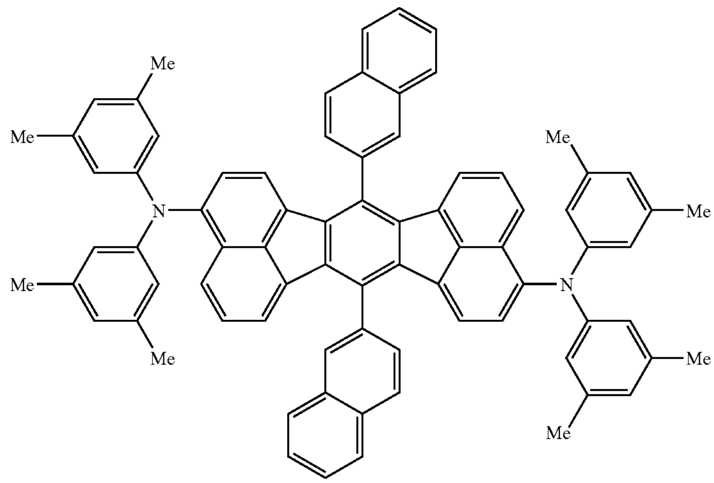
(A)-143
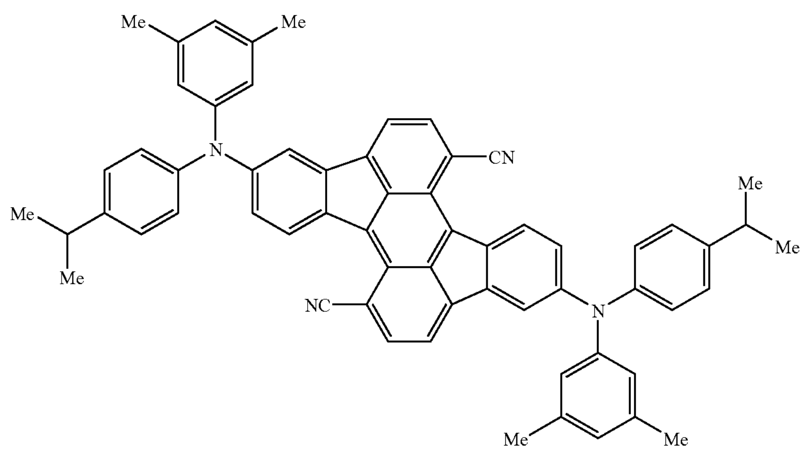
(A)-144
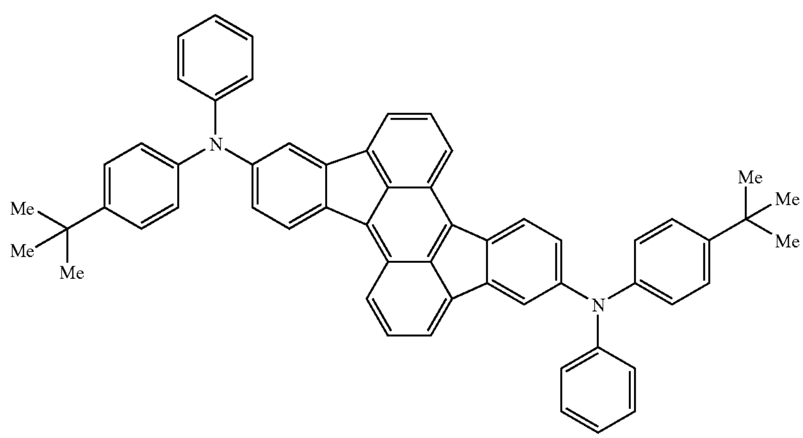

-continued
(A)-145
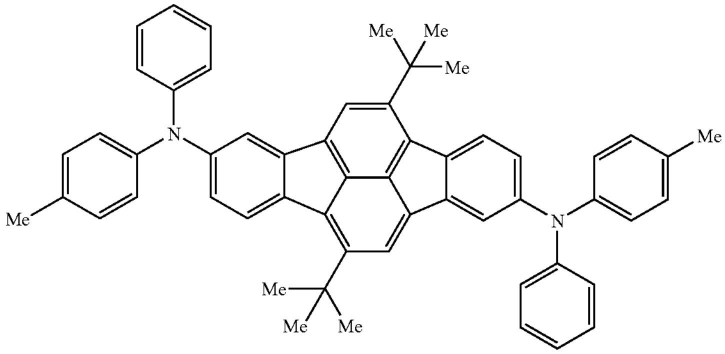
(A)-146
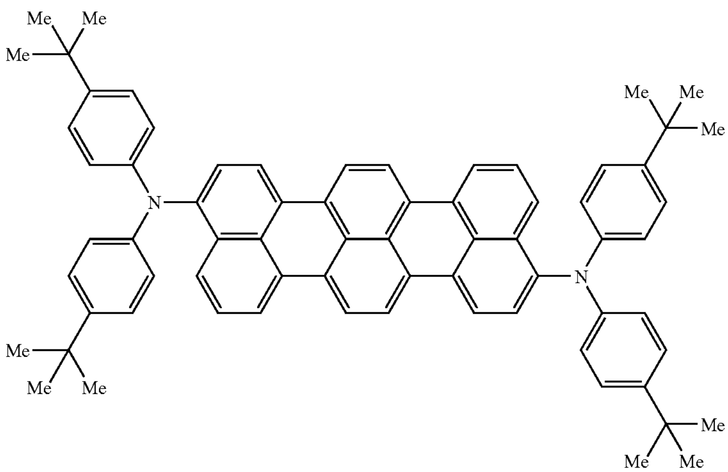
(A)-147
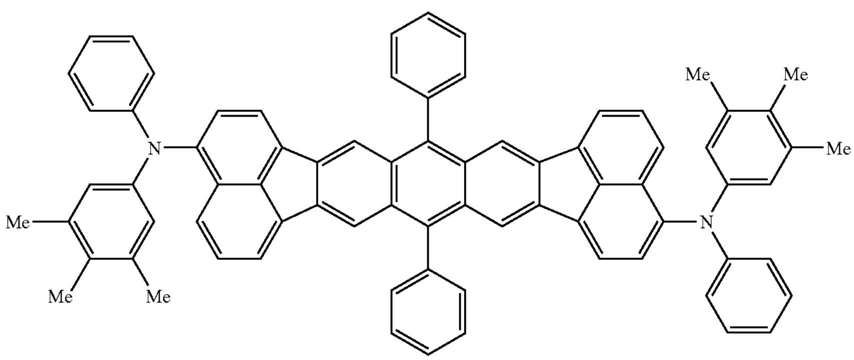
[Chemical Formula 66]
(A)-148
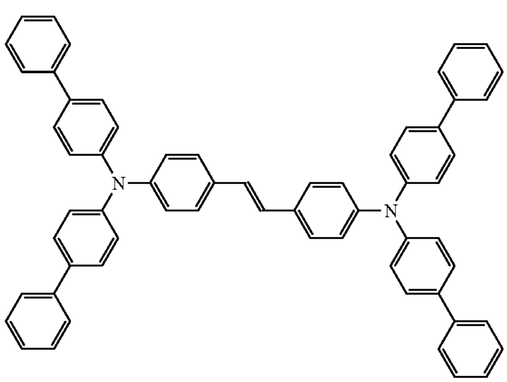
(A)-149
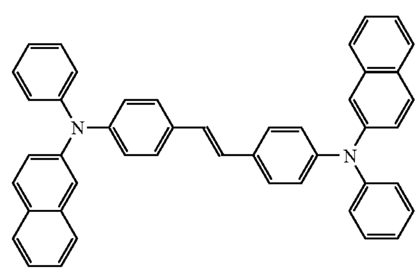

-continued
(A)-150
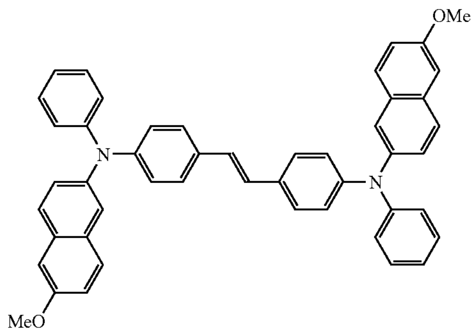
(A)-151
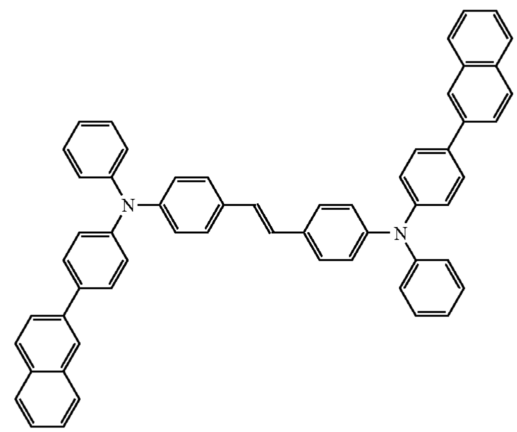
(A)-152
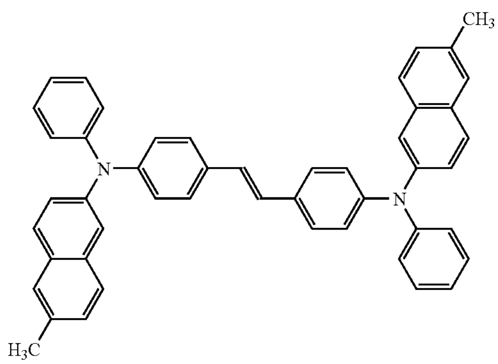
(A)-153
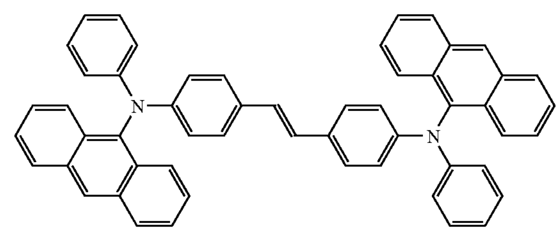
(A)-154
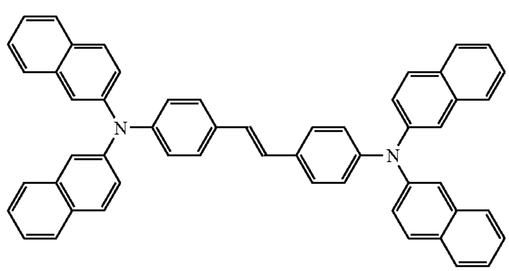
(A)-155
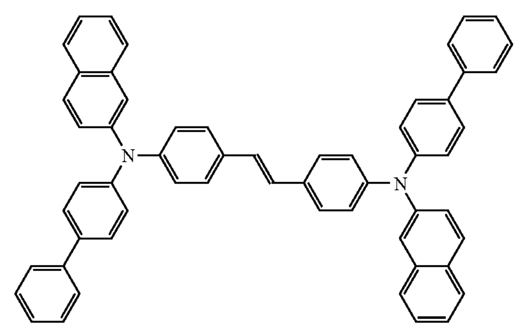
(A)-156
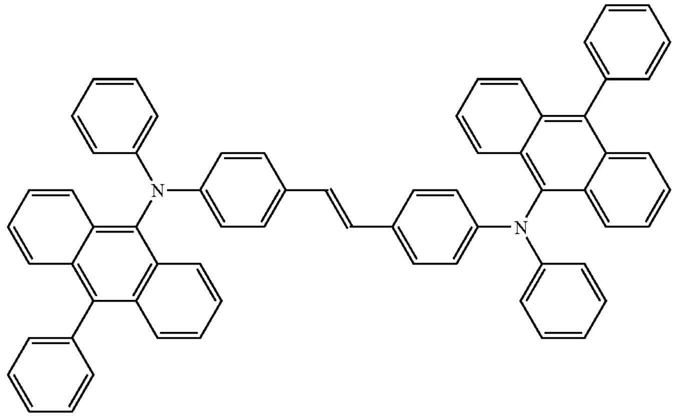

-continued
[Chemical Formula 67]
(A)-157
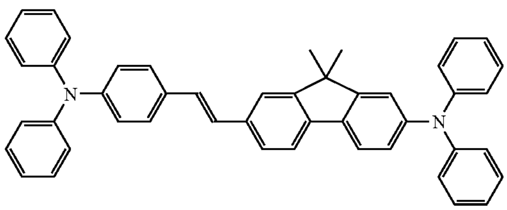
(A)-158
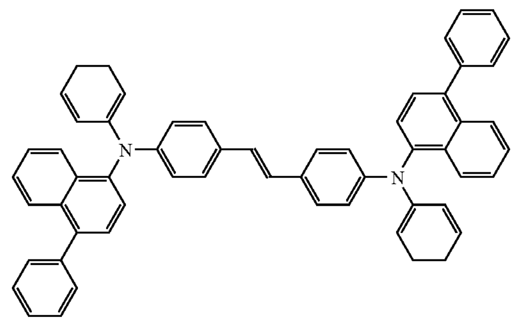
(A)-159
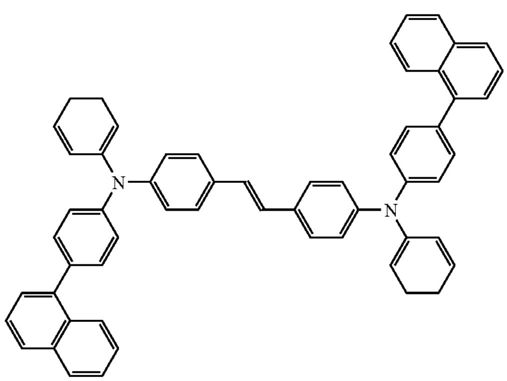
(A)-160
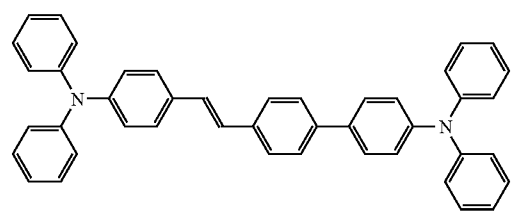
(A)-161
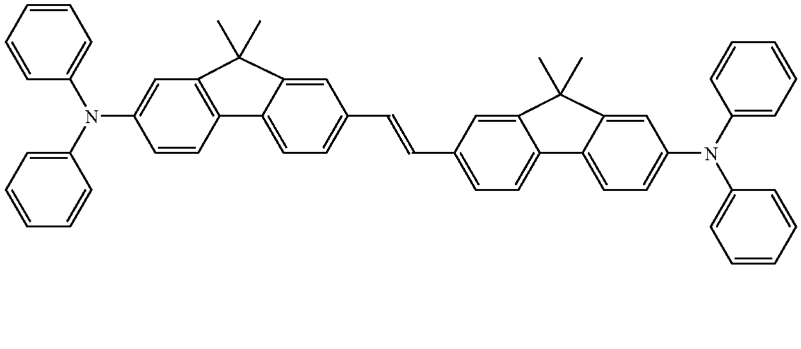

-continued
(A)-162
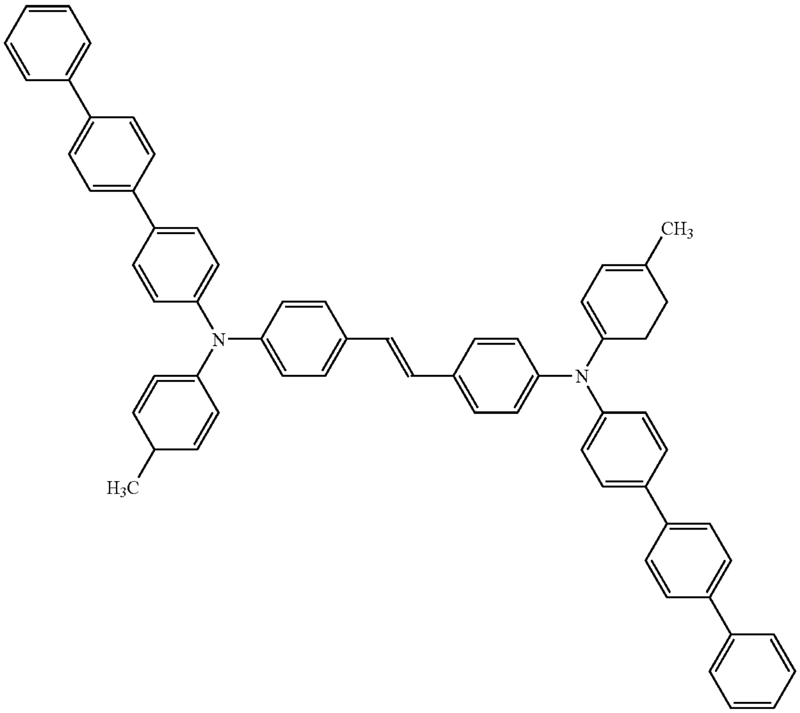
(A)-165
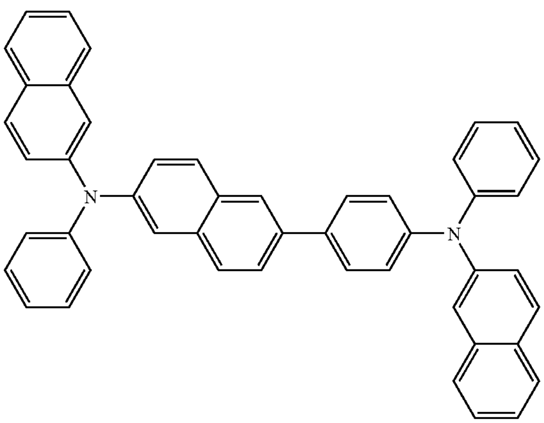
[Chemical Formula 68]
(A)-166
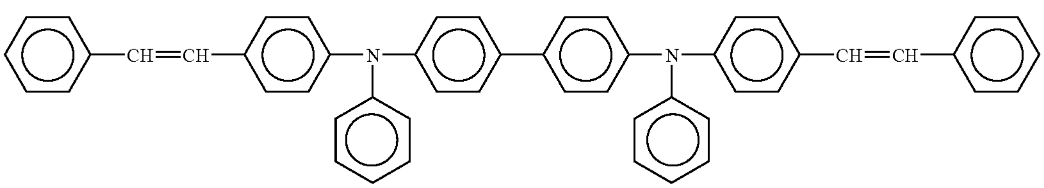
EM32
(A)-167
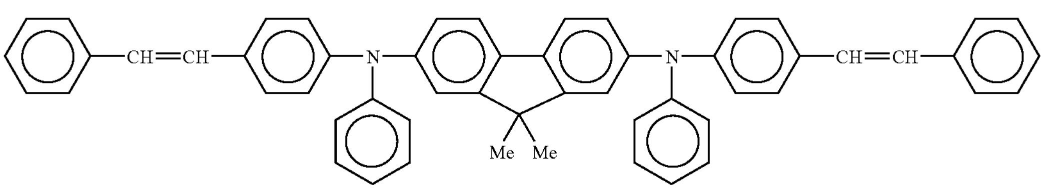
EM33

-continued
(A)-168
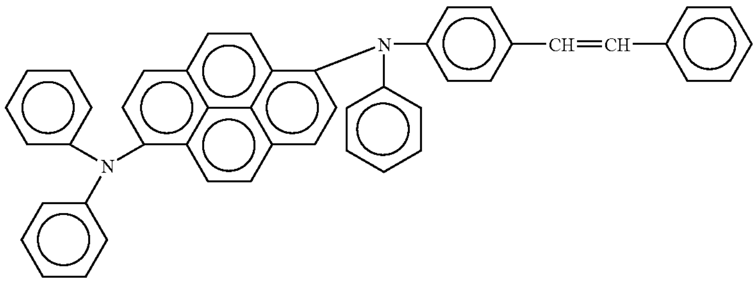
EM34
(A)-169
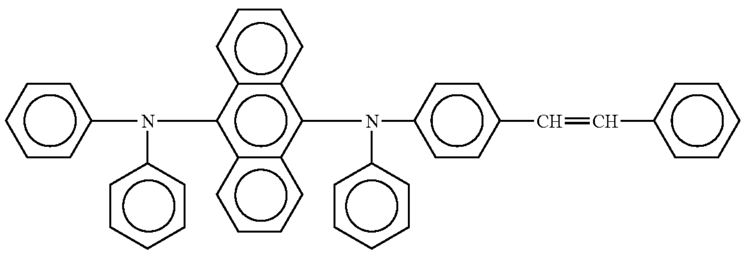
EM35
(A)-170
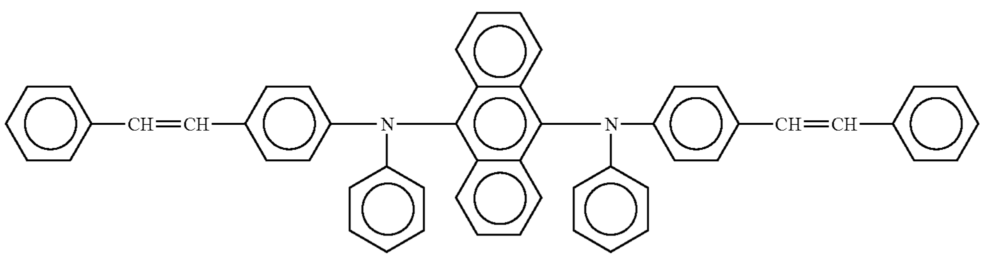
EM36
[Chemical Formula 69]
(A)-171
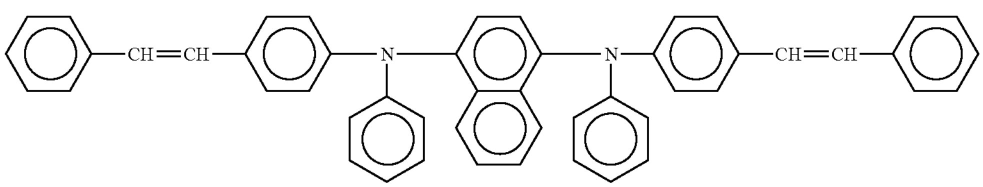
EM41
(A)-172
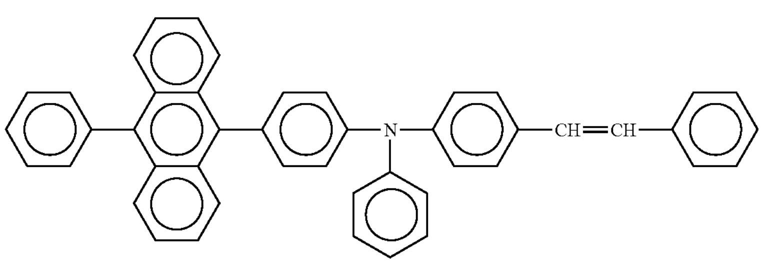
EM42

-continued
(A)-173
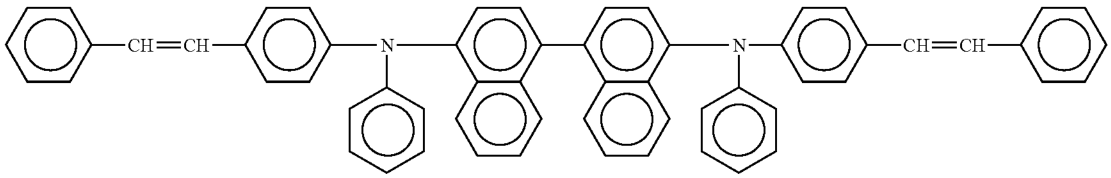
EM43
(A)-174
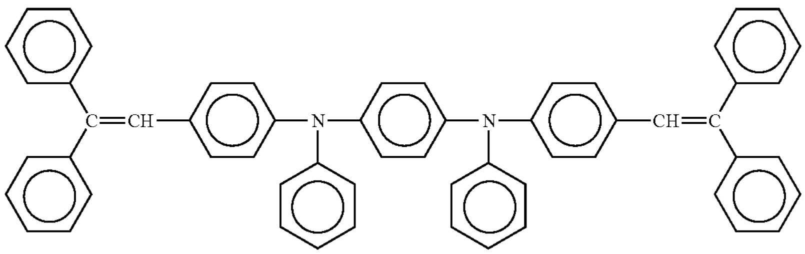
EM44
(A)-175
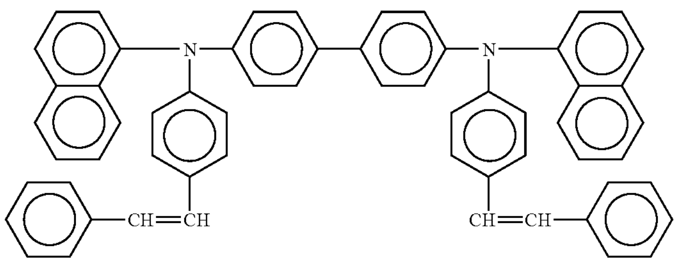
EM45
[Chemical Formula 70]
(A)-176
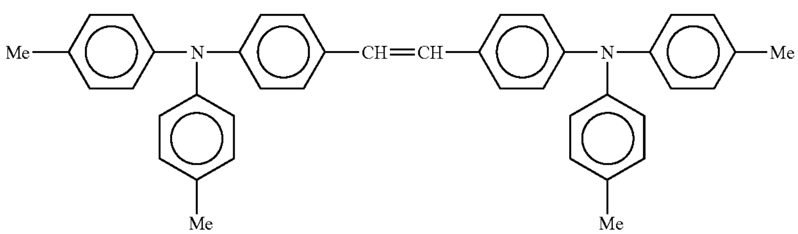
EM46
(A)-177
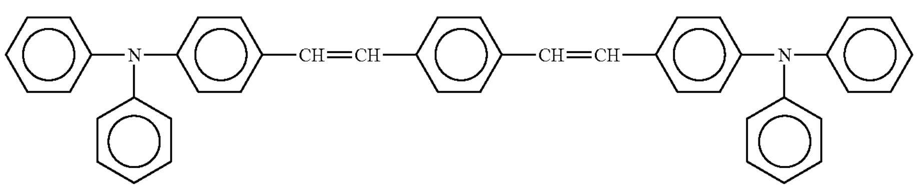
EM47
(A)-178
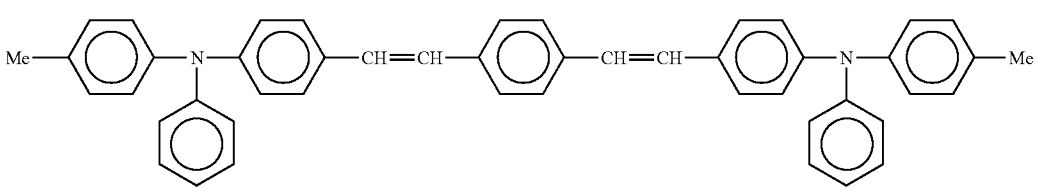
EM48

-continued
(A)-179
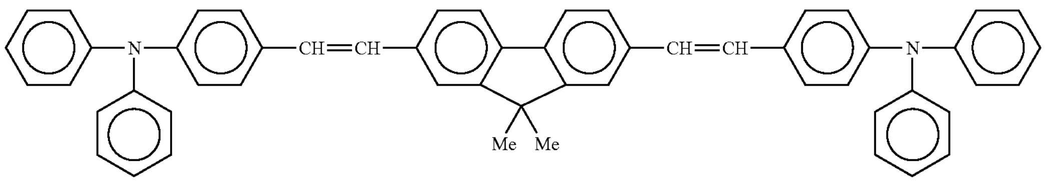
EM49
(A)-180
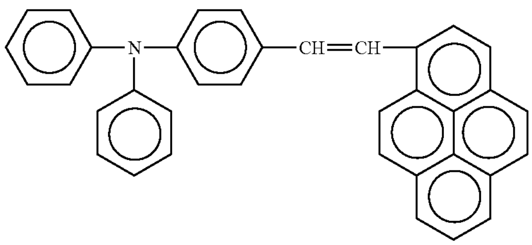
EM50
[Chemical Formula 71]
(A)-181
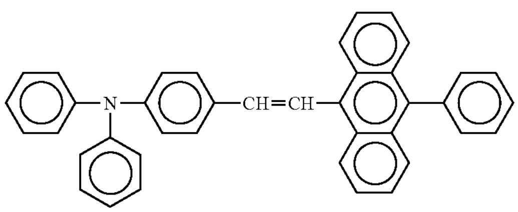
EM51
(A)-182
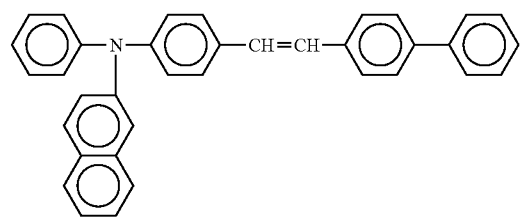
EM52
(A)-183
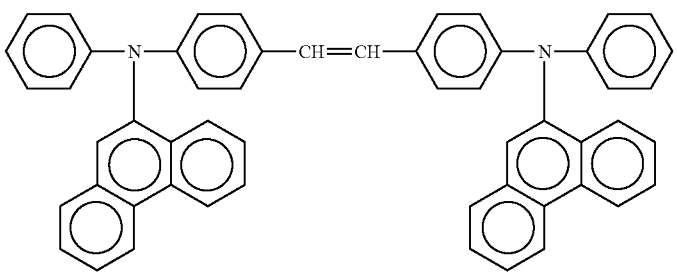
EM53
(A)-184
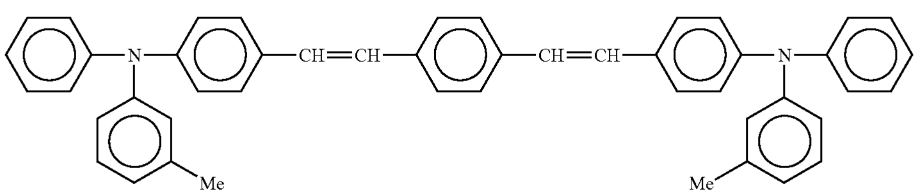
EM54
(A)-185
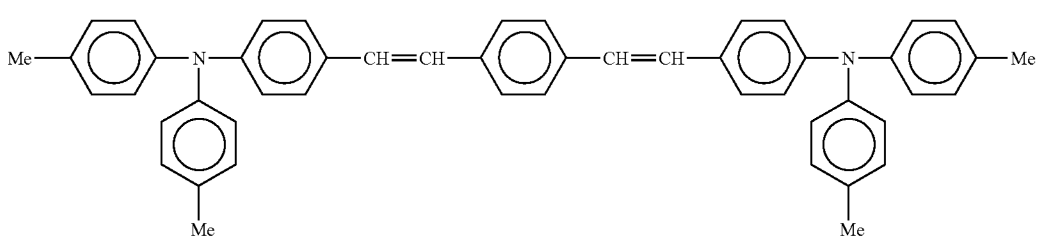
EM55

-continued
[Chemical Formula 72]
(A)-186
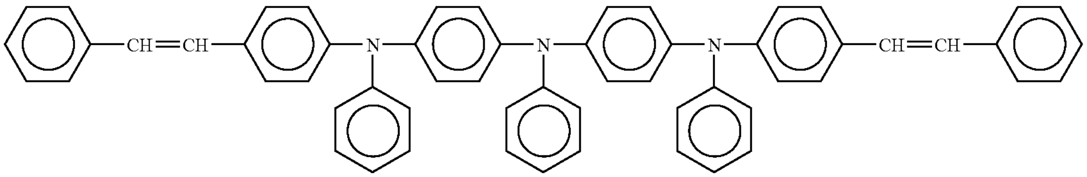
EM56
(A)-187
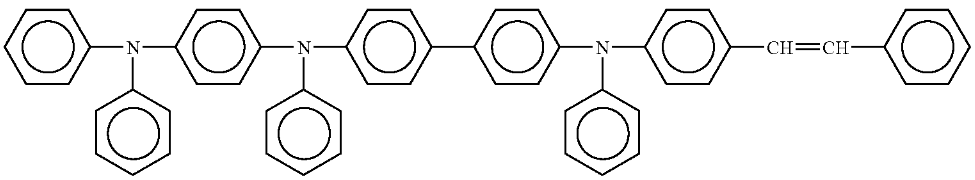
EM57
(A)-188
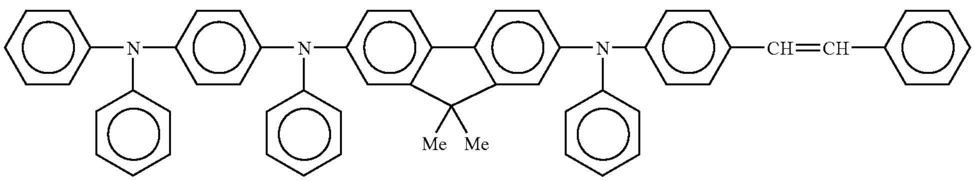
EM58
(A)-189
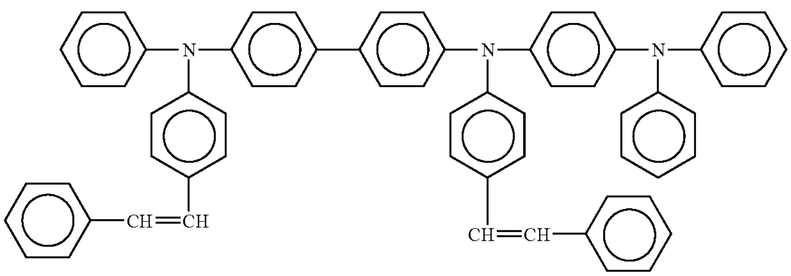
EM59
(A)-190
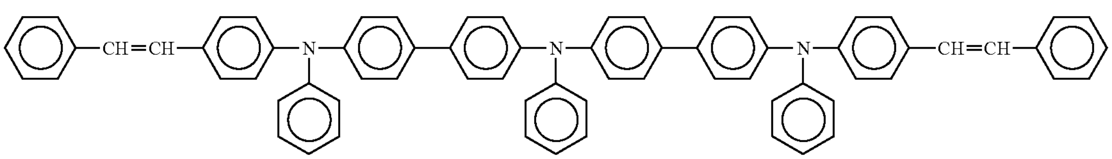
EM60
(A)-191
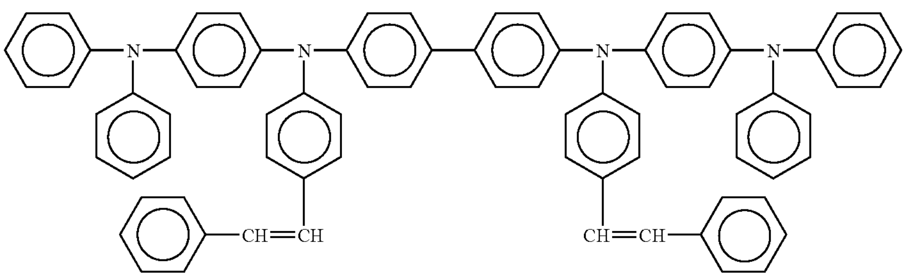
EM61

-continued
(A)-192
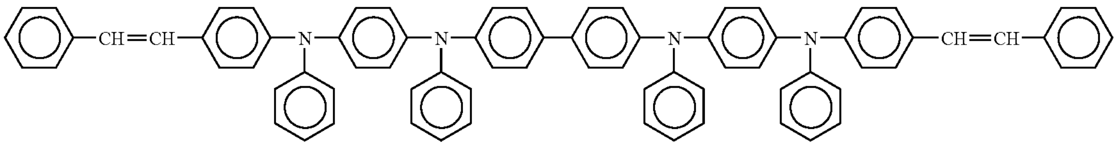
EM62
[Chemical Formula 73]
(A)-193
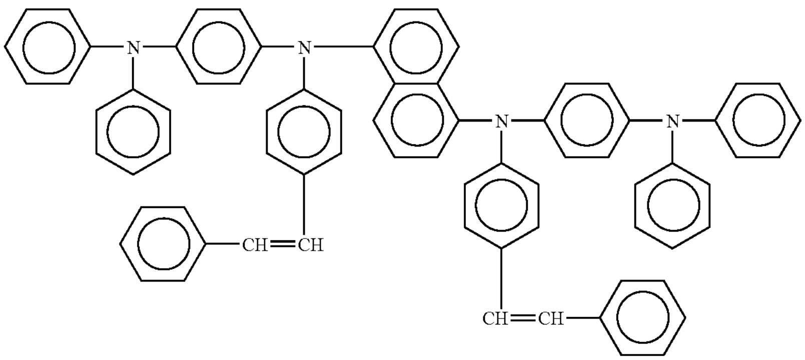
EM63
(A)-194
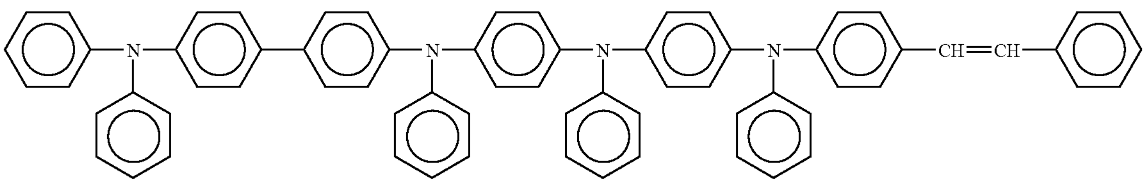
EM64
(A)-195
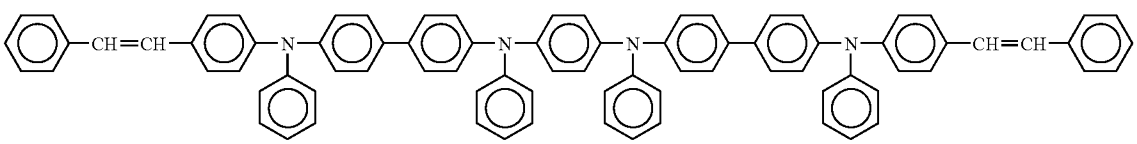
EM65
[Chemical Formula 74]
(A)-196
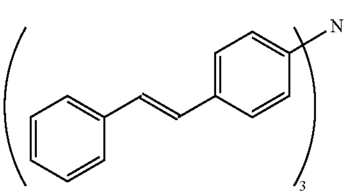
(A)-197
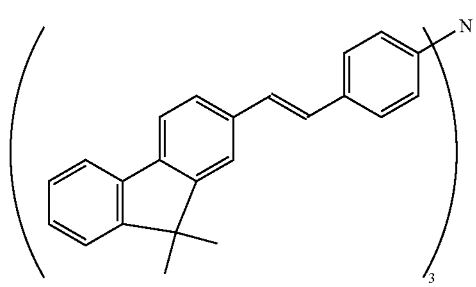
(A)-198
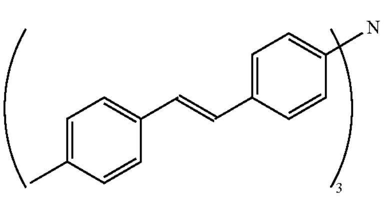
(A)-199
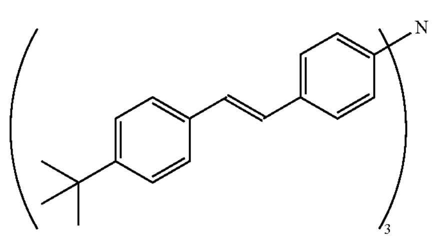

-continued
(A)-201
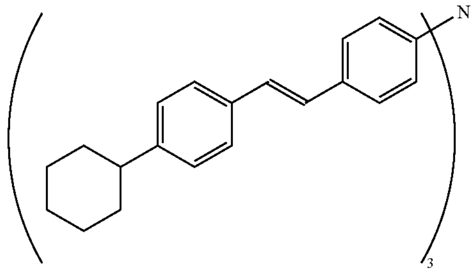
(A)-202
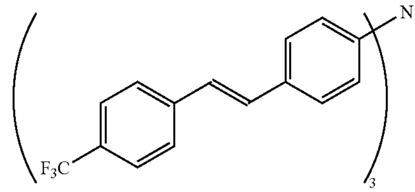
(A)-203
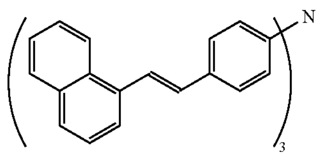
(A)-204
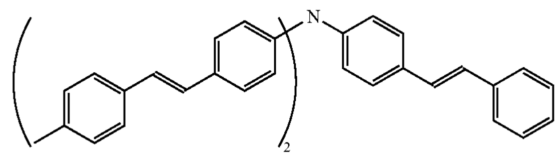
Compounds containing a carbazole group such as those shown below may be used.
[Chemical Formula 75]
(A)-163
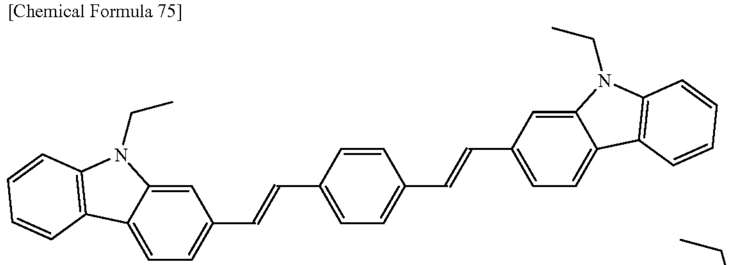
(A)-164
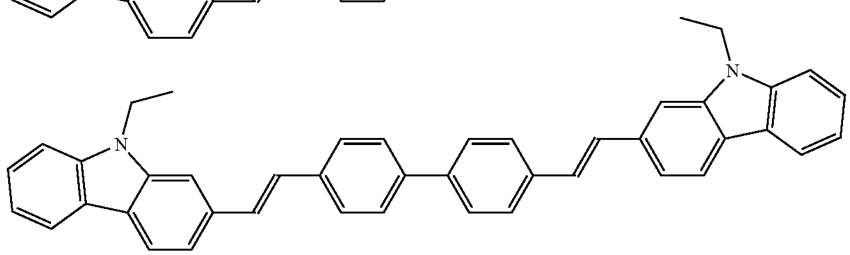
In the organic EL device according to the aspect of the invention, the fluorescent dopant is preferably a fluoranthene derivative represented by any one of the following formulae (5) to (8).
[Chemical Formula 76]
(5)
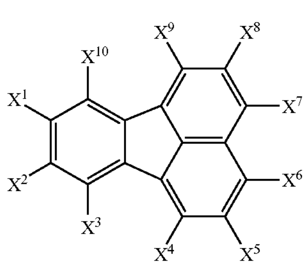
-continued
(6)
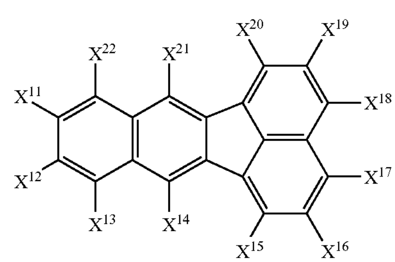
(7)
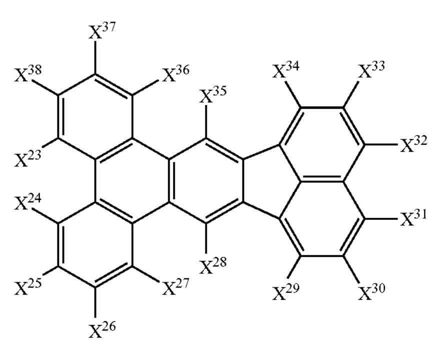

-continued (8)

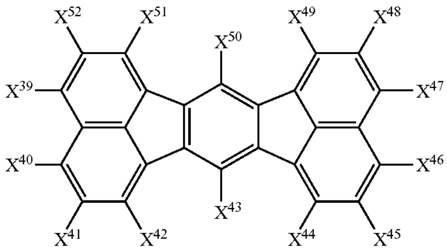

In the formulae (5) to (8), $X^1$ to $X^{52}$ each independently represent a hydrogen atom, halogen atom, substituted or unsubstituted linear, branched or cyclic alkyl group having 1 to 30 carbon atoms, substituted or unsubstituted linear, branched or cyclic alkoxy group having 1 to 30 carbon atoms, substituted or unsubstituted linear, branched or cyclic alkylthio group having 1 to 30 carbon atoms, substituted or unsubstituted linear, branched or cyclic alkenyl group having 2 to 30 carbon atoms, substituted or unsubstituted linear, branched or cyclic alkenyloxy group having 2 to 30 carbon atoms, substituted or unsubstituted linear, branched or cyclic alkenylthio group having 2 to 30 carbon atoms, substituted or unsubstituted aralkyl group having 7 to 30 carbon atoms, substituted or unsubstituted aralkyloxy group having 7 to 30 carbon atoms, substituted or unsubstituted aralkylthio group having 7 to 30 carbon atoms, substituted or unsubstituted aryl group having 6 to 20 carbon atoms, substituted or unsubstituted aryloxy group having 6 to 20 carbon atoms, substituted or unsubstituted arylthio having 6 to 20 carbon atoms, substituted or unsubstituted amino group having 2 to 30 carbon atoms, cyano group, silyl group, hydroxyl group, —$COOR^{1e}$ group wherein $R^{1e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms or substituted or unsubstituted aryl group having 6 to 30 carbon atoms, —$COR^{2e}$ group wherein $R^{2e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, substituted or unsubstituted aryl group having 6 to 30 carbon atoms or amino group, or —$OCOR^{3e}$ group wherein $R^{3e}$ represents a substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, or substituted or unsubstituted aryl group having 6 to 30 carbon atoms. An adjacent set of groups of $X^1$ to $X^{52}$ and an adjacent set of substituents of $X^1$ to $X^{52}$ may be bonded together to form a substituted or unsubstituted carbocycle.

Examples of the fluoranthene derivative are those represented by the following formulae.

[Chemical Formula 77]

1-1

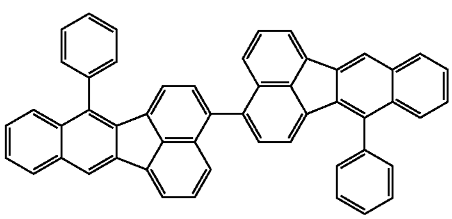

1-2

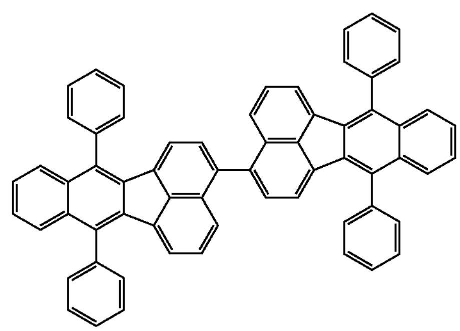

1-3

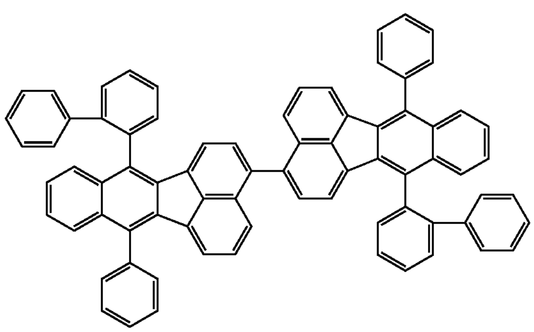

1-4

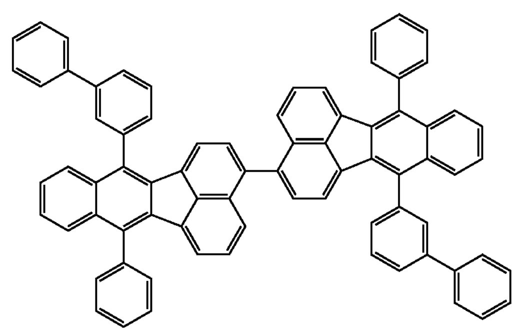

-continued
1-5
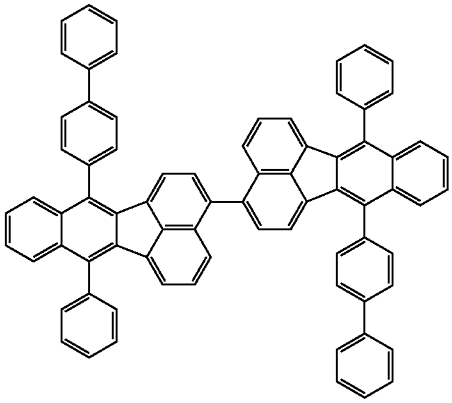
1-6
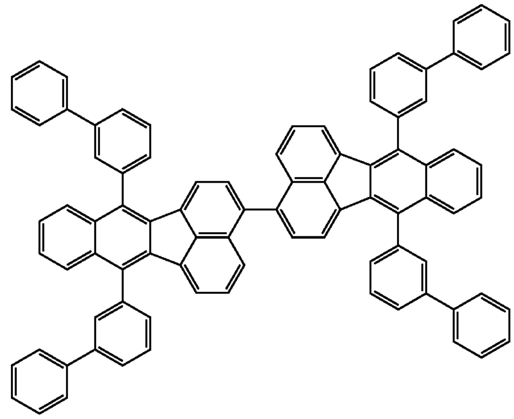
1-7
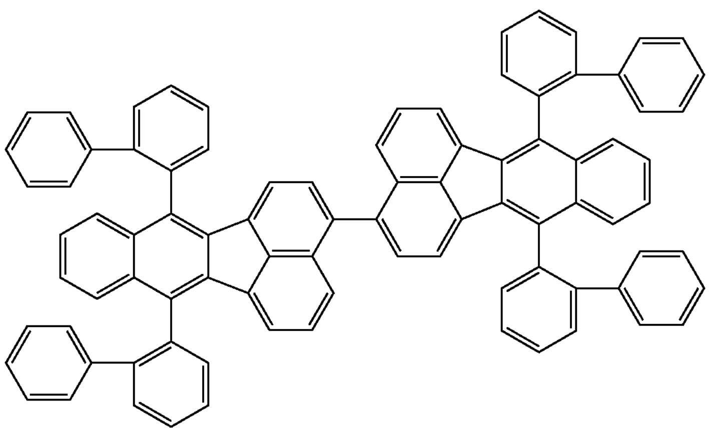
1-8
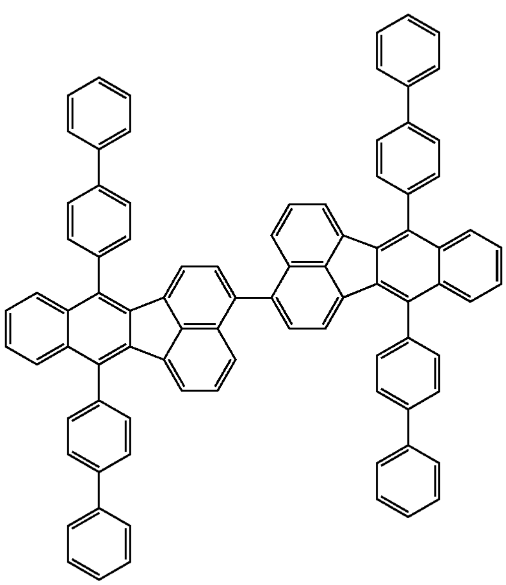
1-9
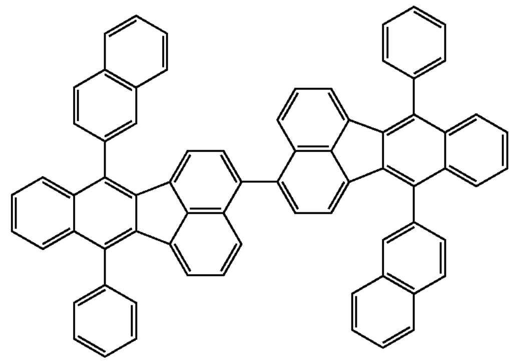

-continued
[Chemical Formula 78]
1-10
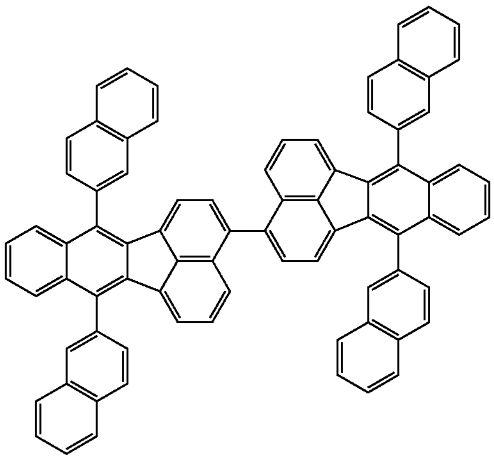
1-11
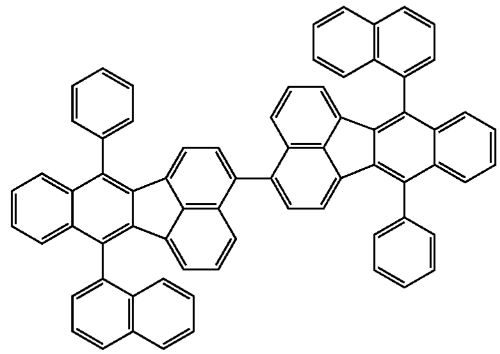
1-12
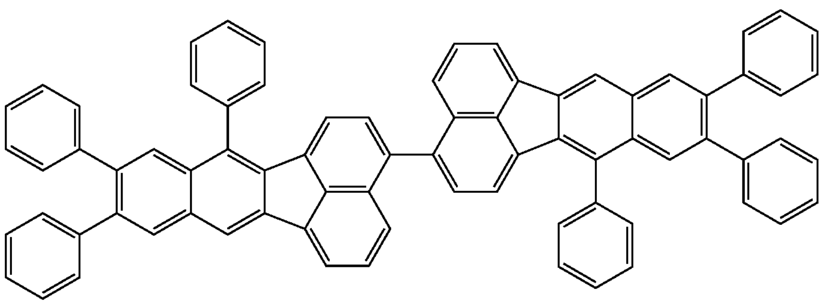
1-13
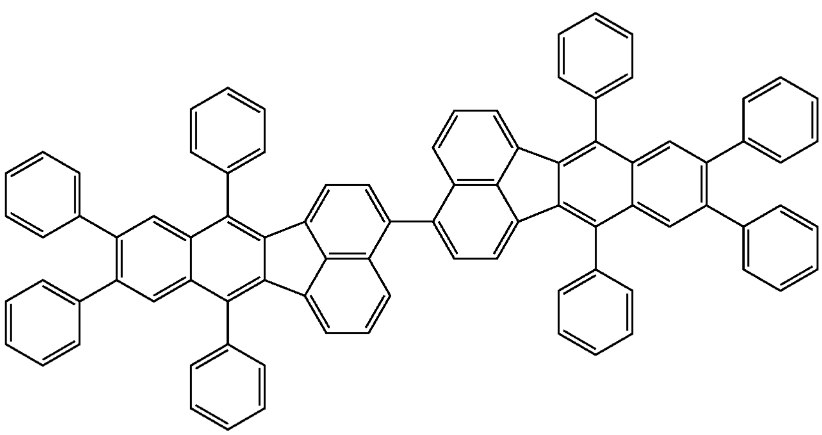
1-14
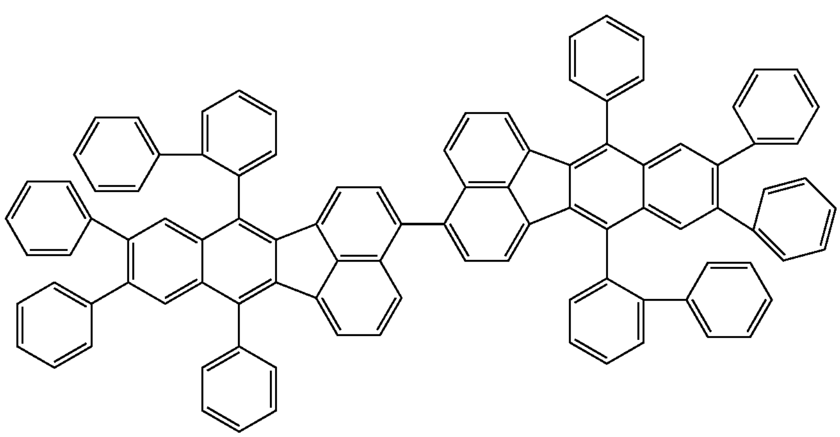

-continued
1-15
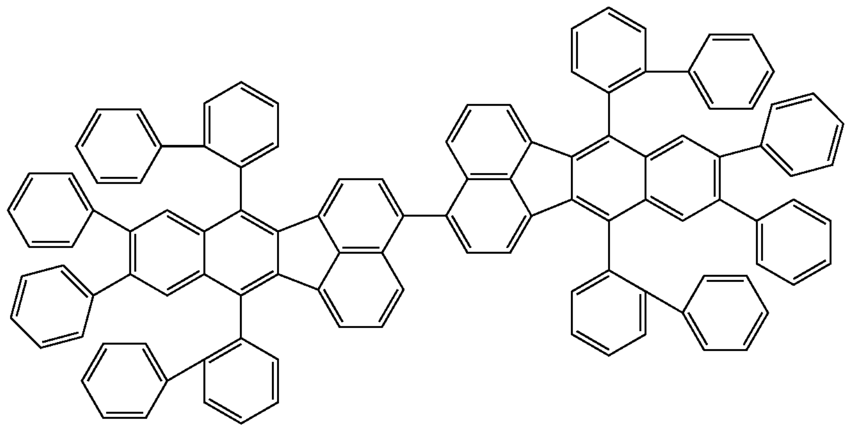
1-16
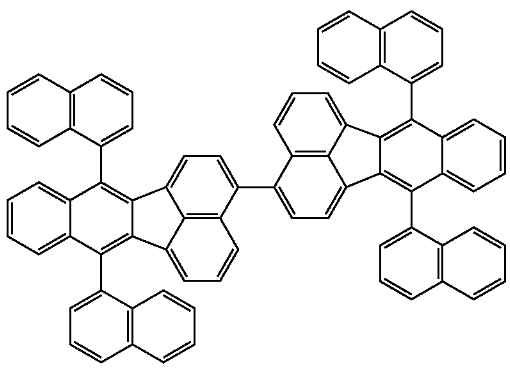
1-17
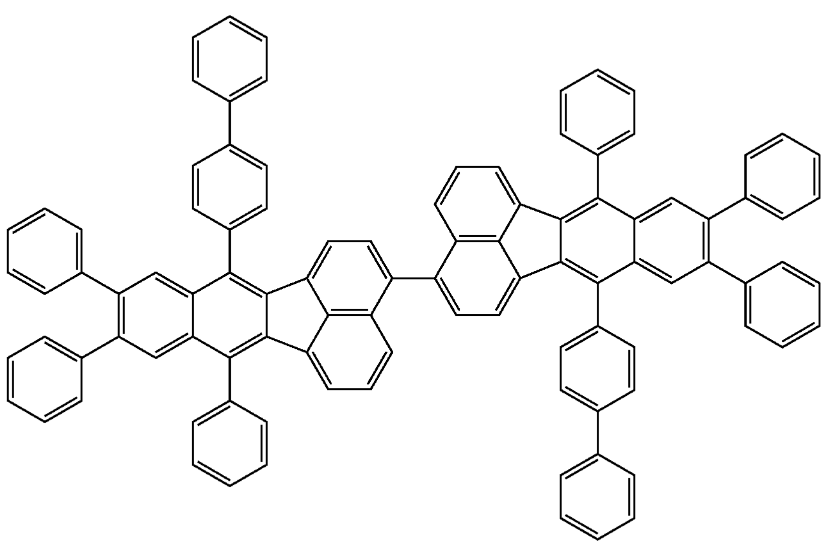

-continued
1-18
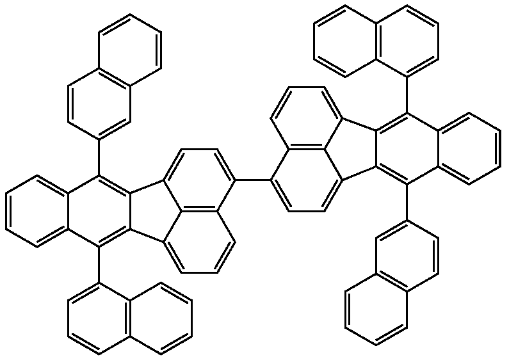
[Chemical Formula 79]
1-19
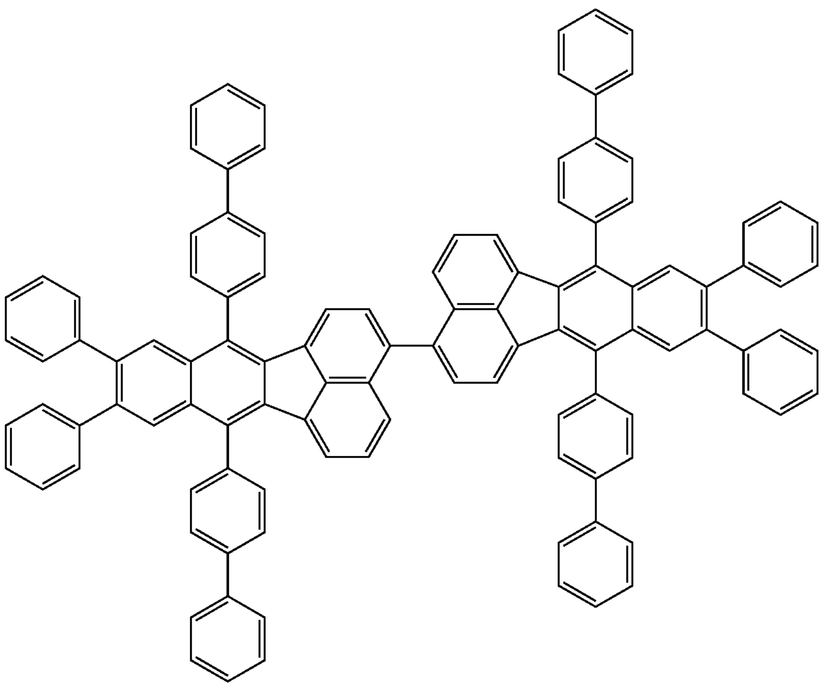
1-20
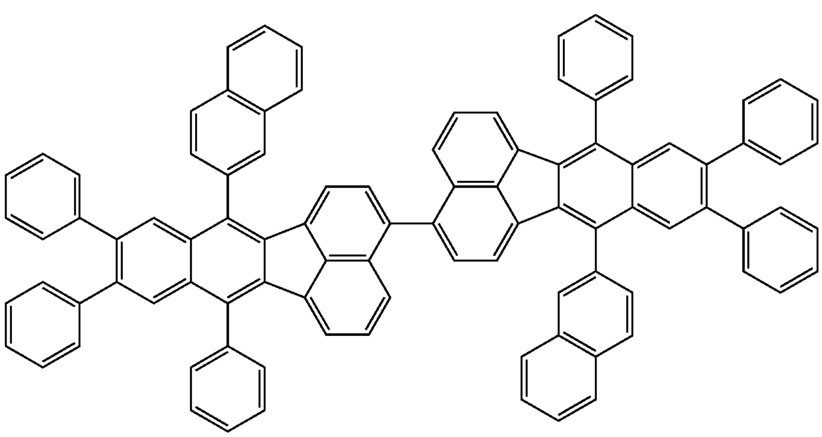

-continued
1-21
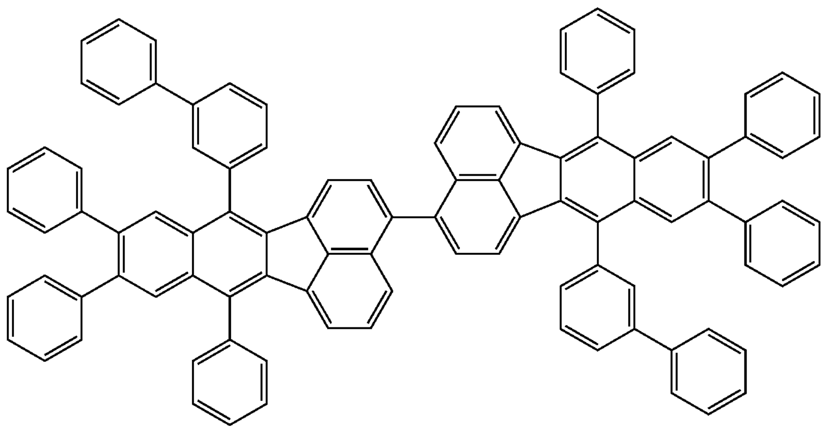
1-22
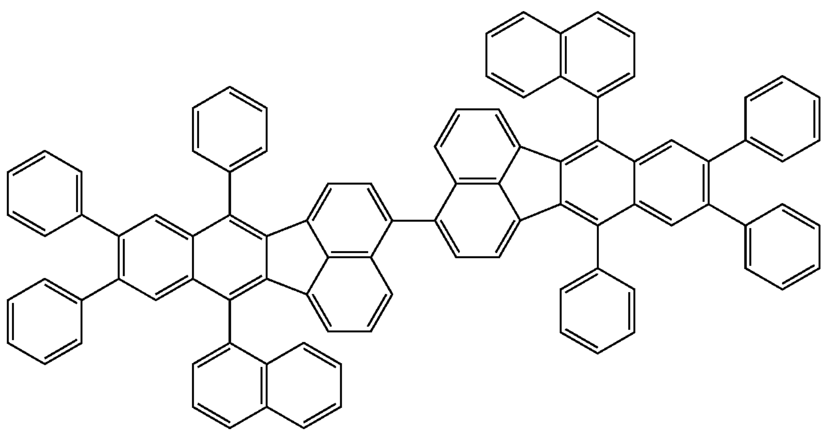
1-23
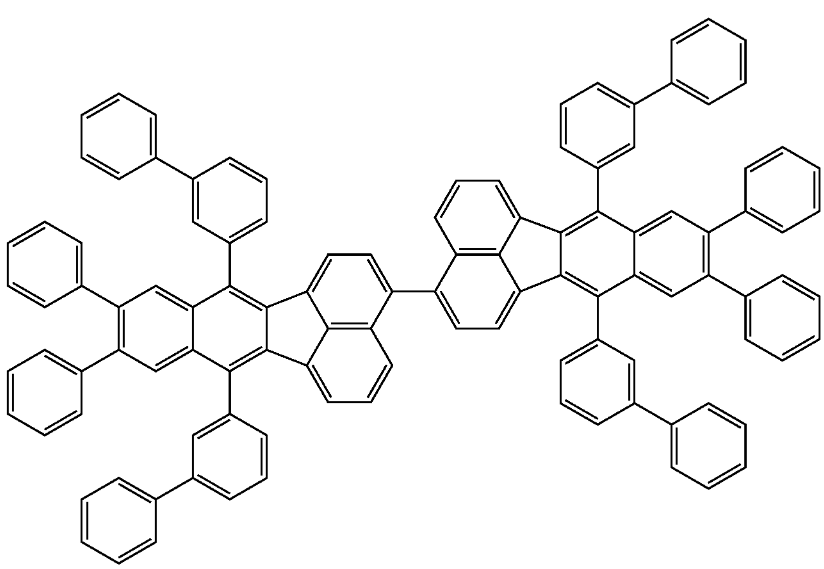

-continued
1-24
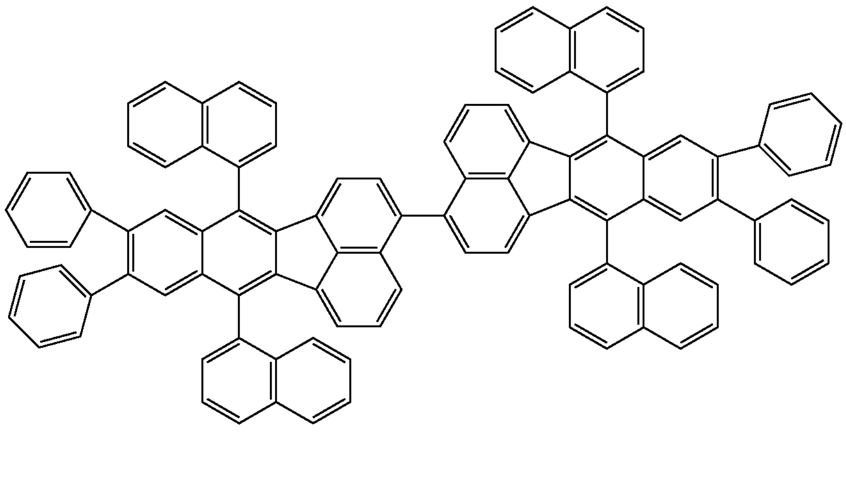
1-25
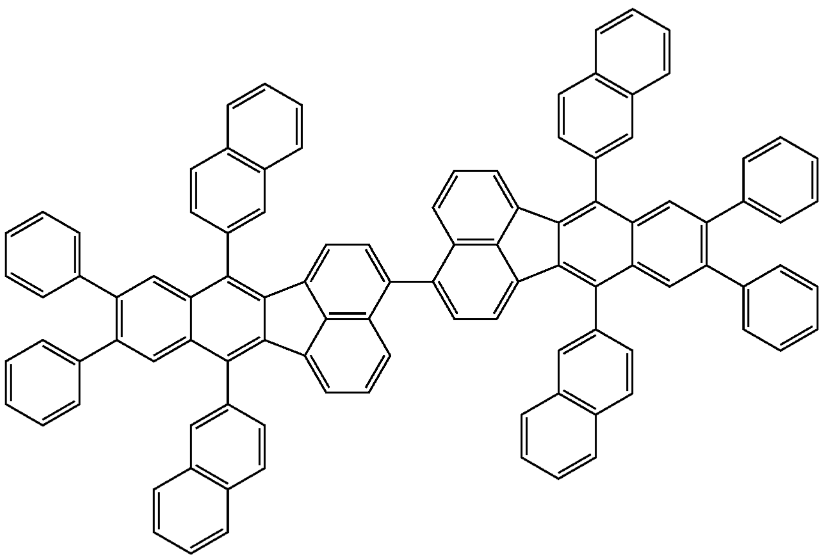
1-26
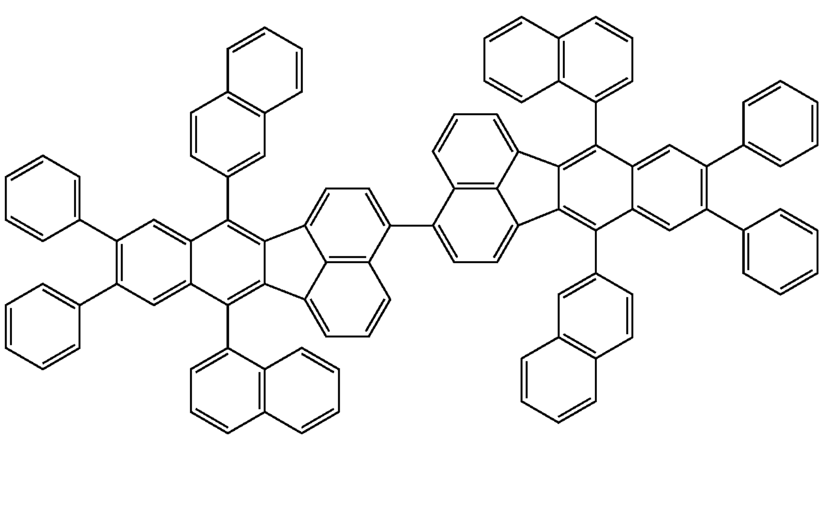

-continued
[Chemical Formula 80]
1-27
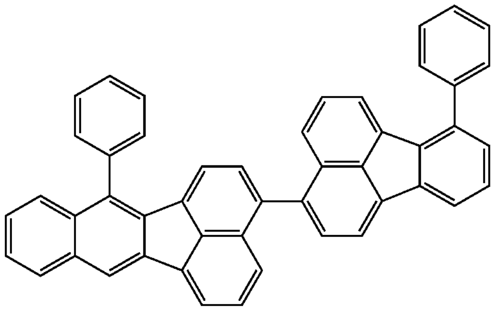
1-28
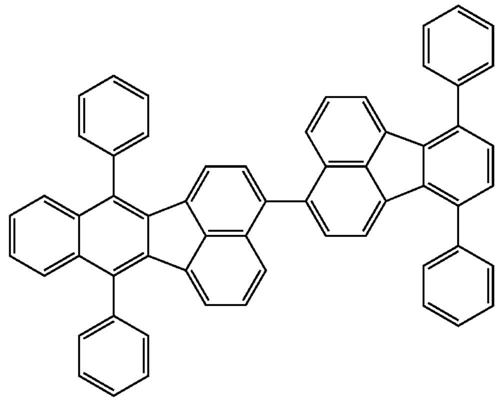
1-29
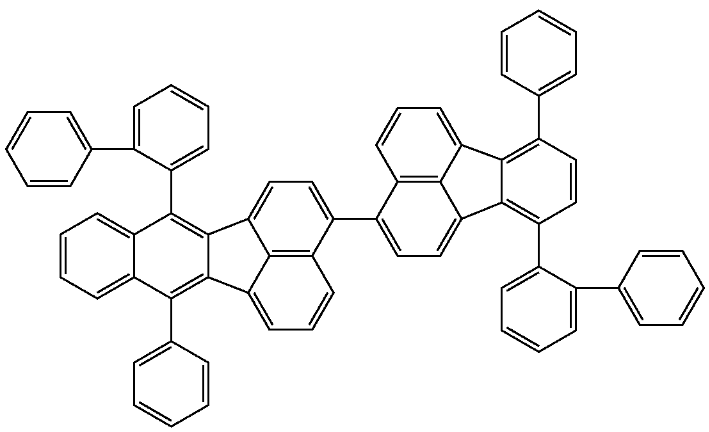
1-30
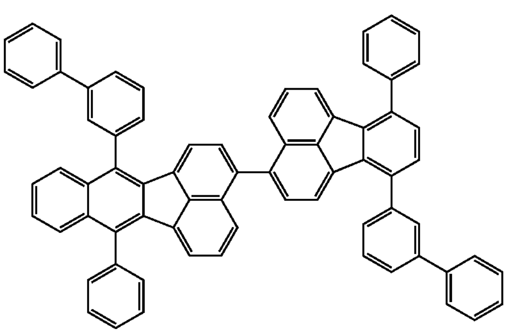
1-31
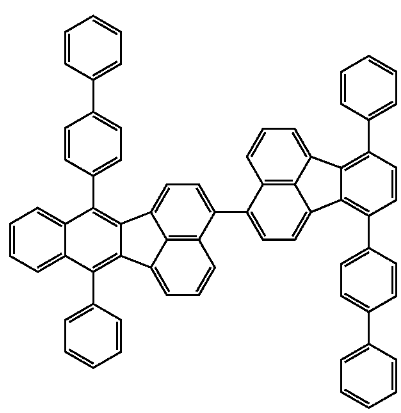

-continued
1-32
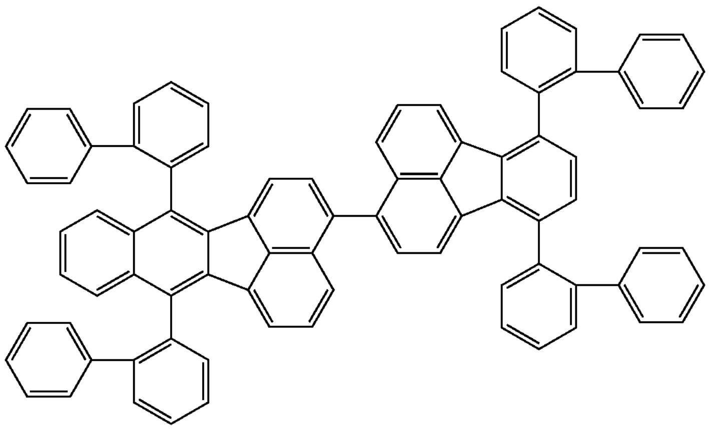
1-33
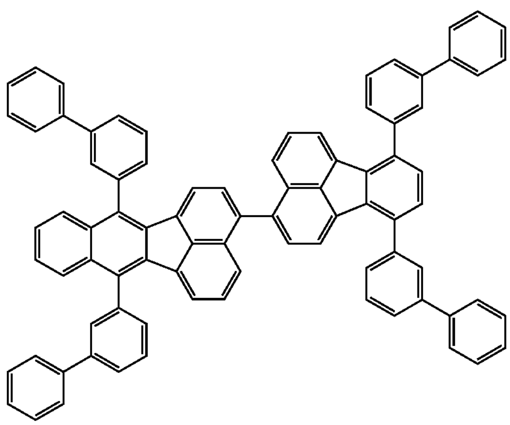
1-34
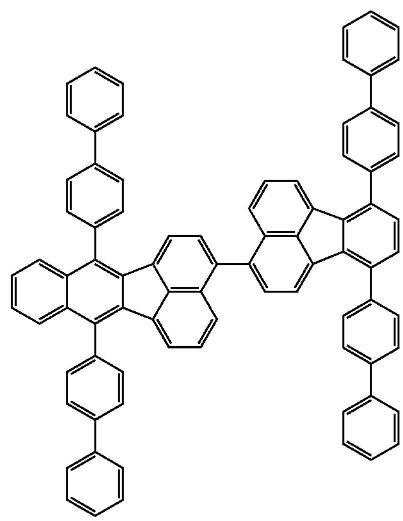
1-35
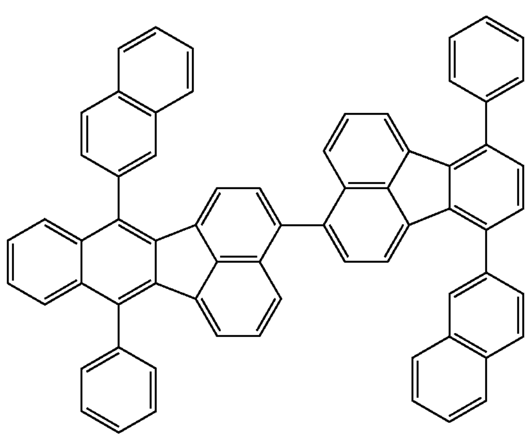

-continued
[Chemical Formula 81]
1-36
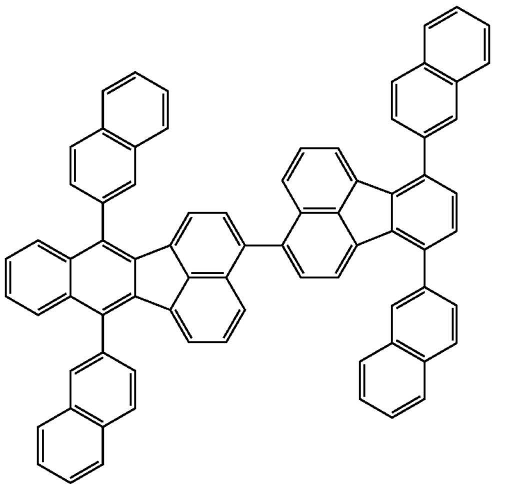
1-37
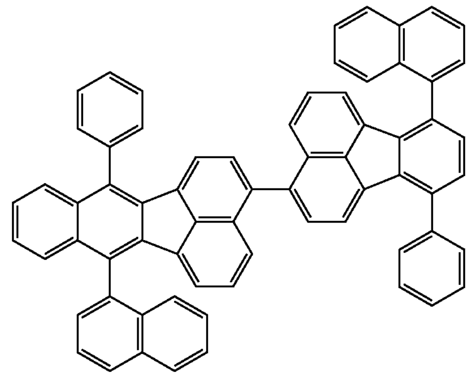
1-38
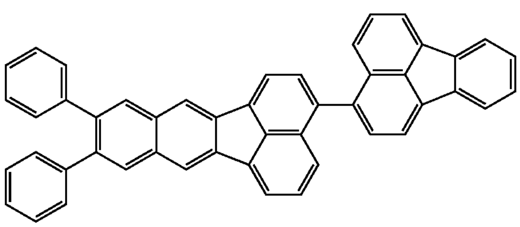
1-39
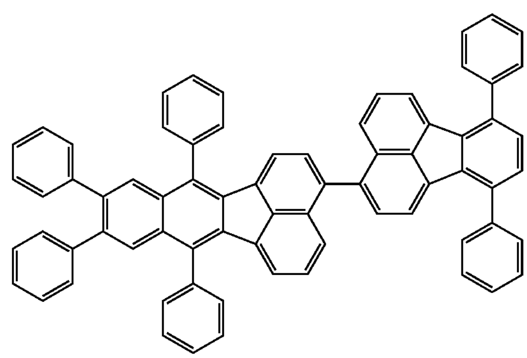
1-40
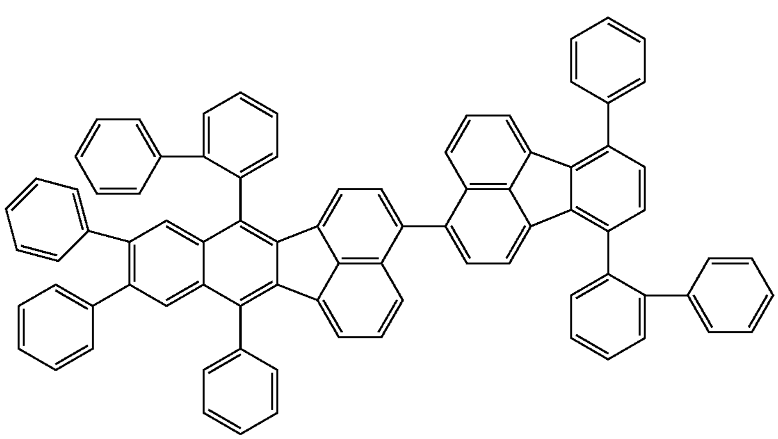

-continued
1-41
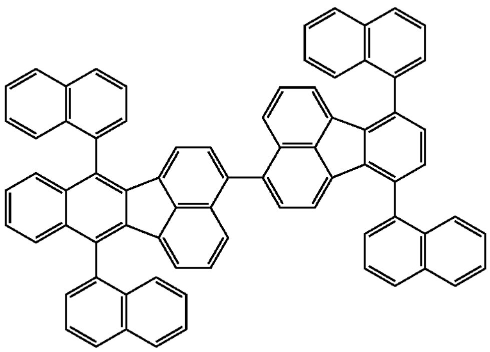
1-42
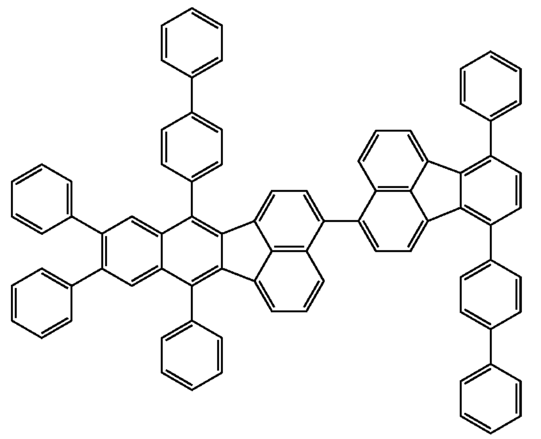
1-43
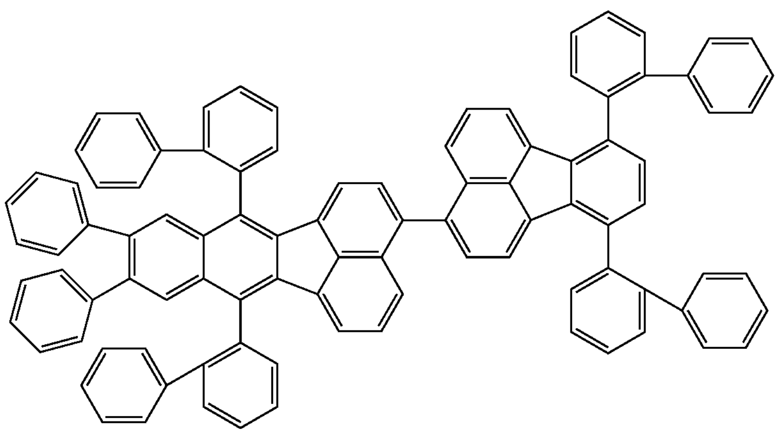
1-44
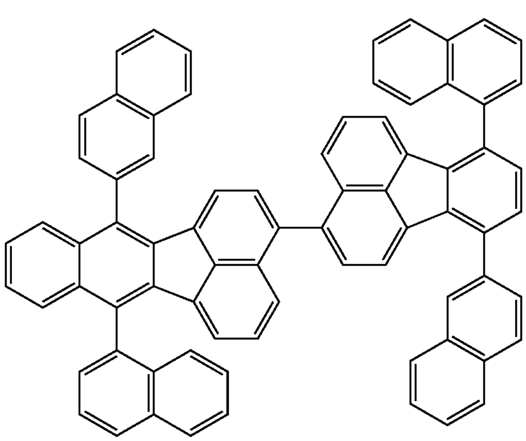

-continued
[Chemical Formula 82]
1-45
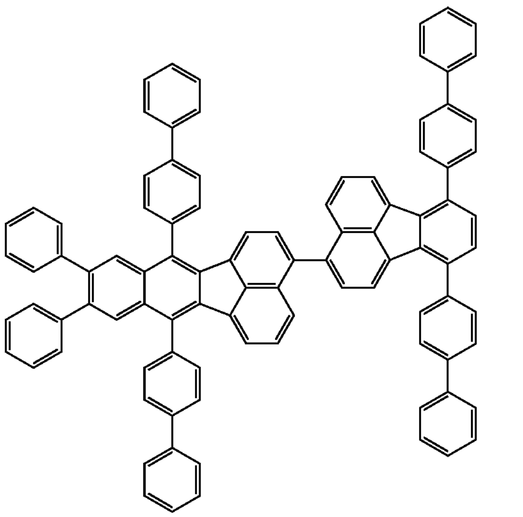
1-46
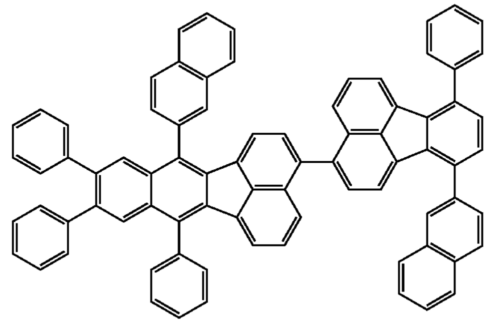
1-47
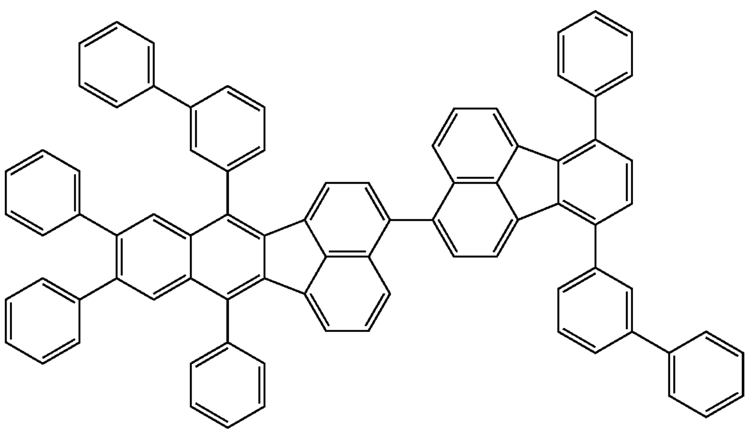
1-48
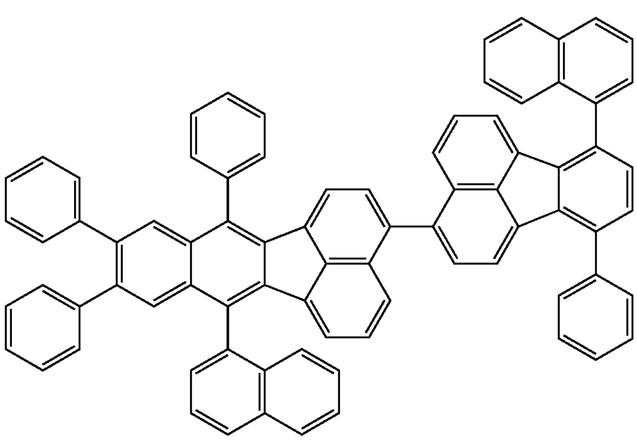

-continued
1-49
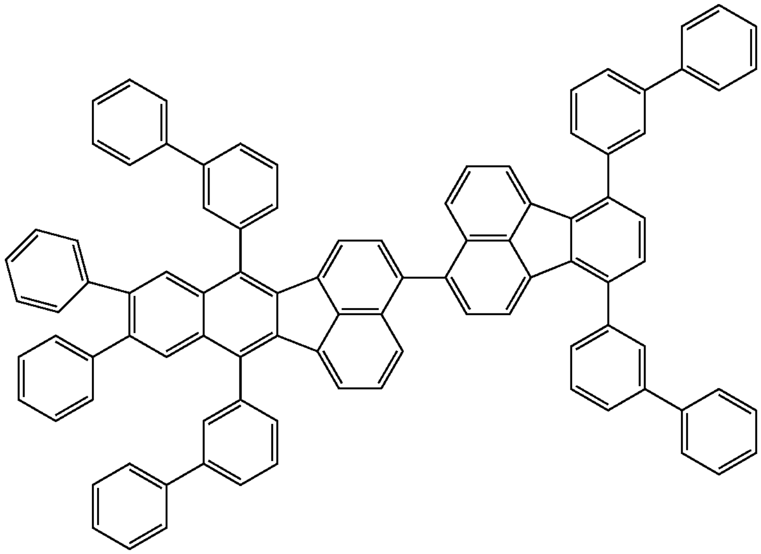
1-50
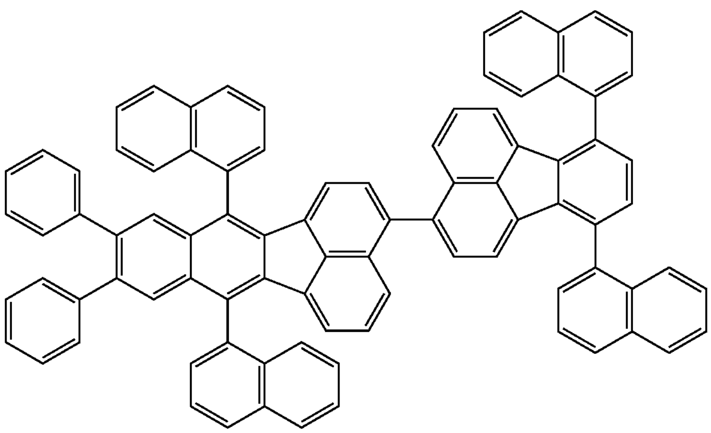
1-51
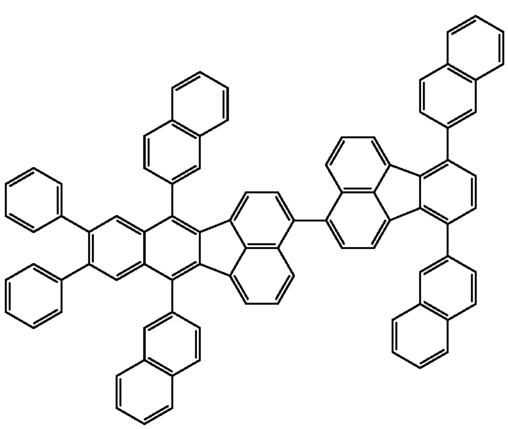
1-52
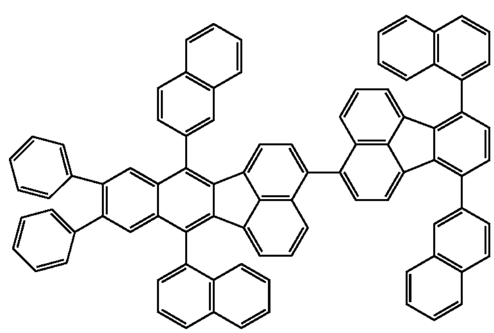

-continued
[Chemical Formula 83]
1-53
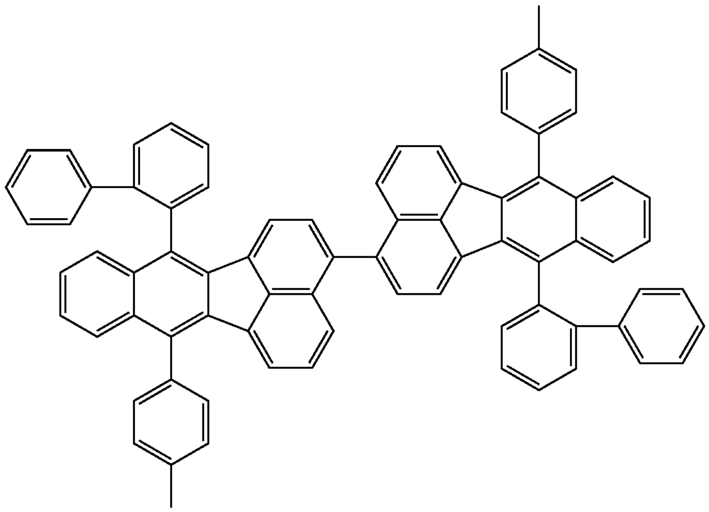
1-54
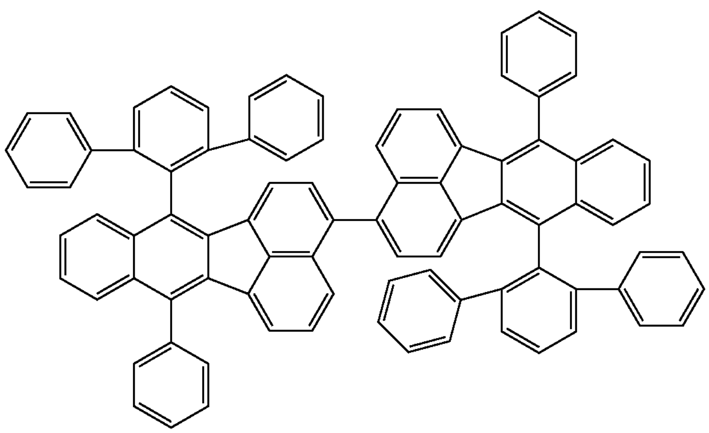
1-55
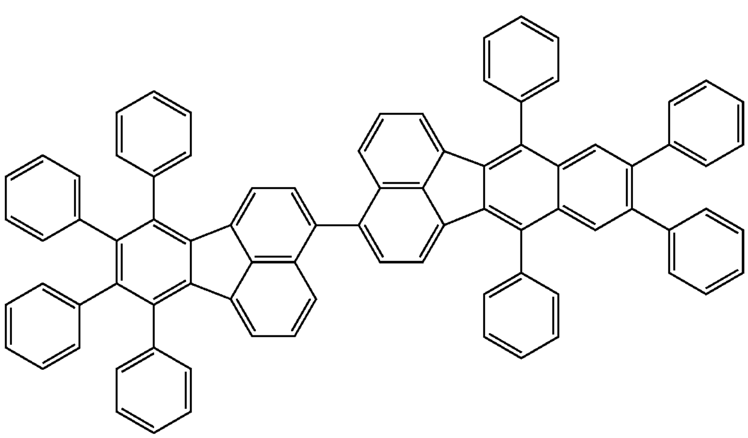

-continued
1-56
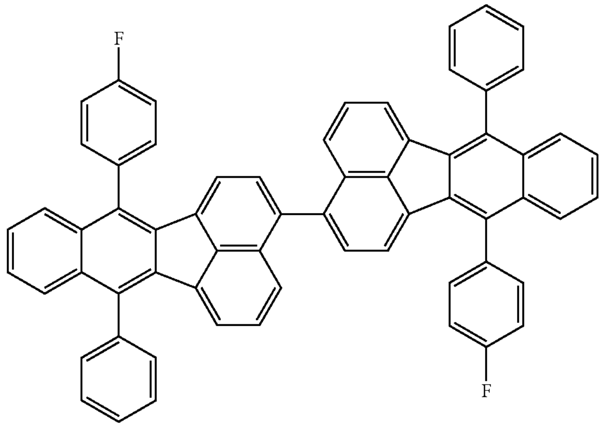
1-57
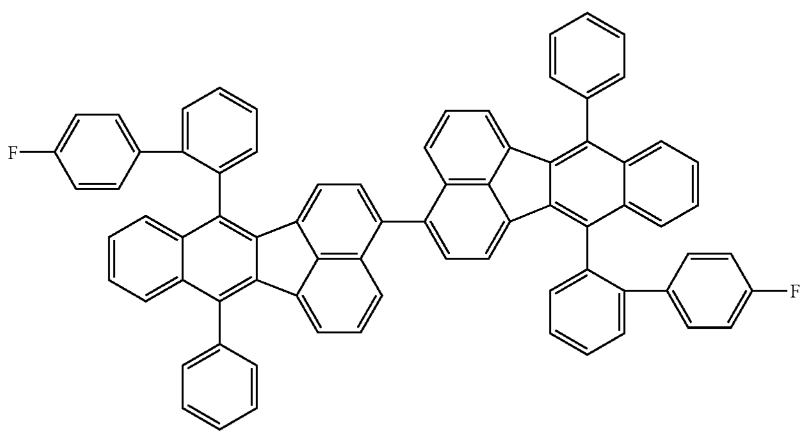
1-58
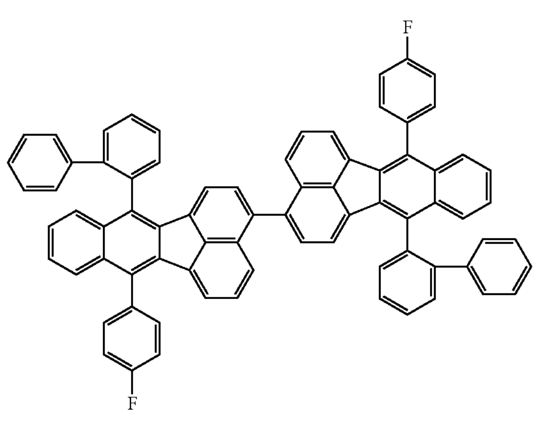
1-59
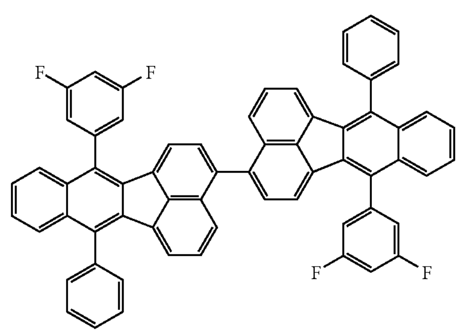

-continued
1-60
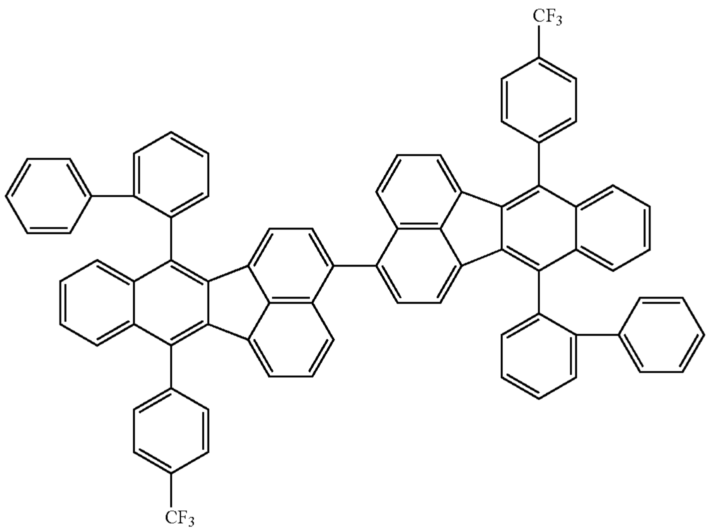
[Chemical Formula 84]
1-61
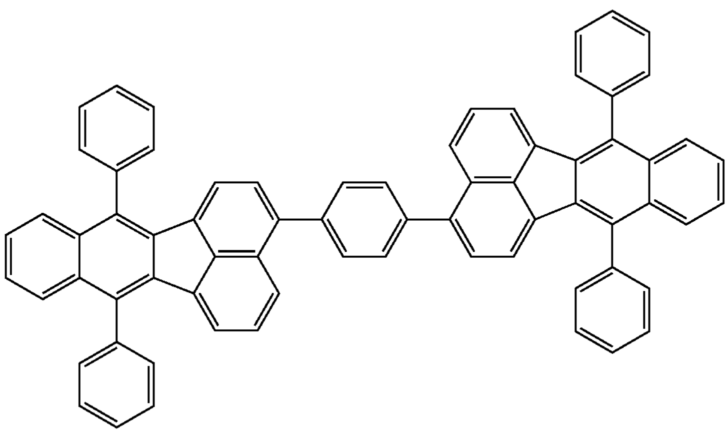
1-62
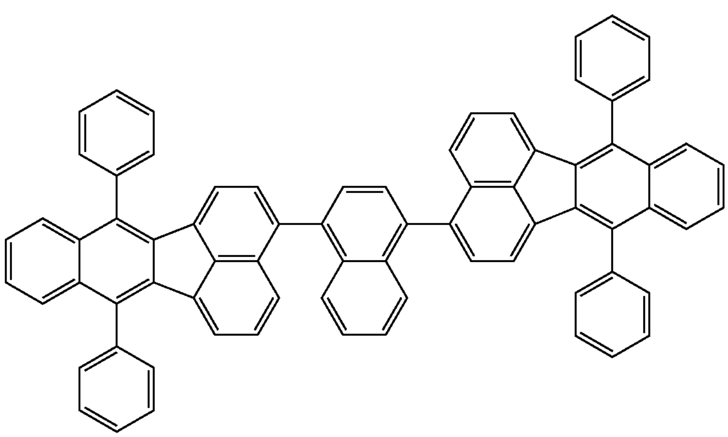

-continued
1-63
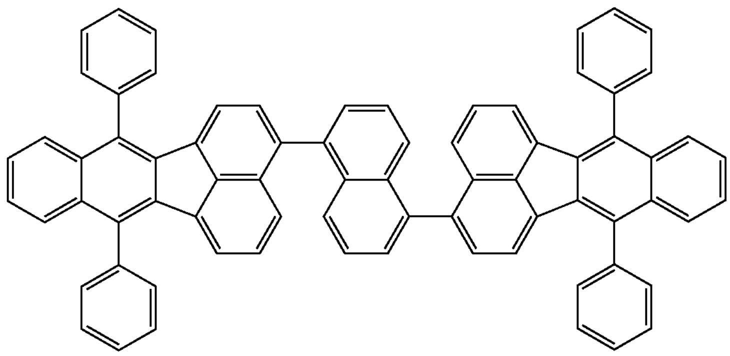
1-64
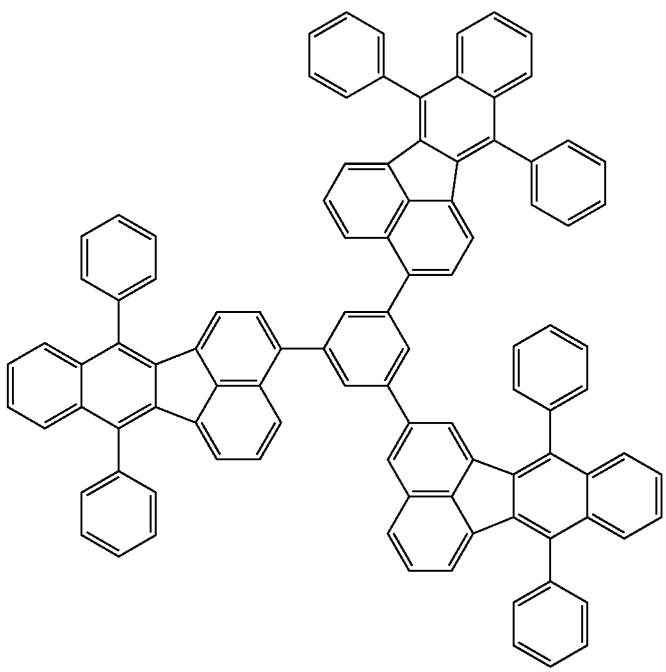
1-65
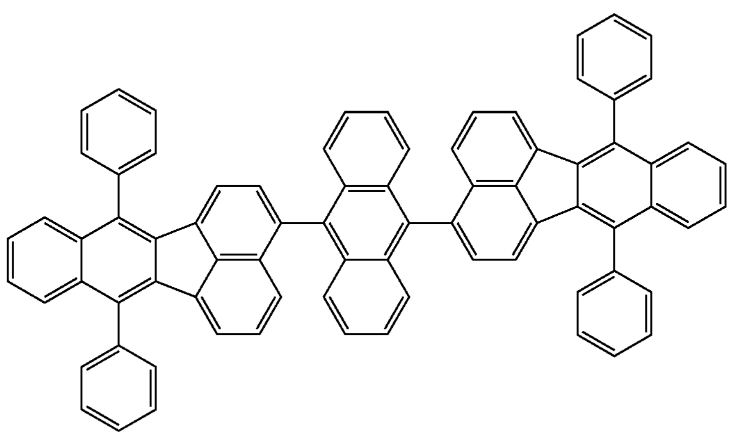

-continued
1-66
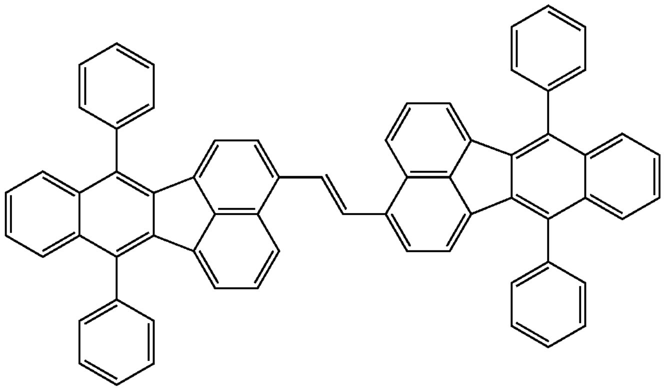
1-67
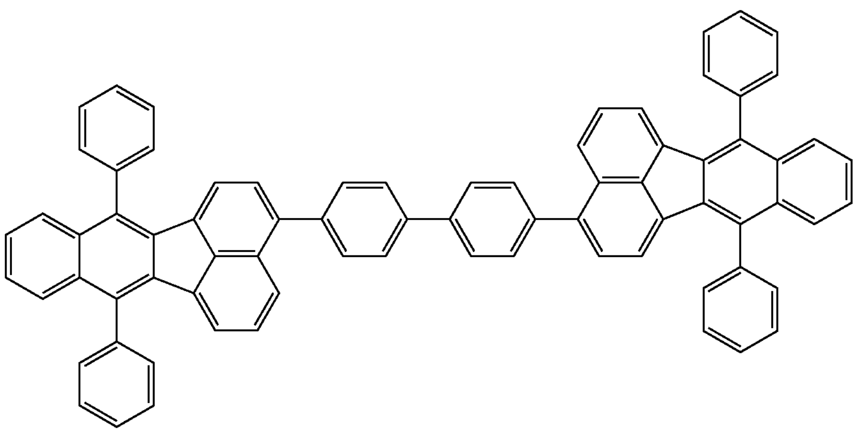
1-68
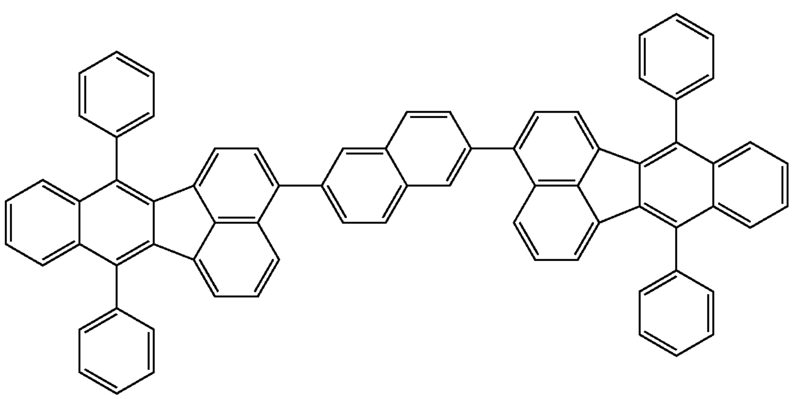
1-69
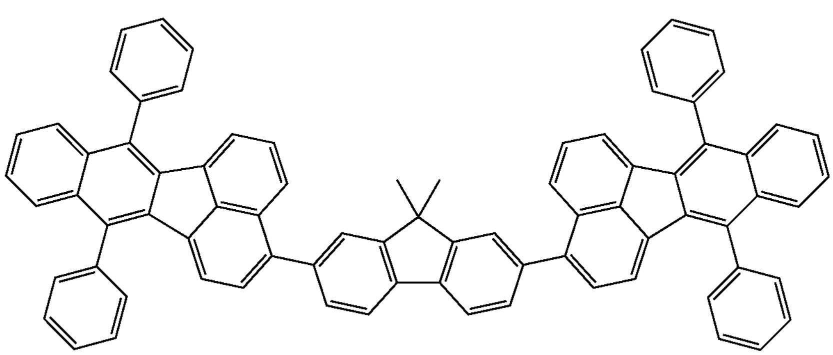

-continued
[Chemical Formula 85]
1-70
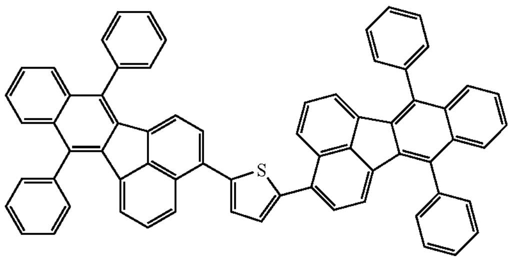
1-71
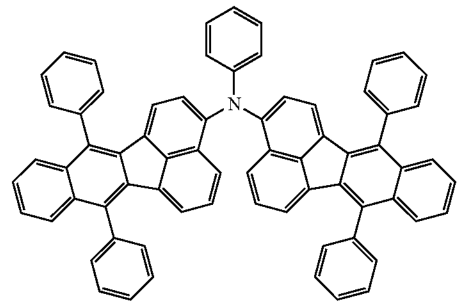
1-72
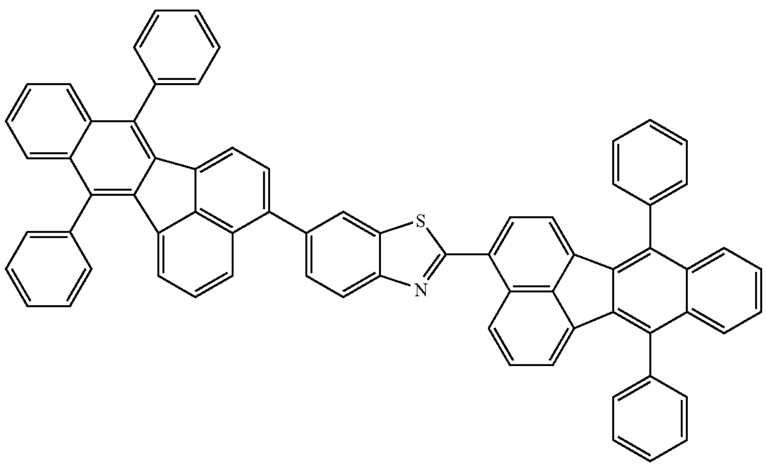
1-73
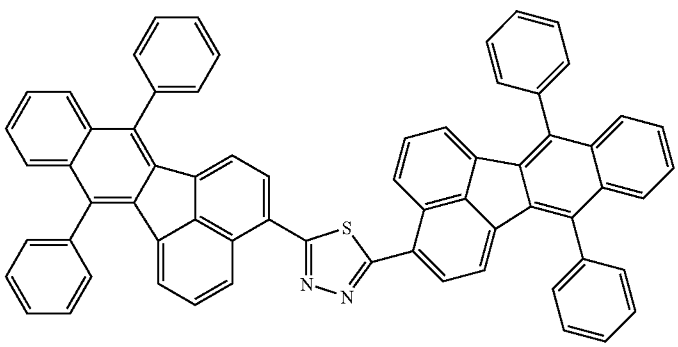
1-74
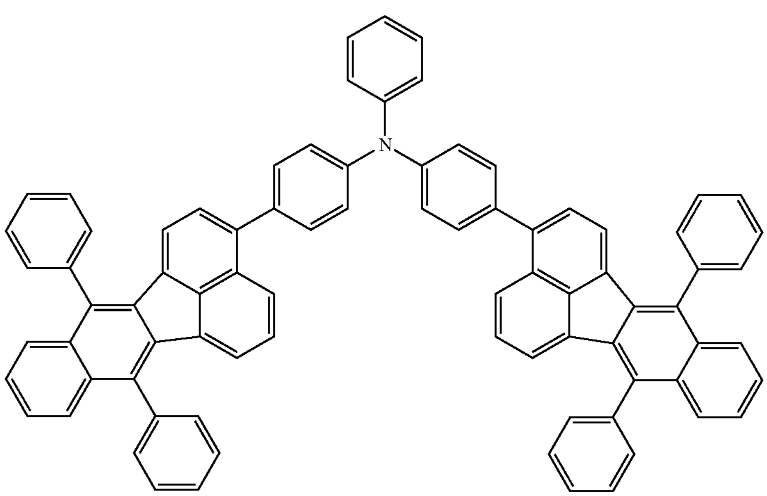

-continued
1-75
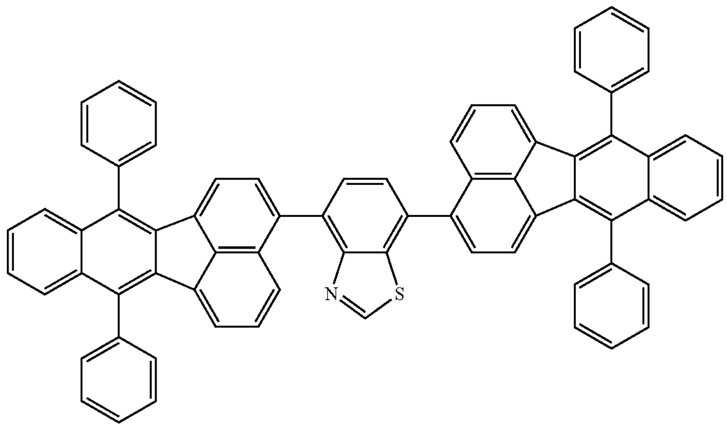
1-76
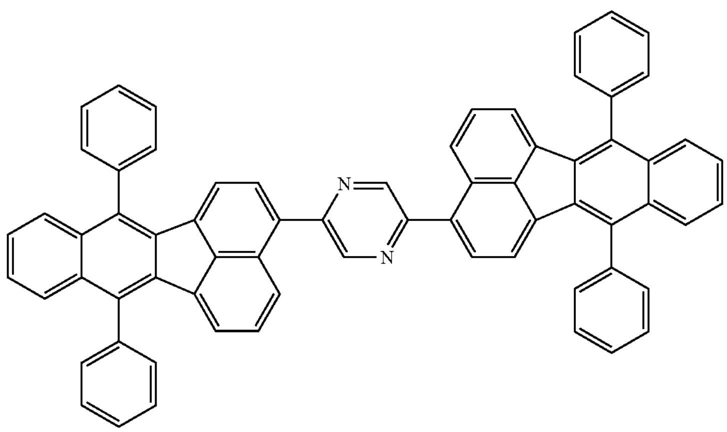
1-77
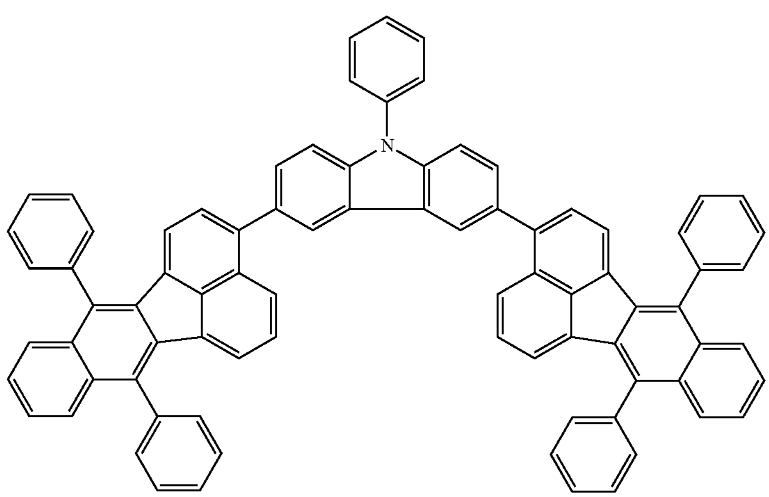

-continued
1-78
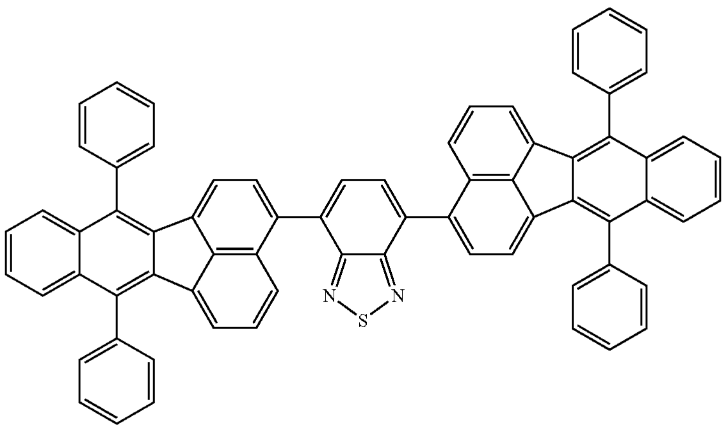
[Chemical Formula 86]
1-79
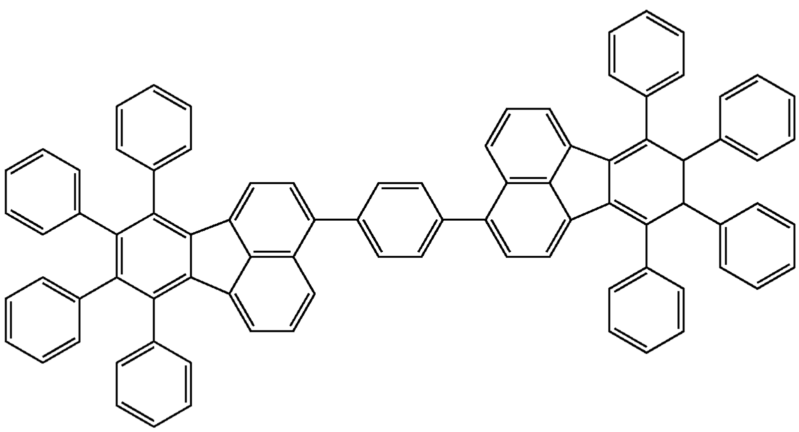
1-80
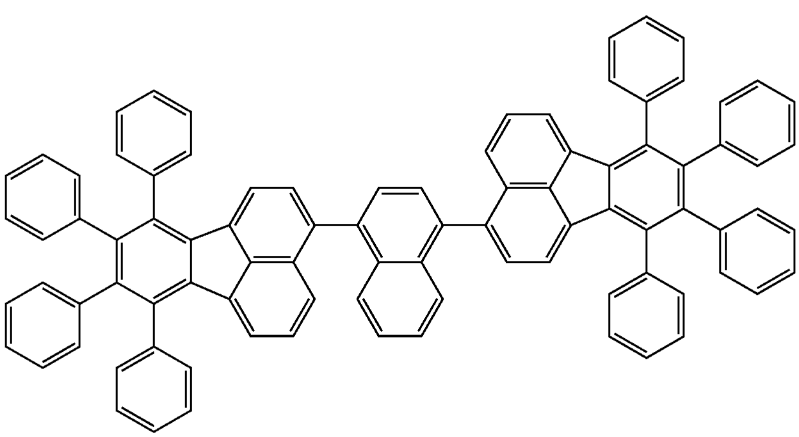

-continued
1-81
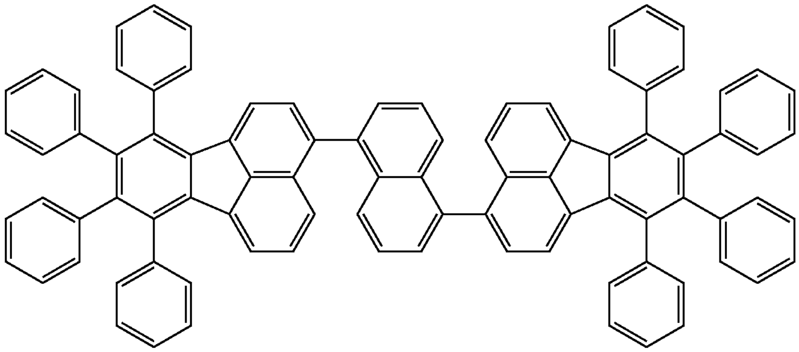
1-82
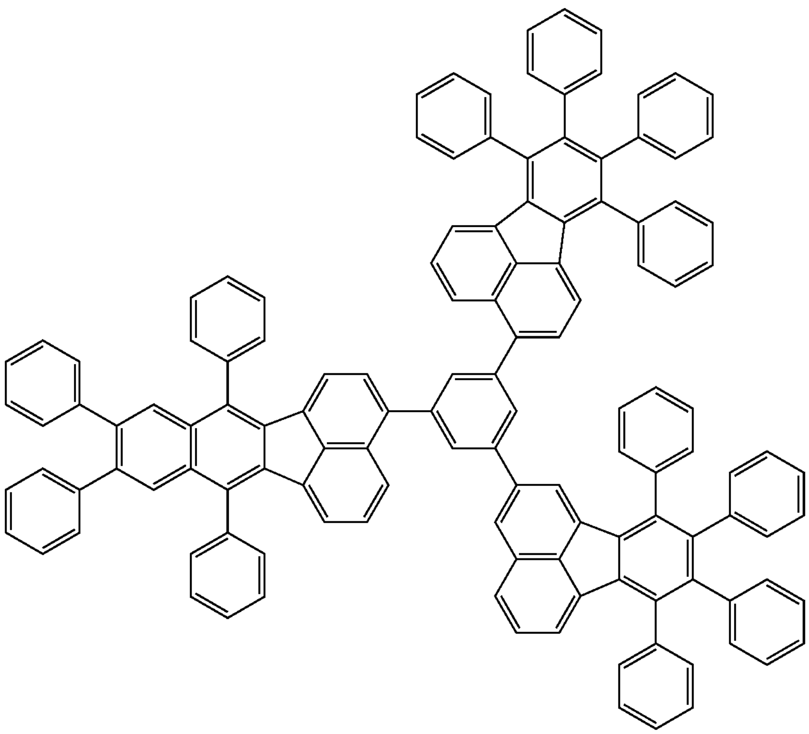
1-83
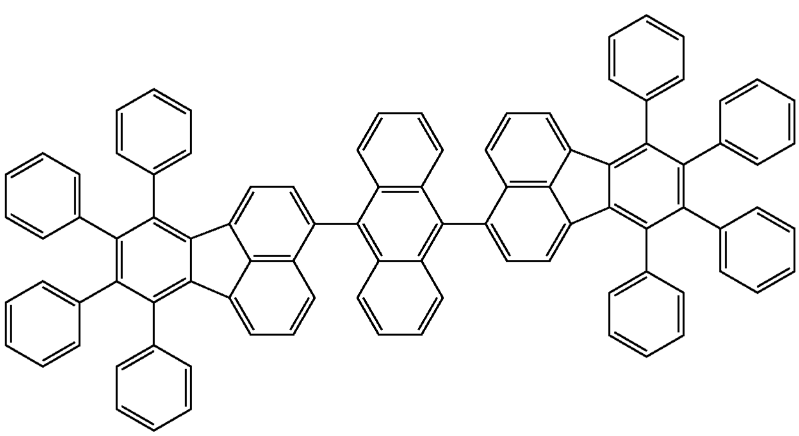

-continued
1-84
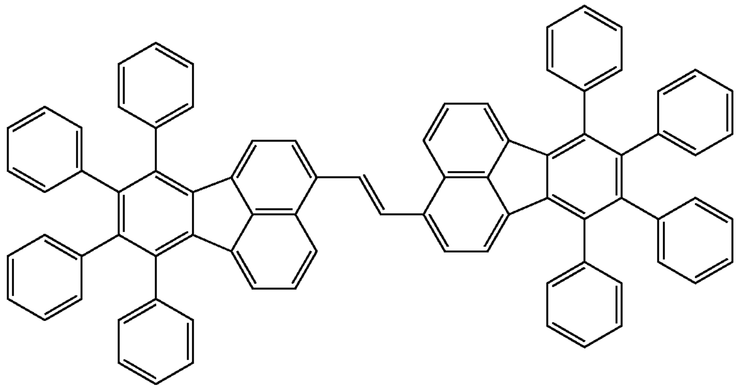
1-85
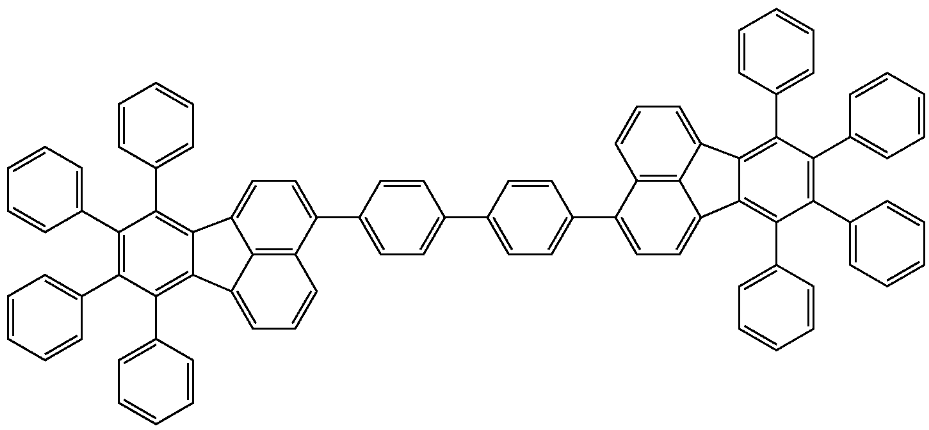
1-86
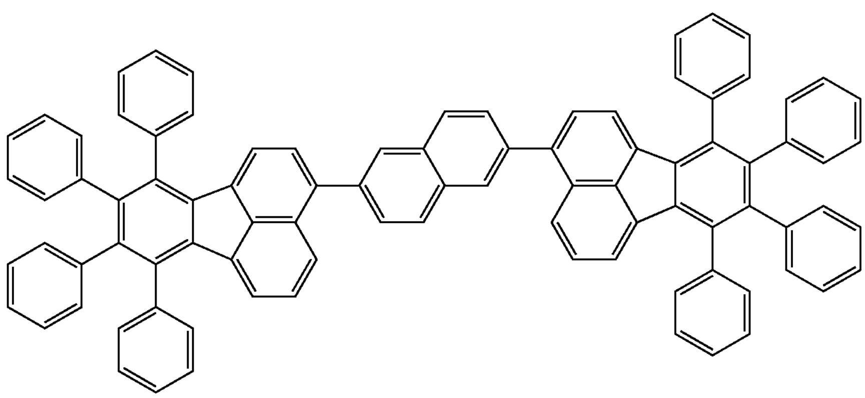
1-87
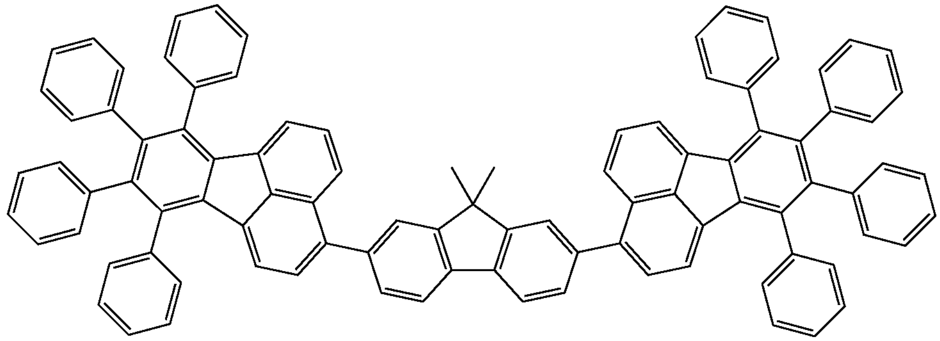

-continued
[Chemical Formula 87]
1-88
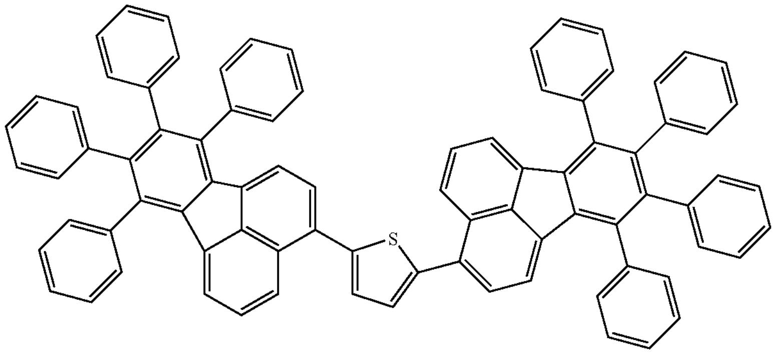
1-89
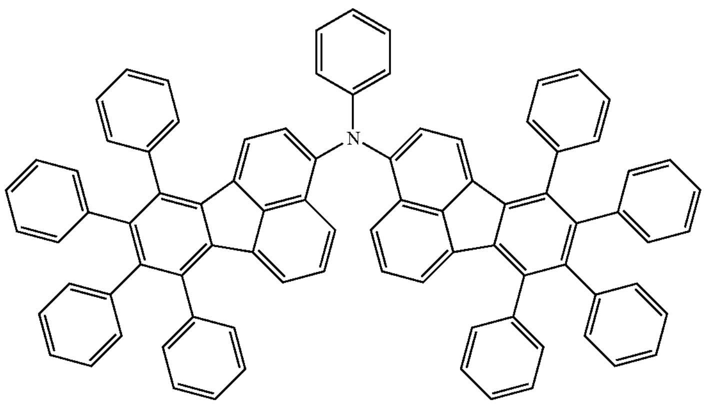
1-90
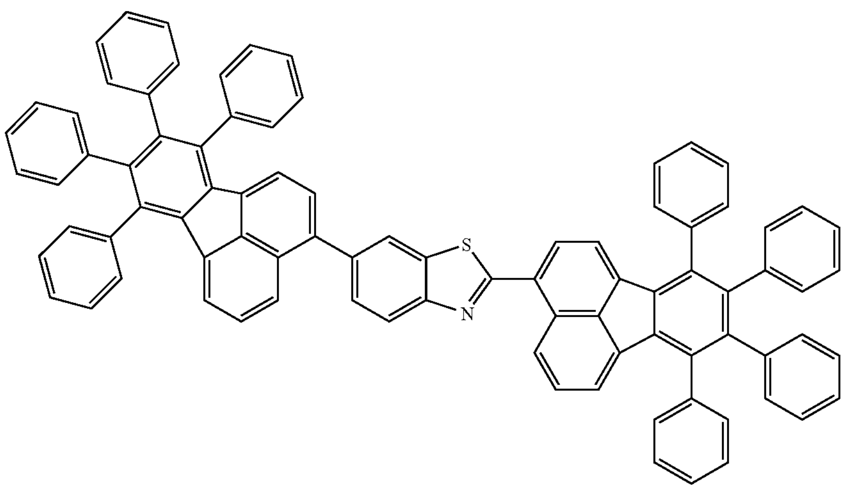
1-91
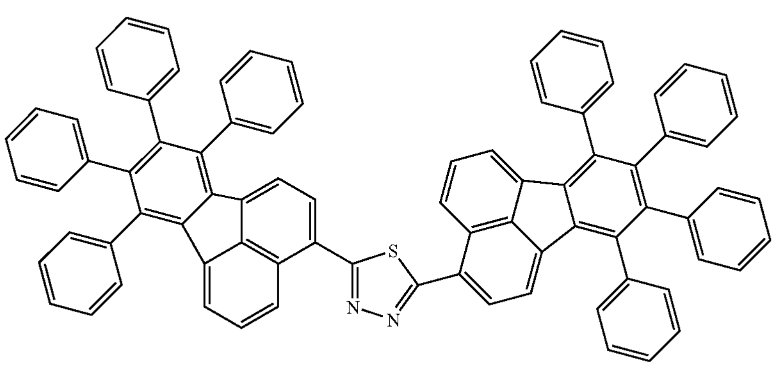

-continued
1-92
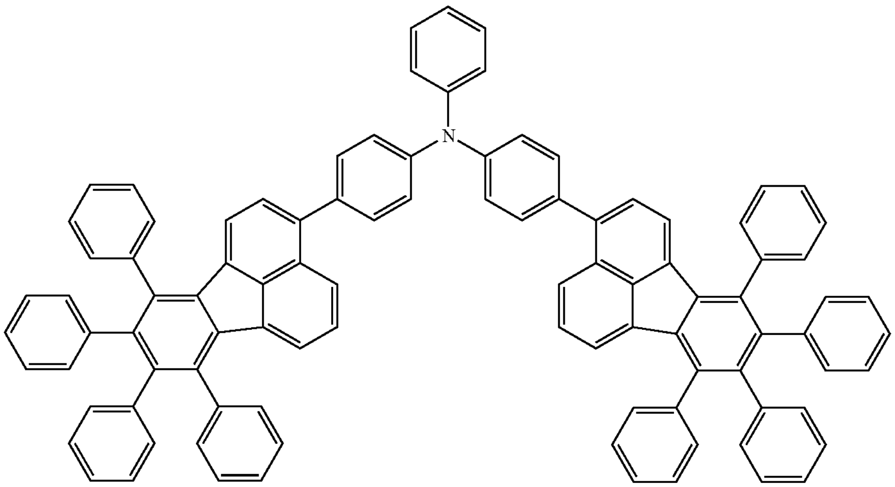
1-93
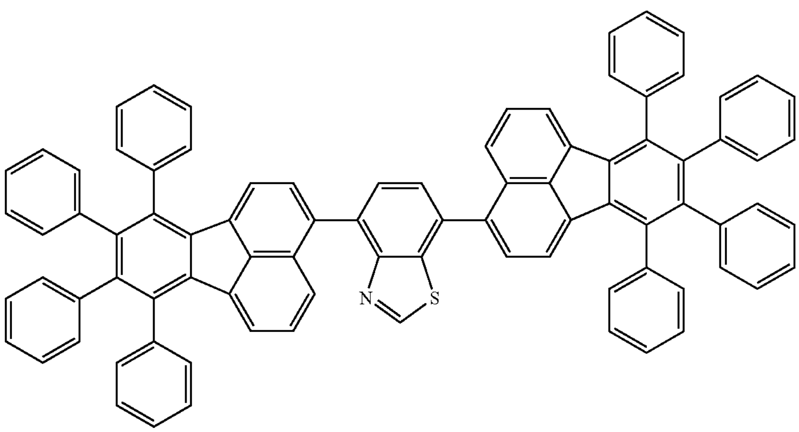
1-94
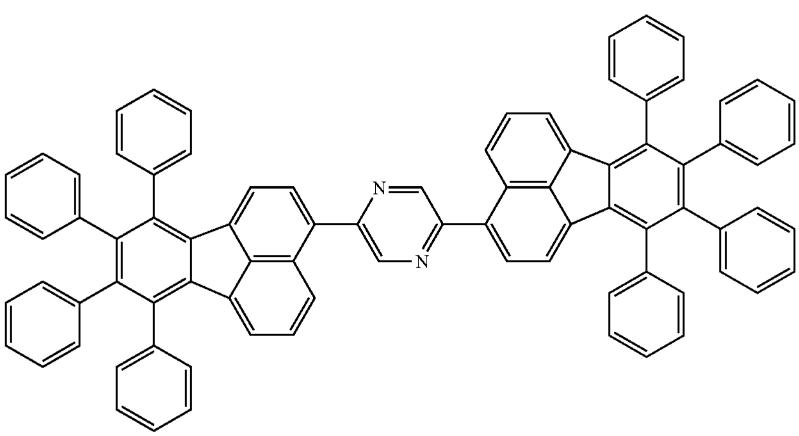

-continued
1-95
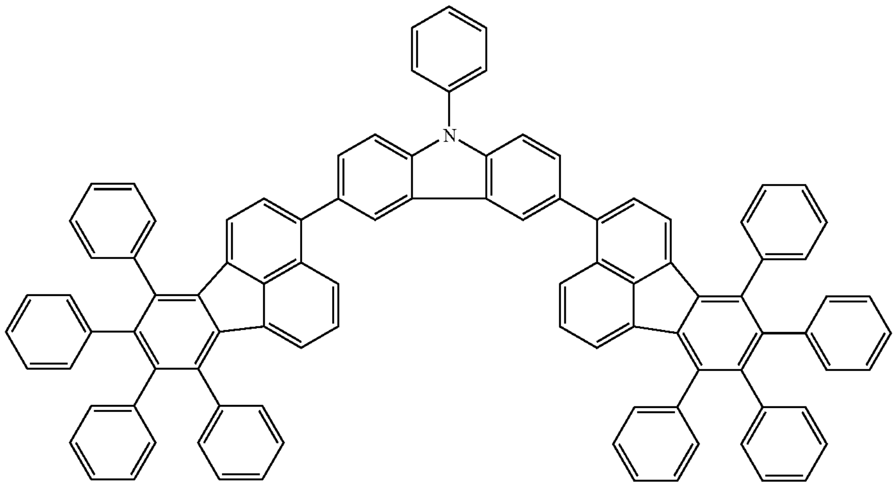
1-96
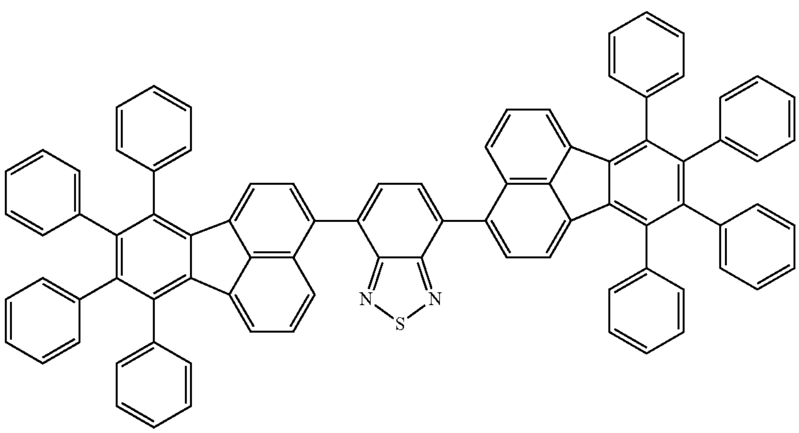
[Chemical Formula 88]
1-97
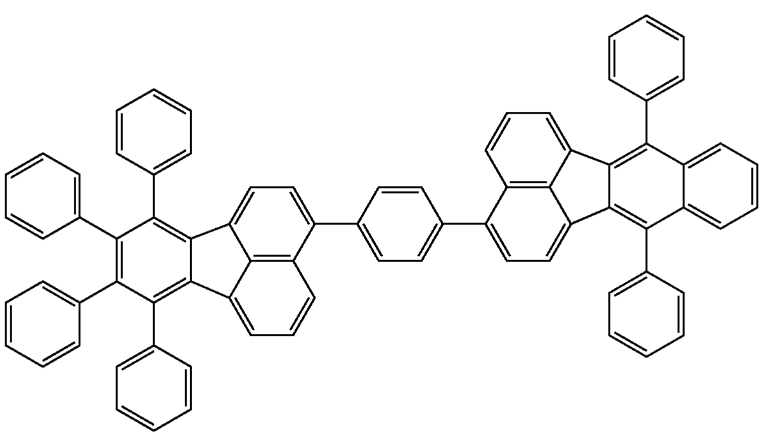

-continued
1-98
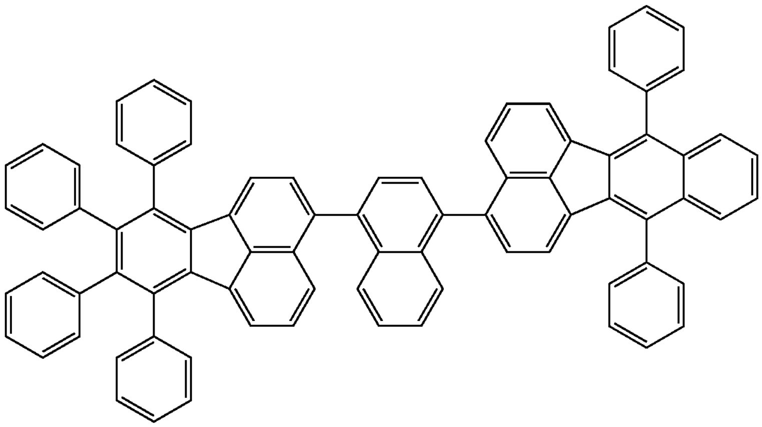
1-99
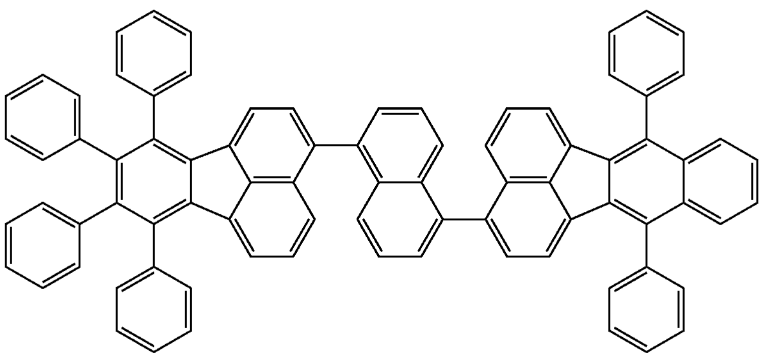
1-100
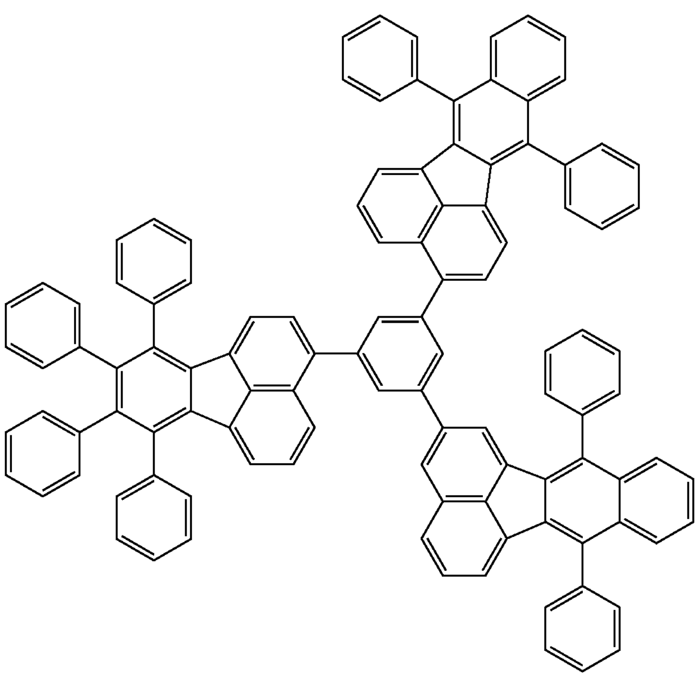

-continued
1-101
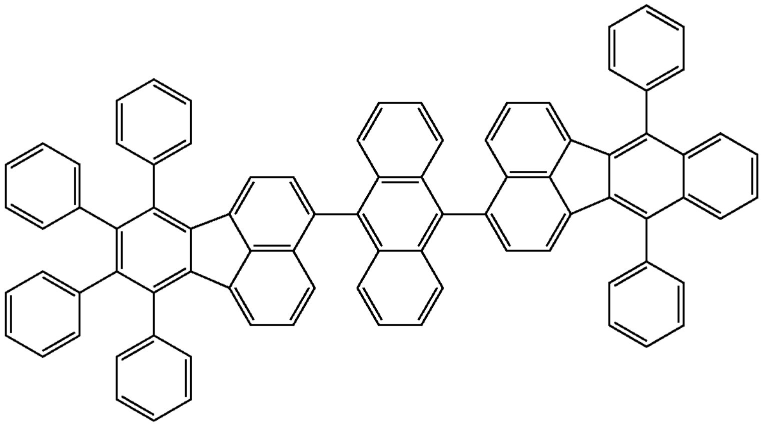
1-102
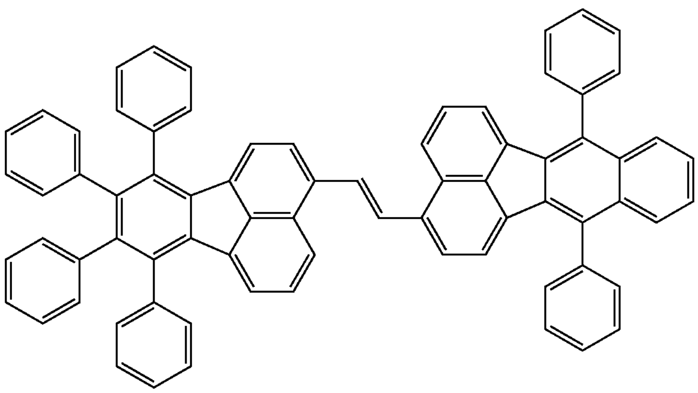
1-103
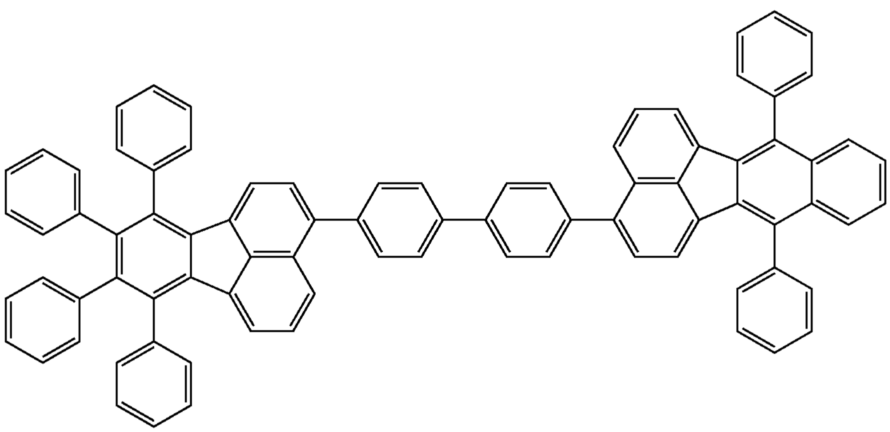
1-104
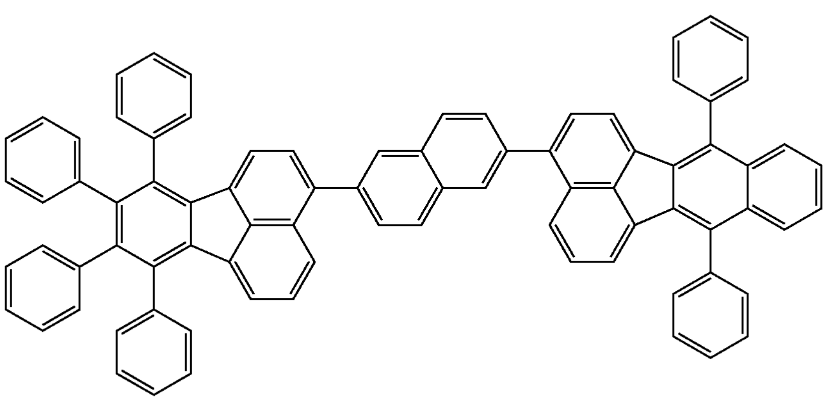

-continued
1-105
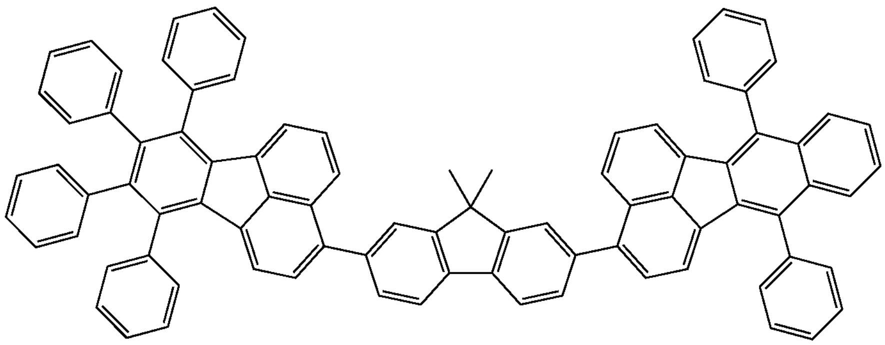
[Chemical Formula 89]
1-106
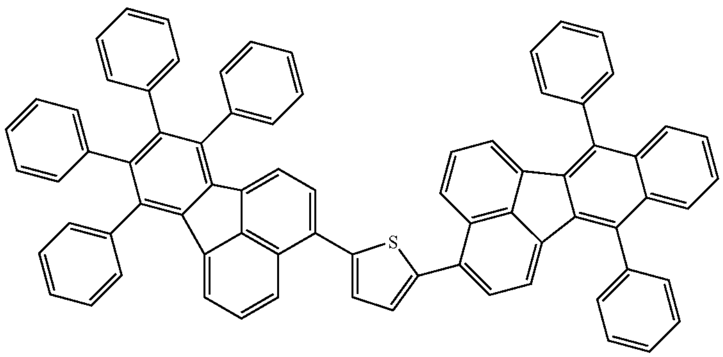
1-107
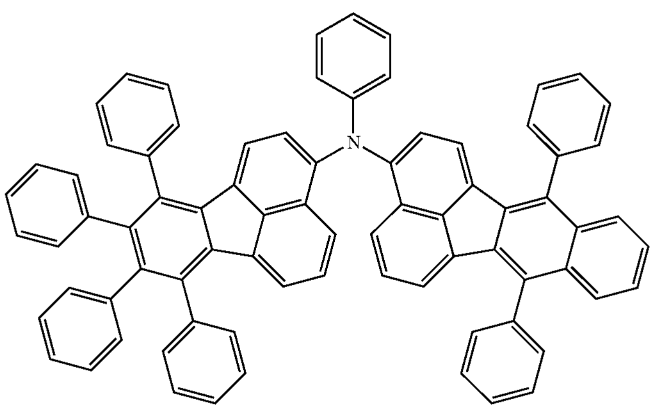
1-108
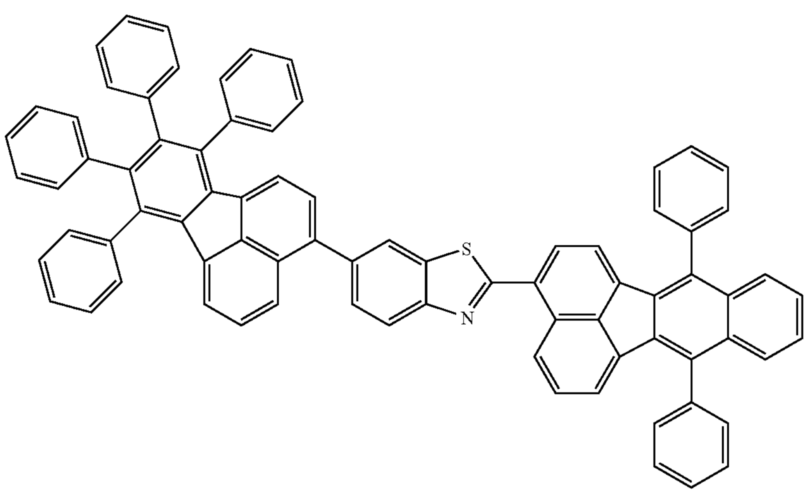

-continued
1-109
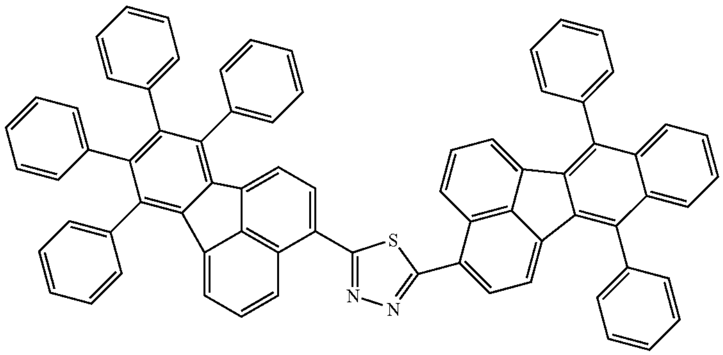
1-110
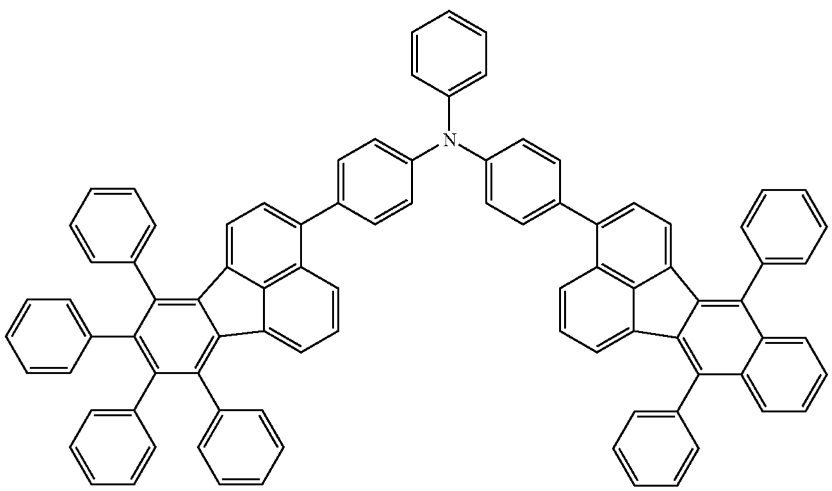
1-111
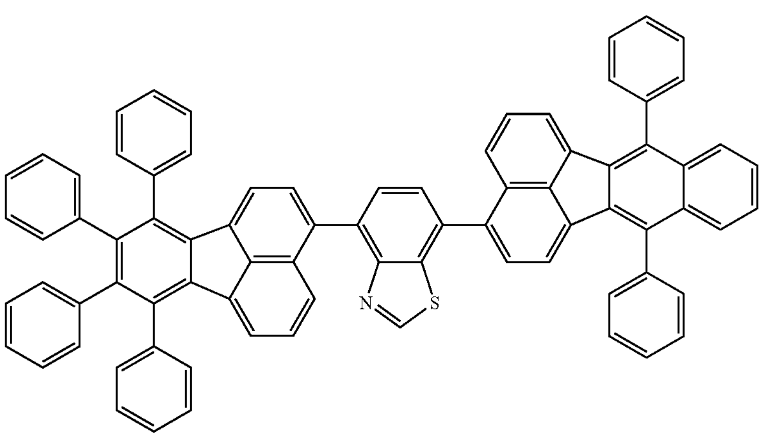

-continued
1-112
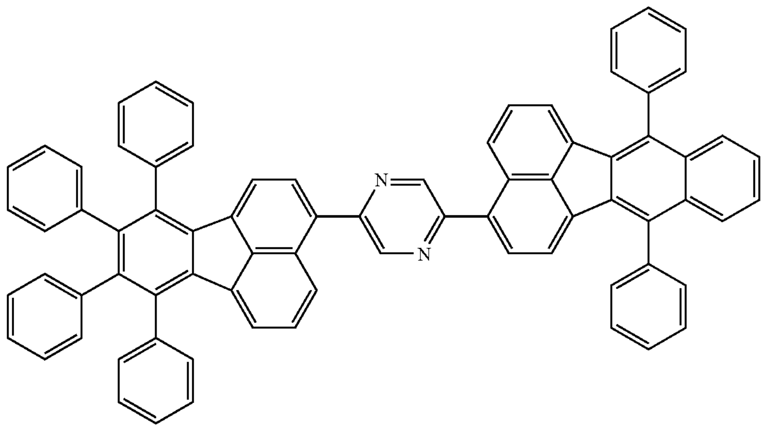
1-113
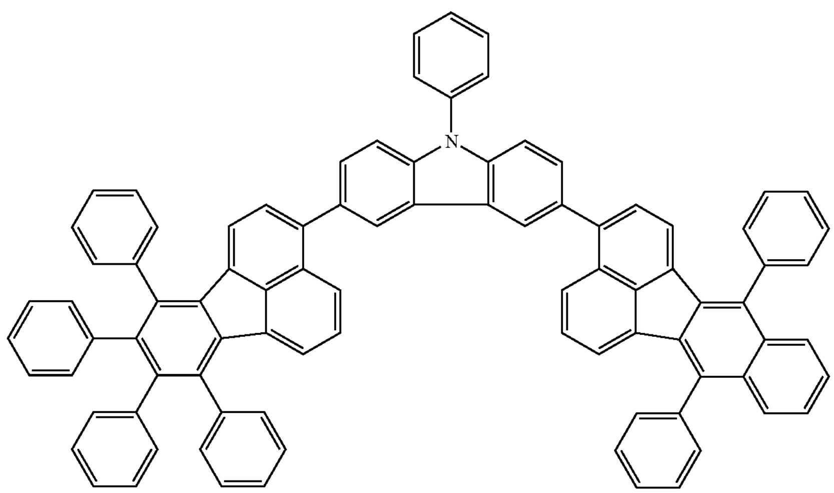
1-114
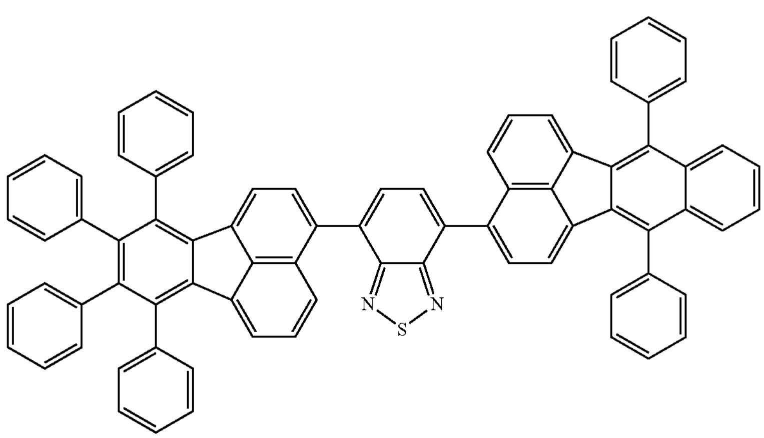

-continued
[Chemical Formula 90]
2-1
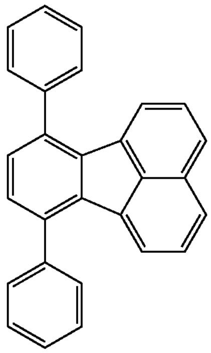
2-2
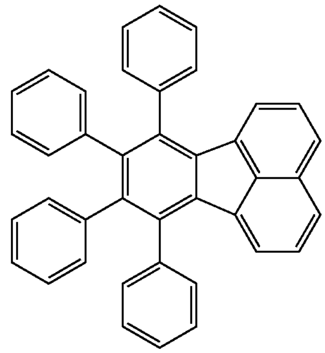
2-3
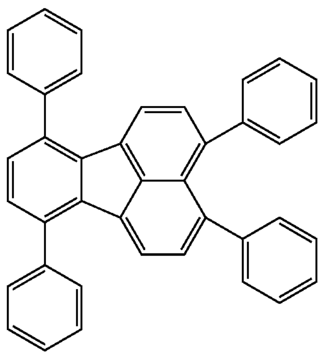
2-4
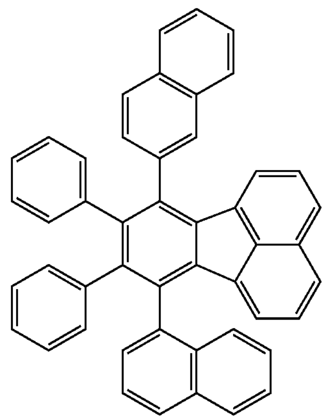
2-5
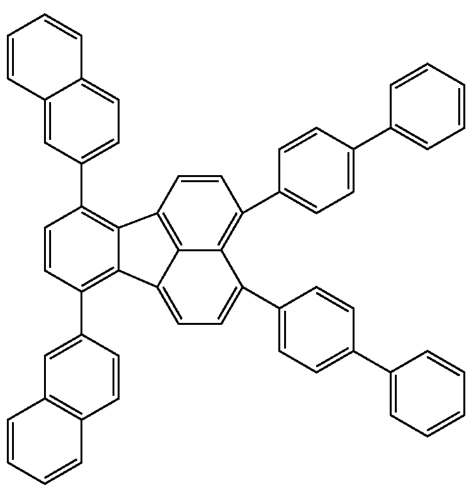
2-6
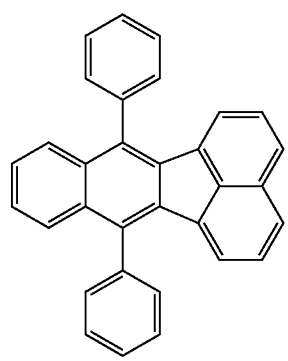
2-7
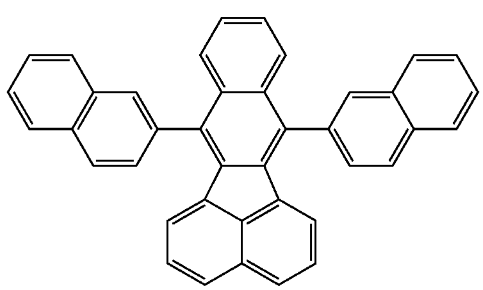
2-8
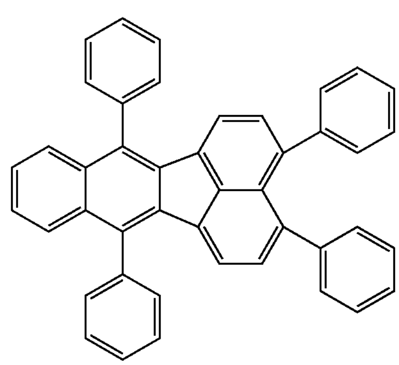

-continued
2-9
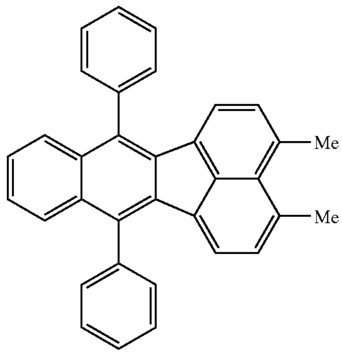
2-10
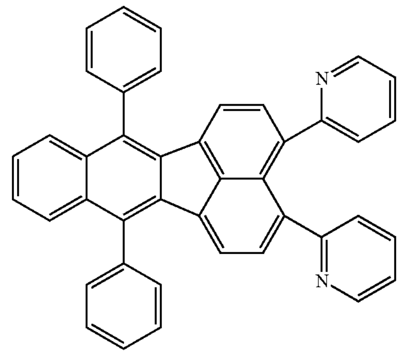
2-11
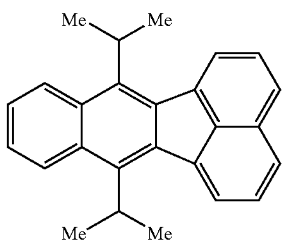
2-12
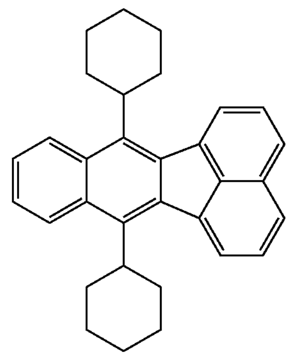
2-13
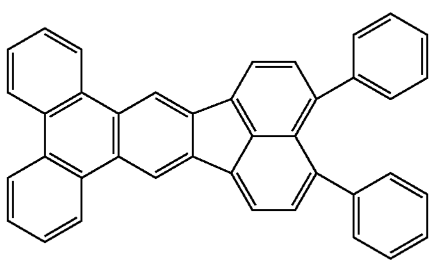
2-14
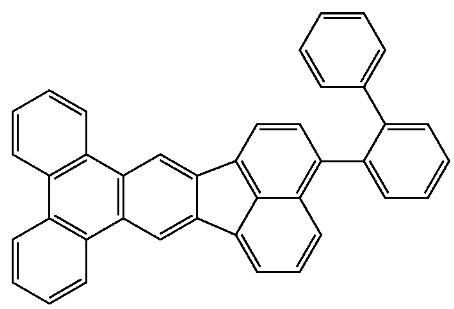
2-15
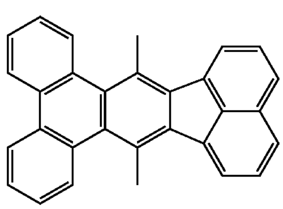
2-16
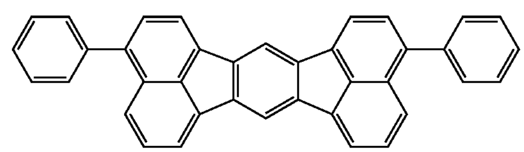
2-17
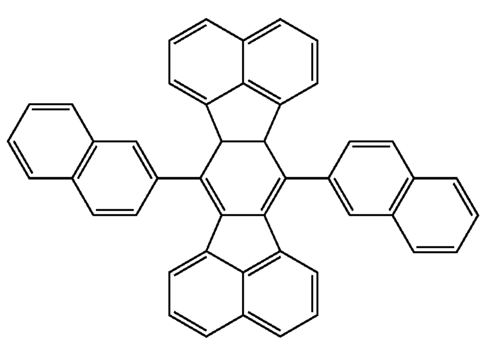
2-18
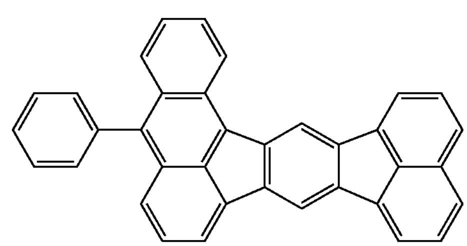

-continued
2-19
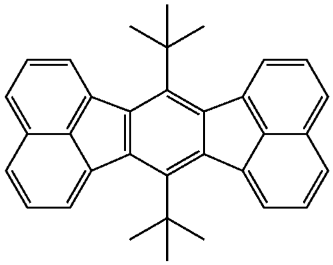
[Chemical Formula 91]
2-20
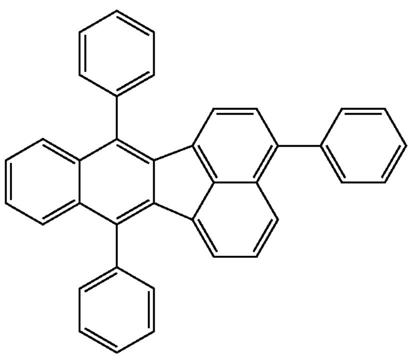
2-21
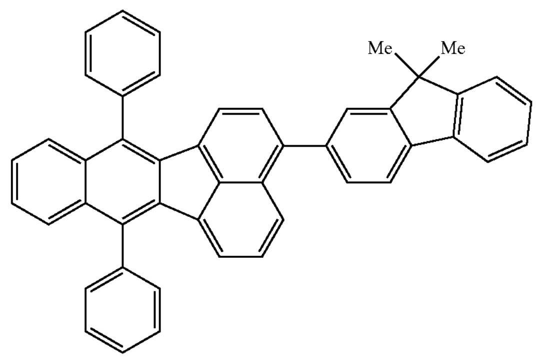
2-22
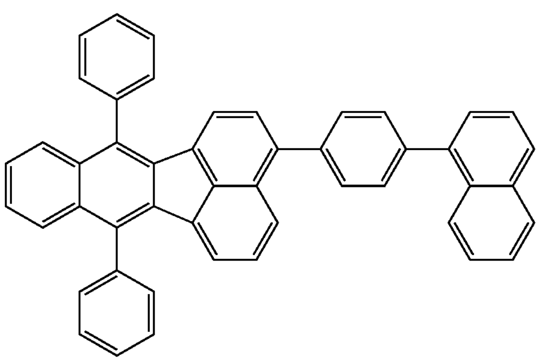
2-23
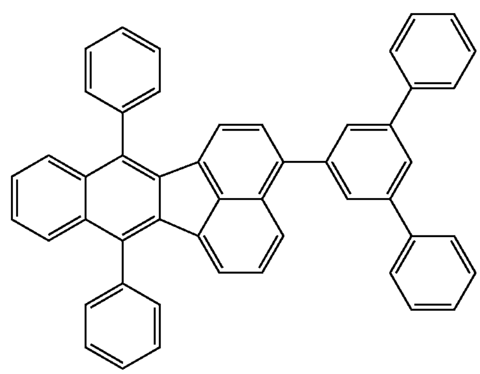
2-24
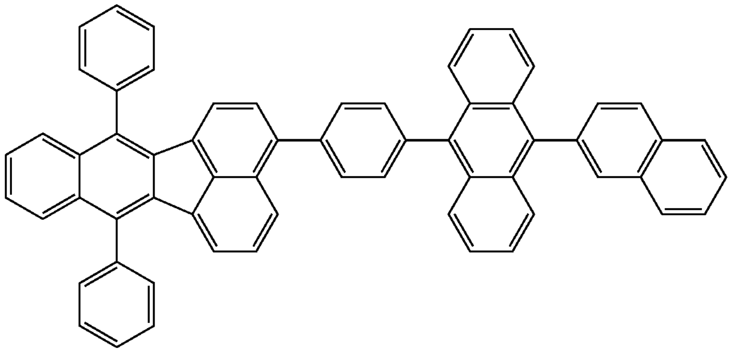

-continued
2-25
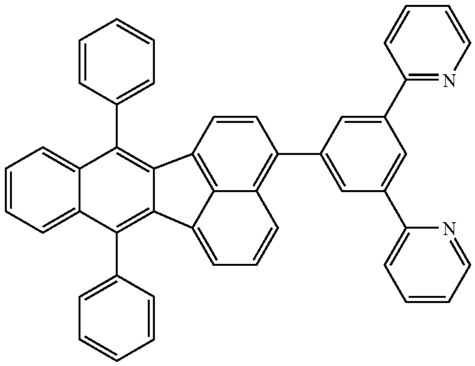
2-26
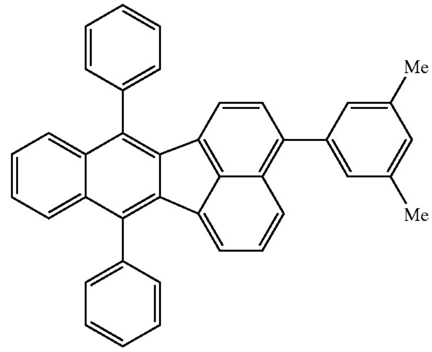
2-27
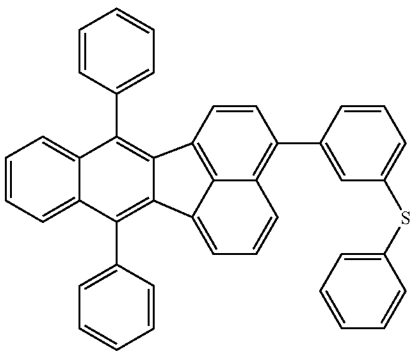
2-28
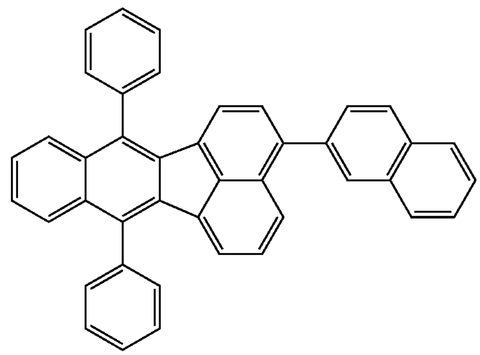
2-29
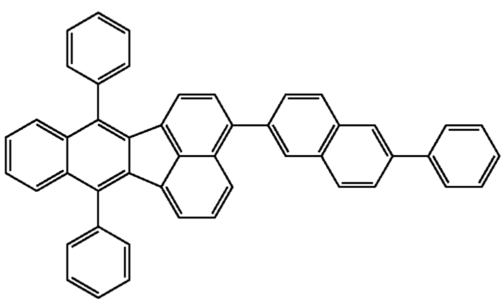
2-30
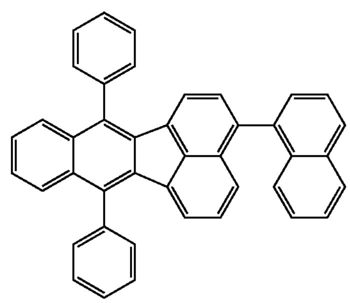
2-31
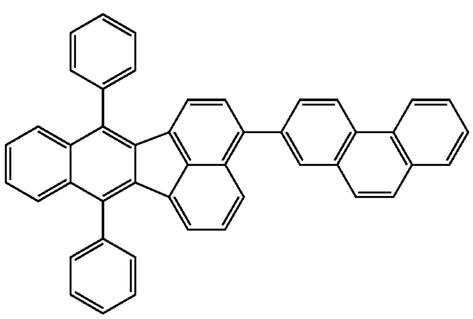
2-32
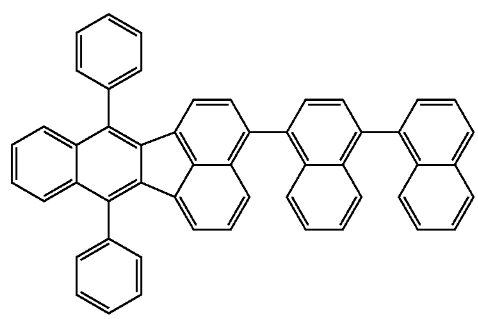
2-33
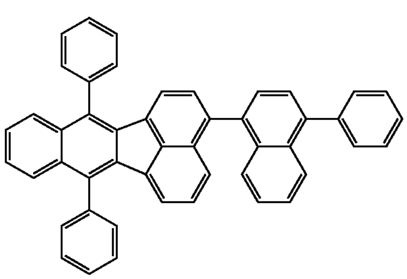
2-34
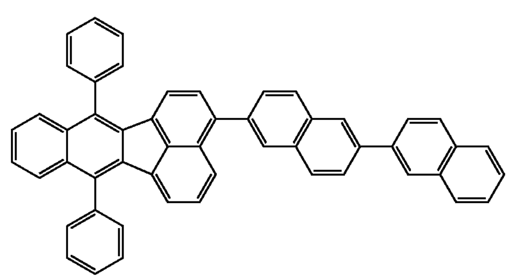

-continued
2-35
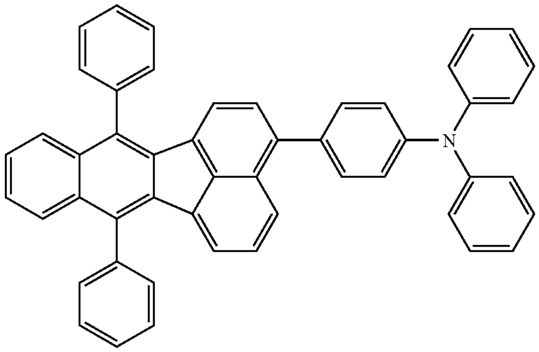
[Chemical Formula 92]
2-36
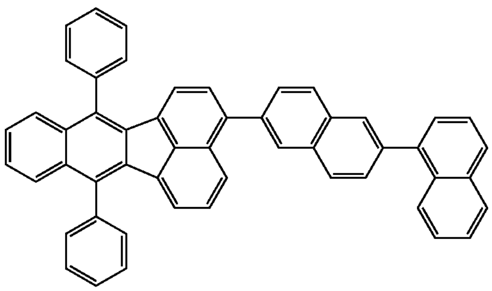
2-37
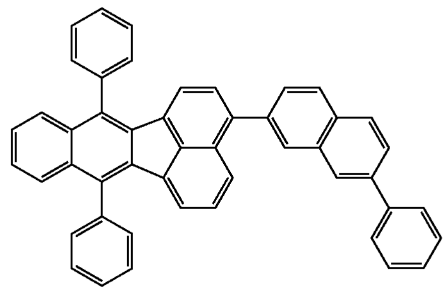
2-38
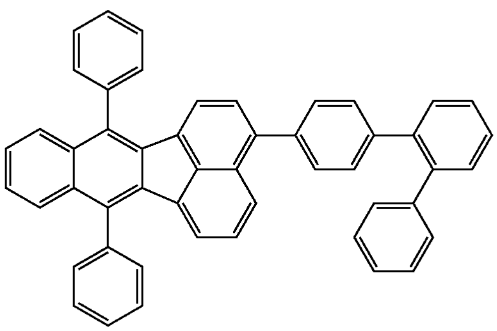
2-39
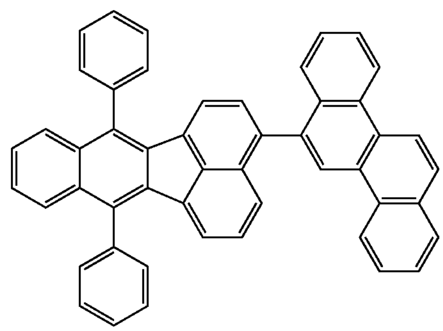
2-40
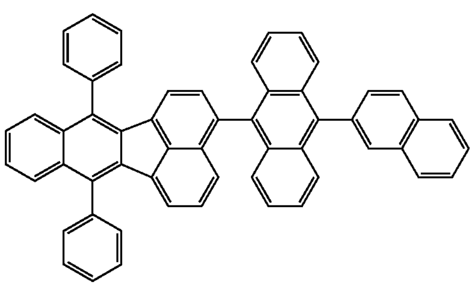
2-41
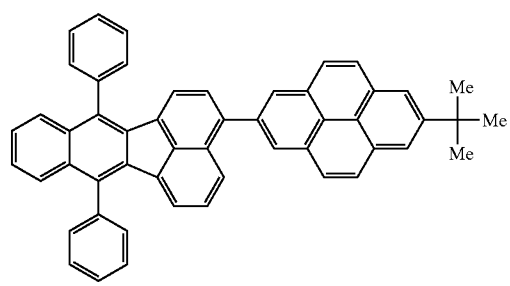
2-42
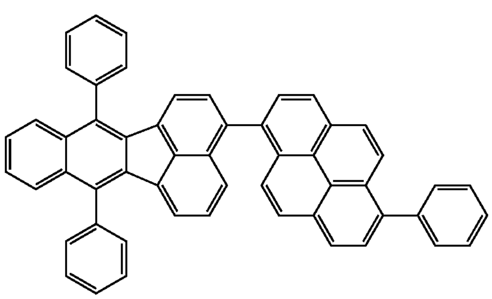
2-43
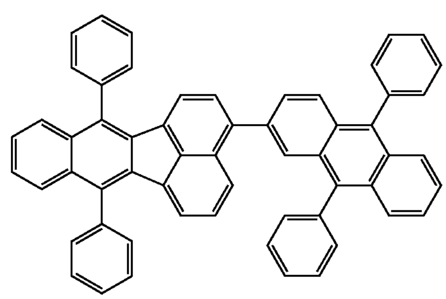

-continued
2-44
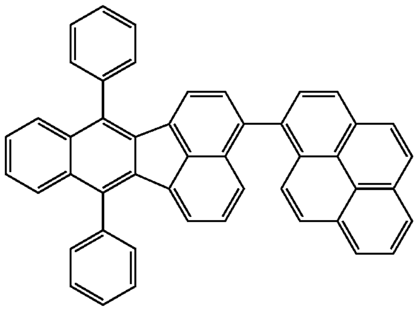
2-45
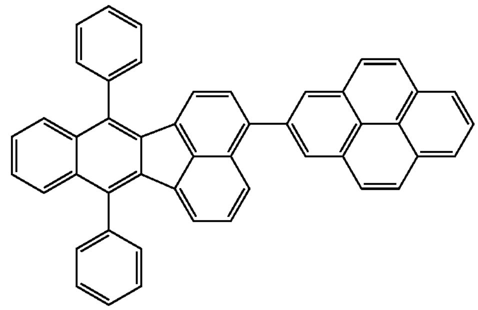
2-46
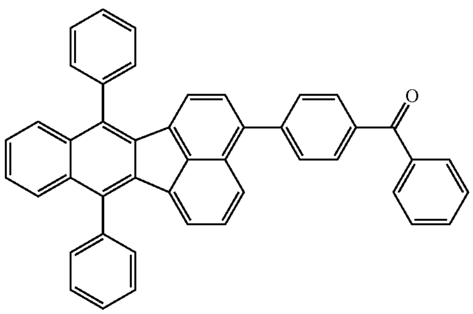
2-47
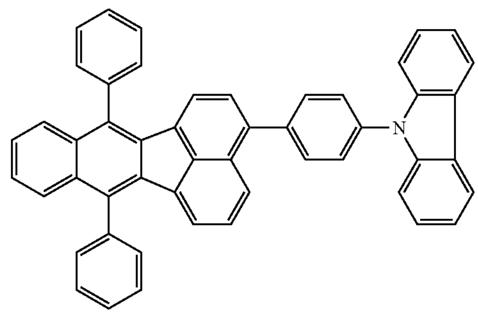
2-48
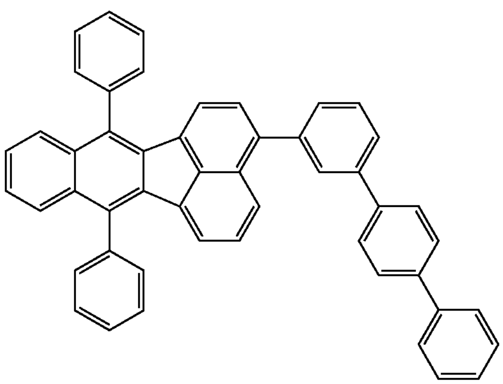
2-49
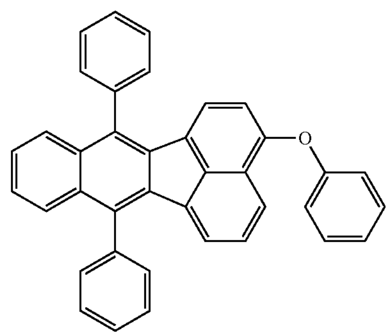
2-50
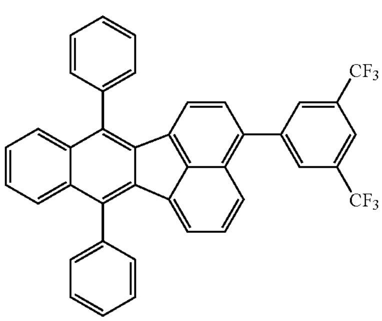
2-51
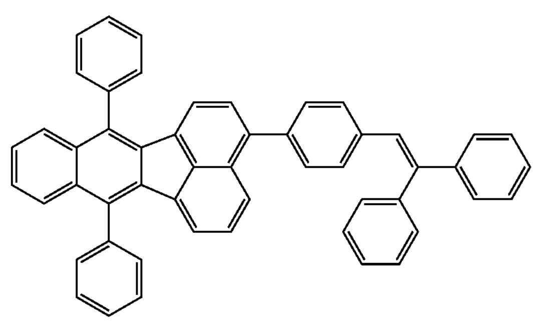

-continued
[Chemical Formula 93]
2-52
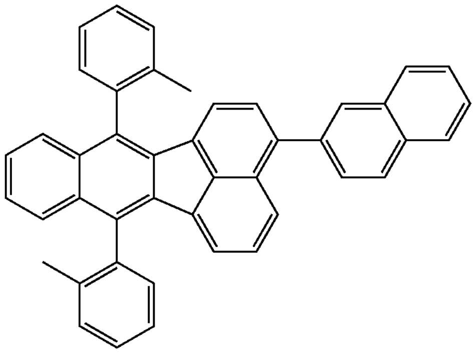
2-53
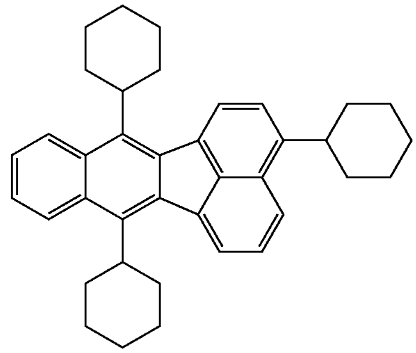
2-54
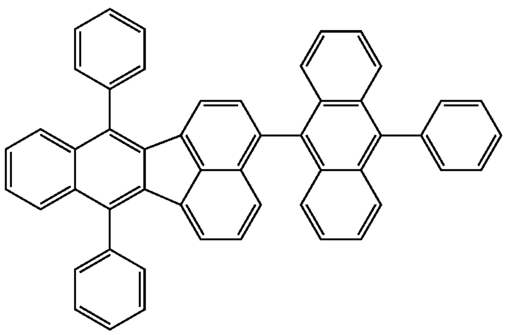
2-55
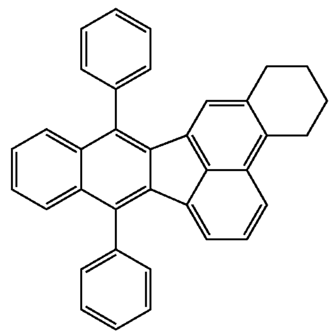
2-56
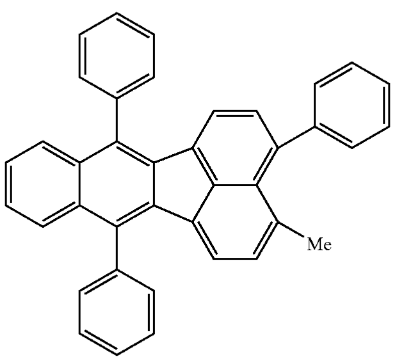
2-57
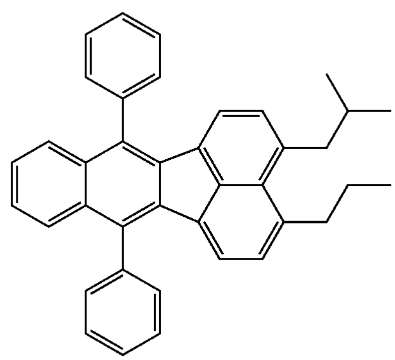
2-58
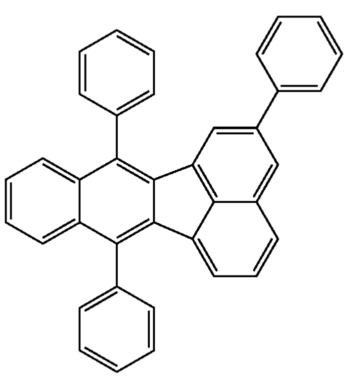
2-59
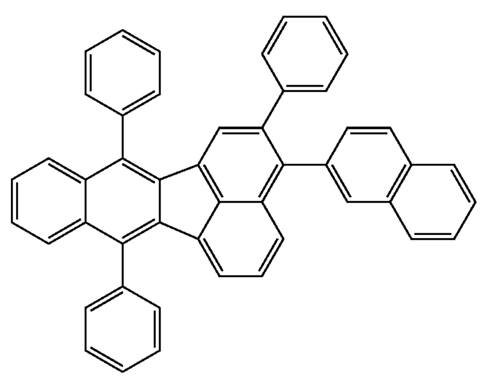

-continued
2-60
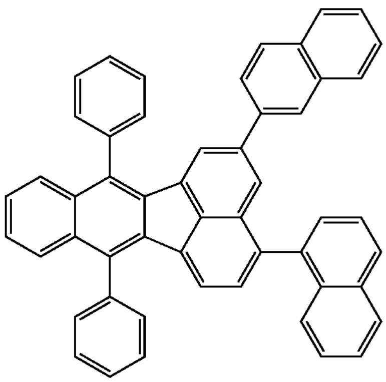
2-61
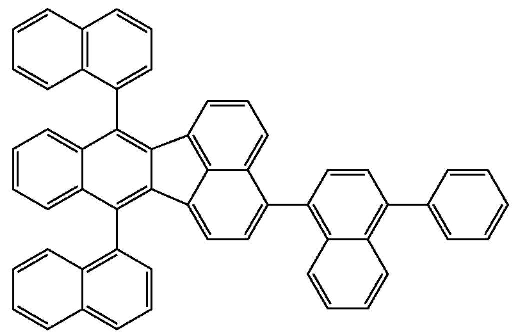
2-62
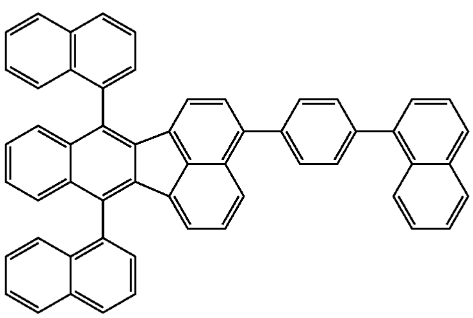
2-63
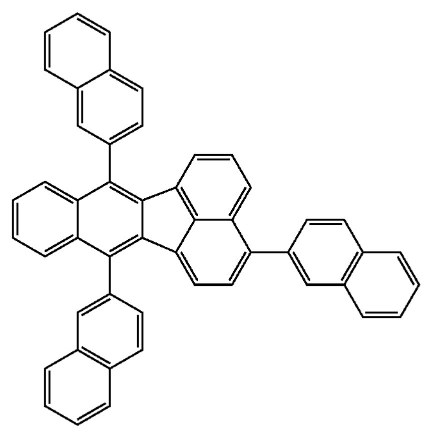
2-64
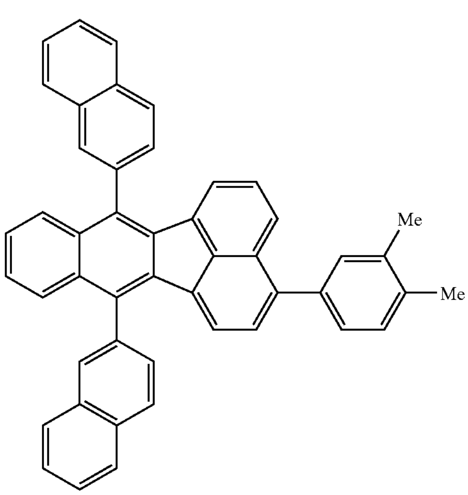
2-65
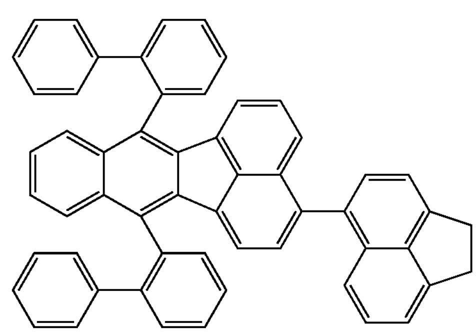

-continued
2-66
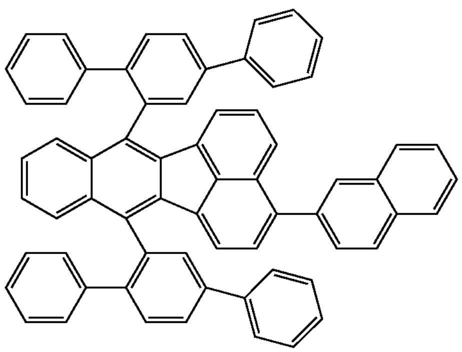
2-67
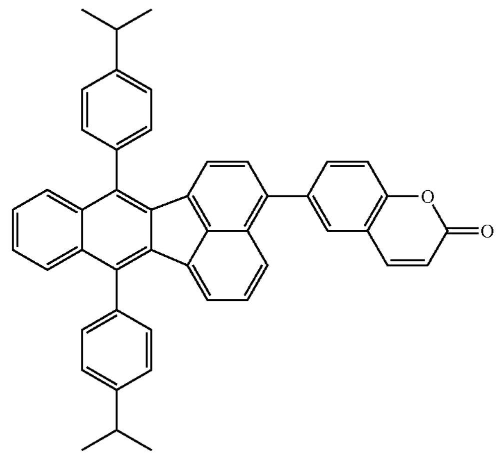
2-68
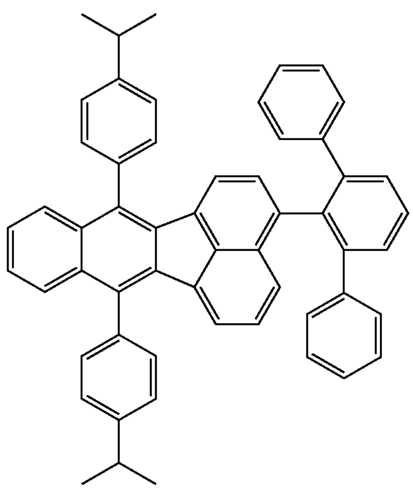
[Chemical Formula 94]
2-69
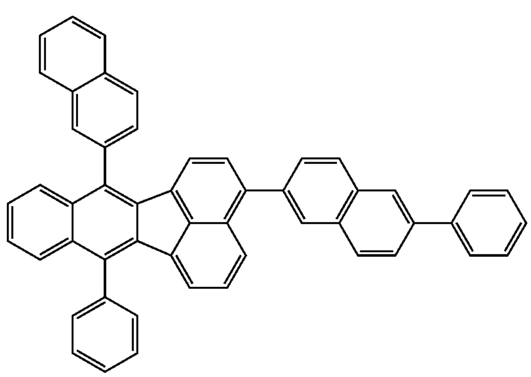
2-70
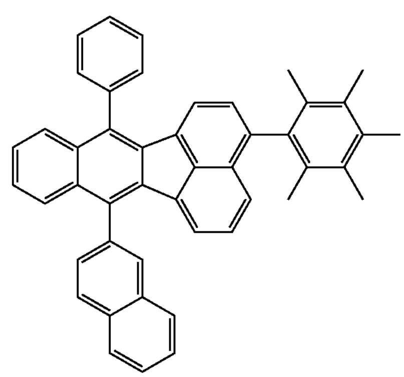

-continued
2-71
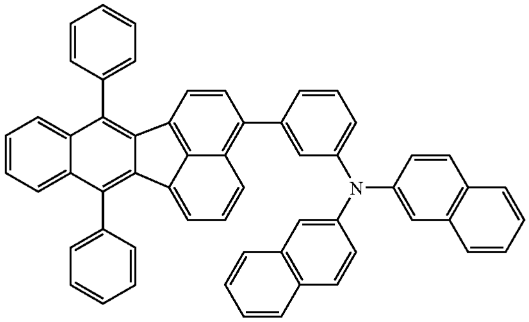
2-72
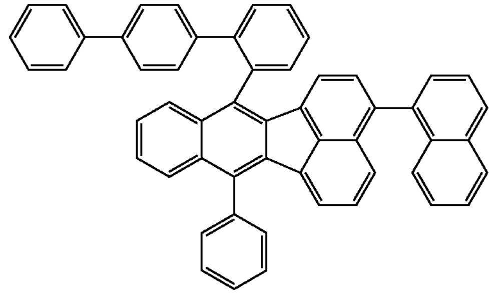
2-73
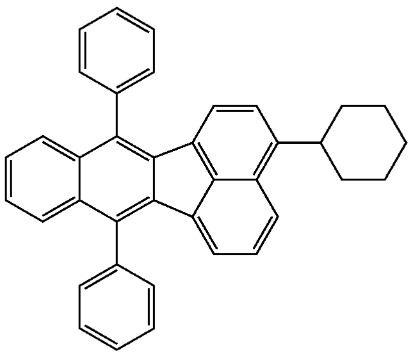
2-74
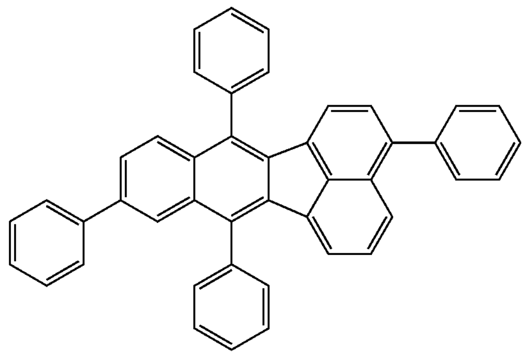
2-75
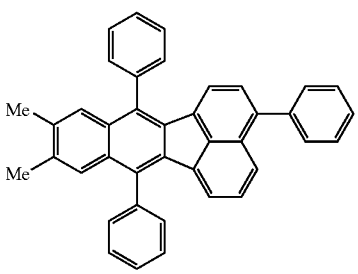
2-76
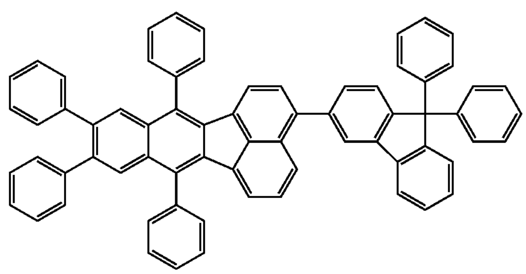
2-77
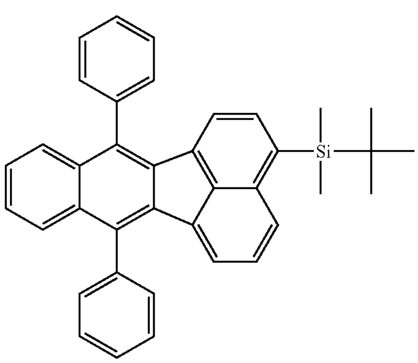
2-78
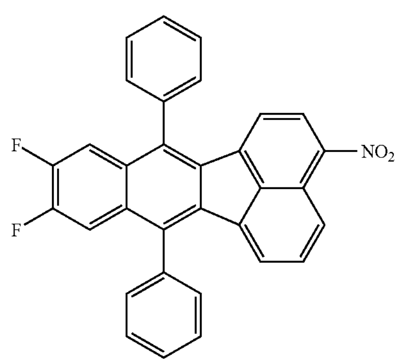

-continued
2-79
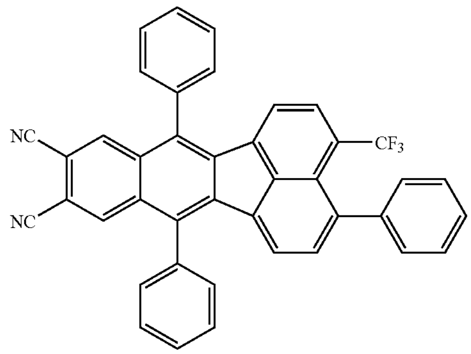
2-80
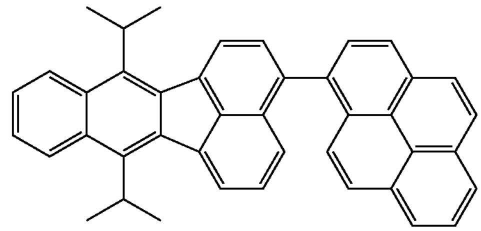
2-81
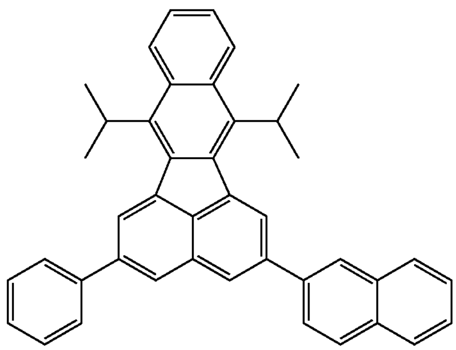
2-82
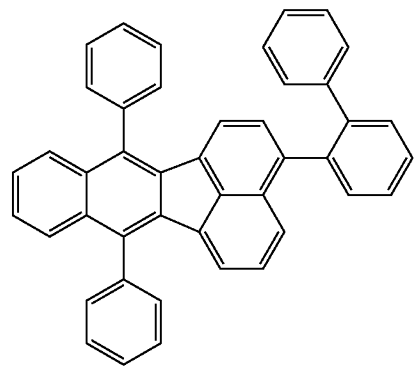
2-83
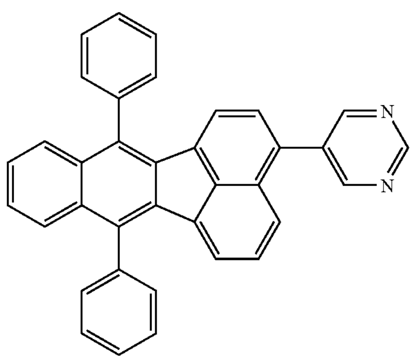
2-84
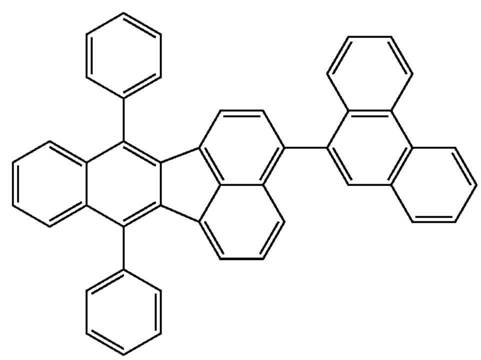
2-85
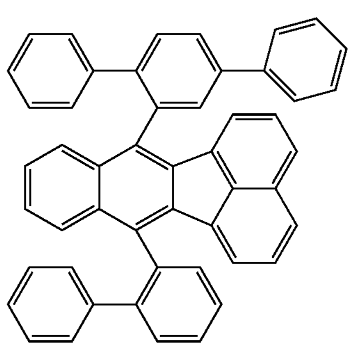
2-86
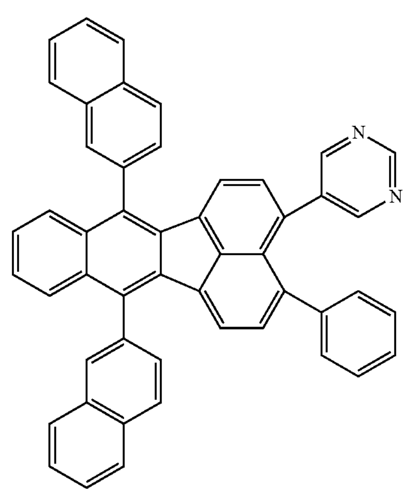

The fluorescent dopant may be represented by a formula below.

[Chemical Formula 95]

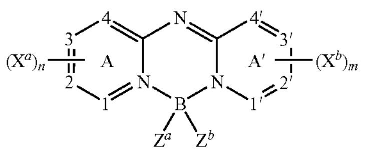

(9)

In the formula, A and A' each represent an independent azine ring system corresponding to a six-membered aromatic ring containing one or more nitrogen. $X^a$ and $X^b$ represent independently-selected substituents capable of being bonded together to form a fused ring with respect to A or A'. m and n each independently represent 0 to 4. $Z^a$ and $Z^b$ represent independently-selected substituents. 1, 2, 3, 4, 1', 2', 3' and 4' are each independently selected from a carbon atom and nitrogen atom.

The azine ring is preferably a quinolinyl ring or isoquinolinyl ring in which: all of 1, 2, 3, 4, 1', 2', 3' and 4' are carbon atoms; m and n each are 2 or more; and $X^a$ and $X^b$ represent 2 or more carbon-substituted groups bonded to form an aromatic ring. $Z^a$ and $Z^b$ are preferably fluorine atoms.

A fluorescent dopant of one preferable embodiment is structured such that: the two fused ring systems are quinoline or isoquinoline systems; aryl or heteroaryl substituents are phenyl groups; at least two $X^a$ groups and two $X^b$ groups are present to form 6-6 fused rings by bonding together; the fused ring systems each are fused in 1-2 position, 3-4 position, 1'-2' position or 3'-4' position; and at least either one of the fused rings is substituted by a phenyl group. The fluorescent dopant is represented by the following formula (91), (92) or (93).

[Chemical Formula 96]

(91)

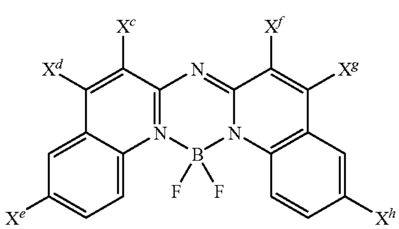

(92)

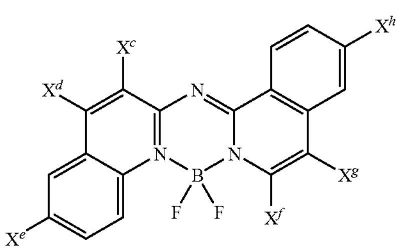

-continued (93)

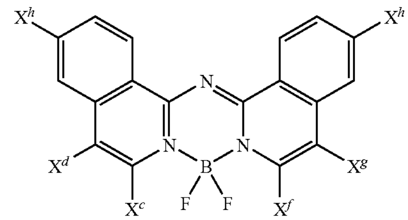

In the formulae (91) to (93), each of $X^c$, $X^d$, $X^e$, $X^f$, $X^g$ and $X^h$ represents a hydrogen atom or an independently-selected substituent. One of them must represent an aryl group or heteroaryl group.

The azine ring is preferably a quinolinyl ring or isoquinolinyl ring in which: all of 1, 2, 3, 4, 1', 2', 3' and 4' are carbon atoms; m and n each are 2 or more; $X^a$ and $X^b$ represent 2 or more carbon-substituted groups bonded to form an aromatic ring; and one of $X^a$ and $X^b$ represents an aryl group or substituted aryl group. $Z^a$ and $Z^b$ are preferably fluorine atoms.

A boron compound usable in the aspect of the invention will be exemplified below. The boron compound is complexated by two ring nitrogen atoms of deprotonated bis(azinyl) amine ligand, and the two ring nitrogen atoms are parts of different 6,6 fused ring systems. At least either one of the 6,6 fused ring systems contains an aryl or heteroaryl substituent.

[Chemical Formula 97]

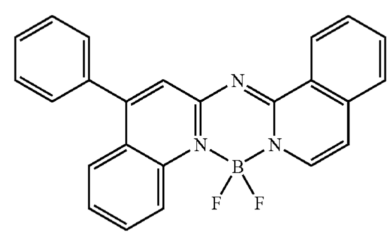

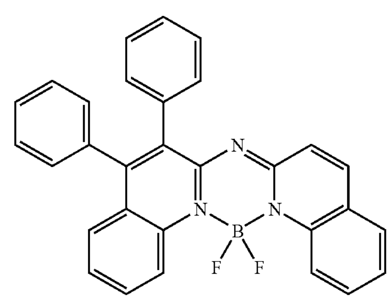

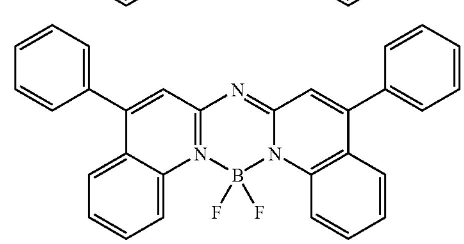

-continued

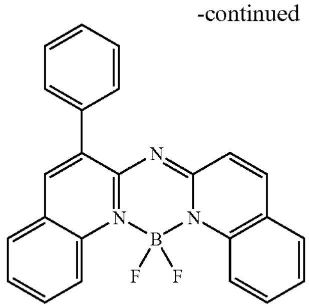

[Chemical Formula 98]

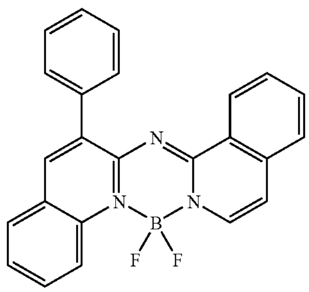

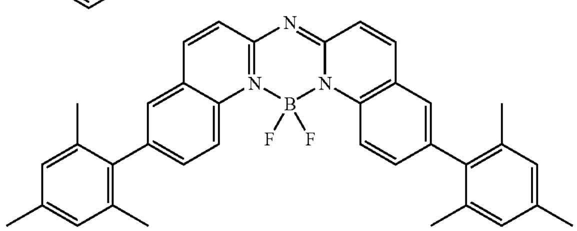

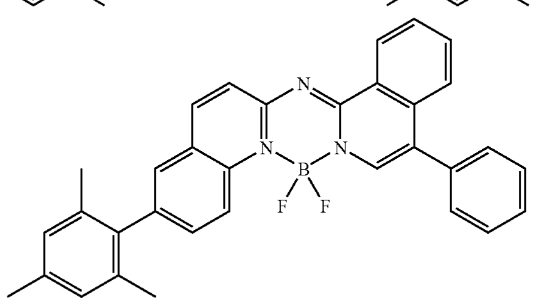

The organic EL device includes the phosphorescent-emitting layer and the fluorescent-emitting layer provided between the anode and the cathode. The fluorescent-emitting layer may be located closer to the anode than the phosphorescent-emitting layer, or may be located closer to the cathode than the phosphorescent-emitting layer. For instance, the anode, the phosphorescent-emitting layer, the fluorescent-emitting layer and the cathode may be layered in this order. Preferably, a hole injecting/transporting layer is provided between the anode and the phosphorescent-emitting layer, and an electron injecting/transporting layer is provided between the cathode and the fluorescent-emitting layer.

In order to increase the probability of the exciton generation in the fluorescent-emitting layer, a hole blocking layer may be provided at a location closer to the cathode than the fluorescent-emitting layer. Alternatively, an electron blocking layer may be provided at location closer to the anode than the fluorescent-emitting layer.

In order to enhance the exciton in the phosphorescent-emitting layer, non-dope layer may be provided between the fluorescent-emitting layer and the phosphorescent-emitting layer. When provided at a location closer to the anode than the fluorescent-emitting layer, the non-dope layer preferably has high hole mobility. When provided at a location closer to the cathode than the fluorescent-emitting layer, the non-dope layer preferably has high electron mobility.

When the phosphorescent-emitting layer is located closer to the hole injecting/transporting layer, the hole injecting/transporting layer preferably has Ip of 5.4 eV or more, more preferably Ip of 5.6 eV or more, in order to facilitate the hole injection. The hole injecting/transporting layer may be single layered or multilayered.

When the phosphorescent-emitting layer is located closer to the anode than the fluorescent-emitting layer, the phosphorescent host preferably exhibits large hole mobility. With this arrangement, the injection of holes into the fluorescent-emitting layer (i.e., exciton generating layer) through the phosphorescent-emitting layer can be facilitated, and a probability of the charge recombination can be increased. At this time, the hole mobility of the phosphorescent host is preferably $1\times10^{-5}$ cm$^2$/Vs or more in an electric field of $1.0\times10^4$ to $1.0\times10^6$V/cm. The hole mobility is more preferably $10^{-4}$ cm$^2$/Vs or more, much more preferably $10^{-3}$ cm$^2$/Vs or more.

When the phosphorescent-emitting layer is located closer to the anode than the fluorescent-emitting layer, the phosphorescent host preferably exhibits larger hole mobility than electron mobility. Examples of such a compound are compounds represented by the general formulae (111), (112), (113), (114), (121), (122), (123) and (124).

On the other hand, when the phosphorescent-emitting layer is located closer to the cathode than the fluorescent-emitting layer, the phosphorescent host preferably exhibits large electron mobility. With this arrangement, the injection of electrons into the fluorescent-emitting layer (i.e., exciton generating layer) through the phosphorescent-emitting layer can be facilitated, and a probability of the charge recombination can be increased. At this time, the electron mobility of the phosphorescent host is preferably $1\times10^{-5}$ cm$^2$/Vs or more in an electric field of $1.0\times10^4$ to $1.0\times10^6$V/cm. The electron mobility is more preferably $10^{-4}$ cm$^2$/Vs or more, much more preferably $10^{-3}$ cm$^2$/Vs or more.

When the phosphorescent-emitting layer is located closer to the cathode than the fluorescent-emitting layer, the phosphorescent host preferably exhibits electron mobility ten or more times larger than hole mobility. Examples of such a compound are compounds represented by the general formulae (115) and (116).

Mobility of carriers (holes, electrons) is measurable in the following manner.

A glass substrate (size: 25 mm×75 mm×1.1 mm) having an ITO transparent electrode (manufactured by Asahi Glass Co., Ltd) is ultrasonic-cleaned in isopropyl alcohol for five minutes, and then UV/ozone-cleaned for 30 minutes. The cleaned glass substrate is then mounted on a substrate holder of a vacuum deposition apparatus. Subsequently, a measurement material is layered on the ITO transparent substrate electrode by resistance-heating deposition to be 3 to 5 μm thick. Thereafter, a metal (Al) is deposited on the film to be 10 nm thick, and a translucent electrode is obtained.

In the produced device, the mobility of carriers (holes, electrons) at electric intensity of $10^4$ to $10^6$ V/cm is measured with a time-of-flight measurement system TOF-401 manufactured by Optel Corporation. The exciting light utilizes light due to nitrogen laser of 337 nm.

The curve of photocurrent (I) to time (t) is plotted by double logarithm. Then, using the obtained folding point tr, the mobility μ is obtained as a result of an equation: mobility $\mu=L^2/(tr\times V)$. In the equation, L is a thickness of a sample, and V is applied voltage.

In the organic EL device according to the aspect of the invention, the emission wavelength of the fluorescent-emitting layer is shorter than that of the phosphorescent-emitting layer. Preferably, the fluorescent-emitting layer provides emission at the wavelength of 410 to 580 nm while the phosphorescent-emitting layer provides emission at the wavelength of 500 to 700 nm.

When the fluorescent-emitting layer is of single-layered structure that only includes a blue fluorescent-emitting layer, the fluorescent-emitting layer provides emission at the wavelength of 410 to 500 nm, and the phosphorescent-emitting layer provides emission at the wavelength of 500 to 700 nm.

Alternatively, when the fluorescent-emitting layer is of two-layered structure that includes a blue fluorescent-emitting layer and a green fluorescent-emitting layer, the fluorescent-emitting layer provides emission at the wavelength of 410 to 580 nm, and the phosphorescent-emitting layer provides emission at the wavelength of 580 to 700 nm.

Further alternatively, when the fluorescent-emitting layer is of single-layered structure that includes only a green fluorescent-emitting layer, the fluorescent-emitting layer provides emission at the wavelength of 500 to 580 nm, and the phosphorescent-emitting layer provides emission at the wavelength of 580 to 700 nm.

Preferably in the organic EL device according to the aspect of the invention, the phosphorescent-emitting layer provides emission at the wavelength of 600 to 700 nm.

Preferably in the organic EL device according to the aspect of the invention, the fluorescent-emitting layer is a blue emitting layer, and the phosphorescent-emitting layer is a red phosphorescent-emitting layer for providing red emission.

As long as the organic EL device provides mixed-color emission by the fluorescent-emitting layer and the phosphorescent-emitting layer, the color mixture pattern may be variously modified.

For instance, the fluorescent-emitting layer may contain a blue fluorescent dopant while the phosphorescent-emitting layer contains a red phosphorescent dopant. The fluorescent-emitting layer may alternatively contain a blue fluorescent dopant and a green fluorescent dopant while the phosphorescent-emitting layer contains a red phosphorescent dopant. Further alternatively, the fluorescent-emitting layer may contain a blue fluorescent dopant while the phosphorescent-emitting layer contains a green phosphorescent dopant and a red phosphorescent dopant.

BRIEF DESCRIPTION OF DRAWINGS

FIG. 1 shows an arrangement of an organic EL device according to an exemplary embodiment.

BEST MODE FOR CARRYING OUT THE INVENTION

Embodiment(s) of the present invention will be described.

Arrangement of Organic EL Device

Arrangement(s) of an organic EL device will be described below.

(1) Arrangement of Organic EL Device

FIG. 1 schematically shows an arrangement of an organic EL device according to this exemplary embodiment.

An organic EL device 1 includes: a transparent substrate 2; an anode 3; a hole injecting/transporting layer 4; a phosphorescent-emitting layer 5; a fluorescent-emitting layer 6; an electron injecting/transporting layer 7; and a cathode 8.

The hole injecting/transporting layer 4 and the electron injecting/transporting layer 7 may not be provided.

In addition, an electron blocking layer may be provided to the phosphorescent-emitting layer 5 adjacently to the anode 3 while a hole blocking layer may be provided to the fluorescent-emitting layer 6 adjacently to the cathode 8. With this arrangement, electrons and holes can be trapped in the phosphorescent-emitting layer 5 and the fluorescent-emitting layer 6, thereby enhancing probability of exciton generation in the phosphorescent-emitting layer 5 and the fluorescent-emitting layer 6.

(2) Substrate 2

The substrate 2, which supports the organic EL device, is preferably a smoothly-shaped substrate that transmits 50% or more of light in a visible region of 400 nm to 700 nm. An example of a material for the substrate 2 is a glass.

(3) Anode 3

The anode 3 injects holes into the hole injecting/transporting layer 4 or the fluorescent-emitting layer 5. It is effective that the anode has a work function of 4.5 eV or more. Exemplary materials for the anode are indium-tin oxide (ITO), tin oxide (NESA), indium zinc oxide, gold, silver, platinum and copper.

(4) Hole Injecting/Transporting Layer 4

The hole injecting/transporting layer 4 is provided between the phosphorescent-emitting layer 5 and the anode 3 for aiding the injection of holes into the phosphorescent-emitting layer 5 and transporting the holes to the emitting region. As the hole injecting/transporting layer 4, for instance, 4,4'-bis [N-(1-naphthyl)-N-phenylamino]biphenyl (hereinafter abbreviated as NPD) is usable.

Other examples of the hole injecting/transporting material are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, No. 3,820,989 and No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, No. 3,180,703, No. 3,240,597, No. 3,658,520, No. 4,232,103, No. 4,175,961 and No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-

94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two fused aromatic rings disclosed in U.S. Pat. Nos. 5,061,569, 4,4',4"-tris(N-(3-methylphenyl)-N-phenylamino) triphenylamine (hereinafter, abbreviated as MTDATA) in which three triphenylamine units disclosed in JP-A-04-308688 are bonded in a starburst form and the like may also be used.

The hole injecting/transporting layer 4 may be a separately-prepared hole injecting layer and hole transporting layer.

The hole injecting layer and the hole transporting layer, which aids the injection of the holes into the emitting layer and transports the holes to the emitting region, exhibits large hole mobility while typically exhibiting as small ionization energy as 5.5 eV or less. Materials for the hole injecting layer and the hole transporting layer are preferably capable of transporting the holes to the emitting layer at lower electric strength. In addition, the hole mobility thereof is preferably $10^4$ $cm^2$V/sec or more when applied with an electric field of, for instance, $10^4$ to $10^6$ V/cm.

The materials for the hole injecting layer and the hole transporting layer are not specifically limited, and may be suitably selected among those typically and widely used as hole charge transporting materials in photoconductive materials and those typically used in hole injecting layers and hole transporting layers of organic EL devices.

For the hole injecting layer and the hole transporting layer, for instance, an aromatic amine derivative represented by the following formula is usable.

[Chemical Formula 99]

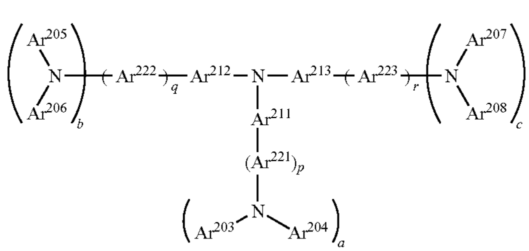

In the formula, $Ar^{211}$ to $Ar^{213}$ and $Ar^{221}$ to $Ar^{223}$ each represent a substituted or unsubstituted arylene group having 6 to 50 ring carbon atoms or a substituted or unsubstituted heteroarylene group having 5 to 50 ring atoms. $Ar^{203}$ to $Ar^{208}$ each represent a substituted or unsubstituted aryl group having 6 to 50 ring carbon atoms or a substituted or unsubstituted heteroaryl group having 5 to 50 ring atoms. a to c and p to r each represent an integer of 0 to 3. $Ar^{203}$ and $Ar^{204}$, $Ar^{205}$ and $Ar^{206}$, and $Ar^{207}$ and $Ar^{208}$ may be respectively linked together to form saturated or unsaturated rings.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the substituted or unsubstituted arylene group having 6 to 50 ring carbon atoms are groups obtained by eliminating one hydrogen atom from the above aryl groups.

Examples of the substituted or unsubstituted heteroaryl group having 5 to 50 ring atoms are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline- 8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted heteroarylene group having 6 to 50 ring carbon atoms are groups obtained by eliminating one hydrogen atom from the above heteroaryl groups.

Further, the hole injecting layer and the hole transporting layer may contain a compound represented by the following formula.

[Chemical Formula 100]

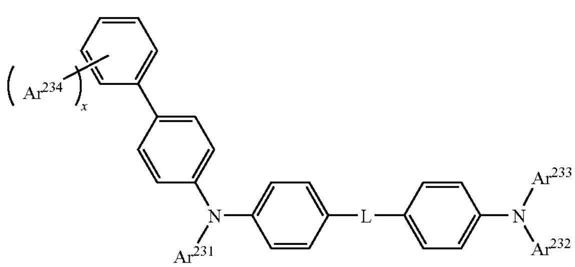

In the formula, $Ar^{231}$ to $Ar^{234}$ each represent a substituted or unsubstituted aryl group having 6 to 50 ring carbon atoms or a substituted or unsubstituted heteroaryl group having 5 to 50 ring atoms. L represents a single bond, a substituted or unsubstituted arylene group having 6 to 50 ring carbon atoms or a substituted or unsubstituted heteroarylene group having 5 to 50 ring atoms. x is an integer of 0 to 5.

$Ar^{232}$ and $Ar^{233}$ may be linked together to form saturated or unsaturated ring. Examples of the substituted or unsubstituted aryl group and arylene group having 6 to 50 ring carbon atoms, and of the substituted or unsubstituted heteroaryl group and heteroarylene group having 5 to 50 ring atoms are the same as enumerated above.

Examples of the materials for the hole injecting layer and the hole transporting layer are triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers and conductive polymer oligomers (particularly thiophene oligomer).

While the above materials are usable for the hole injecting layer and the hole transporting layer, porphyrin compounds, aromatic tertiary amine compounds and styrylamine compounds are preferable, among which aromatic tertiary amine compounds are particularly preferable.

Further usable examples are compounds having two fused aromatic rings in their molecules such as NPD and 4,4',4"-tris(N-(3-methylphenyl)-N-phenylamino)triphenylamine in which three units of triphenylamine are linked together in a starburst form (hereinafter abbreviated as MTDATA).

In addition, a nitrogen-containing heterocyclic derivative represented by the following formula is also usable.

[Chemical Formula 101]

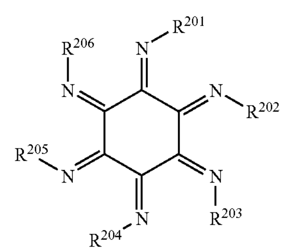

In the formula, $R^{201}$ to $R^{206}$ each represent any one of a substituted or unsubstituted alkyl group having 1 to 50 carbon atoms, substituted or unsubstituted aryl group having 6 to 50 ring carbon atoms, substituted or unsubstituted aralkyl group having 7 to 50 carbon atoms and substituted or unsubstituted heterocyclic group having 5 to 50 ring atoms. $R^{201}$ and $R^{202}$, $R^{203}$ and $R^{204}$, $R^{205}$ and $R^{206}$, $R^{201}$ and $R^{206}$, $R^{202}$ and $R^{203}$ or $R^{204}$ and $R^{205}$ may form a fused ring.

Further, the compound represented by the following formula is also usable.

[Chemical Formula 102]

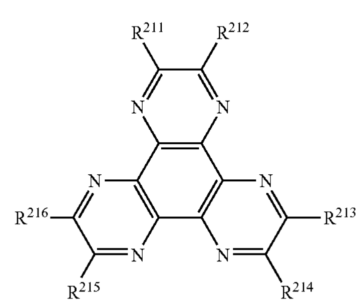

$R^{211}$ to $R^{216}$ each represent a substituent, preferably an electron absorbing group such as cyano group, nitro group, sulfonyl group, carbonyl group, trifluoromethyl group and halogen.

The compound represented by the following formula is also preferable for the hole injecting layer.

[Chemical Formula 103]

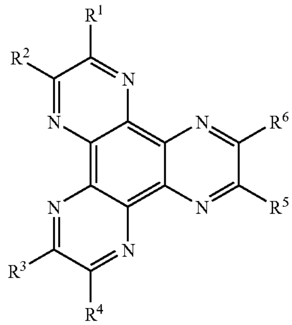

In the formula, $R_1$ to $R_6$ each represent halogen, a cyano group, nitro group, alkyl group or trifluoromethyl group. $R_1$ to $R_6$ may be mutually the same or different. Preferably, $R_1$ to $R_6$ represent a cyano group.

Alternatively, inorganic compounds such as p-type Si and p-type SiC are also usable for the hole injecting layer and the hole transporting layer. The hole injecting layer and the hole transporting layer can be formed by thinly layering the above-described compound by a known method such as vacuum deposition, spin coating, casting and LB method.

The thickness of the hole injecting layer and the hole transporting layer is not particularly limited. Typically, the thickness is 5 nm to 5 μm. The hole injecting layer and the hole transporting layer may be a single-layered layer made of the single one of the above materials or a combinations of two or more of the above materials. Alternatively, the hole injecting layer and the hole transporting layer may be a multilayer layer in which a plurality of hole injecting layers and hole transporting layers made of different materials are layered.

(5) Phosphorescent-Emitting Layer 5

The phosphorescent-emitting layer 5 is a red phosphorescent-emitting layer for providing red emission, and contains a red phosphorescent host and red phosphorescent dopant for red phosphorescent emission.

The phosphorescent-emitting layer 5 may include a red phosphorescent-emitting layer for providing red emission and a green phosphorescent-emitting layer for providing green emission. When the above structure is adopted, the red phosphorescent-emitting layer is located closer to the anode than the green phosphorescent-emitting layer, and contains a red phosphorescent host and red phosphorescent dopant for red phosphorescent emission. The green phosphorescent-emitting layer contains a green phosphorescent host and a green phosphorescent dopant for green phosphorescent emission.

The above materials are usable for the red phosphorescent host and the red phosphorescent dopant for use in the phosphorescent-emitting layer 5 (i.e., red phosphorescent-emitting layer).

For adjustment of the emission chromaticity, an intermediate layer containing no phosphorescent material may be provided between the phosphorescent-emitting layer and the fluorescent-emitting layer. When the phosphorescent-emitting layer is located closer to the anode than the fluorescent-emitting layer, the material of the intermediate layer is preferably a material used for the hole injecting/transporting layer. On the other hand, when the phosphorescent-emitting layer is located closer to the cathode than the fluorescent-emitting layer, materials such as Balq and CBP are usable.

(6) Fluorescent-Emitting Layer 6

The fluorescent-emitting layer 6 contains a fluorescent host and a fluorescent dopant for blue fluorescent emission. The above-described materials are usable for the fluorescent host and the fluorescent dopant.

(7) Electron Injecting/Transporting Layer 7

The electron injecting/transporting layer 7 aids the injection and transfer of the electrons into the fluorescent-emitting layer 6. The electron injecting/transporting layer 7 may be a separately-prepared electron injecting layer and electron transporting layer.

The electron injecting layer preferably contains a nitrogen-containing cyclic derivative.

With use of the nitrogen-containing cyclic derivative having high electron performance in the electron injecting/transporting layer, the driving voltage can be lowered.

As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are electron transport compounds represented by the following formulae (29) to (31).

[Chemical Formula 104]

(29)

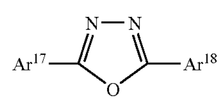

(30)

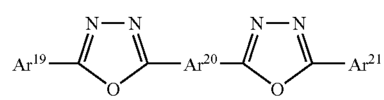

(31)

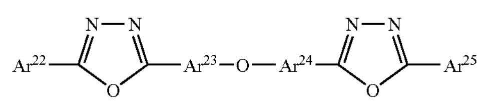

In the formula, $Ar^{17}$, $Ar^{18}$, $Ar^{19}$, $Ar^{21}$, $Ar^{22}$ and $Ar^{25}$ each represent a substituted or unsubstituted arylene group. $Ar^{17}$ and $Ar^{18}$, $Ar^{19}$ and $Ar^{21}$, and $Ar^{22}$ and $Ar^{25}$ may be the same as or different from each other. $Ar^{20}$, $Ar^{23}$ and $Ar^{24}$ each represent a substituted or unsubstituted arylene group. $Ar^{23}$ and $Ar^{24}$ may be mutually the same or different.

Examples of the aryl group in the general formulae (29) to (31) are a phenyl group, biphenyl group, anthranil group, perylenyl group and pyrenyl group. Examples of the arylene group are a phenylene group, naphthylene group, biphenylene group, anthranylene group, perylenylene group and pyrenylene group.

Examples of the substituent therefor are an alkyl group having 1 to 10 carbon atoms, alkoxy group having 1 to 10 carbon atoms and cyano group.

Such an electron transport compound is preferably an electron transport compound that can be favorably formed into a thin film(s).

Examples of the electron transport compounds are as follows.

[Chemical Formula 105]

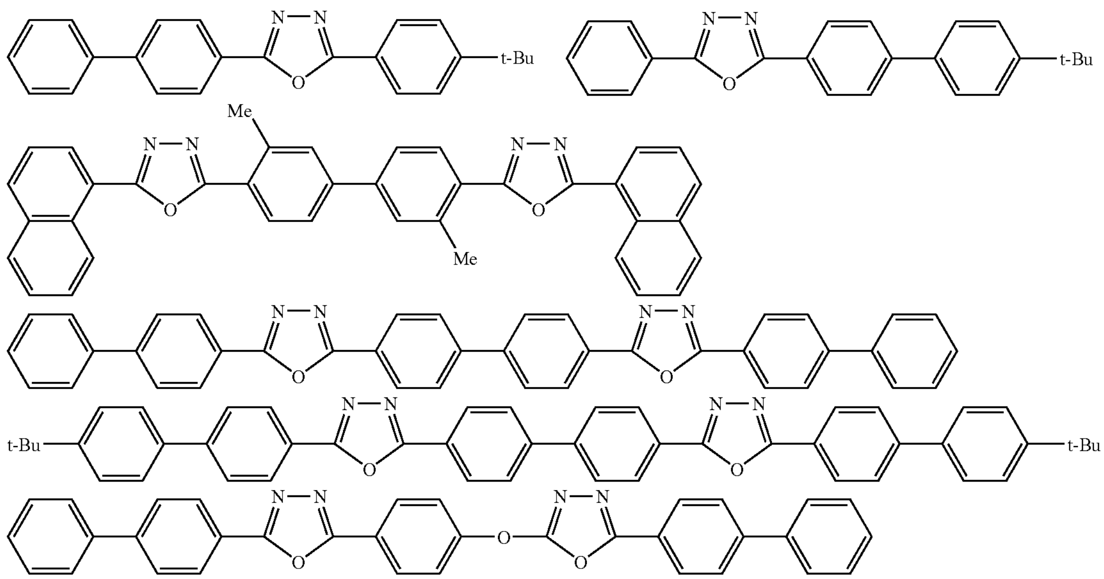

An example of the nitrogen-containing heterocyclic derivative is a nitrogen-containing compound that is not a metal complex, the derivative being formed of an organic compound represented by any one of the following general formulae.

[Chemical Formula 106]

(A)

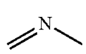

(B)

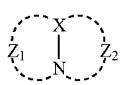

In the formula, X represents a carbon atom or a nitrogen atom. $Z_1$ and $Z_2$ each independently represent an atom group capable of forming a nitrogen-containing heterocycle.

[Chemical Formula 107]

(C)

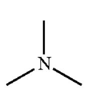

The nitrogen-containing heterocyclic derivative is preferably an organic compound having a nitrogen-containing five-membered or six-membered aromatic polycyclic group. When the number of the nitrogen atoms is plural, the nitrogen atoms bonded to the skeleton thereof in non-adjacent positions. When the nitrogen-containing heterocyclic derivative includes such nitrogen-containing aromatic polycyclic series having plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

[Chemical Formula 108]

(2)

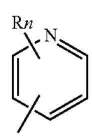

(3)

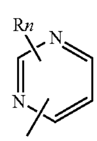

(4)

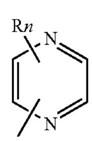

(5)

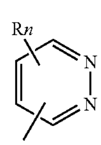

(6)

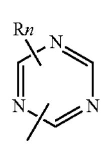

-continued (7)

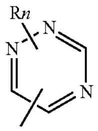

(8)

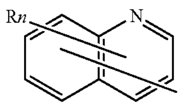

(9)

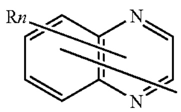

(10)

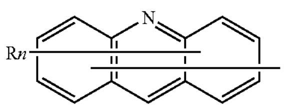

(11)

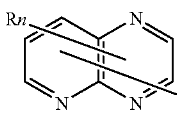

(12)

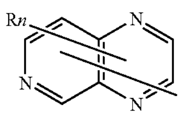

(13)

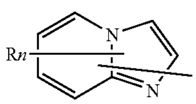

(14)

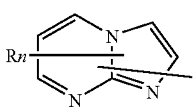

(15)

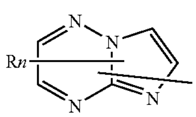

(16)

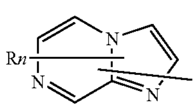

(17)

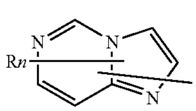

(18)

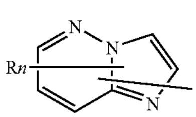

(19)

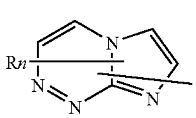

(20)

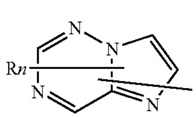

-continued (21)

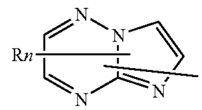

(22)

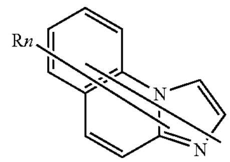

(23)

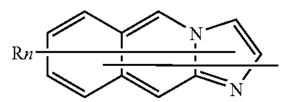

(24)

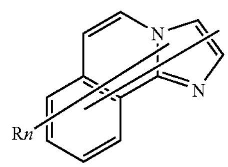

In the formulae: R represents an aryl group having 6 to 40 carbon atoms, heteroaryl group having 3 to 40 carbon atoms, alkyl group having 1 to 20 carbon atoms or alkoxy group having 1 to 20 carbon atoms; and n represents an integer in a range of 0 to 5. When n is an integer of 2 or more, plural R may be mutually the same or different.

A preferable specific compound is a nitrogen-containing heterocyclic derivative represented by the following formula.

$HAr\text{-}L^1\text{-}Ar^1\text{—}Ar^2$ [Chemical Formula 109]

In the formula, HAr represents a substituted or unsubstituted nitrogen-containing heterocycle having 3 to 40 carbon atoms. $L^1$ represents a single bond, substituted or unsubstituted arylene group having 6 to 40 carbon atoms or substituted or unsubstituted heteroarylene group having 3 to 40 carbon atoms. $Ar^1$ represents a substituted or unsubstituted divalent aromatic hydrocarbon group having 6 to 40 carbon atoms. $Ar^2$ represents a substituted or unsubstituted aryl group having 6 to 40 carbon atoms or substituted or unsubstituted heteroaryl group having 3 to 40 carbon atoms.

HAr is exemplarily selected from the following group.

[Chemical Formula 110]

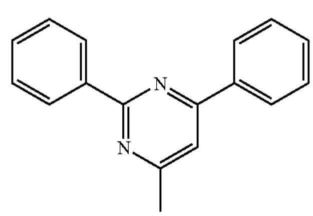

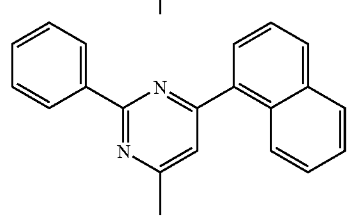

-continued
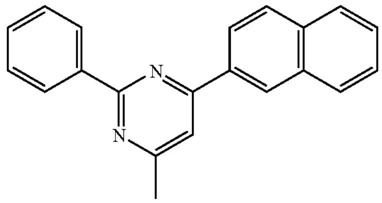
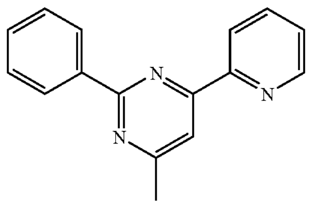
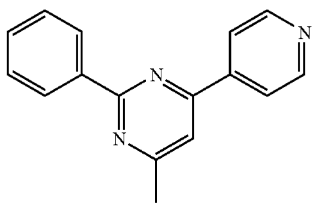
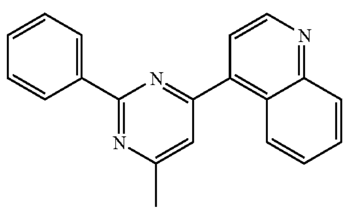
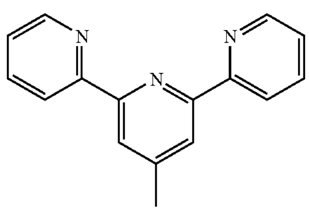
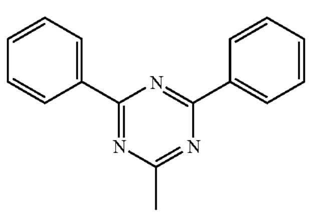
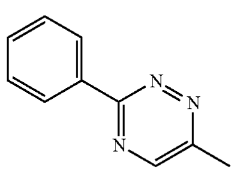
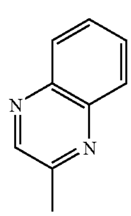
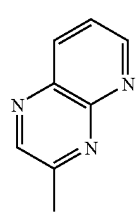
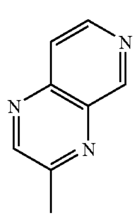
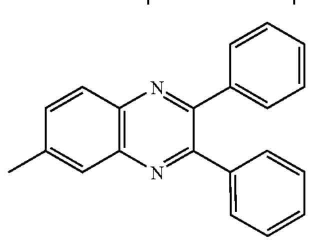
-continued
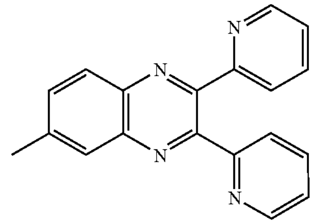
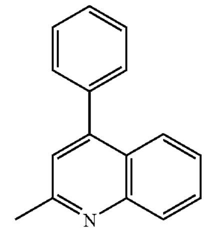
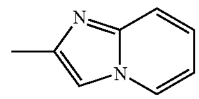
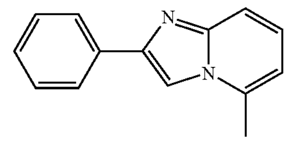
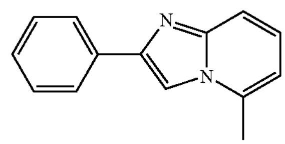
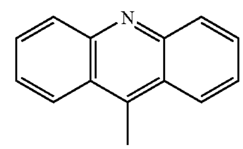
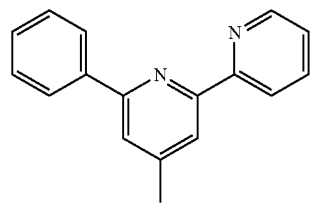
$L^1$ is exemplarily selected from the following group.
[Chemical Formula 111]
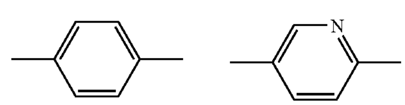
$Ar^2$ is exemplarily selected from the following group.
[Chemical Formula 112]
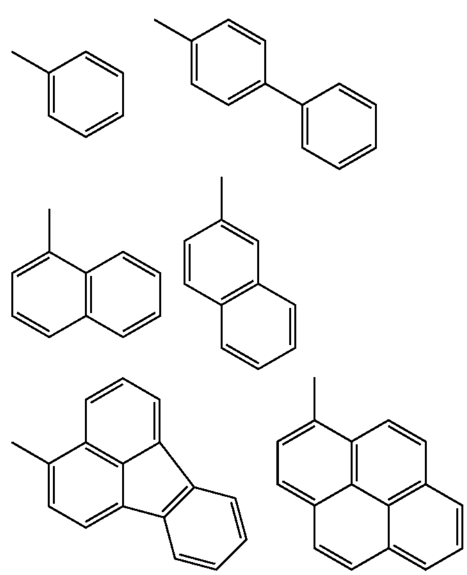

-continued

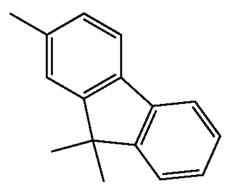

$Ar^1$ is exemplarily selected from the following arylanthranil groups.

[Chemical Formula 113]

(25)

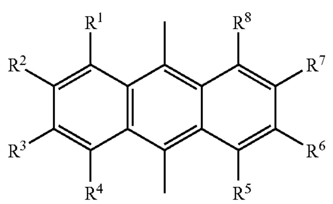

(26)

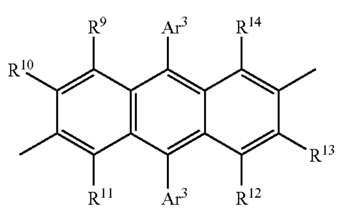

In the formula, $R^1$ to $R^{14}$ each independently represent a hydrogen atom, halogen atom, alkyl group having 1 to 20 carbon atoms, alkoxy group having 1 to 20 carbon atoms, aryloxy group having 6 to 40 carbon atoms, substituted or unsubstituted aryl group having 6 to 40 carbon atoms or heteroaryl group having 3 to 40 carbon atoms. $Ar^3$ represents a substituted or unsubstituted aryl group having 6 to 40 carbon atoms or heteroaryl group having 3 to 40 carbon atoms.

The nitrogen-containing heterocyclic derivative may be a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

[Chemical Formula 114]

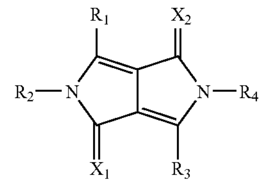

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic ring group, or substituted or unsubstituted heterocyclic group. $X_1$ and $X_2$ each independently represent an oxygen atom, a sulfur atom or a dicyanomethylene group.

Alternatively, the following compound (see JP-A-2000-173774) can also be favorably used.

[Chemical Formula 115]

(51)

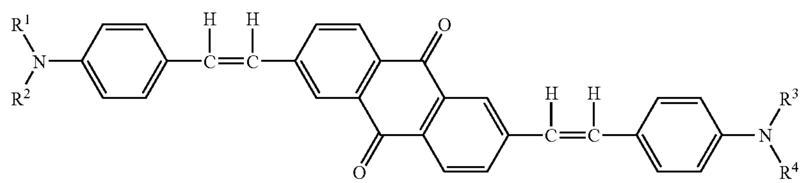

In the formula, $R^1$, $R^2$, $R^3$ and $R^4$, which may be mutually the same or different, each are an aryl group represented by the following formula.

[Chemical Formula 116]

(52)

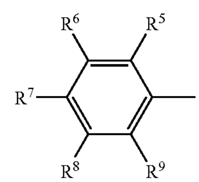

In the formula, $R^5$, $R^6$, $R^7$, $R^8$ and $R^9$, which may be mutually the same or different, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the nitrogen-containing heterocyclic group or a nitrogen-containing heterocyclic derivative may be used.

Although thickness of the electron injecting layer or the electron transporting layer is not specifically limited, the thickness is preferably 1 to 100 nm.

In the organic EL device according to the aspect of the invention, a reduction-causing dopant may be preferably contained in an interfacial region between the cathode and the organic thin-film layer.

With this arrangement, the organic EL device can emit light with enhanced luminance intensity and have a longer lifetime.

The reduction-causing dopant is defined as a substance capable of reducing an electron-transporting compound.

Accordingly, various materials are utilized as far as the material possesses proper reduction-causing property. For example, at least one material selected from a group of alkali metal, alkali earth metal, rare earth metal, oxide of alkali metal, halogenide of alkali metal, oxide of alkali earth metal, halogenide of alkali earth metal, oxide of rare earth metal, halogenide of rare earth metal, organic complexes of alkali metal, organic complexes of alkali earth metal, and organic complexes of rare earth metal may suitably be utilized.

Specifically, a preferable reduction-causing dopant is at least one alkali metal selected from a group consisting of Li (work function: 2.9 eV), Na (work function: 2.36 eV), K (work function: 2.28 eV), Rb (work function: 2.16 eV) and Cs (work function: 1.95 eV), or at least one alkali earth metal selected from a group consisting of Ca (work function: 2.9 eV), Sr (work function: 2.0 to 2.5 eV) and Ba (work function: 2.52 eV). A substance having work function of 2.9 eV or less is particularly preferable. Among the above, a more preferable reduction-causing dopant is at least one alkali metal selected from a group consisting of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic EL device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic EL device.

(8) Cathode 8

An example of the cathode is aluminum.

Manufacturing Method of Organic EL Device

By using the above-exemplified materials, the anode 3, the hole injecting/transporting layer 4, the phosphorescent-emitting layer 5, the fluorescent-emitting layer 6, the electron injecting/transporting layer 7 and the cathode 8 are formed on the substrate 2, through which the organic EL device 1 can be manufactured. Alternatively, the organic EL device can be also manufactured in the reverse order of the above (i.e., from the cathode to the anode). Manufacturing examples will be described below.

In manufacturing the organic EL device 1, a thin film made of anode material is initially formed on a suitable transparent substrate 2 to be 1 nm thick or less, more preferably 10 to 200 nm thick, by a method such as vapor deposition or sputtering, through which an anode 3 is manufactured.

Then, a hole injecting/transporting layer 4 is provided on the anode 3. The hole injecting/transporting layer 4 can be formed by a method such as vacuum deposition, spin coating, casting and LB method. The thickness of the hole injecting/transporting layer 4 may be suitably determined preferably in a range of 5 nm to 5 μm.

Next, a phosphorescent-emitting layer 5, which is to be formed on the hole injecting/transporting layer 4, can be formed by forming a desirable organic emitting material into film by dry processing (representative example: vacuum deposition) or by wet processing such as spin coating or casting.

A fluorescent-emitting layer 6 is subsequently provided on the phosphorescent-emitting layer 5. The fluorescent-emitting layer 6 is formed by the same method as the phosphorescent-emitting layer 5.

An electron injecting/transporting layer 7 is subsequently provided on the fluorescent-emitting layer 6. The electron injecting/transporting layer 7 is formed by the same method as the hole injecting/transporting layer 4.

Lastly, a cathode 8 is layered thereon, and the organic EL device 1 is obtained. The cathode 8 is formed of metal by vapor deposition or sputtering. However, in order to protect the underlying organic layer from damages at the time of film forming, vacuum deposition is preferable.

A method of forming each of the layers in the organic EL device 1 is not particularly limited.

Conventionally-known methods such as vacuum deposition and spin coating are usable. Specifically, the organic thin-film layer may be formed by a conventional coating method such as vacuum deposition, molecular beam epitaxy (MBE method) and coating methods using a solution such as a dipping, spin coating, casting, bar coating, roll coating and ink jetting.

Although the thickness of each organic layer of the organic EL device 1 is not particularly limited, the thickness is typically preferably in a range of several nanometers to 1 μm because an excessively-thinned film is likely to entail defects such as a pin hole while an excessively-thickened film requires high voltage to be applied and deteriorates efficiency.

Modifications of Exemplary Embodiment

It should be noted that the invention is not limited to the above exemplary embodiment but may include any modification and improvement as long as such modification and improvement are compatible with the invention.

In the above exemplary embodiment, the organic EL device includes the red phosphorescent-emitting layer containing a red phosphorescent material and the blue fluorescent-emitting layer. However, the arrangement is not limited thereto. For instance, a green phosphorescent-emitting layer containing a green phosphorescent material may be provided between the red phosphorescent emitting layer and the blue fluorescent-emitting layer. With such a structure, the organic EL device can provide white emission, as the device includes the red phosphorescent-emitting layer, the green phosphorescent-emitting layer and the blue fluorescent-emitting layer.

Further, the materials and treatments for practicing the invention may be altered to other materials and treatments as long as such other materials and treatments are compatible with the invention.

EXAMPLES

Next, the invention will be described in further detail by exemplifying Example(s) and Comparative(s). However, the invention is not limited by the description of Example(s).

Example 1

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus. Then, 55-nm thick film of 4,4'-bis[N-(1-naphthyl)-N-phenylamino]biphenyl (hereinafter abbreviated as "NPD film") was initially formed by resistance heating deposition onto a surface of the glass substrate where the transparent electrode line was provided in a manner of covering the transparent electrode. The NPD film served as the hole injecting/transporting layer.

A 5-nm thick film of CBP, which was used as the red phosphorescent host, was formed on the NPD film by resistance heating deposition. At the same time, the following compound (PD), which was used as the red phosphorescent dopant, was deposited to be contained at a content of 5% (mass ratio) of CBP. This film served as the red phosphorescent-emitting layer.

Then, a 10-nm thick film of CBP, which was used as the green phosphorescent host, was formed on the red phosphorescent-emitting layer by resistance heating deposition. At the same time, $Ir(ppy)_3$, which was used as the green phosphorescent dopant, was deposited to be contained at a content of 5% (mass ratio) of the CBP. This film served as the green phosphorescent-emitting layer.

Then, an intermediate layer formed solely of CBP was provided on the green phosphorescent-emitting layer.

Subsequently, a 30-nm thick film of the following compound (AD1), which was used as the fluorescent host, was formed on the intermediate layer by resistance heating deposition. At the same time, the following compound (BD1), which was used as the blue fluorescent dopant, was deposited to be contained at a content of 5% (mass ratio) of the compound (AD1). This film served as the fluorescent-emitting layer.

The red phosphorescent-emitting layer, the green phosphorescent-emitting layer and the fluorescent-emitting layer, as a whole, served as an emitting layer for white emission.

A 10-nm thick film of the following compound (HB) was formed on this film. This film served as a hole blocking layer.

Further, 30-nm thick film of tris(8-quinolinol) aluminum (Alq) complex was formed on this film. This film served as an electron injecting layer.

After that, LiF was formed into 1-nm thick film. Metal (Al) was deposited on the LiF film to form a 150-nm thick metal cathode, thereby providing the organic EL device.

[Chemical Formula 117]

CBP

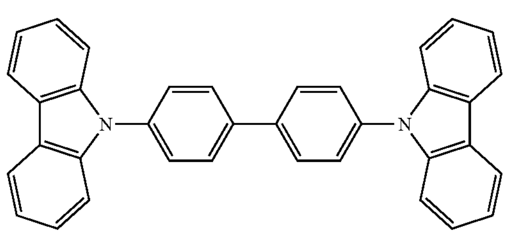

(PD)

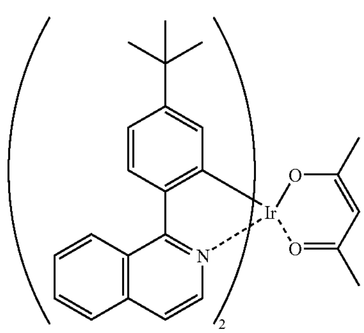

-continued (AD1)

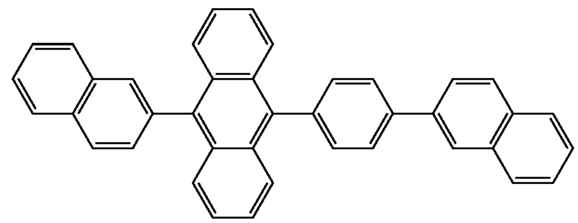

(BD1)

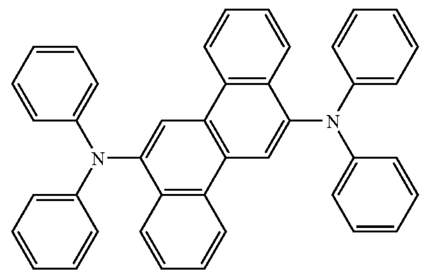

(HB)

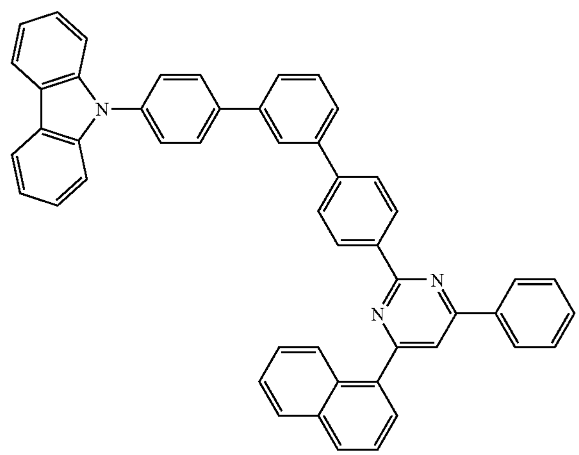

Alq

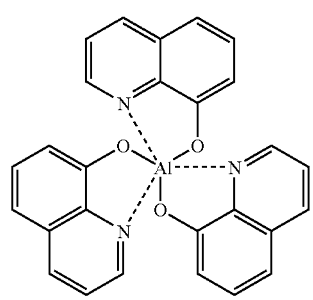

Example 2

An organic EL device was manufactured in the same manner as Example 1, except that the following compound (AD2) was used as the fluorescent host in place of the compound (AD1).

[Chemical Formula 118]

(AD2)

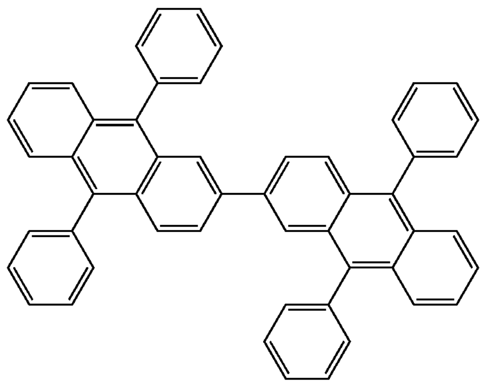

Example 3

An organic EL device was manufactured in the same manner as Example 1, except that the following compound (AD3) was used as the fluorescent host in place of the compound (AD1).

[Chemical Formula 119]

(AD3)

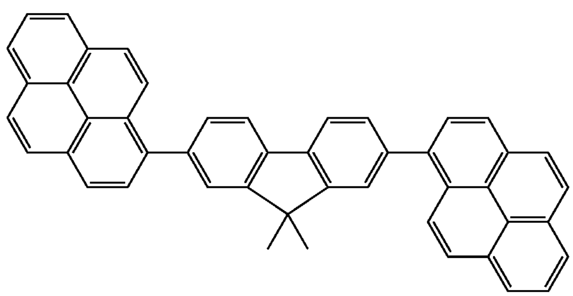

Example 4

An organic EL device was manufactured in the same manner as Example 2, except that the following compound (BD2) was used as the fluorescent dopant in place of the compound (BD1).

[Chemical Formula 120]

(BD2)

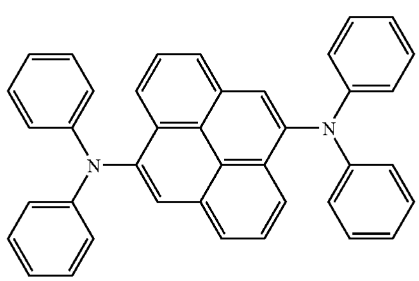

Example 5

An organic EL device was manufactured in the same manner as Example 1, except that the following compound (BD3) was used as the fluorescent dopant in place of the compound (BD1).

[Chemical Formula 121]

(BD3)

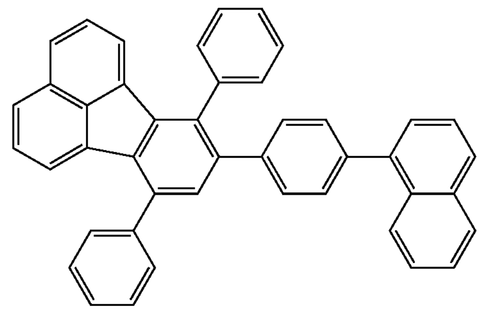

Example 6

An organic EL device was manufactured in the same manner as Example 1, except that: the following compound (BD4) was used as the fluorescent dopant in place of the compound (BD1); and NPD was used as the red phosphorescent host in place of CBP.

[Chemical Formula 122]

(BD4)

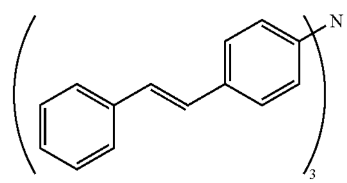

Example 7

An organic EL device was manufactured in the same manner as Example 1, except that NPD was used as the red phosphorescent dopant in place of the CBP.

Example 8

A 30-nm thick film of the compound (AD1), which was used as the fluorescent host, was formed on an NPD film (hole injecting/transporting layer) by resistance heating deposition. At the same time, the compound (BD1), which was used as the blue fluorescent dopant, was deposited to be contained at a content of 5% (mass ratio) of the compound (AD1). This film served as the fluorescent-emitting layer.

Then, an intermediate layer formed solely of Balq was provided on the fluorescent-emitting layer.

Subsequently, a 10-nm thick film of CBP, which was used as the green phosphorescent host, was formed on the intermediate layer by resistance heating deposition. At the same time, $Ir(ppy)_3$, which was used as the green phosphorescent dopant, was deposited to be contained at a content of 5% (mass ratio) of the CBP. This film served as the green phosphorescent-emitting layer.

Subsequently, a 5-nm thick film of CBP, which was used as the red phosphorescent host, was formed on the green phosphorescent-emitting layer by resistance heating deposition. At the same time, the compound (PD), which was used as the red phosphorescent dopant, was deposited to be contained at a content of 5% (mass ratio) of CBP. This film served as the red phosphorescent-emitting layer.

As in Example 1, the hole blocking layer formed of the compound (HB), the electron injecting layer formed of (Alq) complex, the LiF film and metal (Al) were deposited on the red phosphorescent-emitting layer, and the organic EL device was manufactured.

Example 9

An organic EL device was manufactured in the same manner as Example 8, except that CBP was used for the intermediate layer in place of Balq.

Example 10

A 30-nm thick film of CBP, which was used as the red phosphorescent host, was formed on an NPD film (hole injecting/transporting layer) by resistance heating deposition. At the same time, the compound (PD), which was used as the red phosphorescent dopant, was deposited to be contained at a content of 5% (mass ratio) of CBP. This film served as the red phosphorescent-emitting layer.

Next, a 30-nm thick film of the compound (AD1), which was used as the fluorescent host, was formed on the red phosphorescent-emitting layer by resistance heating deposition. At the same time, the compound (BD1), which was used as the blue fluorescent dopant, was deposited to be contained at a content of 5% (mass ratio) of the compound (AD1). This film served as the fluorescent-emitting layer.

Then, a 30-nm thick film of Balq, which was used as the green phosphorescent host, was formed on the fluorescent-emitting layer by resistance heating deposition. At the same time, $Ir(ppy)_3$, which was used as the green phosphorescent dopant, was deposited to be contained at a content of 5% (mass ratio) of the Balq. This film served as the green phosphorescent-emitting layer.

As in Example 1, the hole blocking layer formed of the compound (HB), the electron injecting layer formed of (Alq) complex, the LiF film and metal (Al) were deposited on the green phosphorescent-emitting layer, and the organic EL device was manufactured.

Example 11

A 5-nm thick film of CBP, which was used as the red phosphorescent host, was formed on an NPD film (hole injecting/transporting layer) by resistance heating deposition. At the same time, the compound (PD), which was used as the red phosphorescent dopant, was deposited to be contained at a content of 5% (mass ratio) of CBP. This film served as the red phosphorescent-emitting layer.

Then, an intermediate layer formed solely of NPD was provided on the red phosphorescent-emitting layer.

Next, a 30-nm thick film of the compound (AD1), which was used as the fluorescent host, was formed on the intermediate layer by resistance heating deposition. At the same time, the compound (BD1), which was used as the blue fluorescent dopant, was deposited to be contained at a content of 5% (mass ratio) of the compound (AD1). This film served as the fluorescent-emitting layer.

Then, a 10-nm thick film of the compound (AD1), which was used as the green fluorescent host, was formed on the fluorescent-emitting layer by resistance heating deposition. At the same time, the following compound (GD), which was used as the green fluorescent dopant, was deposited to be contained at a content of 5% (mass ratio) of the compound (AD1). This film served as the green fluorescent-emitting layer.

As in Example 1, the hole blocking layer formed of the compound (HB), the electron injecting layer formed of (Alq) complex, the LiF film and metal (Al) were deposited on the green fluorescent-emitting layer, and the organic EL device was manufactured.

[Chemical Formula 123]

(GD)

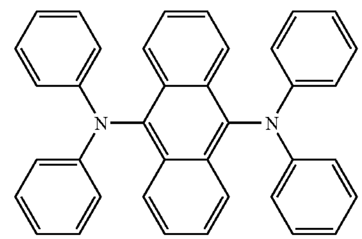

Example 12

An organic EL device was manufactured in the same manner as the Example 11, except that the compound (AD3) was used in the green fluorescent-emitting layer in place of the compound (AD1).

Example 13

An organic EL device was manufactured in the same manner as Example 11, except that the following compound was used as the red phosphorescent host in place of the CBP.

[Chemical Formula 124]

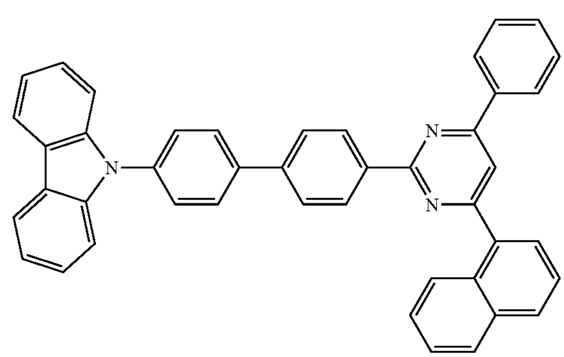

Example 14

An organic EL device was manufactured in the same manner as the Example 1, except that the following compound (E) was used as the electron injecting material in place of Alq.

[Chemical Formula 125]

(E)

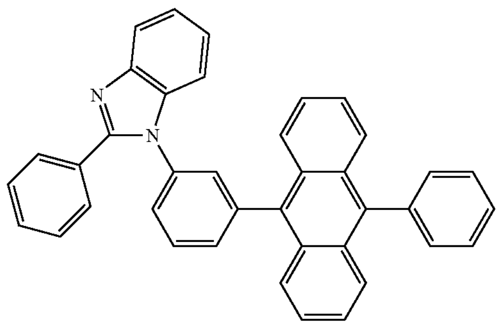

Example 15

Except that no green phosphorescent-emitting layer was provided, a device was manufactured in the same manner as Example 1.

Example 16

Except that the phosphorescent dopant was changed to IrPQ(acac) (iridium(III)bis(2-phenylquinolyl-N,$C^{2'}$)acetylacetonate), a device was manufactured in the same manner as Example 15.

Comparative 1

Except that: TBADN (2-tert-butyl-9,10-bis-((β-naphthyl)-anthracene) was used as the fluorescent host in place of the compound (AD1); TBP (2,5,8,11-tetrakis (1,1-dimethylethyl) perylene) was used as the fluorescent dopant in place of the compound (BD1); and no intermediate layer was provided between the green phosphorescent-emitting layer and the fluorescent-emitting layer, an organic EL device was manufactured in the same manner as Example 1.

Evaluation of Organic EL Device

The organic EL devices each manufactured as described above were driven by direct-current electricity of 1 $mA/cm^2$ to emit light, and then emission chromaticity, the luminance (L) and voltage were measured. Based on the measurement, the external quantum efficiency EQE(%) was obtained.

In addition, by conducting a direct-current continuous current test with the initial luminance intensity being set at 5000 $cd/m^2$ for each organic EL device, time elapsed until the initial luminance intensity was reduced to the half (i.e., time until half-life) was measured for each organic EL device.

The results of the evaluation are shown in Table 1.

TABLE 1

| | EQE % | Time until Half-life @5000nit(h) |
|---|---|---|
| Example 1 | 5.6 | 1800 |
| Example 2 | 6.5 | 2050 |
| Example 3 | 4.2 | 1500 |
| Example 4 | 7.0 | 2000 |
| Example 5 | 5.5 | 1750 |
| Example 6 | 5.3 | 1800 |
| Example 7 | 5.7 | 1750 |

TABLE 1-continued

| | EQE % | Time until Half-life @5000nit(h) |
|---|---|---|
| Example 8 | 5.8 | 1700 |
| Example 9 | 5.4 | 1800 |
| Example 10 | 4.0 | 1350 |
| Example 11 | 7.0 | 1950 |
| Example 12 | 6.9 | 2200 |
| Example 13 | 7.3 | 2150 |
| Example 14 | 6.3 | 2300 |
| Example 15 | 6.1 | 1500 |
| Example 16 | 6.4 | 1800 |
| Comparative 1 | 3.8 | 300 |

As appreciated from Table 1, the organic EL devices of Examples 1 to 16, in which the fluorescent host material was used, exhibited long lifetime and high efficiency.

In contrast, Comparative 1, in which TBADN (a host material conventionally used as a fluorescent host material) was used, exhibited short lifetime.

It should be noted that a "fluorescent host" and a "phosphorescent host" herein respectively mean a host combined with a fluorescent dopant and a host combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material.

Likewise, the phosphorescent host herein means a material for forming a phosphorescent-emitting layer containing a phosphorescent dopant, and does not mean a host that is only usable as a host of a phosphorescent material.

The invention claimed is:

1. An anthracene compound of formula (11) or (12):

(11)

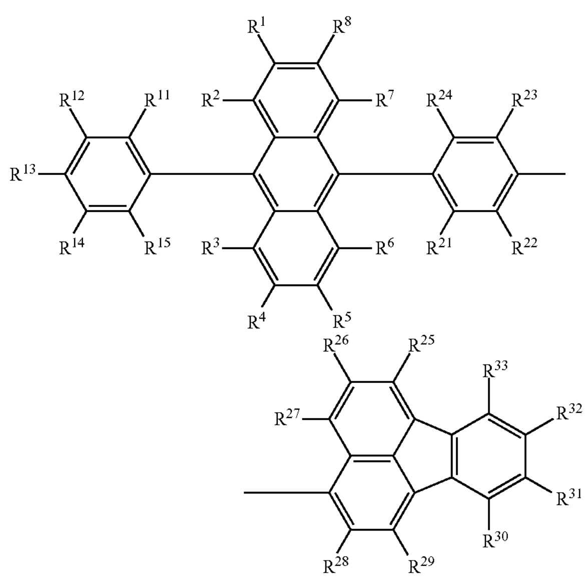

-continued (12)

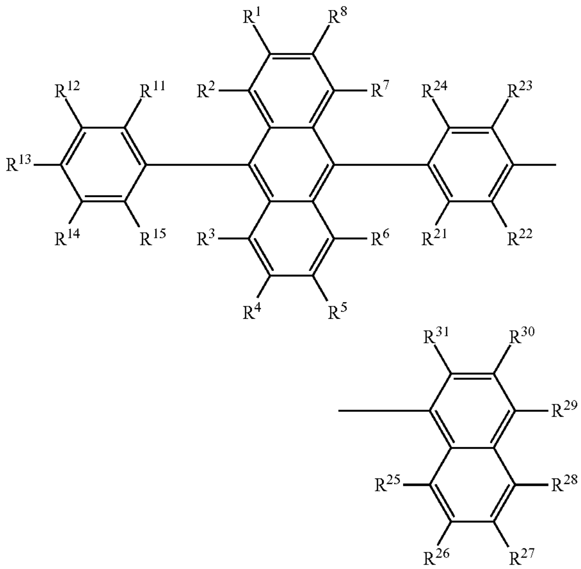

wherein $R^1$ to $R^8$, $R^{11}$ to $R^{15}$ and $R^{21}$ to $R^{33}$ are independently selected from the group consisting of a hydrogen atom, an alkyl group comprising 1 to 50 carbon atoms, a cycloalkyl group comprising 3 to 50 carbon atoms, an alkoxy group comprising 1 to 50 carbon atoms, an aralkyl group comprising 6 to 50 ring carbon atoms, an aryloxy group comprising 5 to 50 ring atoms, an arylthio group comprising 5 to 50 ring atoms, an alkoxycarbonyl group comprising 1 to 50 carbon atoms, a carboxyl group, a halogen atom, a cyano group, a nitro group, and a hydroxy group.

2. The anthracene compound of claim 1, wherein $R^1$ to $R^8$ of the anthracene compound are hydrogen atoms.

3. The anthracene compound of claim 1, wherein $R^{11}$ to $R^{15}$ and $R^{21}$ to $R^{33}$ are hydrogen atoms.

4. The anthracene compound of claim 1, wherein the anthracene compound is represented by the following formula 2a'-80

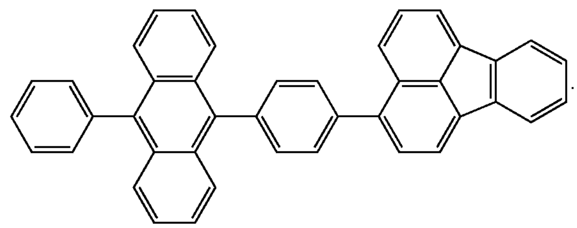

5. The anthracene compound of claim 1, wherein the anthracene compound is represented by the following formula 2a'-76

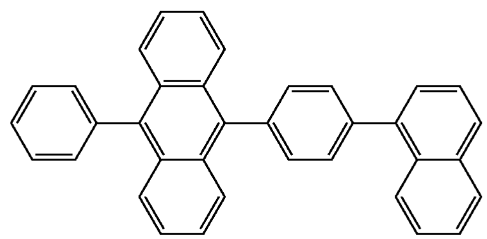

6. An organic EL device, comprising:

an anode;

a cathode; and a plurality of organic thin film layers comprising an emitting layer, the plurality of organic thin film layers being provided between the anode and the cathode, wherein at least one of the organic thin film layers comprises the anthracene compound of claim 1.

* * * * *